United States Patent
Levermore

(10) Patent No.: US 11,737,343 B2
(45) Date of Patent: Aug. 22, 2023

(54) METHOD OF MANUFACTURING PEROVSKITE LIGHT EMITTING DEVICE BY INKJET PRINTING

(71) Applicant: PEROLED LIMITED, Sedgefield (GB)

(72) Inventor: Peter Levermore, Sedgefield (GB)

(73) Assignee: EXCYTON LIMITED, Sedgefield (GB)

( * ) Notice: Subject to any disclaimer, the term of this patent is extended or adjusted under 35 U.S.C. 154(b) by 322 days.

(21) Appl. No.: 17/276,873

(22) PCT Filed: Sep. 16, 2019

(86) PCT No.: PCT/GB2019/052597
§ 371 (c)(1),
(2) Date: Mar. 17, 2021

(87) PCT Pub. No.: WO2020/058685
PCT Pub. Date: Mar. 26, 2020

(65) Prior Publication Data
US 2022/0052303 A1 Feb. 17, 2022

(30) Foreign Application Priority Data

Sep. 17, 2018 (GB) .................................. 1815061
Sep. 17, 2018 (GB) .................................. 1815063
Sep. 17, 2018 (GB) .................................. 1815064

(51) Int. Cl.
*H10K 50/15* (2023.01)
*H10K 71/00* (2023.01)
(Continued)

(52) U.S. Cl.
CPC ........... *H10K 71/00* (2023.02); *H10K 50/135* (2023.02); *H10K 50/15* (2023.02); *H10K 50/16* (2023.02);
(Continued)

(58) Field of Classification Search
None
See application file for complete search history.

(56) References Cited

U.S. PATENT DOCUMENTS 5,707,745 A  1/1998 Forrest et al.
6,303,238 B1 10/2001 Thompson et al.
(Continued)

FOREIGN PATENT DOCUMENTS

CN  105938845  9/2016
CN  106910836  6/2017
(Continued)

OTHER PUBLICATIONS

Protesescu, Loredana, et al. "Nanocrystals of cesium lead halide perovskites ($CsPbX_3$, X= Cl, Br, and I): novel optoelectronic materials showing bright emission with wide color gamut." Nano letters 15.6 (2015): 3692-3696.

(Continued)

*Primary Examiner* — Michael Lebentritt
(74) *Attorney, Agent, or Firm* — Meunier Carlin & Curfman LLC

(57) ABSTRACT

A method of fabricating a perovskite light emitting device is provided. In one embodiment, the method comprises the steps of: providing a substrate; providing a first electrode disposed over the substrate; providing a bank structure disposed over the substrate, wherein the bank structure is patterned so as to define at least one sub-pixel on the substrate; providing a first transport layer ink, wherein the first transport layer ink comprises at least one solvent and at least one first charge transport material mixed in the at least one solvent; depositing the first transport layer ink into the at least one sub-pixel over the first electrode using a method of inkjet printing; vacuum drying the first transport layer ink inside a vacuum drying chamber to assemble a first transport layer over the first electrode in the at least one sub-pixel;

(Continued)

annealing the first transport layer; providing a perovskite ink, wherein the perovskite ink comprises at least one solvent and at least one perovskite light emitting material mixed in the at least one solvent; depositing the perovskite ink into the at least one sub-pixel over the first transport layer using a method of inkjet printing; vacuum drying the perovskite ink inside a vacuum drying chamber to assemble a perovskite emissive layer over the first transport layer in the at least one sub-pixel; annealing the perovskite emissive layer; and depositing a second electrode over the perovskite emissive layer using a method of vapour deposition. Perovskite light emitting devices and displays fabricated using the provided method are also provided.

20 Claims, 46 Drawing Sheets

(51) Int. Cl.
  *H10K 50/16* (2023.01)
  *H10K 50/17* (2023.01)
  *H10K 50/18* (2023.01)
  *H10K 50/135* (2023.01)
  *H10K 59/122* (2023.01)
  *H10K 71/40* (2023.01)
  *H10K 71/13* (2023.01)
  H10K 102/00 (2023.01)

(52) U.S. Cl.
  CPC .......... *H10K 50/17* (2023.02); *H10K 50/171* (2023.02); *H10K 50/18* (2023.02); *H10K 59/122* (2023.02); *H10K 71/135* (2023.02); *H10K 71/40* (2023.02); *H10K 2102/321* (2023.02); *H10K 2102/351* (2023.02); *H10K 2102/361* (2023.02)

(56) References Cited

U.S. PATENT DOCUMENTS

| | | | |
|---|---|---|---|
| 7,279,704 | B2 | 10/2007 | Walters et al. |
| 8,654,001 | B2 | 2/2014 | Tauber et al. |
| 8,773,013 | B2 | 7/2014 | Rajan et al. |
| 2011/0300657 | A1 | 12/2011 | Chesterfield et al. |
| 2016/0005971 | A1 | 1/2016 | Li |
| 2017/0154946 | A1* | 6/2017 | Ono .................... G09G 3/3258 |
| 2017/0294160 | A1* | 10/2017 | Ono ........................ G09G 3/30 |
| 2018/0015814 | A1 | 1/2018 | Haberl |
| 2018/0182977 | A1 | 1/2018 | Hirose et al. |
| 2018/0052363 | A1 | 2/2018 | Yamazaki et al. |
| 2018/0166512 | A1 | 6/2018 | Hack et al. |
| 2018/0269265 | A1 | 9/2018 | Kim et al. |
| 2018/0294412 | A1 | 10/2018 | Cui |
| 2018/0315945 | A1 | 11/2018 | Wang |
| 2018/0327622 | A1 | 11/2018 | Pan et al. |
| 2019/0018287 | A1 | 1/2019 | Lüchinger et al. |
| 2019/0041701 | A1 | 2/2019 | Chen et al. |
| 2019/0198787 | A1 | 6/2019 | Du |
| 2020/0059673 | A1 | 2/2020 | Lejeune |
| 2020/0227661 | A1* | 7/2020 | Nishikiori .............. H10K 71/13 |
| 2020/0243482 | A1 | 7/2020 | Nakamura et al. |
| 2021/0024765 | A1 | 1/2021 | Tan et al. |

FOREIGN PATENT DOCUMENTS

| | | |
|---|---|---|
| CN | 106953023 | 7/2017 |
| CN | 107502065 | 12/2017 |
| CN | 107768529 | 3/2018 |
| CN | 107863445 A | 3/2018 |
| EP | 0423283 | 1/1995 |
| JP | 2008226685 | 9/2008 |
| JP | 2008227330 | 9/2008 |
| JP | 2014035911 | 2/2014 |
| JP | 2018-32020 A | 3/2018 |
| JP | 2018-36645 A | 3/2018 |
| JP | 2018 107084 | 7/2018 |
| WO | 2017/080325 | 5/2017 |
| WO | 2017080318 | 5/2017 |
| WO | 2017/108962 | 6/2017 |
| WO | 2017/140404 | 8/2017 |
| WO | 2018/138319 | 8/2018 |
| WO | 2018/196122 | 11/2018 |

OTHER PUBLICATIONS

Non-Final Office Action issued in U.S. Appl. No. 17/049,423 dated May 24, 2022.
Adjokatse, Sampson, Hong-Hua Fang, and Maria Antonietta Loi. "Broadly tunable metal halide perovskites for solid-state light-emission applications." Materials Today 20.8 (2017): 413-424.
Chao Liang et al.: "One-Step Inkjet Printed Perovskite in Air for Efficient Light Harvesting", Solar FI FI L, 2018, 2, 1700217-1-1700217-9, XP055646598, DOI: 10.1002/solr.201700217 & Chao Liang et al: "Supporting Information One-step Inkjet Printed Perovskite in Air for Efficient Light Harvesting", pp. 1700217-S1-1700217-S8, XP055646607.
D'Andrade, Brian W., and Stephen R. Forrest. "White organic light-emitting devices for solid-state lighting." Advanced Materials 16.18 (2004): 1585-1595.
Florian Mathies et al.: "Inkjet-Printed Triple Cation Perovskite Solar Cells", ACSApp. Ener. Mater., 2018, 1, 1834-1839; XP055647107, DOI: 10.1021/acsaem.8b00222.
Forrest, S. R., et al. "The stacked OLED (SOLED): a new type of organic device for achieving high-resolution full-color displays." Synthetic metals 91.1-3 (1997): 9-13.
Hirose, Tomoya, et al. "20-4: High-efficiency Perovskite QLED Achieving BT. 2020 Green Chromaticity." SID Symposium Digest of Technical Papers. vol. 48. No. 1. 2017, 284-287.
International Preliminary Report on Patentability issued for Application No. PCT/GB2019/052597, dated Mar. 25, 2021.
International Search Report and Written Opinion issued for Application No. PCT/GB2019/052597, dated Dec. 13, 2019.
International Preliminary Report on Patentability issued for Application No. PCT/GB2019/052596, dated Mar. 25, 2021.
International Search Report and Written Opinion issued for Application No. PCT/GB2019/052596, dated Dec. 13, 2019.
International Search Report and Written Opinion issued for Application No. PCT/GB2019/051086, dated Jun. 28, 2019.
International Preliminary Report on Patentability relating to International Application No. PCT/GB2019/051086, dated Oct. 27, 2020.
International Search Report and Written Opinion issued for Application No. PCT/GB2019/052114, dated Nov. 13, 2019.
International Search Report and Written Opinion issued for Application No. PCT/GB2019/051425, dated Aug. 22, 2019.
International Preliminary Report on Patentability in connection to Application No. PCT/GB2019/051425, dated Dec. 3, 2020.
Jeong, Su-Hun, et al. "Universal high work function flexible anode for simplified ITO-free organic and perovskite light-emitting diodes with ultra-high efficiency." NPG Asia Materials 9.7 (2017): e411-e411.
Jung, Young Kwan, et al. "52-3: Distinguished Paper: 3 Stacked Top Emitting White OLED for High Resolution OLED TV." SID Symposium Digest of Technical Papers. vol. 47. No. 1. 2016, 707-710.
Kathirgamanathan, Poopathy, et al. "48-3: Invited Paper: Quantum Dot Electroluminescence: Towards Achieving the REC 2020 Colour Co-ordinates." SID Symposium Digest of Technical Papers. vol. 47. No. 1. (2016) 652-656.
Kathirgamanathan, Poopathy, et al. "Electroluminescent organic and quantum dot LEDs: The state of the art." Journal of Display Technology 11.5 (2015): 480-493.
Kumar, Sudhir, et al. "Efficient blue electroluminescence using quantum-confined two-dimensional perovskites." ACS nano 10.10 (2016): 9720-9729.

(56) References Cited

OTHER PUBLICATIONS

Li, Jianhai, et al. "50-Fold EQE improvement up to 6.27% of solution-processed all-inorganic perovskite CsPbBr3 QLEDs via surface ligand density control." Advanced Materials 29.5 (2017): 1603885.
Search Report issued for Application No. GB1815063.1, dated Mar. 18, 2019.
Search Report issued for Application No. GB1815061.5, dated Mar. 18, 2019.
Search Report issued for Application No. GB 1806530, dated Oct. 12, 2018.
Search Report issued for Application No. GB 1808439.2, dated Nov. 19, 2018.
Search Report issued for Application No. GB1812402.4, dated Jan. 28, 2019.
Soneira et al., iPhone X OLED Display Technology Shoot-Out, DisplayMate Technologies Corporation, http://www.displaymate.com/iPhoneX_ShootOut_la.htm.
Takita, Yusuke, et al. "Highly efficient deep-blue fluorescent dopant for achieving Tow-power OLED display satisfying BT. 2020 chromaticity." Journal of the Society for Information Display 26.2 (2018): 55-63.
Uoyama, Hiroki, et al. "Highly efficient organic light-emitting diodes from delayed fluorescence." Nature 492.7428 (2012): 234-238.
Zhao, Dan, et al. "Progress on material, structure and function for tandem organic light-emitting diodes." Organic Electronics 51 (2017): 220-242.
Vadim Adamovich, et al., All-phosphorescent white stacked organic LEDs for solid-state lighting. A novel technology offers power-efficient high-quality illumination with unprecedented thin form factors and low operating temperatures. SPIE, Oct. 27, 2011. Available on-line: https://spie.org/news/3846-all-phosphorescent-white-stacked-organic-leds-for-solid-state-lighting?SSO=1.
Wang, Nana, et al. "Perovskite light-emitting diodes based on solution-processed self-organized multiple quantum wells." Nature Photonics 10.11 (2016): 699-704.
Non-Final Office Action issued for U.S. Appl. No. 17/056,857, dated Aug. 31, 2022.
Notification of Reasons for Rejection dated Nov. 29, 2022, in Japanese Application No. 2021-506071.
Office Action dated Jan. 20, 2023, in U.S. Appl. No. 17/049,423.

\* cited by examiner (a)

(b)

(c)

(d)

(e)

(f)

(a)

(b)

(c)

(d)

(e)

(f)

(g)

(a)

(b)

(c)

(d)

(e)

(f)

(a)

(b)

(c)

(d)

(e)

(f)

(c)

(d)

(e)

(f)

(g)

(a)

(b)

(c)

(d)

(e)

(f)

(g)

METHOD OF MANUFACTURING PEROVSKITE LIGHT EMITTING DEVICE BY INKJET PRINTING

CROSS-REFERENCE TO RELATED APPLICATIONS

This application is a United States National Phase Patent Application filed under 35 U.S.C. § 371 of International Patent Application Number PCT/GB2019/0052597, filed on Sep. 16, 2019, which claims the benefit of priority to GB Patent Application No. 1815063.1, GB Patent Application No. 1815064.9, and GB Patent Application No. 1815061.5, all filed Sep. 17, 2018, the contents of which are incorporated by reference herein in their entirety.

TECHNICAL FIELD

The present invention relates to perovskite emissive layers comprising perovskite light emitting material, and in particular to methods of assembling perovskite emissive layers comprising perovskite light emitting material. The present invention also relates to perovskite light emitting devices comprising perovskite emissive layers, and in particular to methods of fabricating perovskite light emitting devices comprising perovskite emissive layers.

BACKGROUND

Perovskite materials are becoming increasingly attractive for application in optoelectronic devices. Many of the perovskite materials used to make such devices are earth-abundant and relatively inexpensive, so perovskite optoelectronic devices have the potential for cost advantages over alternative organic and inorganic devices. Additionally, inherent properties or perovskite materials, such as an optical band gap that is readily tunable across the visible, ultra-violet and infra-red, render them well suited for opto-electronics applications, such as perovskite light emitting diodes (PeLEDs), perovskite solar cells and photodetectors, perovskite lasers, perovskite transistors, perovskite visible light communication (VLC) devices and others. PeLEDs comprising perovskite light emitting material may have performance advantages over conventional organic light emitting diodes (OLEDs) comprising organic light emitting material. For example, strong electroluminescent properties, including unrivalled high colour purity enabling displays with wider colour gamut, excellent charge transport properties and low non-radiative rates.

PeLEDs make use of thin perovskite films that emit light when voltage is applied. PeLEDs are becoming an increasingly attractive technology for use in applications such as displays, lighting and signage. As an overview, several PeLED materials and configurations are described in Adjokatse et al., which is included herein by reference in its entirety.

One potential application for perovskite light-emitting materials is a display. Industry standards for a full-colour display require for sub-pixels to be engineered to emit specific colours, referred to as "saturated" colours. These standards call for saturated red, green and blue sub-pixels, where colour may be measured using CIE 1931 (x, y) chromaticity coordinates, which are well known in the art. One example of a perovskite material that emits red light is methylammonium lead iodide ($CH_3NH_3PbI_3$). One example of a perovskite material that emits green light is formamidinium lead bromide ($CH(NH_2)_2PbBr_3$). One example of a perovskite material that emits blue light is methylammonium lead chloride ($CH_3NH_3PbCl_3$). In a display, performance advantages, such as increased colour gamut, may be achieved where PeLEDs are used in place of or in combination with OLEDs.

The present invention relates to perovskite emissive layers comprising perovskite light emitting material, and in particular to methods of assembling perovskite emissive layers comprising perovskite light emitting material. The present invention also relates to perovskite light emitting devices comprising perovskite emissive layers, and in particular to methods of fabricating perovskite light emitting devices comprising perovskite emissive layers.

As used herein, the term "perovskite" includes any perovskite material that may be used in an optoelectronic device. Any material that may adopt a three-dimensional (3D) structure of $ABX_3$, where A and B are cations and X is an anion, may be considered a perovskite material. FIG. 1 depicts an example of a perovskite material with a 3D structure of $ABX_3$. The A cations may be larger than the B cations. The B cations may be in 6-fold coordination with surrounding X anions. The A anions may be in 12-fold coordination with surrounding X anions.

There are many classes of perovskite material. One class of perovskite material that has shown particular promise for optoelectronic devices is the metal halide perovskite material class. For metal halide perovskite material, the A component may be a monovalent organic cation, such as methylammonium ($CH_3NH_3^+$) or formamidinium ($CH(NH_2)_2^+$), an inorganic atomic cation, such as caesium ($Cs^+$), or a combination thereof, the B component may be a divalent metal cation, such as lead ($Pb^+$), tin ($Sn^+$), copper ($Cu^+$), europium ($Eu^+$) or a combination thereof, and the X component may be a halide anion, such as $I^-$, $Br^-$, $Cl^-$, or a combination thereof. Where the A component is an organic cation, the perovskite material may be defined as an organic metal halide perovskite material. $CH_3NH_3PbBr_3$ and $CH(NH_2)_2PbI_3$ are non-limiting examples of organic metal halide perovskite materials with a 3D structure. Where the A component is an inorganic cation, the perovskite material may be defined as an inorganic metal halide perovskite material. $CsPbI_3$, $CsPbCl_3$ and $CsPbBr_3$ are non-limiting examples of inorganic metal halide perovskite materials.

As used herein, the term "perovskite" further includes any material that may adopt a layered structure of $L_2(ABX_3)_{n-1}BX_4$ (which may also be written as $L_2A_{n-1}BnX_{3n+1}$), where L, A and B are cations, X is an anion, and n is the number of $BX_4$ monolayers disposed between two layers of cation L. FIG. 2 depicts examples of perovskite materials with a layered structure of $L_2(ABX_3)_{n-1}BX_4$ having different values for n. For metal halide perovskite material, the A component may be a monovalent organic cation, such as methylammonium ($CH_3NH_3+$) or formamidinium ($CH(NH_2)_2^+$), an atomic cation, such as caesium ($Cs^+$), or a combination thereof, the L component may be an organic cation such as 2-phenyl-ethylammonium ($C_6H_5C_2H_4NH_3^+$) or 1-napthylmethylammonium ($C_{10}H_7CH_2NH_3^+$), the B component may be a divalent metal cation, such as lead ($Pb^+$), tin ($Sn^+$), copper ($Cu^+$), europium ($Eu^+$) or a combination thereof, and the X component may be a halide anion, such as $I^-$, $Br^-$, $Cl^-$, or a combination thereof. $(C_6H_5C_2H_4NH_3)_2(CH(NH_2)_2PbBr_3)_{n-1}PbBr_4$ and $(C_{10}H_7CH_2NH_3)_2(CH_3NH_3PbI_2Br)_{n-1}PbI_3Br$ are non-limiting examples of metal halide perovskite material with a layered structure.

Where the number of layers n is large, for example n greater than approximately 10, perovskite material with a layered structure of $L_2(ABX_3)_{n-1}BX_4$ adopts a structure that is approximately equivalent to perovskite material with a 3D structure of $ABX_3$. As used herein, and as would generally be understood by one skilled in the art, perovskite material having a large number of layers may be referred to as a 3D perovskite material, even though it is recognized that such perovskite material has reduced dimensionality from $n=\infty$. Where the number of layers $n=1$, perovskite material with a layered structure of $L_2(ABX_3)_{n-1}BX_4$ adopts a two-dimensional (2D) structure of $L_2BX_4$. Perovskite material having a single layer may be referred to as a 2D perovskite material. Where n is small, for example n in the range of approximately 2-10, perovskite material with a layered structure of $L_2(ABX_3)_{n-1}BX_4$ adopts a quasi-two-dimensional (Quasi-2D) structure. Perovskite material having a small number of layers may be referred to as a Quasi-2D perovskite material. Owing to quantum confinement effects, the energy band gap is lowest for layered perovskite material structures where n is highest.

Perovskite material may have any number of layers. Perovskites may comprise 2D perovskite material, Quasi-2D perovskite material, 3D perovskite material or a combination thereof. For example, perovskites may comprise an ensemble of layered perovskite materials having different numbers of layers. For example, perovskites may comprise an ensemble of Quasi-2D perovskite materials having different numbers of layers.

As used herein, the term "perovskite" further includes films of perovskite material. Films of perovskite material may be crystalline, polycrystalline or a combination thereof, with any number of layers and any range of grain or crystal size.

As used herein, the term "perovskite" further includes nanocrystals of perovskite material that have structure equivalent to or resembling the 3D perovskite structure of $ABX_3$ or the more general layered perovskite structure of $L_2(ABX_3)_{n-1}BX_4$. Nanocrystals of perovskite material may include perovskite nanoparticles, perovskite nanowires, perovskite nanoplatelets, or a combination thereof. Nanocrystals of perovskite material may be of any shape or size, with any number of layers and any range of grain or crystal sizes. FIG. 3 depicts an example of nanocrystal of perovskite material with a layered structure that resembles $L_2(ABX_3)_{n-1}BX_4$, where $n=5$ and L cations are arranged at the surface of the perovskite nanocrystal. The term "resembles" is used because for a nanocrystal of perovskite material, the distribution of L cations may differ from that of perovskite material with a formal layered structure of $L_2(ABX_3)_{n-1}BX_4$. For example, in a nanocrystal of perovskite material, there may be a greater proportion of L cations arranged along the sides of the nanocrystal.

Several types of perovskite material may be stimulated to emit light in response to optical or electrical excitation. That is to say that perovskite light emitting material may be photoluminescent or electroluminescent. As used herein, the term "perovskite light emitting material" refers exclusively to electroluminescent perovskite light emitting material that is emissive through electrical excitation. Wherever "perovskite light emitting material" is referred to in the text, it should be understood that reference is being made to electroluminescent perovskite light emitting material. This nomenclature may differ slightly from that used by other sources.

In general, PeLED devices may be photoluminescent or electroluminescent. As used herein, the term "PeLED" refers exclusively to electroluminescent devices that comprise electroluminescent perovskite light emitting material. When current is applied to such PeLED devices, the anode injects holes and the cathode injects electrons into the emissive layer(s). The injected holes and electrons each migrate towards the oppositely charged electrode. When an electron and a hole localize, an exciton, which is a localized electron-hole pair having an excited energy state, may be formed. Light is emitted if the exciton relaxes via a photo-emissive mechanism. The term "PeLED" may be used to describe single emissive unit electroluminescent devices that comprise electroluminescent perovskite light emitting material. The term "PeLED" may also be used to describe one or more emissive units of stacked electroluminescent devices that comprise electroluminescent perovskite light emitting material. This nomenclature may differ slightly from that used by other sources.

As used herein, "top" means furthest away from the substrate, while "bottom" means closest to the substrate. Where a first layer is described as "disposed over" a second layer, the first layer is disposed further away from the substrate. There may be other layers between the first and second layer, unless it is specified that the first layer is "in contact with" the second layer. Where a first layer is described as "in contact with" a second layer, the first layer is adjacent to the second layer. That is to say the first layer is in direct physical contact with the second layer, with no additional layers, gaps or spaces disposed between the first layer and the second layer.

As used herein, "solution processible" means capable of being dissolved, dispersed or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) and electron affinities (EA) are measured as negative energies relative to a vacuum level, a higher HOMO energy level corresponds to an IP that is less negative. Similarly, a higher LUMO energy level corresponds to an EA that is less negative. On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. The definitions of HOMO and LUMO energy levels therefore follow a different convention than work functions.

SUMMARY

A method of fabricating a perovskite light emitting device is provided. In one embodiment, the method comprises the steps of: providing a substrate; providing a first electrode disposed over the substrate; providing a bank structure disposed over the substrate, wherein the bank structure is patterned so as to define at least one sub-pixel on the substrate; providing a first transport layer ink, wherein the first transport layer ink comprises at least one solvent and at least one first charge transport material mixed in the at least one solvent; depositing the first transport layer ink into the at least one sub-pixel over the first electrode using a method of inkjet printing; vacuum drying the first transport layer ink inside a vacuum drying chamber to assemble a first transport layer over the first electrode in the at least one sub-pixel; annealing the first transport layer; providing a perovskite ink, wherein the perovskite ink comprises at least one solvent and at least one perovskite light emitting material mixed in the at least one solvent; depositing the perovskite ink into the at least one sub-pixel over the first transport layer using a method of inkjet printing; vacuum drying the perovskite ink inside a vacuum drying chamber to assemble a perovskite emissive layer over the first transport layer in the at least one sub-pixel; annealing the perovskite emissive layer; and depositing a second electrode over the perovskite emissive layer using a method of vapour deposition.

In one embodiment, the perovskite ink comprises organic metal halide light-emitting perovskite material. In one embodiment, the perovskite ink comprises inorganic metal halide light-emitting perovskite material.

In one embodiment, the profile of the assembled first transport layer may be controlled by varying the rate of vacuum drying of the first transport layer ink. In one embodiment, the morphology of the assembled first transport layer may be controlled by varying the rate of vacuum drying of the first transport layer ink. In one embodiment, the step of vacuum drying the first transport layer ink inside a vacuum drying chamber to assemble a first transport layer over the first electrode in the at least one sub-pixel, the ambient temperature inside the vacuum drying chamber is 50° C. or less, optionally 30° C. or less. In one embodiment, the thickness of the first transport layer is in the range of 10 nm to 80 nm. In one embodiment, the first transport layer is a cross-linked layer. In one embodiment, the step of depositing the first transport layer ink into the at least one sub-pixel over the first electrode using a method of inkjet printing is performed in an atmosphere of air or nitrogen. In one embodiment, the step of annealing the first transport layer is performed in an atmosphere of nitrogen. In one embodiment, the first transport layer is annealed at a temperature in the range of 100° C. to 220° C. In one embodiment, the step of annealing the first transport layer is performed in a different chamber to the step of vacuum drying the first transport layer ink inside a vacuum drying chamber to assemble a first transport layer over the first electrode in the at least one sub-pixel.

In one embodiment, the profile of the assembled perovskite emissive layer may be controlled by varying the rate of vacuum drying of the perovskite ink. In one embodiment, the morphology of the assembled perovskite emissive layer may be controlled by varying the rate of vacuum drying of the perovskite ink.

In one embodiment, during the step of vacuum drying the perovskite ink inside a vacuum drying chamber to assemble a perovskite emissive layer over the first transport layer in the at least one sub-pixel, the pressure inside the vacuum drying chamber is reduced to less than or equal to 0.0001 mbar. In one embodiment, during the step of vacuum drying the perovskite ink inside a vacuum drying chamber to assemble a perovskite emissive layer over the first transport layer in the at least one sub-pixel, the pressure inside the vacuum drying chamber is reduced to less than or equal to 0.0001 mbar in less than or equal to 60 seconds. In one embodiment, during the step of vacuum drying the perovskite ink inside a vacuum drying chamber to assemble a perovskite emissive layer over the first transport layer in the at least one sub-pixel, the pressure inside the vacuum drying chamber is reduced to less than or equal 0.0001 mbar in less than or equal to 30 seconds. In one embodiment, the duration of the step of vacuum drying the perovskite ink inside a vacuum drying chamber to assemble a perovskite emissive layer over the first transport layer in the at least one sub-pixel is less than or equal to 120 seconds. In one embodiment, the step of vacuum drying the perovskite ink inside a vacuum drying chamber to assemble a perovskite emissive layer over the first electrode in the at least one sub-pixel, the ambient temperature inside the vacuum drying chamber is 50° C. or less, optionally 30° C. or less.

In one embodiment, the perovskite ink comprises at least one perovskite light emitting material mixed in the at least one solvent at a concentration by weight in the range of 0.01 wt. % to 10 wt. %. In one embodiment, the perovskite ink comprises at least one perovskite light emitting material mixed in the at least one solvent at a concentration by weight in the range of 0.1 wt. % to 5 wt. %. In one embodiment, the thickness of the assembled perovskite emissive layer is in the range of 15 nm to 150 nm.

In one embodiment, the profile of the assembled perovskite emissive layer may be controlled by varying dimensions of the at least one sub-pixel. In one embodiment, the profile of the assembled perovskite emissive layer may be controlled by varying the perovskite ink drop volume during the step of depositing the perovskite ink. In one embodiment, the length of the at least one sub-pixel is in the range of 100 μm to 250 μm, and the width of the at least one sub-pixel is in the range of 40 μm to 80 μm. In one embodiment, the length of the at least one sub-pixel is in the range of 50 μm to 150 μm, and the width of the at least one sub-pixel is in the range of 20 μm to 40 μm. In one embodiment, the length of the at least one sub-pixel is in the range of 10 μm to 50 μm, and the width of the at least one sub-pixel is in the range of 5 μm to 20 μm.

In one embodiment, the perovskite ink drop volume during the step of depositing the perovskite ink is in the range of 5 pico-liters to 15 pico-liters. In one embodiment, the perovskite ink drop volume during the step of depositing the perovskite ink is in the range of 0.5 pico-liters to 2 pico-liters. In one embodiment, the profile of the assembled perovskite emissive layer may be controlled by varying the number of perovskite ink drops during the step of depositing the perovskite ink. In one embodiment, the total number of perovskite ink drops deposited during the step of depositing the perovskite may be in the range of 4 perovskite ink drops to 20 perovskite ink drops.

In one embodiment, the profile of the assembled perovskite emissive layer may be controlled by varying the angle of the bank structure at the edge of the at least one sub-pixel. In one embodiment, the bank structure is provided at an angle in the range of 30° to 60° at the edge of the at least one sub-pixel. In one embodiment, the profile of the perovskite emissive layer may be controlled by varying the surface energy of the bank structure.

In one embodiment, the step of depositing the perovskite ink into the at least one sub-pixel over the first transport layer using a method of inkjet printing is performed in an atmosphere of air or nitrogen. In one embodiment, the step of depositing the perovskite ink into the at least one sub-pixel over the first transport layer using a method of inkjet printing is performed in an atmosphere of air. In one embodiment, the step of depositing the perovskite ink into the at least one sub-pixel over the first transport layer using a method of inkjet printing is performed in an atmosphere of nitrogen. In one embodiment, the perovskite emissive layer is annealed at a temperature in the range of 80° C. to 200° C. In one embodiment, the step of annealing the perovskite emissive layer is performed in an atmosphere of nitrogen. In one embodiment, the step of annealing the perovskite emissive layer is performed in a different chamber to the step of vacuum drying the perovskite ink inside a vacuum drying chamber to assemble a perovskite emissive layer over the first transport layer in the at least one sub-pixel.

In one embodiment, after the step of providing a bank structure disposed over the substrate, wherein the bank structure is patterned so as to define at least one sub-pixel on the substrate, but before the step of providing a first transport layer ink, wherein the first transport layer ink comprises at least one solvent and at least one first charge transport material mixed in the at least one solvent, the method further comprises the steps of: providing a first injection layer ink, wherein the first injection layer ink comprises at least one solvent and at least one first charge injection material mixed in the at least one solvent; depositing the first injection layer ink into the at least one sub-pixel over the first electrode using a method of inkjet printing; vacuum drying the first injection layer ink inside a vacuum drying chamber to assemble a first injection layer over the first electrode in the at least one sub-pixel; and annealing the first injection layer.

In one embodiment, the thickness of the first injection layer is in the range of 10 nm to 80 nm. In one embodiment, the step of depositing the first injection layer ink into the at least one sub-pixel over the first electrode using a method of inkjet printing is performed in an atmosphere of air or nitrogen. In one embodiment, the step of vacuum drying the first injection layer ink inside a vacuum drying chamber to assemble a first injection layer over the first electrode in the at least one sub-pixel, the ambient temperature inside the vacuum drying chamber is 50° C. or less, optionally 30° C. or less.

In one embodiment, the first injection layer is annealed at a temperature in the range of 100° C. to 220° C. In one embodiment, the step of annealing the first injection layer is performed in an atmosphere of air or nitrogen. In one embodiment, the step of annealing the first injection layer is performed in a different chamber to the step of vacuum drying the first injection layer ink inside a vacuum drying chamber to assemble a first injection layer over the first electrode in the at least one sub-pixel.

In one embodiment, after the step annealing the perovskite emissive layer, but before the step of depositing a second electrode over the perovskite emissive layer using a method of vapour deposition, the method further comprises the step of depositing a second injection layer over the perovskite emissive layer using a method of vapour deposition.

In one embodiment, after the step of annealing the perovskite emissive layer, but before the step of depositing a second electrode over the perovskite emissive layer using a method of vapour deposition, the method further comprises the step of depositing a second transport layer over the perovskite emissive layer using a method of vapour deposition.

In one embodiment, after the step of annealing the perovskite emissive layer, but before the step of depositing a second electrode over the perovskite emissive layer using a method of vapour deposition, the method further comprises the steps of depositing a second transport layer over the perovskite emissive layer using a method of vapour deposition, and depositing a second injection layer over the second transport layer using a method of vapour deposition.

In one embodiment, after the step of annealing the perovskite emissive layer, but before the step of depositing a second electrode over the perovskite emissive layer using a method of vapour deposition, the method further comprises the steps of depositing a blocking layer over the perovskite emissive layer using a method of vapour deposition, and depositing a second transport layer over the blocking layer using a method of vapour deposition.

In one embodiment, after the step of annealing the perovskite emissive layer, but before the step of depositing a second electrode over the perovskite emissive layer using a method of vapour deposition, the method further comprises the steps of depositing a blocking layer over the perovskite emissive layer using a method of vapour deposition, depositing a second transport layer over the blocking layer using a method of vapour deposition, and depositing a second injection layer over the second transport layer using a method of vapour deposition.

In one embodiment, the first electrode is an anode, the first injection layer, where included, is a hole injection layer, the first transport layer is a hole transport layer, the blocking layer, where included, is a hole blocking layer, the second transport layer, where included, is an electron transport layer, the second injection layer, where included, is an electron injection layer and the second electrode is a cathode, such that the perovskite light emitting device is a standard perovskite light emitting device.

In one embodiment, the first electrode is an cathode, the first injection layer, where included, is an electron injection layer, the first transport layer is an electron transport layer, the blocking layer, where included, is an electron blocking layer, the second transport layer, where included, is a hole transport layer, the second injection layer, where included, is a hole injection layer and the second electrode is an anode, such that the perovskite light emitting device is an inverted perovskite light emitting device.

A perovskite light emitting device is provided. In one embodiment, the perovskite light emitting device is fabricated by the aforementioned method comprising the steps of: providing a substrate; providing a first electrode disposed over the substrate; providing a bank structure disposed over the substrate, wherein the bank structure is patterned so as to define at least one sub-pixel on the substrate; providing a first transport layer ink, wherein the first transport layer ink comprises at least one solvent and at least one first charge transport material mixed in the at least one solvent; depositing the first transport layer ink into the at least one sub-pixel over the first electrode using a method of inkjet printing; vacuum drying the first transport layer ink inside a vacuum drying chamber to assemble a first transport layer over the first electrode in the at least one sub-pixel; annealing the first transport layer; providing a perovskite ink, wherein the perovskite ink comprises at least one solvent and at least one perovskite light emitting material mixed in the at least one solvent; depositing the perovskite ink into the at least one sub-pixel over the first transport layer using a method of inkjet printing; vacuum drying the perovskite ink inside a vacuum drying chamber to assemble a perovskite emissive layer over the first transport layer in the at least one sub-pixel; annealing the perovskite emissive layer; and depositing a second electrode over the perovskite emissive layer using a method of vapour deposition.

A perovskite light emitting device is provided. In one embodiment, the perovskite light emitting device is a standard perovskite light emitting device fabricated by the aforementioned method comprising the steps of: providing a substrate; providing an anode disposed over the substrate; providing a bank structure disposed over the substrate, wherein the bank structure is patterned so as to define at least one sub-pixel on the substrate; providing a hole transport layer ink, wherein the hole transport layer ink comprises at least one solvent and at least one hole transport material mixed in the at least one solvent; depositing the hole transport layer ink into the at least one sub-pixel over the anode using a method of inkjet printing; vacuum drying the hole transport layer ink inside a vacuum drying chamber to assemble a hole transport layer over the anode in the at least one sub-pixel; annealing the hole transport layer; providing a perovskite ink, wherein the perovskite ink comprises at least one solvent and at least one perovskite light emitting material mixed in the at least one solvent; depositing the perovskite ink into the at least one sub-pixel over the hole transport layer using a method of inkjet printing; vacuum drying the perovskite ink inside a vacuum drying chamber to assemble a perovskite emissive layer over the hole transport layer in the at least one sub-pixel; annealing the perovskite emissive layer; and depositing a cathode over the perovskite emissive layer using a method of vapour deposition.

A perovskite light emitting device is provided. In one embodiment, the perovskite light emitting device is an inverted perovskite light emitting device fabricated by the aforementioned method comprising the steps of: providing a substrate; providing a cathode disposed over the substrate; providing a bank structure disposed over the substrate, wherein the bank structure is patterned so as to define at least one sub-pixel on the substrate; providing an electron transport layer ink, wherein the electron transport layer ink comprises at least one solvent and at least one electron transport material mixed in the at least one solvent; depositing the electron transport layer ink into the at least one sub-pixel over the cathode using a method of inkjet printing; vacuum drying the electron transport layer ink inside a vacuum drying chamber to assemble an electron transport layer over the cathode in the at least one sub-pixel; annealing the electron transport layer; providing a perovskite ink, wherein the perovskite ink comprises at least one solvent and at least one perovskite light emitting material mixed in the at least one solvent; depositing the perovskite ink into the at least one sub-pixel over the electron transport layer using a method of inkjet printing; vacuum drying the perovskite ink inside a vacuum drying chamber to assemble a perovskite emissive layer over the electron transport layer in the at least one sub-pixel; annealing the perovskite emissive layer; and depositing an anode over the perovskite emissive layer using a method of vapour deposition.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing. Embodiments of the present disclosure will now be described, by way of example only, with reference to the following.

DESCRIPTION OF EMBODIMENTS

General device architectures and operating principles for PeLEDs are substantially similar to those for OLEDs. Both of these light emitting devices comprises at least one emissive layer disposed between and electrically connected to an anode and a cathode. For a PeLED, the emissive layer comprises perovskite light emitting material. For an OLED, the emissive layer comprises organic light emitting material. For both of these light emitting devices, when a current is applied, the anode injects holes and the cathode injects electrons into the emissive layer(s). The injected holes and electrons each migrate towards the oppositely charged electrode. When an electron and a hole localize, an exciton, which is a localized electron-hole pair having an excited energy state, may be formed. Light is emitted if the exciton relaxes via a photo-emissive mechanism. Non-radiative mechanisms, such as thermal radiation and/or Auger recombination may also occur, but are generally considered undesirable.

Figure 4:
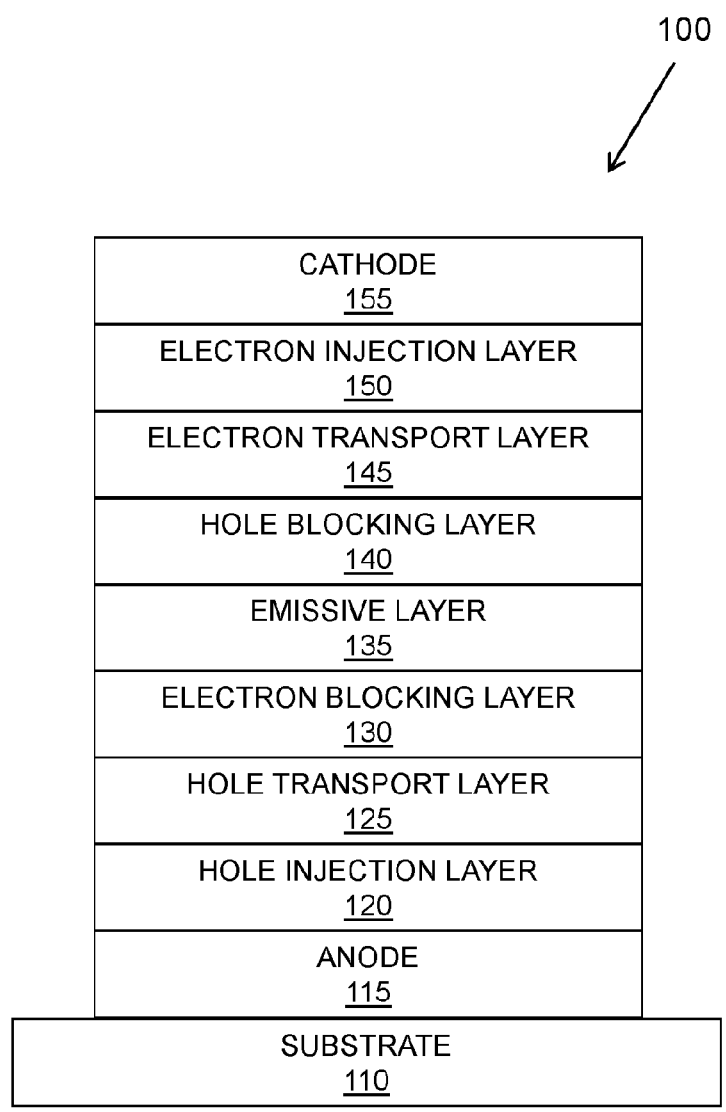
FIG. 4 depicts a standard perovskite light emitting device.

FIG. 4 shows a light emitting device 100 comprising a single emissive layer. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150 and a cathode 155. The emissive layer 135 may comprise perovskite light emitting material. Device 100 may be fabricated by depositing the layers described in order. As the device 100 has anode 115 disposed under cathode 155, device 100 may be referred to as a "standard" device architecture. If the device were orientated differently, with the cathode 155 disposed under the anode 115, then the device would instead be referred to as an "inverted device architecture.

Figure 5:
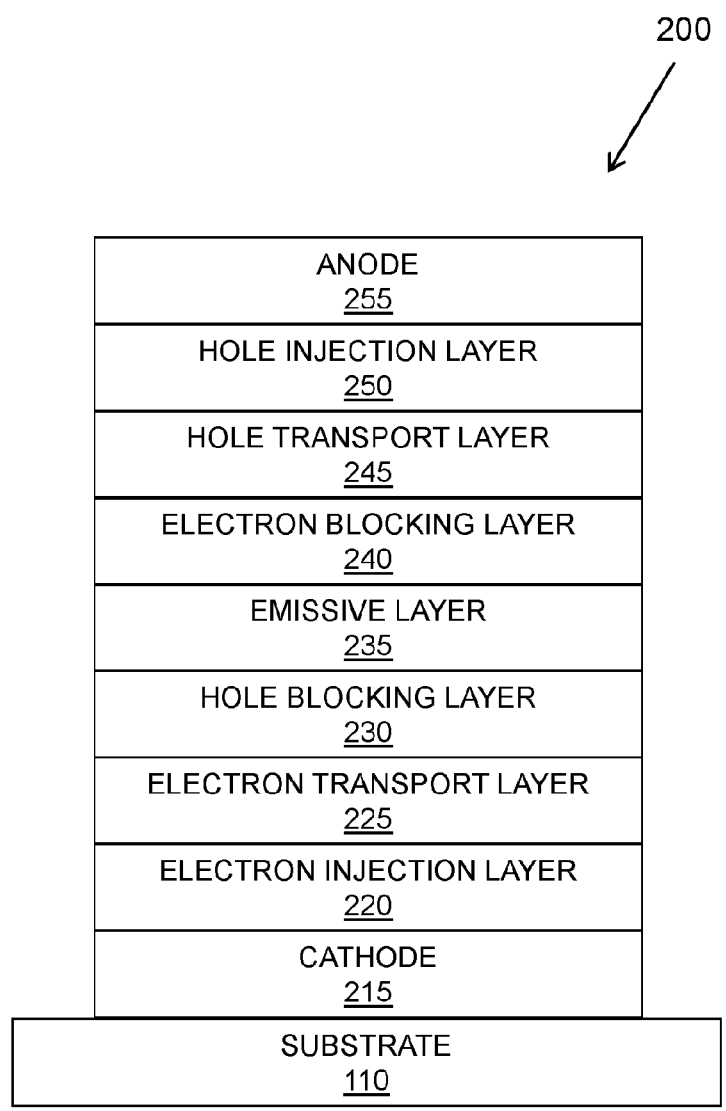
FIG. 5 depicts an inverted perovskite light emitting device.

FIG. 5 shows an inverted light emitting device 200 comprising a single emissive layer. Device 200 may include a substrate 110, a cathode 215, an electron injection layer 220, an electron transport layer 225, a hole blocking layer 230, an emissive layer 235, an electron blocking layer 240, a hole transport layer 245, a hole injection layer 250 and an anode 255. The emissive layer 235 may comprise perovskite light emitting material. Device 200 may be fabricated by depositing the layers described in order.

Figure 17:
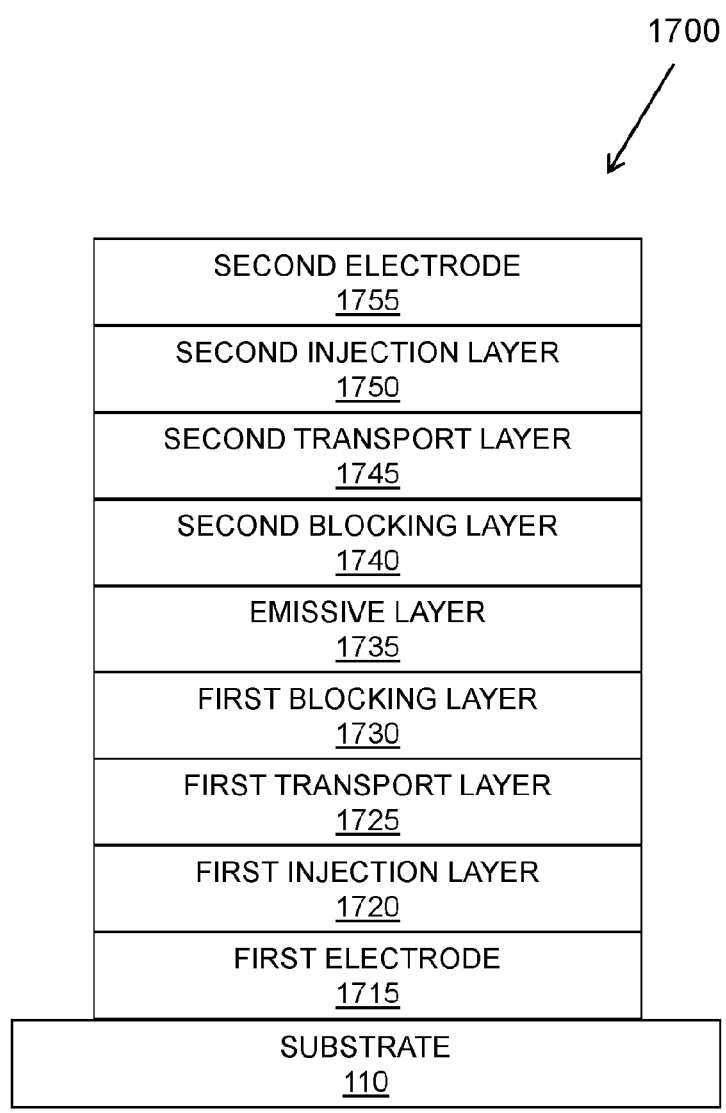
FIG. 17 depicts a perovskite light emitting device with a generic structure that may be a standard perovskite light emitting device or an inverted perovskite light emitting device.

The present invention relates to perovskite light emitting devices and to methods of fabricating perovskite light emitting devices. The perovskite light emitting devices may be standard perovskite light emitting devices as depicted in FIG. 4 or inverted perovskite light emitting devices as depicted in FIG. 5. FIG. 17 shows a perovskite light emitting device 1700 that may be a standard perovskite light emitting device or an inverted perovskite light emitting device. Device 1700 may include a substrate 110, a first electrode 1715, a first injection layer 1720, a first transport layer 1725, a first blocking layer 1730, an emissive layer 1735, a second blocking layer 1740, a second transport layer 1745, a second injection layer 1750 and a second electrode 1755. The emissive layer 1735 may comprise perovskite light emitting material. Device 1700 may be fabricated by depositing the layers described in order.

The simple layered structures illustrated in FIGS. 4 and 5 and 17 are provided by way of non-limiting examples, and it is understood that embodiments of the invention may be used in connection with a wide variety of other structures. The specific materials and structures described are exemplary in nature, and other materials and structures may be used. Functional PeLEDs may be achieved by combining the various layers described in different ways, or layers may be omitted entirely, based on factors such as performance, design and cost. Other layers, not specifically described, may also be included. Materials other than those specifically described may be used. Although many of the examples provided herein describe various layers as comprising a single material, it is understood that combinations of materials may be used. Also, the layers may have various sublayers. The names given to the various layers herein are not intended to be strictly limiting. For example, in a device, the hole transport layer may transport and inject holes into the emissive layer and may be described as a hole transport layer or a hole injection layer. For example, in a device, the hole blocking layer may block holes and transport electrons and may be described as a hole blocking layer or an electron transport layer.

FIG. 4 discloses a standard PeLED device architecture, while FIG. 5 discloses an inverted PeLED device architecture. The present invention relates to standard PeLED device architectures. Standard PeLED device architectures may be advantageous because the standard device architecture is the predominant device architecture used in the existing OLED industry. This allows significant synergy in material design, device engineering and manufacturing techniques with the existing OLED display industry. The present invention further relates to inverted PeLED device architectures. Inverted PeLED device architectures may be advantageous because the inverted device architecture is the predominant device architecture used in the existing perovskite solar industry. This allows significant synergy in material design, device engineering and manufacturing techniques with the existing perovskite solar industry.

PeLEDs are generally intended to emit light through at least one of the electrodes, and one or more transparent electrodes may be useful in such optoelectronic devices. For example, a transparent electrode material, such as indium tin oxide (ITO), may be used for the bottom electrode, while a transparent electrode material, such as a thin metallic layer of a blend of magnesium and silver (Mg:Ag), may be used for the top electrode. For a device intended to emit light only through the bottom electrode, the top electrode does not need to be transparent, and may be comprised of an opaque and/or reflective layer, such as a metal layer having a high reflectivity. Similarly, for a device intended only to emit light through the top electrode, the bottom electrode may be opaque and/or reflective, such as a metal layer having a high reflectivity. Where an electrode does not need to be transparent, using a thicker layer may provide better conductivity and may reduce voltage drop and/or Joule heating in the device, and using a reflective electrode may increase the amount of light emitted through the other electrode by reflecting light back towards the transparent electrode. A fully transparent device may also be fabricated, where both electrodes are transparent.

Devices fabricated in accordance with embodiments of the present invention may optionally comprise a substrate 110. The substrate 110 may comprise any suitable material that provides the desired structural and optical properties. The substrate 110 may be rigid or flexible. The substrate 110 may be flat or curved. The substrate 110 may be transparent, translucent or opaque. Preferred substrate materials are glass, plastic and metal foil. Other substrates, such as fabric and paper may be used. The material and thickness of the substrate 110 may be chosen to obtain desired structural and optical properties.

With reference to FIG. 4 and FIG. 5 as non-limiting examples, devices fabricated in accordance with embodiments of the present invention may optionally comprise an anode 115 or 255. The anode 115 or 255 may comprise any suitable material or combination of materials known to the art, such that the anode 115 or 255 is capable of conducting holes and injecting them into the layers of the device. Preferred anode 115 or 255 materials include conductive metal oxides, such as indium tin oxide (ITO), indium zinc oxide (IZO) and aluminum zinc oxide (AlZnO), metals such as silver (Ag), aluminum (Al), aluminum-neodymium (Al:Nd), gold (Au) and alloys thereof, or a combination thereof. Other preferred anode 115 or 255 materials include graphene, carbon nanotubes, nanowires or nanoparticles, silver nanowires or nanoparticles, organic materials, such as poly (3,4-ethylenedioxythiophene): polystyrene sulfonate (PEDOT:PSS) and derivatives thereof, or a combination thereof. Compound anodes comprising one or more anode materials in a single layer may be preferred for some devices. Multilayer anodes comprising one or more anode materials in one or more layers may be preferred for some devices. One example of a multilayer anode is ITO/Ag/ITO. In a standard device architecture for PeLEDs, the anode 115 may be sufficiently transparent to create a bottom-emitting device, where light is emitted through the substrate. One example of a transparent anode commonly used in a standard device architecture is a layer of ITO. Another example of a transparent anode commonly used in a standard device architecture is ITO/Ag/ITO, where the Ag thickness is less than approximately 25 nm. By including a layer of silver of thickness less than approximately 25 nm, the anode may be transparent as well as partially reflective. When such a transparent and partially reflective anode is used in combination with a reflective cathode, such as LiF/Al, this may have the advantage of creating a microcavity within the device. A microcavity may provide one or more of the following advantages: an increased total amount of light emitted from device, and therefore higher efficiency and brightness; an increased proportion of light emitted in the forward direction, and therefore increased apparent brightness at normal incidence; and spectral narrowing of the emission spectrum, resulting in light emission with increased colour saturation. The anode 115 or 255 may be opaque and/or reflective. In a standard device architecture for PeLEDs, a reflective anode 115 may be preferred for some top-emitting devices to increase the amount of light emitted from the top of the device. One example of a reflective anode commonly used in a standard device architecture is a multilayer anode of ITO/Ag/ITO, where the Ag thickness is greater than approximately 80 nm. When such a reflective anode is used in combination with a transparent and partially reflective cathode, such as Mg:Ag, this may have the advantage of creating a microcavity within the device. The material and thickness of the anode 115 or 255 may be chosen to obtain desired conductive and optical properties. Where the anode 115 or 255 is transparent, there may be a range of thicknesses for a particular material that is thick enough to provide the desired conductivity, yet thin enough to provide the desired degree of transparency. Other materials and structures may be used.

With reference to FIG. 4 and FIG. 5 as non-limiting examples, devices fabricated in accordance with embodiments of the present invention may optionally comprise a hole transport layer 125 or 245. The hole transport layer 125 or 245 may include any material capable of transporting holes. The hole transport layer 125 or 245 may be deposited by a solution process or by a vacuum deposition process. The hole transport layer 125 or 245 may be doped or undoped. Doping may be used to enhance conductivity. The hole transport layer 125 or 245 may be cross-liked on not cross-linked. Cross-linking may be used to reduce the solubility of the hole transport layer 125 or 245 so that solution-processed layers may be deposited on top of the hole transport layer 125 or 245 without damaging the underlying hole transport layer 125 or 245.

Examples of undoped hole transport layers are N,N'-Di (1-naphthyl)-N,N'-diphenyl-(1,1'-biphenyl)-4,4'-diamine (NPD), poly[(9,9-dioctylfluorenyl-2,7-diyl)-co-(4,4'-(N-(4-sec-butylphenyl) diphenylamine (TFB), poly[N,N'-bis(4-butylphenyl)-N,N'-bis(phenyl)-benzidine] (poly-TPD), poly (9-vinylcarbazole) (PVK), 4,4'-Bis(N-carbazolyl)-1,1'-biphenyl (CBP), Spiro-OMeTAD and molybdenum oxide ($MoO_3$). One example of a doped hole transport layer is 4,4',4''-Tris[phenyl(m-tolyl)amino]triphenylamine (m-MTDATA) doped with $F_4$-TCNQ at a molar ratio of 50:1. One example of a solution-processed hole transport layer is PEDOT:PSS. One example of a cross-linked hole transport layer is 9,9-Bis[4-[(4-ethenylphenyl)methoxy]phenyl]-N2, N7-di-1-naphthalenyl-N2,N7-diphenyl-9H-Fluorene-2,7-diamine (VB-FNPD). Other hole transport layers and structures may be used. The preceding examples of hole transport materials are especially well-suited to application in PeLEDs.

Devices fabricated in accordance with embodiments of the present invention may optionally comprise one or more emissive layers 135 or 235. The emissive layer 135 or 235 may include any perovskite material capable of emitting light when a current is passed between anode 115 or 255 and cathode 155 or 215. The emissive layer of a PeLED may comprise perovskite light emitting material.

Examples of perovskite light-emitting materials include 3D perovskite materials, such as methylammonium lead iodide ($CH_3NH_3PbI_3$), methylammonium lead bromide ($CH_3NH_3PbBr_3$), methylammonium lead chloride ($CH_3NH_3PbCl_3$), formamidinium lead iodide ($CH(NH_2)_2PbI_3$), formamidinium lead bromide ($CH(NH_2)_2PbBr_3$), formamidinium lead chloride ($CH(NH_2)_2PbCl_3$), caesium lead iodide ($CsPbI_3$), caesium lead bromide ($CsPbBr_3$) and caesium lead chloride ($CsPbCl_3$). Examples of perovskite light-emitting materials further include 3D perovskite materials with mixed halides, such as $CH_3NH_3PbI_{3-x}Cl_x$, $CH_3NH_3PbI_{3-x}Br_x$, $CH_3NH_3PbCl_{3-x}Br_x$, $CH(NH_2)_2PbI_{3-x}Br_x$, $CH(NH_2)_2PbI_{3-x}Cl_x$, $CH(NH_2)_2PbCl_{3-x}Br_x$, $CsPbI_{3-x}Cl_x$, $CsPbI_{3-x}Br_x$ and $CsPbCl_{3-x}Br_x$, where x is in the range of 0-3. Examples of perovskite light-emitting materials further include 2D perovskite materials such as $(C_{10}H_7CH_2NH_3)_2PbI_4$, $(C_{10}H_7CH_2NH_3)_2PbBr_4$, $(C_{10}H_7CH_2NH_3)_2PbCl_4$, $(C_6H_5C_2H_4NH_3)_2PbI_4$, $(C_6H_5C_2H_4NH_3)_2PbBr_4$ and $(C_6H_5C_2H_4NH_3)_2PbCl_4$, 2D perovskite materials with mixed halides, such as $(C_{10}H_7CH_2NH_3)_2PbI_{3-x}Cl_x$, $(C_{10}H_7CH_2NH_3)_2PbI_{3-x}Br_x$, $(C_{10}H_7CH_2NH_3)_2PbCl_{3-x}Br_x$, $(C_6H_5C_2H_4NH_3)_2PbI_{3-x}Cl_x$, $(C_6H_5C_2H_4NH_3)_2PbI_{3-x}Br_x$ and $(C_6H_5C_2H_4NH_3)_2PbCl_{3-x}Br_x$, where x is in the range of 0-3. Examples of perovskite light-emitting materials further include Quasi-2D perovskite materials, such as $(C_6H_5C_2H_4NH_3)_2(CH(NH_2)_2PbBr_3)_{n-1}PbI_4$, $(C_6H_5C_2H_4NH_3)_2(CH(NH_2)_2PbBr_3)_{n-1}PbBr_4$, $(C_6H_5C_2H_4NH_3)_2(CH(NH_2)_2PbBr_3)_{n-1}PbCl_4$, $(C_{10}H_7CH_2NH_3)_2(CH_3NH_3PbI_2Br)_{n-1}PbI_4$, $(C_{10}H_7CH_2NH_3)_2(CH_3NH_3PbI_2Br)_{n-1}PbBr_4$ and $(C_{10}H_7CH_2NH_3)_2(CH_3NH_3PbI_2Br)_{n-1}PbCl_4$, where n is the number of layers, and, optionally, n may be in the range of about 2-10. Examples of perovskite light-emitting materials further include Quasi-2D perovskite materials with mixed halides, such as $(C_6H_5C_2H_4NH_3)_2(CH(NH_2)_2PbBr_3)_{n-1}PbI_{3-x}Cl_x$, $(C_6H_5C_2H_4NH_3)_2(CH(NH_2)_2PbBr_3)_{n-1}PbI_{3-x}Br_x$, $(C_6H_5C_2H_4NH_3)_2(CH(NH_2)_2PbBr_3)_{n-1}PbCl_{3-x}Br_x$, $(C_{10}H_7CH_2NH_3)_2(CH_3NH_3PbI_2Br)_{n-1}PbI_{3-x}Cl_x$, $(C_{10}H_7CH_2NH_3)_2(CH_3NH_3PbI_2Br)_{n-1}PbI_{3-x}Br_x$ and $(C_{10}H_7CH_2NH_3)_2(CH_3NH_3PbI_2Br)_{n-1}PbCl_{3-x}Br_x$, where n is the number of layers, and, optionally, n may be in the range of about 2-10, and x is in the range of 0-3. Examples of perovskite light-emitting materials further include any of the aforementioned examples, where the divalent metal cation lead ($Pb^+$) may be replaced with tin ($Sn^+$), copper ($Cu^+$) or europium ($Eu^+$). Examples of perovskite light-emitting materials further include perovskite light-emitting nanocrystals with structures that closely resemble Quasi-2D perovskite materials.

Figure 1:
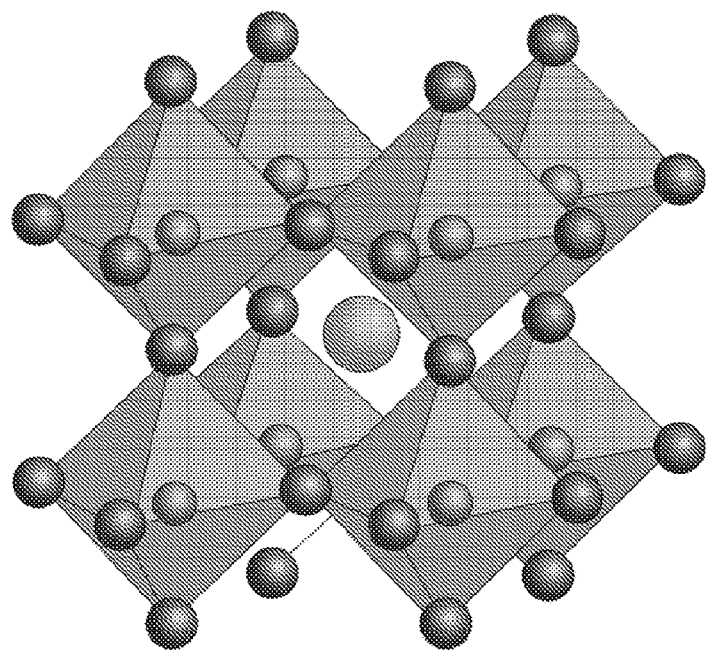
FIG. 1 depicts 3D perovskite light emitting material with structure $ABX_3$.
Figure 1:
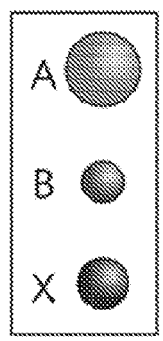
Figure 2:
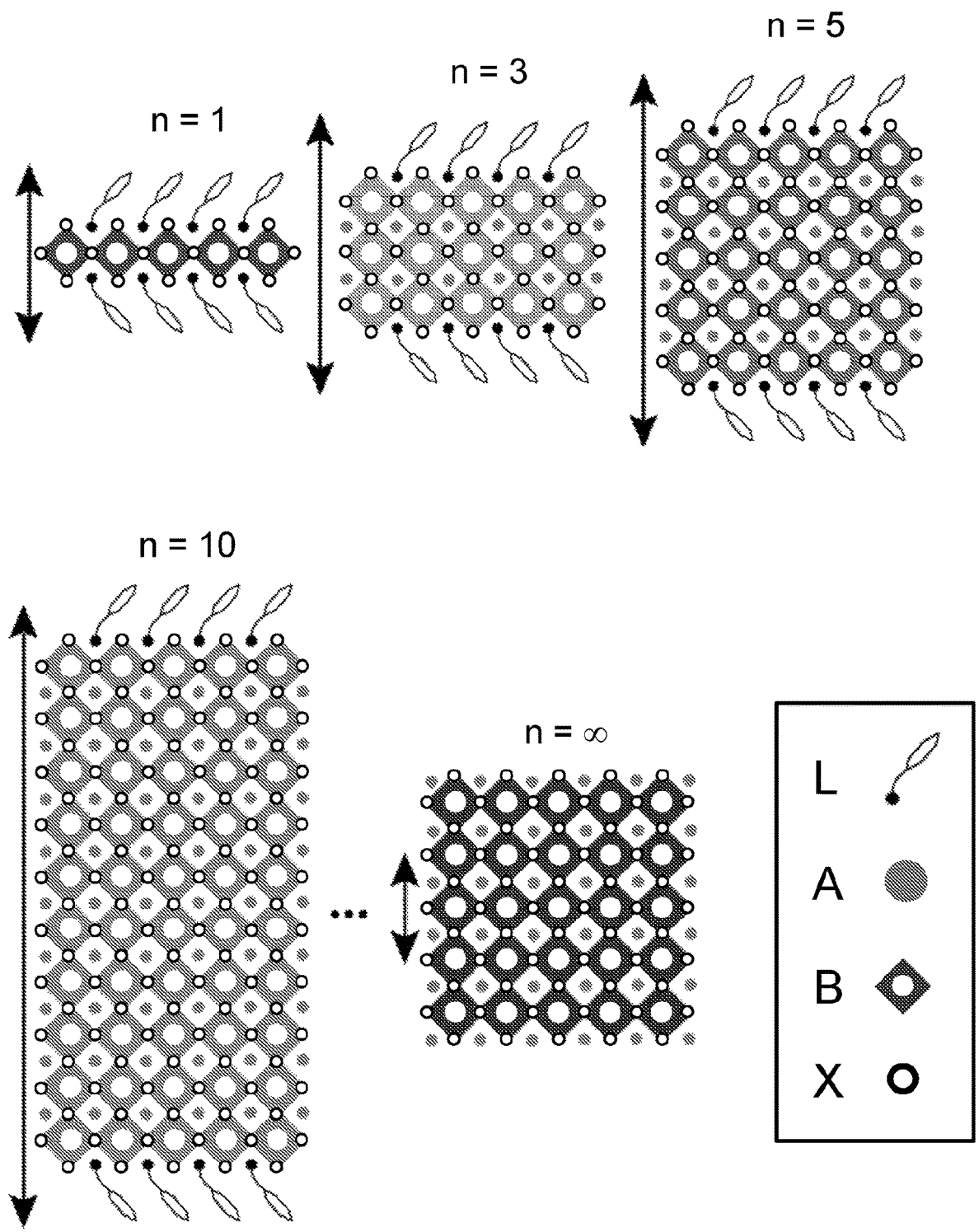
FIG. 2 depicts layered perovskite light emitting material with structure $L_2(ABX_3)_{n-1}BX_4$, where n=1, 3, 5, 10 and ∞.
Figure 3:
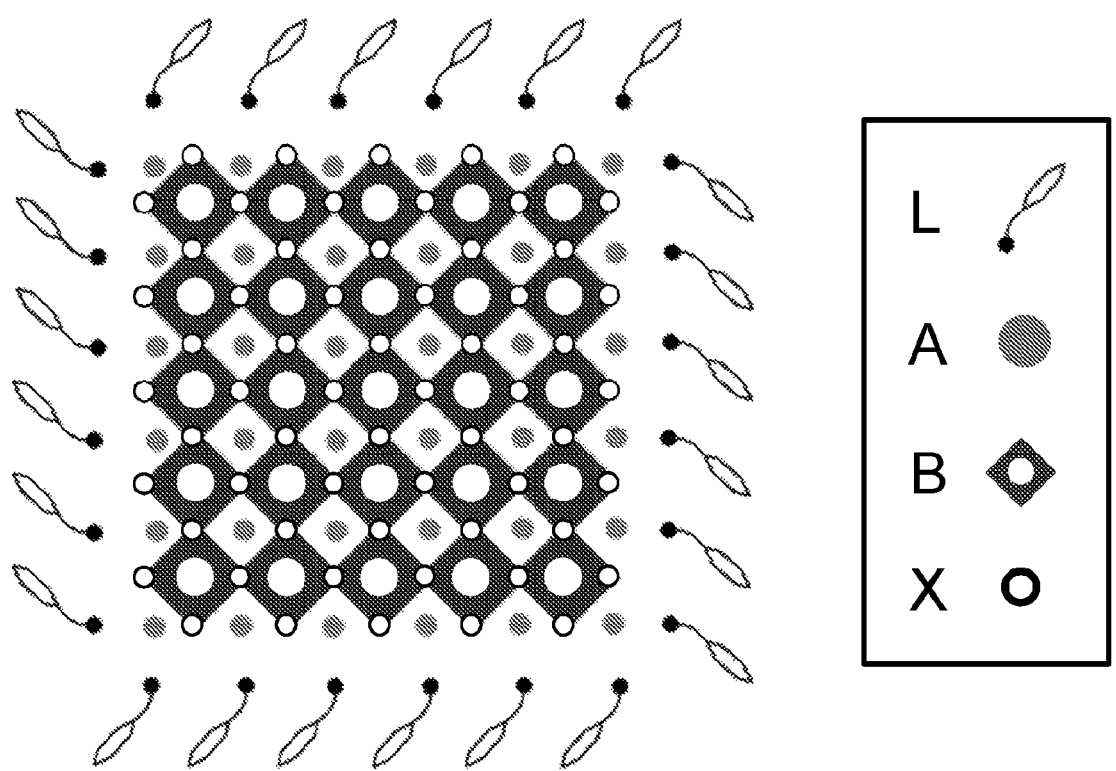
FIG. 3 depicts an example of a nanocrystal of perovskite material with a layered structure that resembles $L_2(ABX_3)_{n-1}BX_4$, where n=5.

Perovskite light emitting material may comprise organic metal halide perovskite material, such as methylammonium lead iodide ($CH_3NH_3PbI_3$), methylammonium lead bromide ($CH_3NH_3PbBr_3$), methylammonium lead chloride ($CH_3NH_3PbCl_3$), where the materials comprises an organic cation. Perovskite light emitting material may comprise inorganic metal halide perovskite material, such as caesium lead iodide ($CsPbI_3$), caesium lead bromide ($CsPbBr_3$) and caesium lead chloride ($CsPbCl_3$), where the material comprises an inorganic cation. Furthermore, perovskite light emitting material may comprise perovskite light emitting material where there is a combination of organic and inorganic cations. The choice of an organic or inorganic cation may be determined by several factors, including desired emission colour, efficiency of electroluminescence, stability of electroluminescence and ease of processing. Inorganic metal halide perovskite material may be particularly well-suited to perovskite light-emitting materials with a nanocrystal structure, such as those depicted in FIG. 3, wherein an inorganic cation may enable a compact and stable perovskite light-emitting nanocrystal structure.

Perovskite light emitting material may be included in the emissive layer 135 or 235 in a number of ways. For example, the emissive layer may comprise 2D perovskite light-emitting material, Quasi-2D perovskite light-emitting material or 3D perovskite light-emitting material, or a combination thereof. Optionally, the emissive layer may comprise perovskite light emitting nanocrystals. Optionally, the emissive layer 135 or 235 may comprise an ensemble of Quasi-2D perovskite light emitting materials, where the Quasi-2D perovskite light emitting materials in the ensemble may comprise a different number of layers. An ensemble of Quasi-2D perovskite light emitting materials may be preferred because there may be energy transfer from Quasi-2D perovskite light emitting materials with a smaller number of layers and a larger energy band gap to Quasi-2D perovskite light emitting materials with a larger number of layers and a lower energy band gap. This energy funnel may efficiently confine excitons in a PeLED device, and may improve device performance. Optionally, the emissive layer 135 or 235 may comprise perovskite light emitting nanocrystal materials. Perovskite light emitting nanocrystal materials may be preferred because nanocrystal boundaries may be used to confine excitons in a PeLED device, and surface cations may be used to passivate the nanocrystal boundaries. This exciton confinement and surface passivation may improve device performance. Other emissive layer materials and structures may be used.

Devices fabricated in accordance with embodiments of the present invention may optionally comprise an electron transport layer 145 or 225. The electron transport layer 145 or 225 may include any material capable of transporting electrons. The electron transport layer 145 or 225 may be deposited by a solution process or by a vacuum deposition process. The electron transport layer 145 or 225 may be doped or undoped. Doping may be used to enhance conductivity.

Examples of undoped electron transport layers are tris(8-hydroxyquinolinato)aluminum ($Alq_3$), 2,2',2"-(1,3,5-Benzi-netriyl)-tris(1-phenyl-1-H-benzimidazole) (TPBi), 2,9-Dimethyl-4,7-diphenyl-1,10-phenanthroline (BCP), zinc oxide (ZnO) and titanium dioxide ($TiO_3$). One example of a doped electron transport layer is 4,7-diphenyl-1,10-phenanthroline (BPhen) doped with lithium (Li) at a molar ratio of 1:1. One example of a solution-processed electron transport layer is [6,6]-Phenyl C61 butyric acid methyl ester (PCBM). Other electron transport layers and structures may be used. The preceding examples of electron transport materials are especially well-suited to application in PeLEDs.

Devices fabricated in accordance with embodiments of the present invention may optionally comprise a cathode 155 or 215. The cathode 155 or 215 may comprise any suitable material or combination of materials known to the art, such that the cathode 155 or 215 is capable of conducting electronics and injecting them into the layers of the device. Preferred cathode 155 or 215 materials include metal oxides, such as indium tin oxide (ITO), indium zinc oxide (IZO) and fluorine tin oxide (FTO), metals, such as calcium (Ca), barium (Ba), magnesium (Mg) and ytterbium (Yb) or a combination thereof. Other preferred cathode 155 or 215 materials include metals such as silver (Ag), aluminum (Al), aluminum-neodymium (Al:Nd), gold (Au) and alloys thereof, or a combination thereof. Compound cathodes comprising one or more cathode materials in a single layer may be preferred from some devices. One example of a compound cathode is Mg:Ag. Multilayer cathodes comprising one or more cathode materials in one or more layers may be preferred for some devices. One example of a multilayer cathode is Ba/Al. In a standard device architecture for PeLEDs, the cathode 155 may be sufficiently transparent to create a top-emitting device, where light is emitted from the top of the device. One example of a transparent cathode commonly used in a standard device architecture is a compound layer of Mg:Ag. By using a compound of Mg:Ag, the cathode may be transparent as well as partially reflective. When such a transparent and partially reflective cathode is used in combination with a reflective anode, such as ITO/Ag/ITO, where the Ag thickness is greater than approximately 80 nm, this may have the advantage of creating a microcavity within the device. The cathode 155 or 215 may be opaque and/or reflective. In a standard device architecture for PeLEDs, a reflective cathode 155 may be preferred for some bottom-emitting devices to increase the amount of light emitted through the substrate from the bottom of the device. One example of a reflective cathode commonly used in a standard device architecture is a multilayer cathode of LiF/Al. When such a reflective cathode is used in combination with a transparent and partially reflective anode, such as ITO/Ag/ITO, where the Ag thickness is less than approximately 25 nm, this may have the advantage of creating a microcavity within the device.

The material and thickness of the cathode 155 or 215 may be chosen to obtain desired conductive and optical properties. Where the cathode 155 or 215 is transparent, there may be a range of thicknesses for a particular material that is thick enough to provide the desired conductivity, yet thin enough to provide the desired degree of transparency. Other materials and structures may be used.

Devices fabricated in accordance with embodiments of the present invention may optionally comprise one or more blocking layers. Blocking layers may be used to reduce the number of charge carriers (electrons or holes) and/or excitons exiting the emissive layer. An electron blocking layer 130 or 240 may be disposed between the emissive layer 135 or 235 and the hole transport layer 125 or 245 to block electrons from leaving the emissive layer 135 or 235 in the direction of the hole transport layer 125 or 245. Similarly, a hole blocking layer 140 or 230 may be disposed between the emissive layer 135 or 235 and the electron transport layer 145 or 225 to block holes from leaving the emissive layer 135 or 235 in the direction of the electron transport layer 145 or 225. Blocking layers may also be used to block excitons from diffusing from the emissive layer. As used herein, and as would be understood by one skilled in the art, the term "blocking layer" means that the layer provides a barrier that significantly inhibits transport of charge carriers and/or excitons, without suggesting that the layer completely blocks the charge carriers and/or excitons. The presence of such a blocking layer in a device may result in substantially higher efficiencies as compared to a similar device lacking a blocking layer. A blocking layer may also be used to confine emission to a desired region of a device.

Devices fabricated in accordance with embodiments of the present invention may optionally comprise one or more injection layers. Generally, injection layers are comprised of one or more materials that may improve the injection of charge carriers from one layer, such as an electrode, into an adjacent layer. Injection layers may also perform a charge transport function.

In devices 100 and 200, the hole injection layer 120 or 250 may be any layer that improves the injection of holes from the anode 115 or 255 into the hole transport layer 125 or 245. Examples of materials that may be used as a hole injection layer are Copper(II)phthalocyanine (CuPc) and 1,4,5,8,9,11-Hexaazatriphenylenehexacarbonitrile (HATCN), which may be vapor deposited, and polymers, such as PEDOT:PSS, which may be deposited from solution. Another example of a material that may be used as a hole injection layer is molybdenum oxide ($MoO_3$). The preceding examples of hole injection materials are especially well-suited to application in PeLEDs.

A hole injection layer (HIL) 120 or 250 may comprise a charge carrying component having HOMO energy level that favourably matches, as defined by their herein-described relative IP energies, with the adjacent anode layer on one side of the HIL, and the hole transporting layer on the opposite side of the HIL. The "charge carrying component" is the material responsible for the HOMO energy level that actually transports the holes. This material may be the base material of the HIL, or it may be a dopant. Using a doped HIL allows the dopant to be selected for its electrical properties, and the host to be selected for morphological properties, such as ease of deposition, wetting, flexibility, toughness, and others. Preferred properties of the HIL material are such that holes can be efficiently injected from the anode into the HIL material. The charge carrying component of the HIL 120 or 250 preferably has an IP not more than about 0.5 eV greater than the IP of the anode material. Similar conditions apply to any layer into which holes are being injected. HIL materials are further distinguished from conventional hole transporting materials that are typically used in the hole transporting layer of a PeLED in that such HIL materials may have a hole conductivity that is substantially less than the hole conductivity of conventional hole transporting materials.

In devices 100 and 200, the electron injection layer 150 or 220 may be any layer that improves the injection of electrons from the cathode 155 or 215 into the electron transport layer 145 or 225. Examples of materials that may be used as an electron injection layer are inorganic salts, such as lithium fluoride (LiF), sodium fluoride (NaF), barium fluoride (BaF), caesium fluoride (CsF), and caesium carbonate ($CsCO_3$). Other examples of materials that may be used as an electron injection layer are metal oxides, such as zinc oxide (ZnO) and titanium oxide ($TiO_2$), and metals, such as calcium (Ca), barium (Ba), magnesium (Mg) and ytterbium (Yb). Other materials or combinations of materials may be used for injection layers. Depending on the configuration of a particular device, injection layers may be disposed at locations different than those shown in devices 100 and 200. The preceding examples of electron injection materials are all especially well-suited to application in PeLEDs.

Unless otherwise specified, any one of the layers of the various embodiments may be deposited by any suitable method. Methods include vapor deposition processes, such as vacuum thermal evaporation, sputtering, electron beam physical vapour deposition, organic vapor phase deposition and organic vapourjet printing. Other suitable methods include solution-based processes, including spincoating and inkjet printing.

Devices fabricated in accordance with embodiments of the invention may be incorporated into a wide range of consumer products. Optionally, devices may be used in displays for televisions, computer monitors, tablets, laptop computers, smart phones, cell phones, digital cameras, video recorders, smartwatches, fitness trackers, personal digital assistants, vehicle displays and other electronic devices. Optionally, devices may be used for micro-displays or heads-up displays. Optionally, devices may be used in light panels for interior or exterior illumination and/or signaling, in smart packaging or in billboards.

Optionally, various control mechanisms may be used to control light emitting devices fabricated in accordance with the present invention, including passive matrix and active matrix address schemes.

The materials and structures described herein may have applications in devices other than light emitting devices. For example, other optoelectronic devices such as solar cells, photodetectors, transistors or lasers may employ the materials and structures.

Layers, materials, regions, units and devices may be described herein in reference to the colour of light they emit. As used herein, a "red" layer, material, region, unit or device, refers to one that emits light that has an emission spectrum with a peak wavelength in the range of about 580-780 nm; a "green" layer, material, region, unit or device, refers to one that emits light that has an emission spectrum with a peak wavelength in the range of about 500-580 nm; a "blue" layer, material, region, unit or device, refers to one that emits light that has an emission spectrum with a peak wavelength in the range of about 380-500 nm. Preferred ranges include a peak wavelength in the range of about 600-640 nm for red, about 510-550 nm for green, and about 440-465 nm for blue.

Display technology is rapidly evolving, with recent innovations enabling thinner and lighter displays with higher resolution, improved frame rate and enhanced contrast ratio. However, one area where significant improvement is still required is colour gamut. Digital displays are currently incapable of producing many of the colours the average person experiences in day-to-day life. To unify and guide the industry towards improved colour gamut, two industry standards have been defined, DCI-P3 and Rec. 2020, with DCI-P3 often seen as a stepping stone towards Rec. 2020.

DCI-P3 was defined by the Digital Cinema Initiatives (DCI) organization and published by the Society of Motion Picture and Television Engineers (SMPTE). Rec. 2020 (more formally known as ITU-R Recommendation BT. 2020) was developed by the International Telecommunication Union to set targets, including improved colour gamut, for various aspects of ultra-high-definition televisions.

Figure 6:
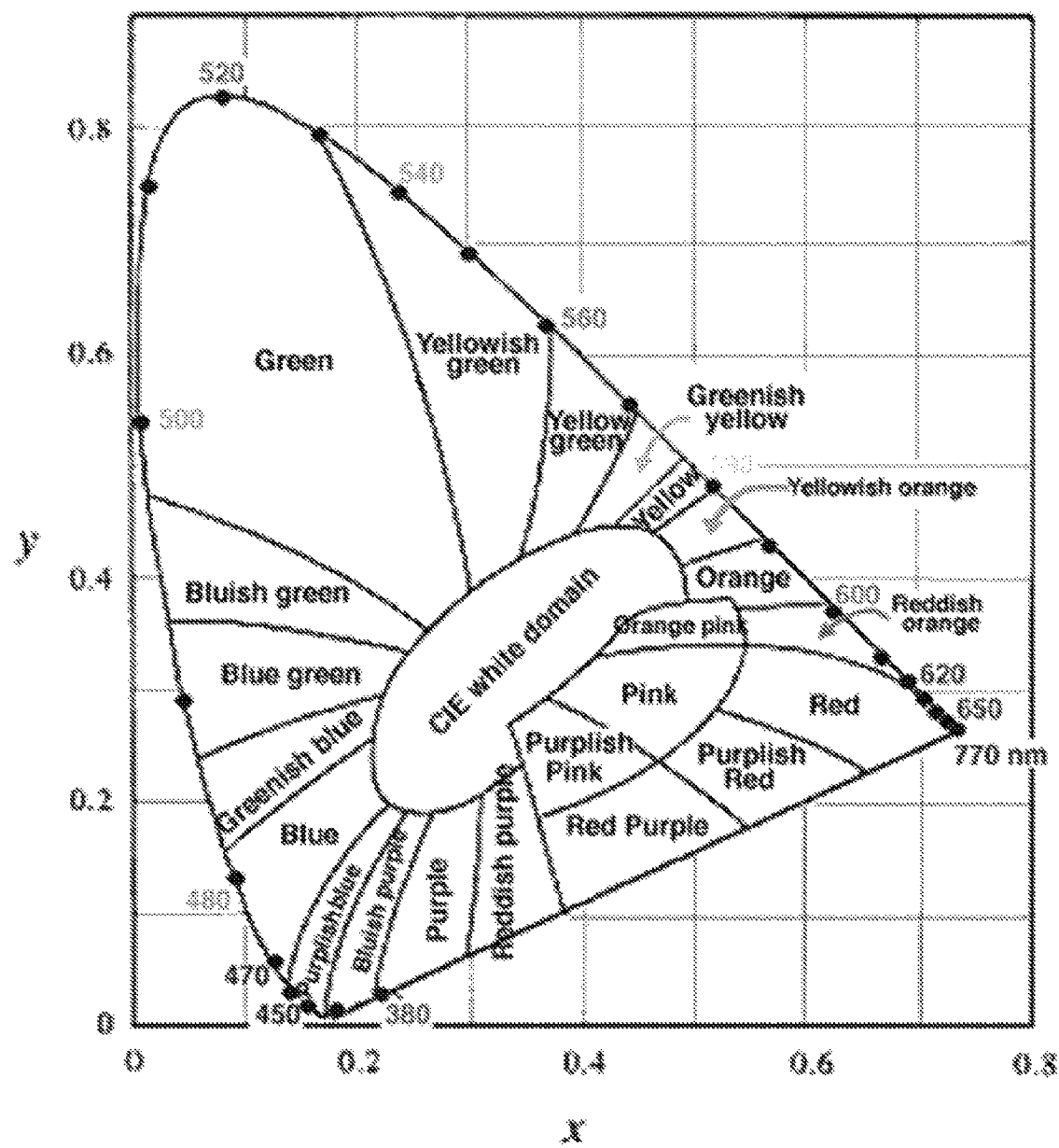
FIG. 6 depicts a rendition of the CIE 1931 (x, y) colour space chromaticity diagram.
Figure 7:
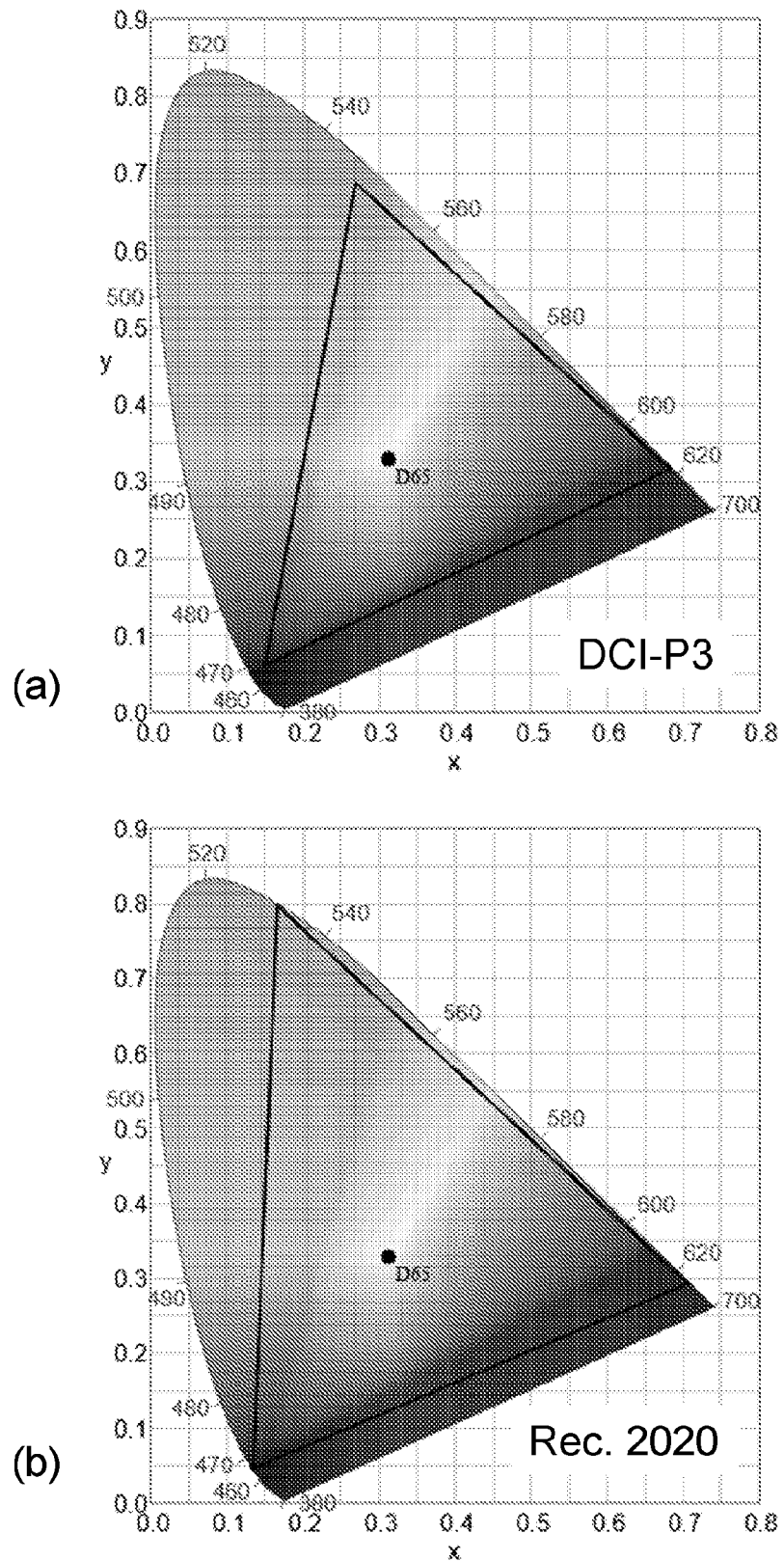
FIG. 7 depicts a rendition of the CIE 1931(x, y) colour space chromaticity diagram that also shows colour gamut for (a) DCI-P3 and (b) Rec. 2020 colour spaces.

The CIE 1931 (x, y) chromaticity diagram was created by the Commission Internationale de l'Éclairage (CIE) in 1931 to define all colour sensations that an average person can experience. Mathematical relationships describe the location of each colour within the chromaticity diagram. The CIE 1931 (x, y) chromaticity diagram may be used to quantify the colour gamut of displays. The white point (D65) is at the centre, while colours become increasingly saturated (deeper) towards the extremities of the diagram. FIG. 6 shows the CIE 1931 (x, y) chromaticity diagram with labels added to different locations on the diagram to enable a general understanding of distribution of colour within the colour space. FIG. 7 shows (a) DCI-P3 and (b) Rec. 2020 colour spaces superimposed on the CIE 1931 (x, y) chromaticity diagram. The tips of the triangles are primary colours for DCI-P3 and Rec. 2020, respectively, while colours enclosed within the triangles are all the colours that can be reproduced by combining these primary colours. For a display to meet DCI-P3 colour gamut specifications, the red, green and blue sub-pixels of the display must emit light at least as deep in colour as the DCI-P3 primary colours. For a display to meet Rec. 2020 colour gamut specifications, the red, green and blue sub-pixels of the display must emit light at least as deep in colour as the Rec. 2020 primary colours. Primary colours for Rec. 2020 are significantly deeper than for DCI-P3, and therefore achievement of the Rec. 2020 standard for colour gamut is seen as a greater technical challenge than achieving the DCI-P3 standard.

Commercial OLED displays can successfully render the DCI-P3 colour gamut. For example, smartphones with OLED displays such as the iPhone X (Apple), Galaxy S9 (Samsung) and OnePlus 5 (OnePlus) can all render the DCI-P3 gamut. Commercial liquid crystal displays (LCDs) can also successfully render the DCI-P3 colour gamut. For example, LCDs in the Surface Studio (Microsoft), Mac Book Pro and iMac Pro (both Apple) can all render the DCI-P3 gamut. However, until now, no display has been demonstrated that can render the Rec. 2020 colour gamut.

Here we disclose a novel method for fabricating a perovskite light emitting device. In various embodiments, the perovskite light emitting device fabricated by the disclosed method may render a primary colour of the DCI-P3 colour gamut. In various embodiments, the perovskite light emitting device fabricated by the disclosed method may render a primary colour of the Rec. 2020 colour gamut.

Figure 8:
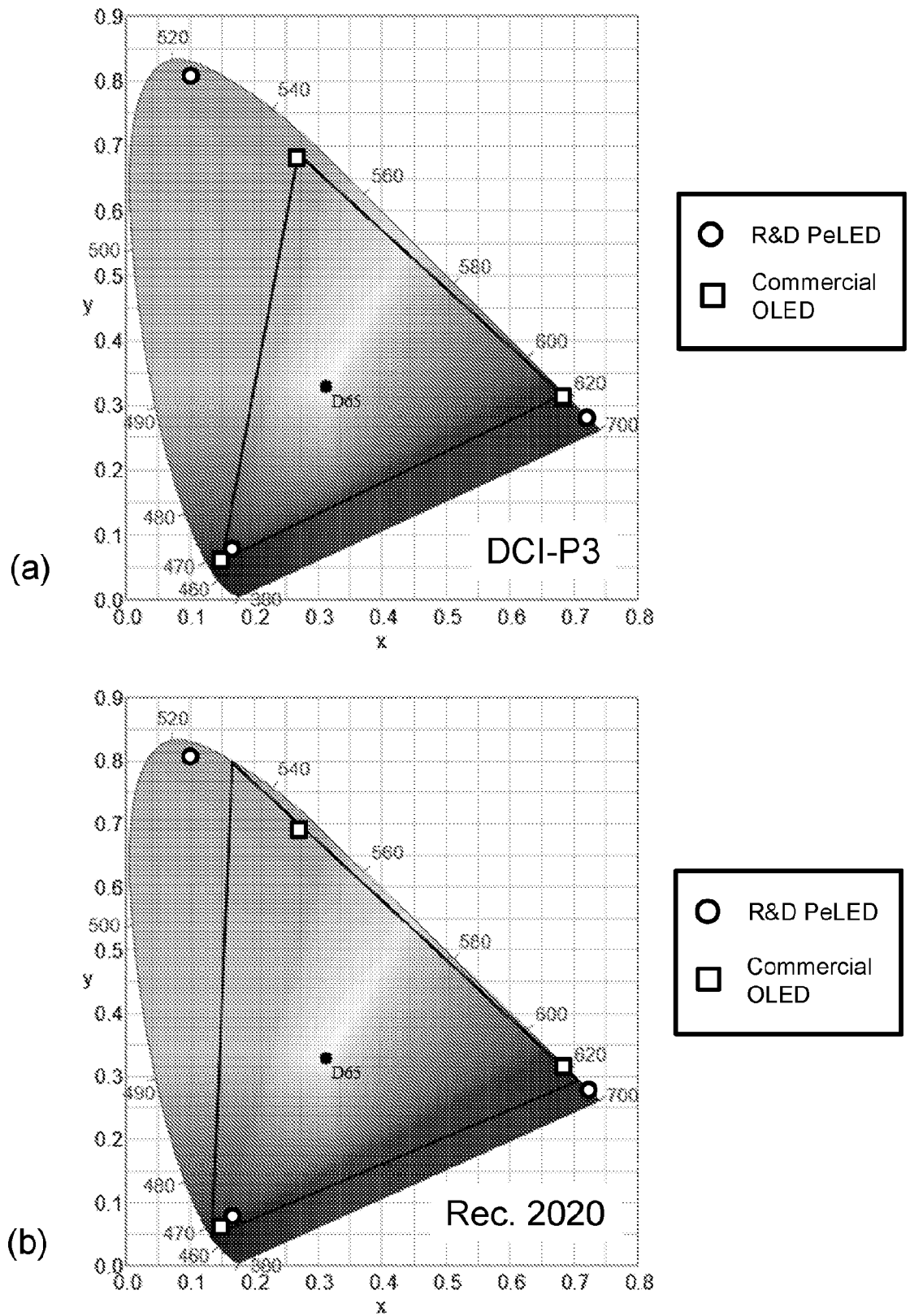
FIG. 8 depicts a rendition of the CIE 1931 (x, y) colour space chromaticity diagram that also shows colour gamut for (a) DCI-P3 and (b) Rec. 2020 colour spaces with colour coordinates for exemplary red, green and blue PeLED and OLED devices.

One or more advantages of perovskite light emitting devices may be demonstrated using the data shown in Table 1 and FIG. 8. Table 1 shows CIE 1931 (x, y) colour coordinates for single emissive layer red, green and blue R&D PeLED and Commercial OLED devices. Also included in Table 1 are CIE 1931 (x, y) colour coordinates for DCI-P3 and Rec. 2020 colour gamut standards. Generally, for red light, a higher CIE x value corresponds to deeper emission colour, for green light, a higher CIE y value corresponds to deeper emission colour, and for blue light, a lower CIE y value corresponds to deeper emission colour. This can be understood with reference FIG. 8, which includes markers for the red, green and blue R&D PeLED (circles) and Commercial OLED (squares) device data in Table 1, as well as markers for the primary colours of the DCI-P3 colour gamut in FIG. 8a and for the Rec. 2020 colour gamut in FIG. 8b.

TABLE 1

|  | Red | | Green | | Blue | |
| --- | --- | --- | --- | --- | --- | --- |
|  | CIE x | CIE y | CIE x | CIE y | CIE x | CIE y |
| DCI-P3 | 0.680 | 0.320 | 0.265 | 0.690 | 0.150 | 0.060 |
| Rec. 2020 | 0.708 | 0.292 | 0.170 | 0.797 | 0.131 | 0.046 |
| Commercial OLED | 0.680 | 0.320 | 0.265 | 0.690 | 0.150 | 0.060 |
| R&D PeLED | 0.720 | 0.280 | 0.100 | 0.810 | 0.166 | 0.079 |

CIE 1931 (x, y) colour coordinates for exemplary single emissive layer R&D PeLED and Commercial OLED devices. Also included are colour coordinates for DCI-P3 and Rec. 2020 colour gamut standards.

Figure 9:
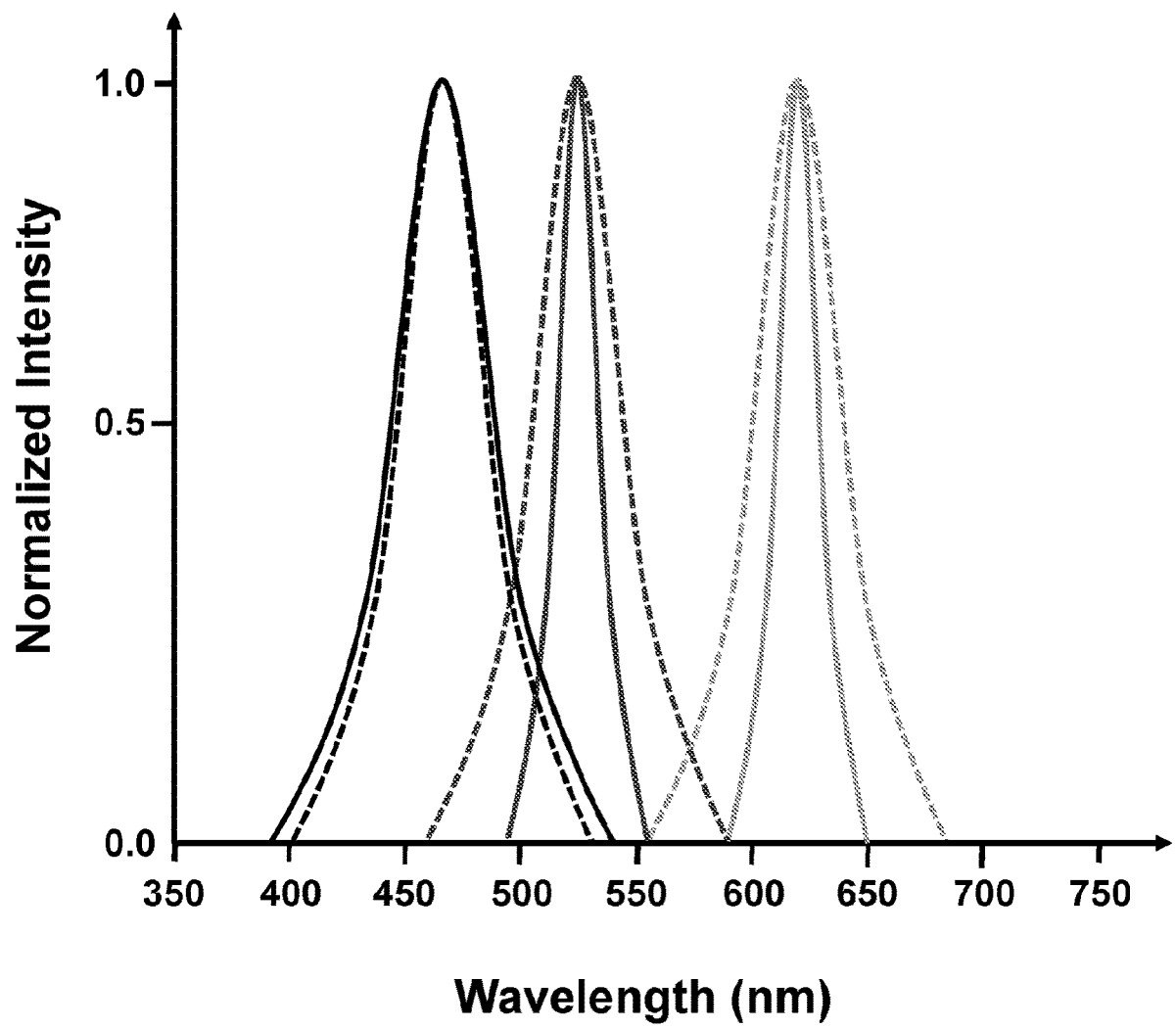
FIG. 9 depicts exemplary electroluminescence emission spectra for red, green and blue PeLED and OLED devices.

FIG. 9 depicts exemplary electroluminescence emission spectra for single emissive layer red, green and blue R&D PeLEDs and Commercial OLEDs. The red, green and blue spectra depicted using dashed lines correspond to spectra for Commercial OLED devices, such as those in the Apple iPhone X, which may be used to render the DCI-P3 colour gamut. The red, green and blue spectra depicted using solid lines correspond to spectra for R&D PeLED devices. The electroluminescence spectra for red, green and blue R&D PeLED devices depicted using solid lines in FIG. 9 demonstrate that red and green R&D PeLED devices may render deeper red and green colours than Commercial OLED devices, but that further development is needed for blue R&D PeLED devices to render deeper blue colours than Commercial OLED devices.

The CIE 1931 (x, y) colour coordinate data reported for single emissive layer red, green and blue R&D PeLED and Commercial OLED devices in Table 1 are exemplary. Commercial OLED data are taken from the Apple iPhone X, which fully supports the DCI-P3 colour gamut. This data set is available from Raymond Soneira at DisplayMate Technologies Corporation (Soneira et al.). Data for R&D PeLED devices are taken from a selection of peer-reviewed scientific journals: Red R&D PeLED data are taken from Wang et al. Green R&D PeLED data are taken from Hirose et al. Blue R&D PeLED data are taken from Kumar et al. Data from these sources are used by way of example, and should be considered non-limiting. Data from other peer-reviewed scientific journals, simulated data and/or experimental data collected from laboratory devices may also be used to demonstrate the aforementioned advantages of perovskite light emitting devices.

As can be seen from Table 1 and FIG. 8a, existing organic light emitting materials and devices can already be used to demonstrate a commercial display that can render the DCI-P3 colour gamut, as is exemplified by the Apple iPhone X. However, as can be seen from FIG. 8b, existing organic light emitting materials and devices alone cannot be used to demonstrate a display that can render the Rec. 2020 colour gamut. Table 1 and FIG. 8b show that one path to demonstrating a display that can render the Rec. 2020 colour gamut is to include one or more perovskite emissive layers in one or more perovskite light emitting devices in one or more sub-pixels of a display.

Optionally, by including one or more perovskite emissive layers in a perovskite light emitting device, the device may emit red light with CIE 1931 (x, y)=(0.720, 0.280), which as can be seen from FIG. 8b, is more saturated than the red primary color for the Rec. 2020 standard, which has CIE 1931 (x, y)=(0.708, 0.292).

Optionally, by including one or more perovskite emissive layers in a perovskite light emitting device, the device may emit green light with CIE 1931 (x, y)=(0.100, 0.810), which as can be seen from FIG. 8b, is more saturated than the green primary colour for the Rec. 2020 standard, which has CIE 1931 (x, y)=(0.170, 0.797).

As described herein, the colour saturation of blue light emission from exemplary perovskite emissive layers may be slightly less than that required to render the blue primary colour of the Rec. 2020 standard. For example, as shown in Table 1, a perovskite light emitting device comprising a perovskite emissive layer may emit blue light with CIE 1931 (x, y)=(0.166, 0.079), which as can be seen from FIG. 8b, is less saturated than the blue primary color for the Rec. 2020 standard, which has CIE 1931 (x, y)=(0.131, 0.046). However, under some circumstances, including a perovskite light emitting device comprising a perovskite emissive layer that emits blue light may provide the device with one or more advantages, such as improved efficiency, higher brightness, improved operational lifetime, lower voltage and/or reduced cost, and may therefore be preferred.

The foregoing description demonstrates the potential for perovskite light emitting materials and devices to enhance the performance of displays. However, until now, perovskite light emitting devices such as those in Adjokatse et al., Hirose et al., Kumar et al. and Wang et al. have been assembled using solution-process laboratory techniques, such as spin-coating, which are not compatible with manufacturing processes for displays. Here we disclose a method for fabricating a perovskite light emitting device that is readily compatible with manufacturing processes for displays.

Figure 18:
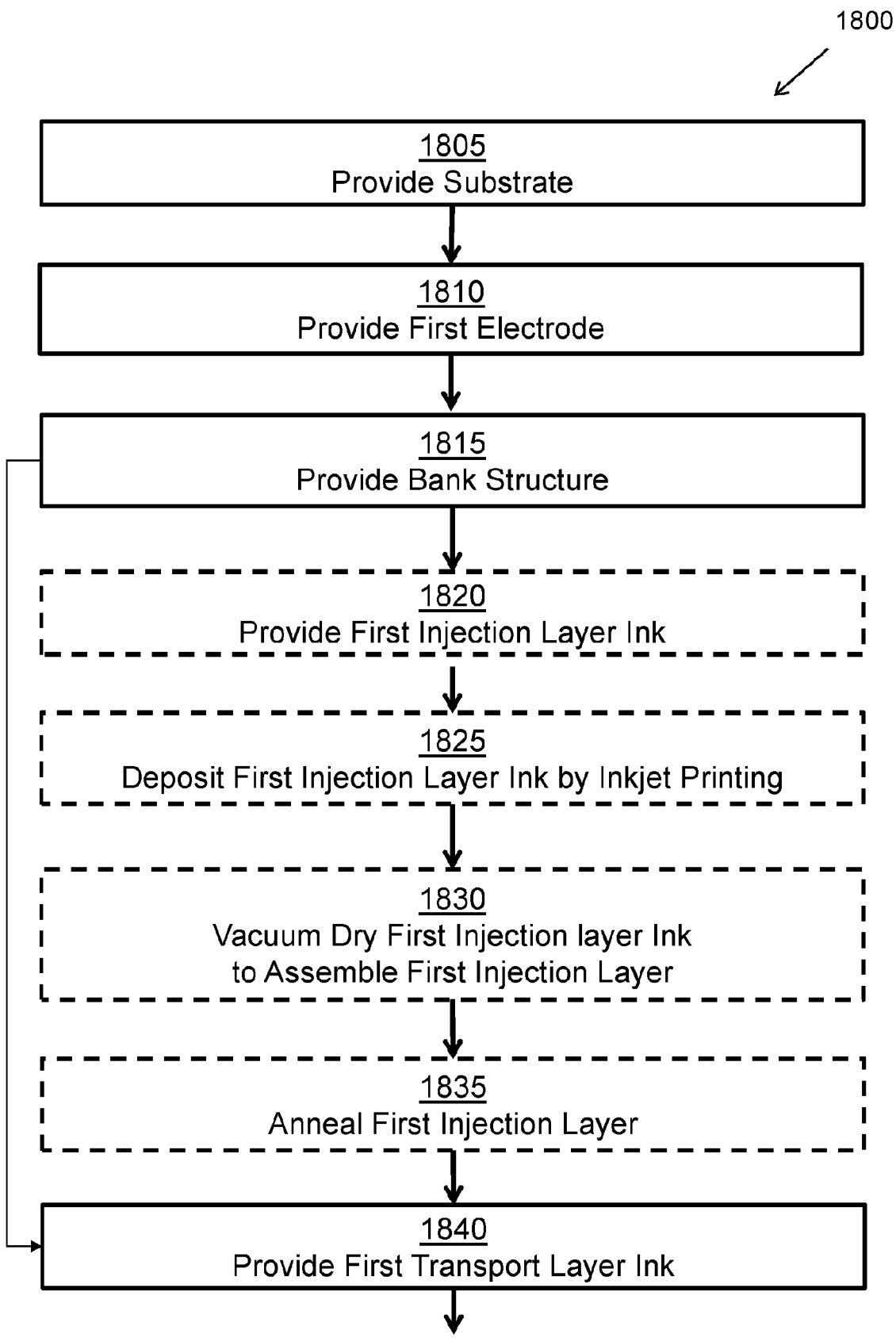
FIG. 18 depicts a process flow for a method for fabricating a generic perovskite light emitting device.
Figure 18:
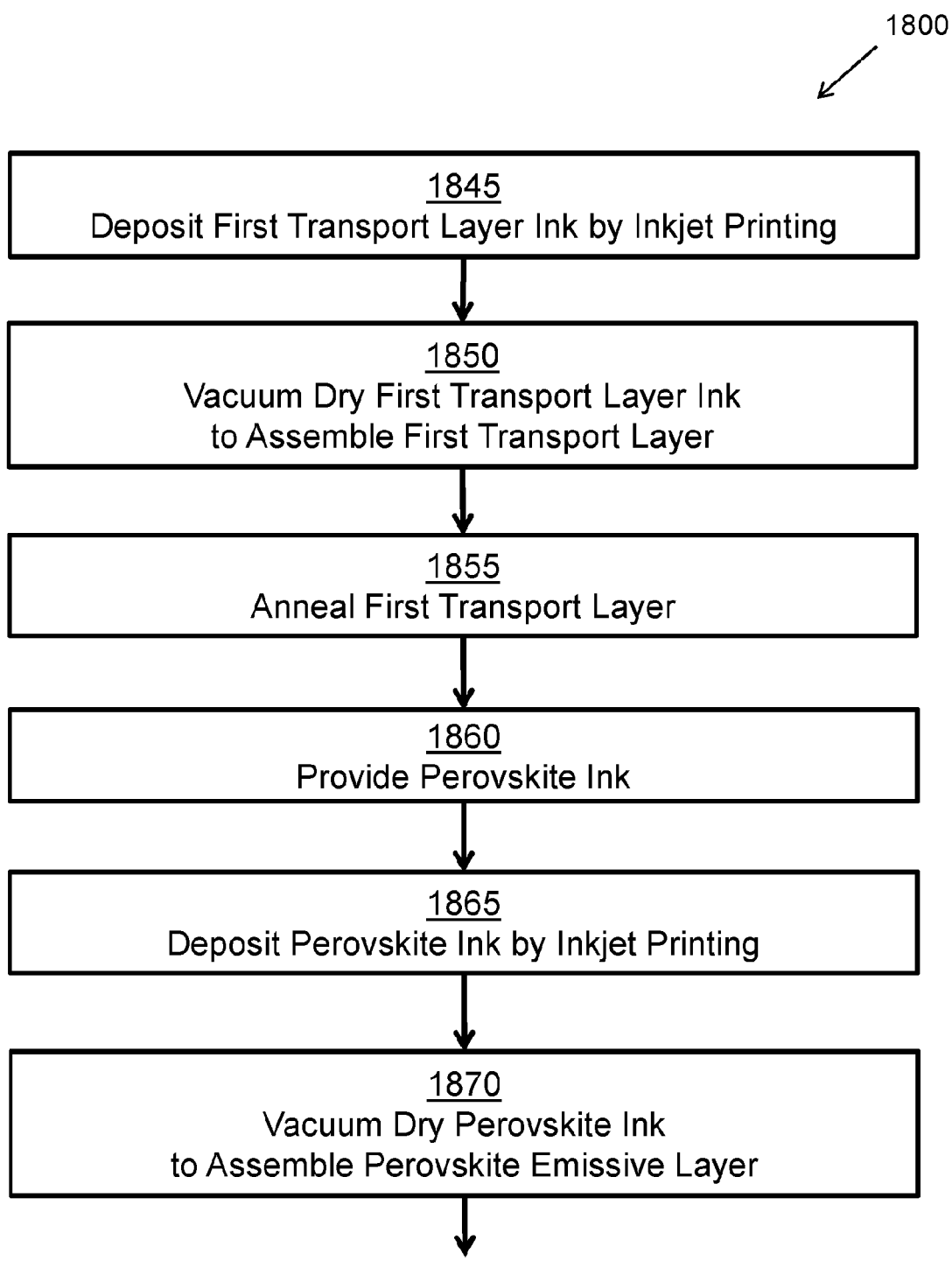
Figure 18:
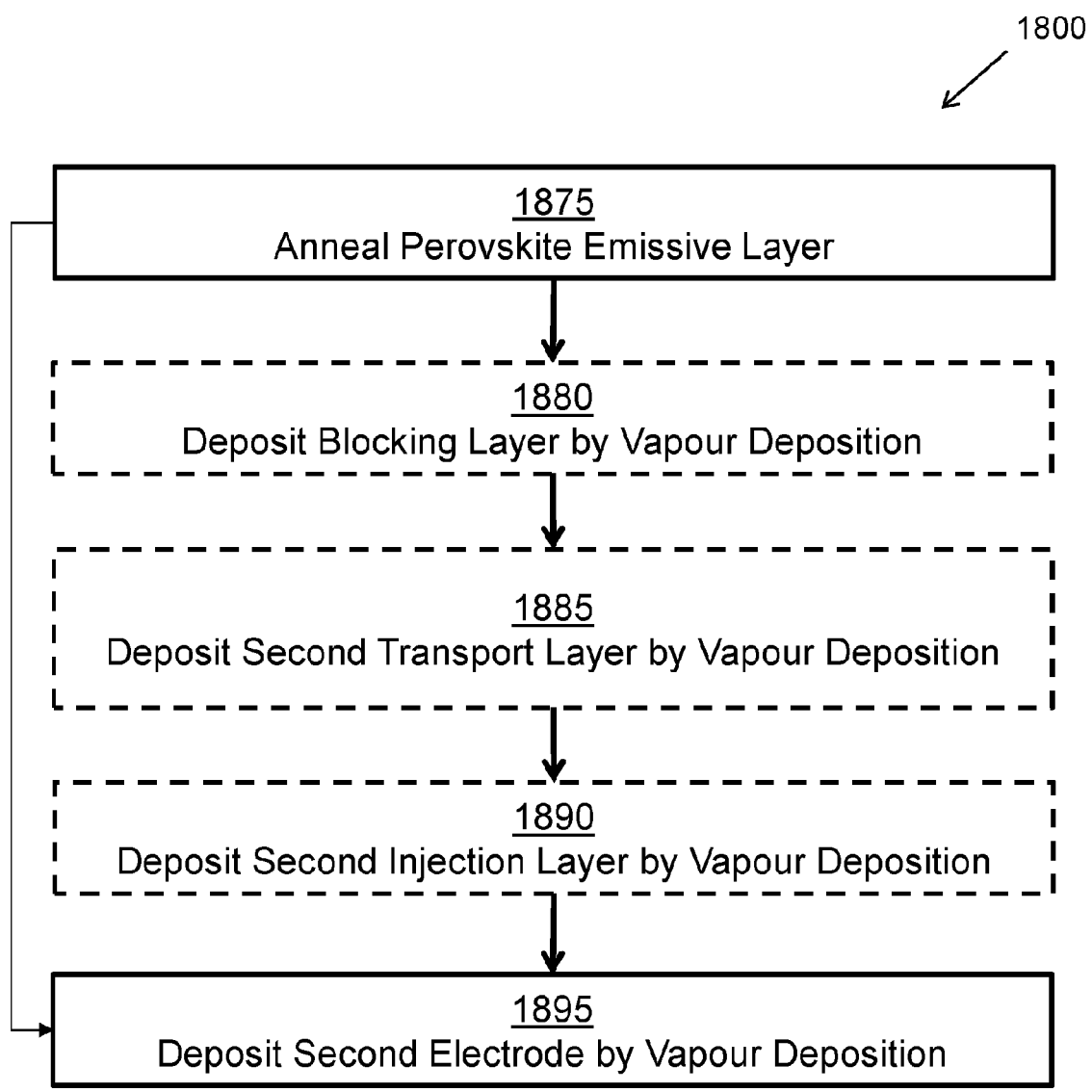

FIG. 18 depicts a method 1800 for fabricating a perovskite light emitting device. The method 1800 comprises: step 1805 of providing a substrate, which is labelled "Provide Substrate"; step 1810 of providing a first electrode disposed over the substrate, which is labelled "Provide First Electrode"; step 1815 of providing a bank structure disposed over the substrate, wherein the bank structure is patterned so as to define at least one sub-pixel on the substrate, which is labelled "Provide Bank Structure"; step 1840 of providing a first transport layer ink, wherein the first transport layer ink comprises at least one solvent and at least one first charge transport material mixed in the at least one solvent, which is labelled "Provide First Transport Layer Ink"; step 1845 of depositing the first transport layer ink into the at least one sub-pixel over the first electrode using a method of inkjet printing, which is labelled "Deposit First Transport Layer Ink by Inkjet Printing"; step 1850 of vacuum drying the first transport layer ink inside a vacuum drying chamber to assemble a first transport layer over the first electrode in the at least one sub-pixel, which is labelled "Vacuum Dry First Transport Layer Ink to Assemble First Transport Layer; step 1855 of annealing the first transport layer, which is labelled "Anneal First Transport Layer"; step 1860 of providing a perovskite ink, wherein the perovskite ink comprises at least one solvent and at least one perovskite light emitting material mixed in the at least one solvent, which is labelled "Provide Perovskite Ink"; step 1865 of depositing the perovskite ink into the at least one sub-pixel over the first transport layer using a method of inkjet printing, which is labelled "Deposit Perovskite Ink by Inkjet Printing"; step 1870 of vacuum drying the perovskite ink inside a vacuum drying chamber to assemble a perovskite emissive layer over the first transport layer in the at least one sub-pixel, which is labelled "Vacuum Dry Perovskite Ink to Assemble Perovskite Emissive Layer; step 1875 of annealing the perovskite emissive layer, which is labelled "Anneal Perovskite Emissive Layer; and step 1895 of depositing a second electrode over the perovskite emissive layer using a method of vapour deposition, which is labelled "Deposit Second Electrode by Vapour Deposition".

Optionally, method 1800 comprises the additional steps: 1820 of providing a first injection layer ink, wherein the first injection layer ink comprises at least one solvent and at least one first charge injection material mixed in the at least one solvent, which is labelled "Provide First Injection Layer Ink"; step 1825 of depositing the first injection layer ink into the at least one sub-pixel over the first electrode using a method of inkjet printing, which is labelled "Deposit First Injection Layer Ink by Inkjet Printing"; step 1830 of vacuum drying the first injection layer ink inside a vacuum drying chamber to assemble a first injection layer over the first electrode in the at least one sub-pixel, which is labelled "Vacuum Dry First Injection Layer Ink to Assemble First Injection Layer; and step 1835 of annealing the first injection layer, which is labelled "Anneal First Injection Layer".

The optional additional steps 1820, 1825, 1830 and 1835 are marked by boxes outlined with dashed lines in FIG. 18. The dashed lines represent that the additional steps 1820, 1825, 1830 and 1835 are optional steps in method 1800. In contrast, boxes outlined with a solid line in FIG. 18 are not optional steps in method 1800. Arrangement 2200 in FIG. 22a depicts an exemplary perovskite light emitting device fabricated using method 1800, without the inclusion of the optional steps 1820, 1825, 1830 and 1835. The perovskite light emitting device in arrangement 2200 therefore does not include an optional first injection layer 1720. Arrangement 2210 in FIG. 22b depicts an exemplary perovskite light emitting device fabricated using method 1800, with the inclusion of the optional steps 1820, 1825, 1830 and 1835. The perovskite light emitting device in arrangement 2210 therefore includes an optional first injection layer 1720.

Optionally, method 1800 further comprises the additional steps: 1880 of depositing a blocking layer over the perovskite emissive layer using a method of vapour deposition, which is labelled "Deposit Blocking Layer by Vapour Deposition"; step 1885 of depositing a second transport layer over the perovskite emissive layer using a method of vapour deposition, which is labelled "Deposit Second Transport Layer by Vapour Deposition"; and step 1890 of depositing a second injection layer over the perovskite emissive layer using a method of vapour deposition, which is labelled "Deposit Second Injection Layer by Vapour Deposition". The optional additional steps 1880, 1885 and 1890 are marked by boxes outlined with dashed lines in FIG. 18. The dashed lines represent that the additional steps 1880, 1885 and 1890 are optional steps in method 1800. In contrast, boxes outlined with a solid line in FIG. 18 are not optional steps in method 1800.

Figure 11:
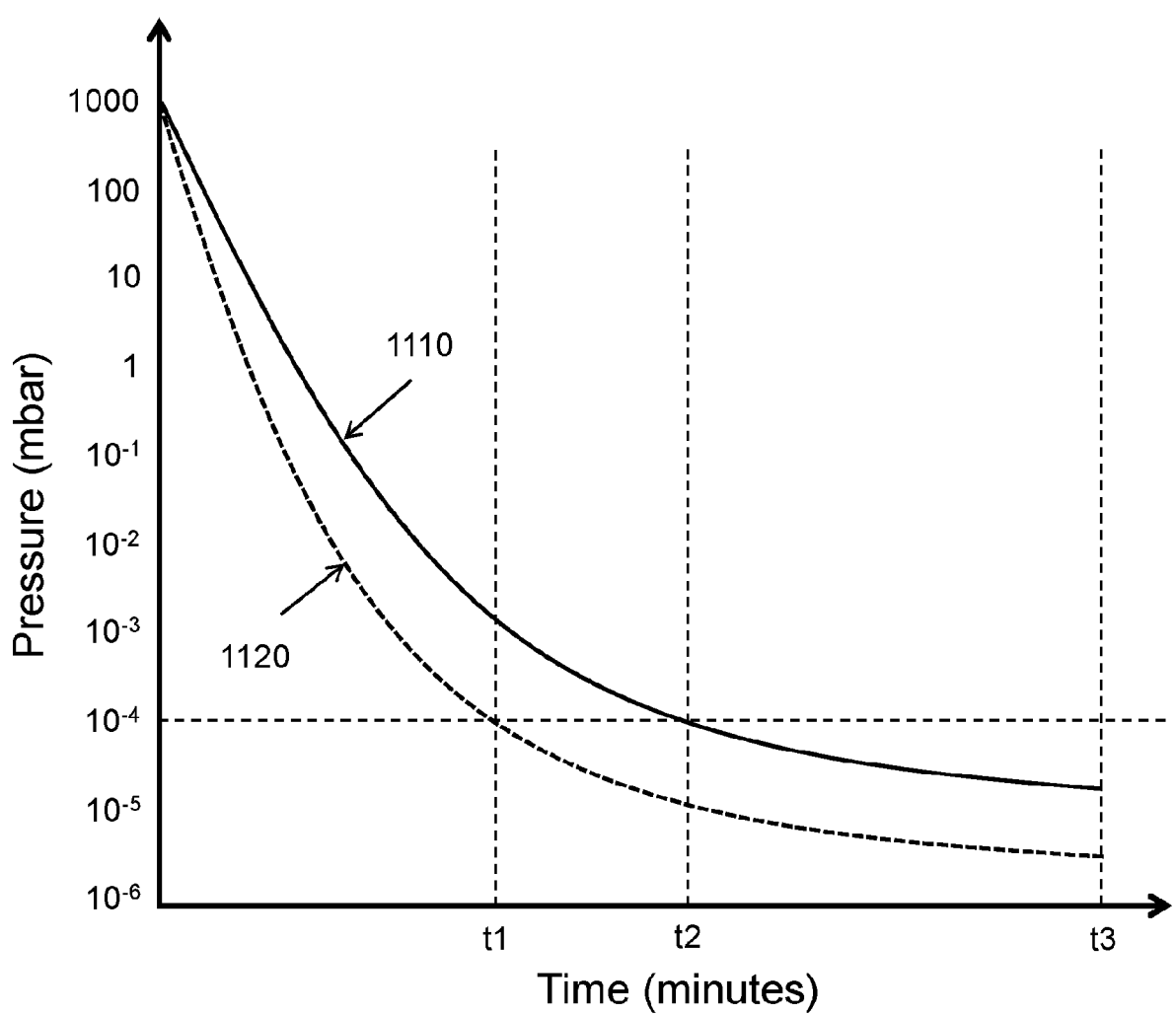
FIG. 11 depicts exemplary vacuum drying curves.
Figure 20:
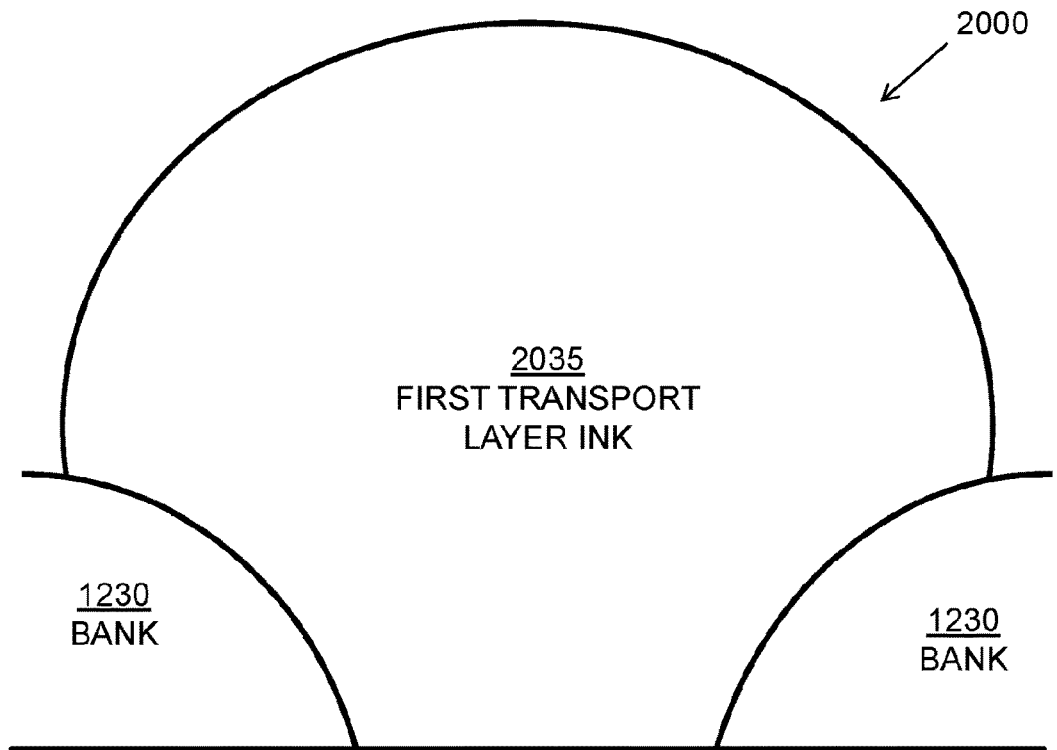
FIG. 20 depicts the assembly of various device layers of a generic perovskite light emitting device from various inks.
Figure 20:
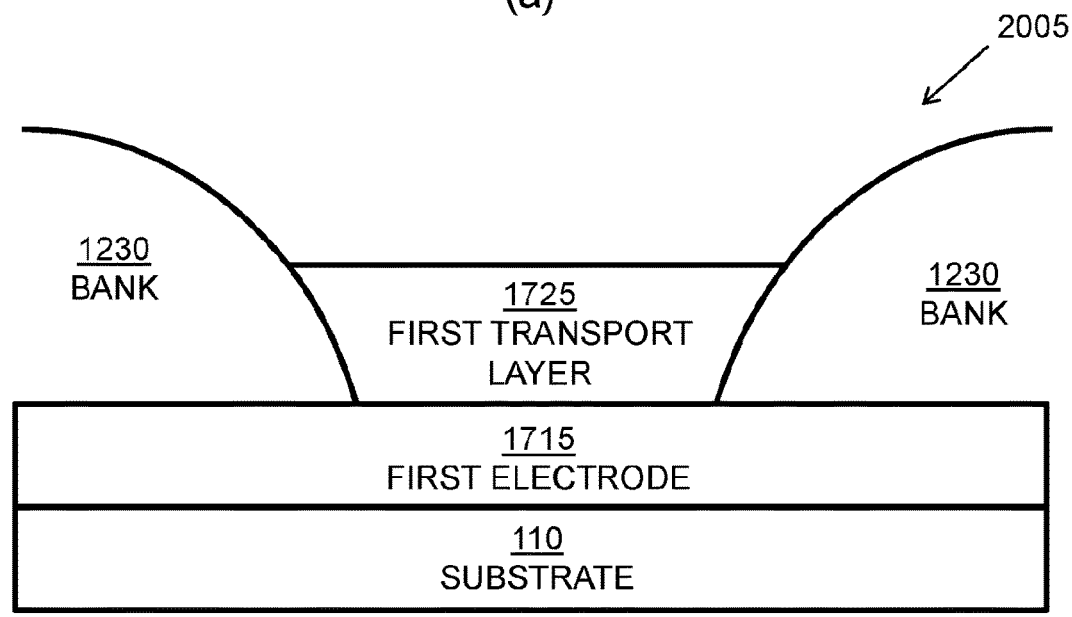
Figure 20:
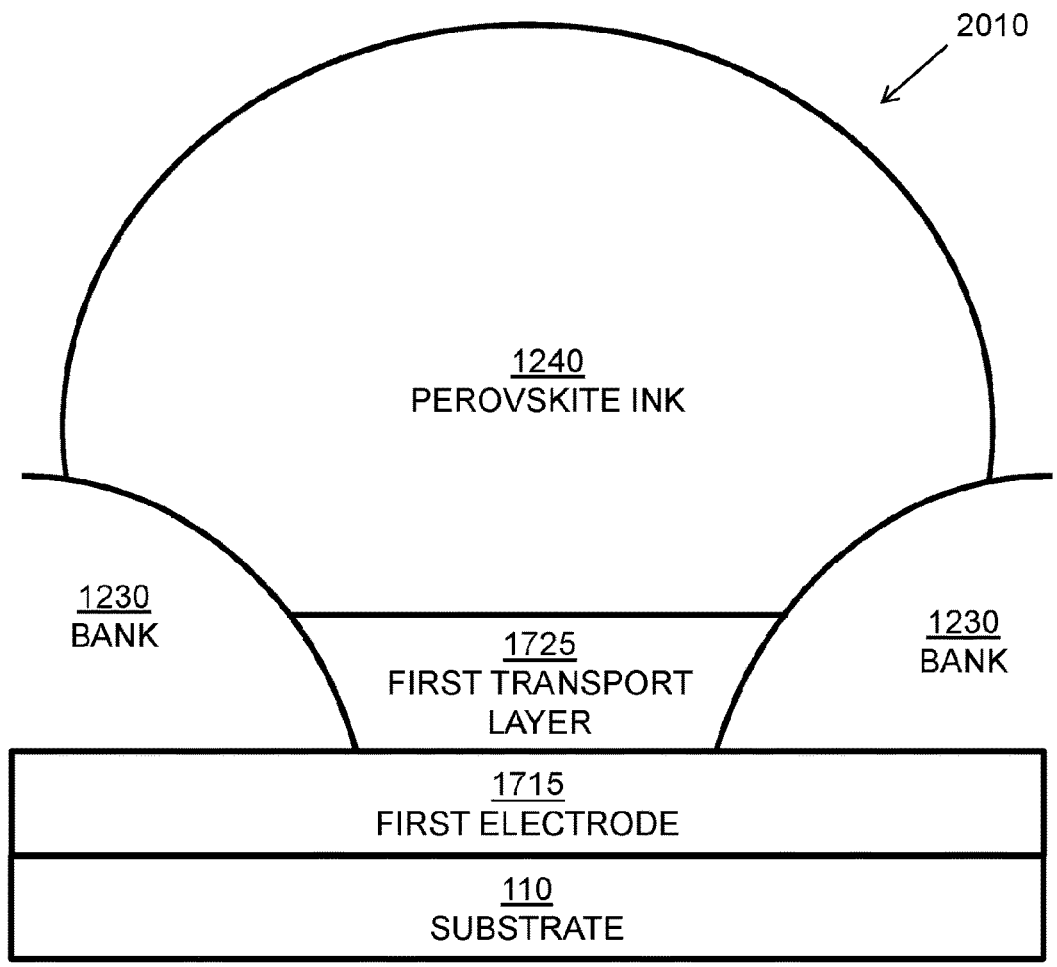
Figure 20:
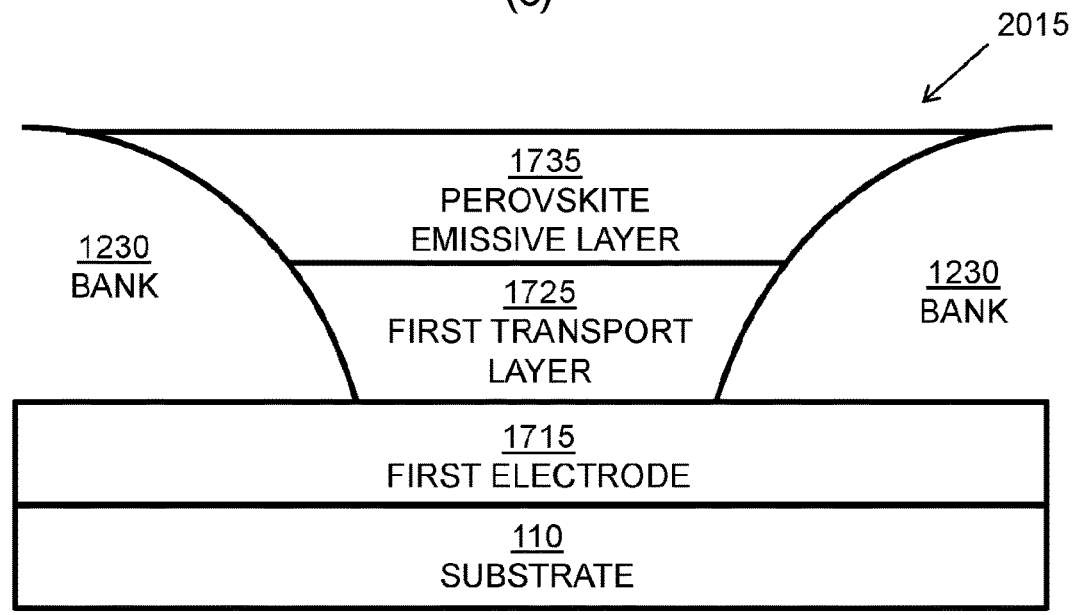
Figure 20:
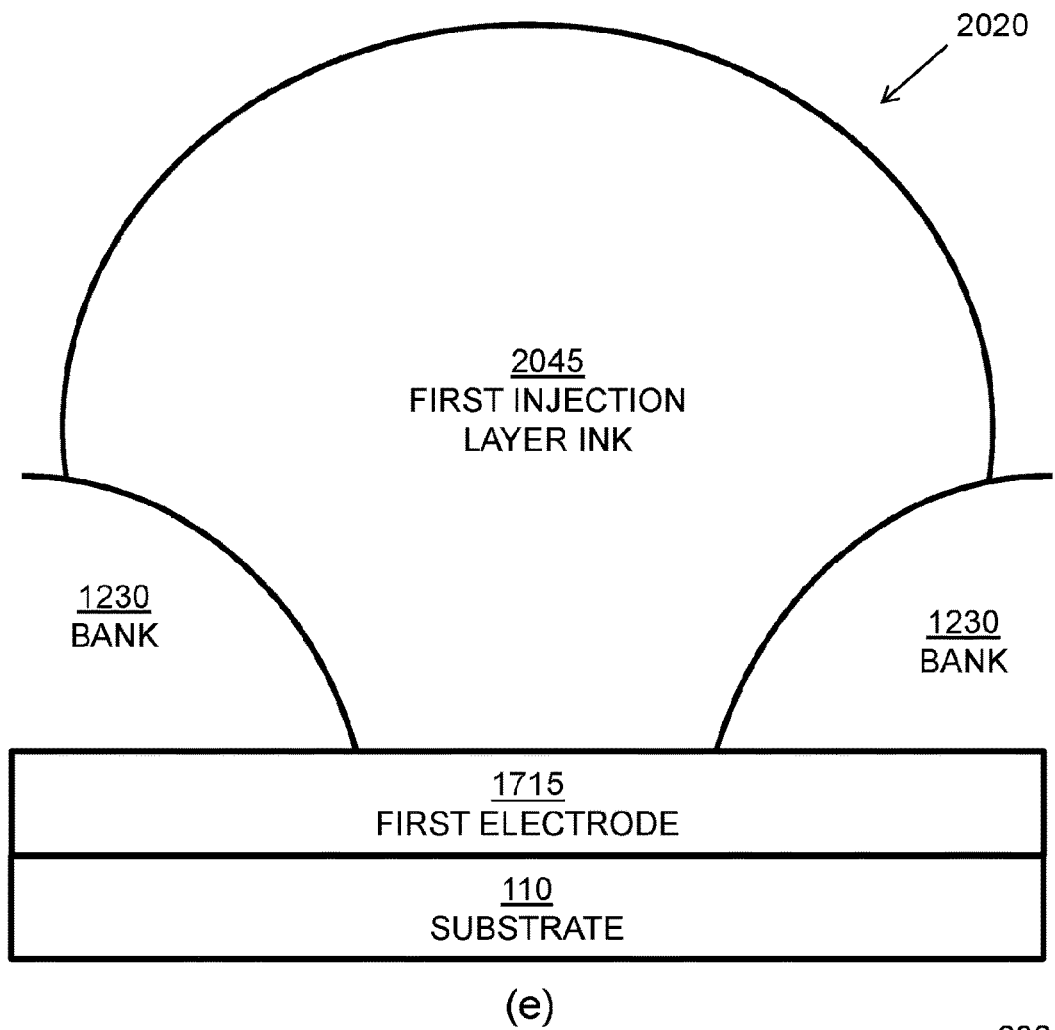
Figure 20:
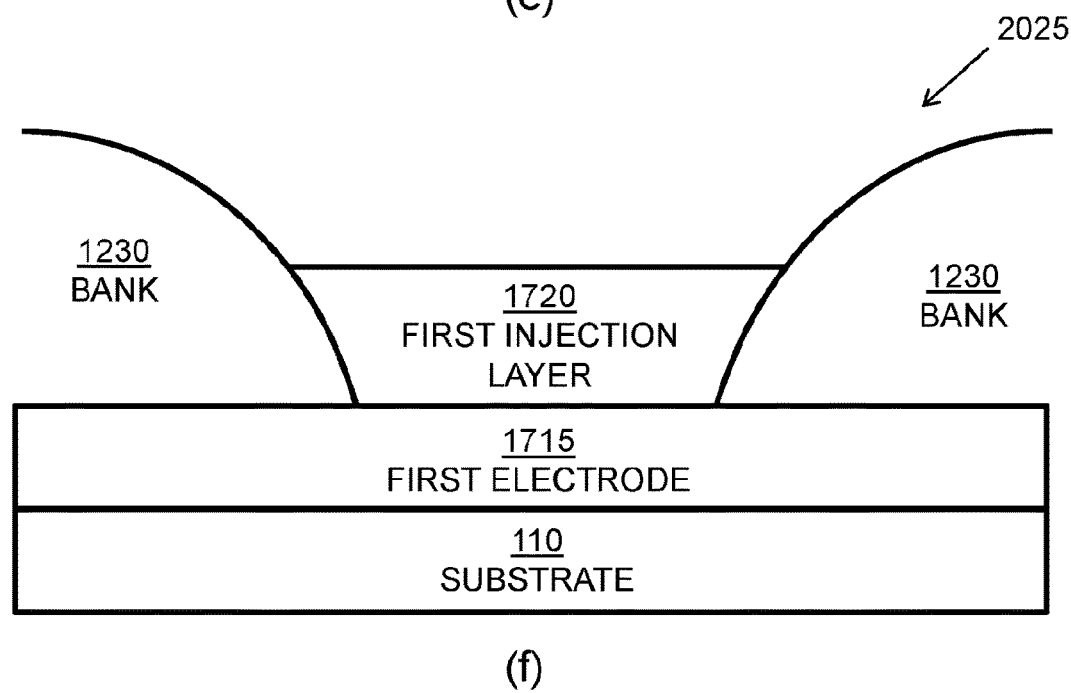

Method 1800 may be further understood with reference to FIG. 11, which depicts exemplary vacuum drying curves 1110 and 1120 that may be applied during steps 1830, 1850 and 1870, as well as with reference to FIG. 17, which depicts a generic perovskite light emitting device, and with reference to FIG. 20, which depicts the assembly of various device layers from various inks.

Method 1800 comprises a step 1805 of providing a substrate 110. The substrate 110 may be rigid or flexible. The substrate 110 may be flat or curved. The substrate 110 may be transparent, translucent or opaque. Preferred substrate 110 materials are glass, plastic and metal foil. Method 1800 further comprises a step 1810 of providing a first electrode 1715 disposed over the substrate 110. The first electrode 1715 may be transparent, enabling a bottom-emission device architecture or reflective, enabling a top-emission device architecture. Method 1800 further comprises a step 1815 of providing a bank structure 1230 disposed over the substrate 110, wherein the bank structure 1230 is patterned so as to define at least one sub-pixel on the substrate 110. The bank structure 1230 defines the area into which the first transport layer ink 2035, the perovskite ink 1240, and optionally the first injection layer ink 2045, may be inkjet printed and contained. For a display, the defined area may correspond to a sub-pixel of the display.

Method 1800 further comprises a step 1840 of providing a first transport layer ink 2035, wherein the first transport layer ink 2035 comprises at least one solvent and at least one first charge transport material mixed in the at least one solvent. The at least one solvent is needed to solubilize the at least one first charge transport material to form a first transport layer ink 2035 that can be inkjet printed. Method 1800 further comprises a step 1845 of depositing the first transport layer ink 2035 into the at least one sub-pixel over the first electrode 1715 using a method of inkjet printing.

Arrangement 2000 in FIG. 20*a* depicts a first transport layer ink 2035 that has been deposited into the at least one sub-pixel over the first electrode 1715 using a method of inkjet printing. The sub-pixel is defined by a bank structure 1230. Inkjet printing has several advantages over other deposition techniques. Inkjet printing is readily compatible with manufacturing processes for displays. Ink droplets may be printed uniformly with high accuracy and at high speed across large area substrates. Ink droplets may be printed on demand with no more than the necessary ink volume for each layer deposited into each sub-pixel, resulting in substantially higher material utilization than for vacuum deposition processes. In one embodiment, the step 1845 of depositing the first transport layer ink 2035 into the at least one sub-pixel over the first electrode 1715 by inkjet printing is performed in an atmosphere of air. In one embodiment, the step 1845 of depositing the first transport layer ink 2035 into the at least one sub-pixel over the first electrode 1715 by inkjet printing is performed in an atmosphere of nitrogen.

Method 1800 further comprises a step 1850 of vacuum drying the first transport layer ink 2035 inside a vacuum drying chamber to assemble a first transport layer 1725 over the first electrode 1715 in the at least one sub-pixel. The process of vacuum drying the first transport layer ink 2035 can be understood with reference to FIG. 20*a* and FIG. 20*b*. Arrangement 2000 in FIG. 20*a* depicts the status of method 1800 after step 1845, but before step 1850. That is to say, arrangement 2000 depicts the status before the step of vacuum drying the first transport layer ink 2035. During step 1850, the arrangement 2000 is transferred to a vacuum drying chamber. Within the vacuum drying chamber, ambient pressure is reduced to extract one or more solvents from the first transport layer ink 2035. This causes the first transport layer ink 2035 to contract and solidify to assemble a first transport layer 1725. Arrangement 2005 in FIG. 20*b* depicts the status of method 1800 after step 1850. That is to say, arrangement 2005 depicts the status after the step of vacuum drying the first transport layer ink 2035. After vacuum drying, one or more solvents have been extracted from the first transport layer ink 2035, and a first transport layer 1725 has been assembled.

Vacuum drying has several advantages over other layer assembly techniques. For example, the rate at which one or more solvents are extracted from the first transport layer ink 2035 may be controlled by varying the rate at which pressure is reduced in a vacuum drying chamber. This enables both the profile and morphology of the assembled first transport layer 1725 to be controlled by varying the rate of vacuum drying of the first transport layer ink 2035. Using an external factor, such as ambient pressure, to control the morphology and profile of the first transport layer 1725 is advantageous compared to spincoat techniques, such as those disclosed in Wang et al. because the first transport layer 1725 properties may be controlled more precisely and with greater reproducibility.

Vacuum drying enables first transport layers 1725 to be assembled rapidly across large area substrates 110, as required in the manufacturing process for displays, where takt times are typically of order 90-120 seconds. This cannot be achieved by alternative drying processes such as annealing a first transport layer ink 2035 to assemble a first transport layer 1725, which is the method that has been used in all previous work on perovskite light emitting devices. As disclosed herein, an additional step 1855 of annealing the first transport layer 1725 after it has been assembled by a step 1850 of vacuum drying is advantageous. Such an additional annealing step 1855 would not assemble the first transport layer 1725 from the first transport layer ink 2035 because the first transport layer 1725 would already have been assembled during the vacuum drying step 1850. Such an additional annealing step 1855 would instead remove residual solvent from the assembled first transport layer 1725 and optimize the morphology of the first transport layer 1725.

The process of vacuum drying may be further understood with reference to FIG. 11, which depicts two exemplary vacuum drying curves 1110 and 1120, which may be applied during step 1850.

In one embodiment, during the step 1850 of vacuum drying the first transport layer ink 2035, the pressure inside the vacuum drying chamber may be reduced to less than or equal to 0.0001 mbar. By reducing the pressure to less than or equal to 0.0001 mbar, one or more solvents may be extracted from the first transport layer ink 2035 to assemble a first transport layer 1725. Furthermore, by reducing the pressure to less than or equal to 0.0001 mbar, very little residual solvent may remain in the first transport layer 1725 after step 1850.

In one embodiment, during the step 1850 of vacuum drying the first transport layer ink 2035, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1850 of vacuum drying the first transport layer ink 2035, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1850 of vacuum drying the first transport layer ink 2035 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1850 of vacuum drying the first transport layer ink 2035 may include additional time for processes such as transfer and alignment of the substrate 110, but such additional time is not included in the foregoing discussion of vacuum drying process times.

Preferably, during the step 1850 of vacuum drying the first transport layer ink 2035 to assemble the first transport layer 1725, the ambient temperature inside the vacuum drying chamber is 50° C. or less, optionally 30° C. or less. This low temperature ensures that the first transport layer ink 2035 does not dry prematurely to assemble a non-uniform first transport layer 1725 during transfer of the substrate 110 into the vacuum drying chamber. For example, if the ambient temperature inside the vacuum drying chamber were higher than approximately 50° C., the first transport layer ink 2035 disposed over the area of the substrate 110 that enters the vacuum chamber first would begin to dry before the first transport layer ink 2035 disposed over the area of the substrate 110 that enters the vacuum chamber last. This would result in an imbalance of vapour pressure and evaporation rate of the first transport layer ink 2035 across the substrate 110 and the assembly of a non-uniform first transport layer 1725 with reduced optoelectronic performance.

The rate at which ambient pressure is reduced may be tuned according to the required first transport layer 1725 morphology and profile. The rate at which ambient pressure is reduced may also be tuned according to other additional factors that may influence the assembly and resultant morphology and profile of the first transport layer 1725. Such additional factors may include solid content of the first transport layer ink, sub-pixel dimensions, volume of the first transport layer ink drops, number of the first transport layer ink drops and bank structure 1230 design. The ability to tune the rate at which ambient pressure is reduced during step 1850 in the disclosed method 1800 enables greater control over the assembly and resultant morphology and profile of a first transport layer 1725 compared to alternative self-assembly processes, such as those described in Wang et al. This results in improved perovskite light emitting device performance.

Method 1800 further comprises a step 1855 of annealing the first transport layer 1725. By annealing the first transport layer 1725, any residual solvent may be removed from the first transport layer 1725. Furthermore, by annealing the first transport layer 1725, the thickness, morphology or profile of the first transport layer 1725 may be defined by any movement of the first transport layer 1725 during extraction of any residual solvent during the annealing process. In one embodiment, the first transport layer 1725 may be a cross-linked layer, and after the step 1855 of annealing the first transport layer, the first transport layer 1725 may be cross-linked. In one embodiment, the step 1855 of annealing the first transport layer 7125 may be performed in an atmosphere of nitrogen. Such a nitrogen atmosphere may be preferred for the annealing process because one or more materials within the first transport layer 1725 may be susceptible to oxidation and degradation when annealed in an atmosphere of air.

In one embodiment, during the step 1855 of annealing the first transport layer 1725, the annealing temperature may be in the range of 100° C. to 220° C. Such a range annealing of temperatures may effectively enable any residual solvent to be removed from the first transport layer 1725. In one embodiment, the step 1855 of annealing the first transport layer 1725 may be performed in a different chamber to the vacuum drying chamber. In one embodiment, the step 1855 of annealing the first transport layer 1725 may be performed in the same chamber as the vacuum drying chamber. In one embodiment, the step 1855 of annealing the first transport layer 1725 may be performed during the step 1850 of vacuum drying the first transport layer ink 2035.

Preferably, the step 1855 of annealing the first transport layer 1725 is performed in a different step to the step 1850 of vacuum drying the first transport layer ink 2035. Preferably, the step 1855 of annealing the first transport layer 1725 is performed in a different chamber to the step 1850 of vacuum drying the first transport layer ink 2035. Preferably, the step 1855 of annealing the first transport layer 1725 is performed in a different step and in a different chamber to the step 1850 of vacuum drying the first transport layer ink 2035. This enables the vacuum drying step 1850 to be performed at an ambient temperature of 50° C. or less, optionally 30° C. or less, which as described herein, ensures the first transport layer ink 2035 does not dry prematurely to assemble a non-uniform first transport layer 1725 during transfer of the substrate 110 into the vacuum drying chamber. Furthermore, process times for the step 1850 of vacuum drying the first transport layer ink 2035 and the step 1855 of annealing the first transport layer 1725 may be individually optimized. For example, a typical optimized vacuum drying step 1850 may be expected to be 90-120 seconds, whereas a typical optimized annealing step 1855 may be expected to be in the range of 10-30 minutes, such that multiple substrates are required to be loaded into a single annealing chamber to ensure a steady process flow for manufacturing displays. Separating the step 1850 of vacuum drying and the step 1855 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform first transport layers 1725 with reduced optoelectronic performance and a non-optimized manufacturing process flow with higher cost.

Method 1800 further comprises a step 1860 of providing a perovskite ink 1240, wherein the perovskite ink 1240 comprises at least one solvent and at least one perovskite light emitting material mixed in the at least one solvent. The at least one solvent is needed to solubilize the at least one perovskite light emitting material to form a perovskite ink 1240 that can be inkjet printed.

Method 1800 further comprises a step 1865 of depositing the perovskite ink 1240 into the at least one sub-pixel over the first transport layer 1725 using a method of inkjet printing. Inkjet printing allows for inks for red, green and blue emissive layers to be deposited within different sub-pixels of a display, without the need for expensive fine metal masks that would be required for patterning red, green and blue emissive layers within different sub-pixels of a display using vapour deposition processes. The inkjet printing process may be performed in an atmosphere of air or nitrogen, avoiding the need for expensive vacuum chambers, as required to deposit layers using vacuum deposition processes.

Arrangement 2010 in FIG. 20c depicts a perovskite ink 1240 that has been deposited into the at least one sub-pixel over a first transport layer 1725 using a method of inkjet printing. The sub-pixel is defined by a bank structure 1230. In one embodiment, the step 1865 of depositing the perovskite ink 1240 into the at least one sub-pixel over the first transport layer 1725 by inkjet printing is performed in an atmosphere of air. In one embodiment, the step 1865 of depositing the perovskite ink 1240 into the at least one sub-pixel over the first transport layer 1725 by inkjet printing is performed in an atmosphere of nitrogen.

Method 1800 further comprises a step 1870 of vacuum drying the perovskite ink 1240 inside a vacuum drying chamber to assemble a perovskite emissive layer 1735 over the first transport layer 1725 in the at least one sub-pixel. The process of vacuum drying the perovskite ink 1240 can be understood with reference to FIG. 20c and FIG. 20d. Arrangement 2010 in FIG. 20c depicts the status of method 1800 after step 1865, but before step 1870. That is to say, arrangement 2010 depicts the status before the step of vacuum drying the perovskite ink 1240. During step 1870, the arrangement 2010 is transferred to a vacuum drying chamber. Within the vacuum drying chamber, ambient pressure is reduced to extract one or more solvents from the perovskite ink 1240. This causes the perovskite ink 1240 to contract and solidify to assemble a perovskite emissive layer 1735. Arrangement 2015 in FIG. 20d depicts the status of method 1800 after step 1870. That is to say, arrangement 2015 depicts the status after the step of vacuum drying the perovskite ink 1240. After vacuum drying, one or more solvents have been extracted from perovskite ink 1240, and a perovskite emissive layer 1735 has been assembled.

Vacuum drying has several advantages over other layer assembly techniques. For example, the rate at which one or more solvents are extracted from the perovskite ink 1240 may be controlled by varying the rate at which pressure is reduced in a vacuum drying chamber. This enables both the profile and morphology of the assembled perovskite emissive layer 1735 to be controlled by varying the rate of vacuum drying of the perovskite ink 1240. Using an external factor, such as ambient pressure, to control the morphology and profile of the perovskite emissive layer 1735 is advantageous compared to spincoat techniques, such as those disclosed in Wang et al. because the perovskite emissive layer 1735 properties may be controlled more precisely and with greater reproducibility.

Vacuum drying enables perovskite emissive layers 1735 to be assembled rapidly across large area substrates 110, as required in the manufacturing process for displays, where takt times are typically of order 90-120 seconds. This cannot be achieved by alternative drying processes such as annealing a perovskite ink 1240 to assemble a perovskite emissive layer 1735, which is the method that has been used in all previous work on perovskite light emitting devices. As disclosed herein, an additional step 1875 of annealing the perovskite emissive layer 1735 after it has been assembled by a step 1870 of vacuum drying is advantageous. Such an additional annealing step 1875 would not assemble the perovskite emissive layer 1735 from the perovskite ink 1240 because the perovskite emissive layer 1735 would already have been assembled during the vacuum drying step 1870. Such an additional annealing step 1875 would instead remove residual solvent from the assembled perovskite emissive layer 1735 and optimize the morphology of the perovskite emissive layer 1735.

The process of vacuum drying may be further understood with reference to FIG. 11, which depicts two exemplary vacuum drying curves 1110 and 1120, which may be applied during step 1870.

In one embodiment, during the step 1870 of vacuum drying the perovskite ink 1240, the pressure inside the vacuum drying chamber may be reduced to less than or equal to 0.0001 mbar. By reducing the pressure to less than or equal to 0.0001 mbar, one or more solvents may be extracted from the perovskite ink 1240 to assemble a perovskite emissive layer 1735. Furthermore, by reducing the pressure to less than or equal to 0.0001 mbar, very little residual solvent may remain in the perovskite emissive layer 1735 after step 1870.

In one embodiment, during the step 1870 of vacuum drying the perovskite ink 1240, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1870 of vacuum drying the perovskite ink 1240, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1870 of vacuum drying the perovskite ink 1240 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1870 of vacuum drying the perovskite ink 1240 may include additional time for processes such as transfer and alignment of the substrate 110, but such additional time is not included in the foregoing discussion of vacuum drying process times.

Preferably, during the step 1870 of vacuum drying the perovskite ink 1240 to assemble the perovskite emissive layer 1735, the ambient temperature inside the vacuum drying chamber is 50° C. or less, optionally 30° C. or less. This low temperature ensures that the perovskite ink 1240 does not dry prematurely to assemble a non-uniform perovskite emissive layer 1735 during transfer of the substrate 110 into the vacuum drying chamber. For example, if the ambient temperature inside the vacuum drying chamber were higher than approximately 50° C., the perovskite ink 1240 disposed over the area of the substrate 110 that enters the vacuum chamber first would begin to dry before the perovskite ink 1240 disposed over the area of the substrate 110 that enters the vacuum chamber last. This would result in an imbalance of vapour pressure and evaporation rate of the perovskite ink 1240 across the substrate 110 and the assembly of a non-uniform perovskite emissive layer 1735 with reduced optoelectronic performance.

The rate at which ambient pressure is reduced may be tuned according to the required perovskite emissive layer 1735 morphology and profile. The rate at which ambient pressure is reduced may also be tuned according to other additional factors that may influence the assembly and resultant morphology and profile of the perovskite emissive layer 1735. Such additional factors may include solid content of the perovskite ink, sub-pixel dimensions, volume of the perovskite ink drops, number of the perovskite ink drops and bank structure 1230 design. The ability to tune the rate at which ambient pressure is reduced during step 1870 in the disclosed method 1800 enables greater control over the assembly and resultant morphology and profile of a perovskite emissive layer 1735 compared to alternative self-assembly processes, such as those described in Wang et al. This results in improved perovskite light emitting device performance.

Method 1800 further comprises a step 1875 of annealing the perovskite emissive layer 1735. By annealing the perovskite emissive layer 1735, any residual solvent may be removed from the perovskite emissive layer 1735. Furthermore, by annealing the perovskite emissive layer 1735, the thickness, morphology or profile of the perovskite emissive layer 1735 may be defined by any movement of the perovskite emissive layer 1735 during extraction of any residual solvent during the annealing process. In one embodiment, the perovskite emissive layer 1735 may be a cross-linked layer, and after the step 1875 of annealing the perovskite emissive layer, the perovskite emissive layer 1735 may be cross-linked. In one embodiment, the step 1875 of annealing the perovskite emissive layer 1735 may be performed in an atmosphere of nitrogen. Such a nitrogen atmosphere may be preferred for the annealing process because one or more materials within the perovskite emissive layer 1735 may be susceptible to oxidation and degradation when annealed in an atmosphere of air.

In one embodiment, during the step 1875 of annealing the perovskite emissive layer 1735, the annealing temperature may be in the range of 80° C. to 200° C. In one embodiment, during the step 1875 of annealing the perovskite emissive layer 1735, the annealing temperature may be in the range of 80° C. to 160° C. Such a range annealing of temperatures may effectively enable any residual solvent to be removed from the perovskite emissive layer 1735. In one embodiment, the step 1875 of annealing the perovskite emissive layer 1735 may be performed in a different chamber to the vacuum drying chamber. In one embodiment, the step 1875 of annealing the perovskite emissive layer 1735 may be performed in the same chamber as the vacuum drying chamber. In one embodiment, the step 1875 of annealing the perovskite emissive layer may be performed during the step 1870 of vacuum drying the perovskite ink 1240.

Preferably, the step 1875 of annealing the perovskite emissive layer 1735 is performed in a different chamber to the step 1870 of vacuum drying the perovskite ink 1240. Preferably, the step 1875 of annealing the perovskite emissive layer 1735 is performed in a different step and in a different chamber to the step 1870 of vacuum drying the perovskite ink 1240. This enables the vacuum drying step 1870 to be performed at an ambient temperature of 50° C. or less, optionally 30° C. or less, which as described herein, ensures the perovskite ink 1240 does not dry prematurely to assemble a non-uniform perovskite emissive layer 1735 during transfer of the substrate 110 into the vacuum drying chamber. Furthermore, process times for the step 1870 of vacuum drying the perovskite ink 1240 and the step 1875 of annealing the perovskite emissive layer 1735 may be individually optimized. For example, a typical optimized vacuum drying step 1870 may be expected to be 90-120 seconds, whereas a typical optimized annealing step 1875 may be expected to be in the range of 10-30 minutes, such that multiple substrates are required to be loaded into a single annealing chamber to ensure a steady process flow for manufacturing displays. Separating the step 1870 of vacuum drying and the step 1875 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform perovskite emissive layers 1735 with reduced optoelectronic performance and a non-optimized manufacturing process flow with higher cost.

Method 1800 further comprises a step 1895 of depositing a second electrode 1755 over the perovskite emissive layer 1735 using a method of vapour deposition, which is labelled "Deposit Second Electrode by Vapour Deposition". The second electrode 1755 may be transparent, enabling a top-emission device architecture, or reflective, enabling a bottom-emission device architecture.

In one embodiment, method 1800 comprises an optional additional step 1820 of providing a first injection layer ink 2045, wherein the first injection layer ink 2045 comprises at least one solvent and at least one first charge injection material mixed in the at least one solvent. The at least one solvent is needed to solubilize the at least one first charge injection material to form a first injection layer ink 2045 that can be inkjet printed. In one embodiment, method 1800 comprises an optional additional step 1825 of depositing the first injection layer ink 2045 into the at least one sub-pixel over the first electrode 1715 using a method of inkjet printing.

Arrangement 2020 in FIG. 20e depicts a first injection layer ink 2045 that has been deposited into the at least one sub-pixel over the first electrode 1715 using a method of inkjet printing. The sub-pixel is defined by a bank structure 1230. In one embodiment, the step 1825 of depositing the first injection layer ink 2045 into the at least one sub-pixel over the first electrode 1715 by inkjet printing is performed in an atmosphere of air. In one embodiment, the step 1825 of depositing the first injection layer ink 2045 into the at least one sub-pixel over the first electrode 1715 by inkjet printing is performed in an atmosphere of nitrogen.

In one embodiment, method 1800 comprises an optional additional step 1830 of vacuum drying the first injection layer ink 2045 inside a vacuum drying chamber to assemble a first injection layer 1720 over the first electrode 1715 in the at least one sub-pixel. The process of vacuum drying the first injection layer ink 2045 can be understood with reference to FIG. 20e and FIG. 20f. Arrangement 2020 in FIG. 20e depicts the status of method 1800 after step 1825, but before step 1830. That is to say, arrangement 2020 depicts the status before the step of vacuum drying the first injection layer ink 2045. During step 1830, the arrangement 2020 is transferred to a vacuum drying chamber. Within the vacuum drying chamber, ambient pressure is reduced to extract one or more solvents from the first injection layer ink 2045. This causes the first injection layer ink 2045 to contract and solidify to assemble a first injection layer 1720. Arrangement 2025 in FIG. 20f depicts the status of method 1800 after step 1830. That is to say, arrangement 2025 depicts the status after the step of vacuum drying the first injection layer ink 2045. After vacuum drying, one or more solvents have been extracted from the first injection layer ink 2045, and a first injection layer 1720 has been assembled.

Vacuum drying has several advantages over other layer assembly techniques. For example, the rate at which one or more solvents are extracted from the first injection layer ink 2045 may be controlled by varying the rate at which pressure is reduced in a vacuum drying chamber. This enables both the profile and morphology of the assembled first injection layer 1720 to be controlled by varying the rate of vacuum drying of the first injection layer ink 2045. Using an external factor, such as ambient pressure, to control the morphology and profile of the first injection layer 1720 is advantageous compared to spincoat techniques, such as those disclosed in Wang et al. because the first injection layer 1720 properties may be controlled more precisely and with greater reproducibility.

Vacuum drying enables first injection layers 1720 to be assembled rapidly across large area substrates 110, as required in the manufacturing process for displays, where takt times are typically of order 90-120 seconds. This cannot be achieved by alternative drying processes such as annealing a first injection layer ink 2045 to assemble a first injection layer 1720, which is the method that has been used in all previous work on perovskite light emitting devices. As disclosed herein, an additional step 1835 of annealing the first injection layer 1720 after it has been assembled by a step 1830 of vacuum drying is advantageous. Such an additional annealing step 1835 would not assemble the first injection layer 1720 from the first injection layer ink 2045 because the first injection layer 1720 would already have been assembled during the vacuum drying step 1830. Such an additional annealing step 1835 would instead remove residual solvent from the assembled first injection layer 1720 and optimize the morphology of the first injection layer 1720.

The process of vacuum drying may be further understood with reference to FIG. 11, which depicts two exemplary vacuum drying curves 1110 and 1120, which may be applied during step 1830.

In one embodiment, during the step 1830 of vacuum drying the first injection layer ink 2045, the pressure inside the vacuum drying chamber may be reduced to less than or equal to 0.0001 mbar. By reducing the pressure to less than or equal to 0.0001 mbar, one or more solvents may be extracted from the first injection layer ink 2045 to assemble a first injection layer 1720. Furthermore, by reducing the pressure to less than or equal to 0.0001 mbar, very little residual solvent may remain in the first injection layer 1720 after step 1830.

In one embodiment, during the step 1830 of vacuum drying the first injection layer ink 2045, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1830 of vacuum drying the first injection layer ink 2045, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1830 of vacuum drying the first injection layer ink 2045 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1830 of vacuum drying the first injection layer ink 2045 may include additional time for processes such as transfer and alignment of the substrate 110, but such additional time is not included in the foregoing discussion of vacuum drying process times.

Preferably, during the step 1830 of vacuum drying the first injection layer ink 2045 to assemble the first injection layer 1720, the ambient temperature inside the vacuum drying chamber is 50° C. or less, optionally 30° C. or less. This low temperature ensures that the first injection layer ink 2045 does not dry prematurely to assemble a non-uniform first injection layer 1720 during transfer of the substrate 110 into the vacuum drying chamber. For example, if the ambient temperature inside the vacuum drying chamber were higher than approximately 50° C., the first injection layer ink 2045 disposed over the area of the substrate 110 that enters the vacuum chamber first would begin to dry before the first injection layer ink 2045 disposed over the area of the substrate 110 that enters the vacuum chamber last. This would result in an imbalance of vapour pressure and evaporation rate of the first injection layer ink 2045 across the substrate 110 and the assembly of a non-uniform first injection layer 1720 with reduced optoelectronic performance.

The rate at which ambient pressure is reduced may be tuned according to the required first injection layer 1720 morphology and profile. The rate at which ambient pressure is reduced may also be tuned according to other additional factors that may influence the assembly and resultant morphology and profile of the first injection layer 1720. Such additional factors may include solid content of the first injection layer ink, sub-pixel dimensions, volume of the first injection layer ink drops, number of the first injection layer ink drops and bank structure 1230 design. The ability to tune the rate at which ambient pressure is reduced during step 1830 in the disclosed method 1800 enables greater control over the assembly and resultant morphology and profile of a first injection layer 1720 compared to alternative self-assembly processes, such as those described in Wang et al. This results in improved perovskite light emitting device performance.

In one embodiment, method 1800 comprises an optional additional step 1835 of annealing the first injection layer 1720. By annealing the first injection layer 1720, any residual solvent may be removed from the first injection layer 1720. Furthermore, by annealing the first injection layer 1720, the thickness, morphology or profile of the first injection layer 1720 may be defined by any movement of the first injection layer 1720 during extraction of any residual solvent during the annealing process. In one embodiment, the first injection layer 1720 may be a cross-linked layer, and after the step 1835 of annealing the first injection layer, the first injection layer 1720 may be cross-linked. In one embodiment, the step 1835 of annealing the first injection layer 1720 may be performed in an atmosphere of air. In one embodiment, the step 1835 of annealing the first injection layer 1720 may be performed in an atmosphere of nitrogen.

In one embodiment, during the step 1835 of annealing the first injection layer 1720, the annealing temperature may be in the range of 100° C. to 220° C. Such a range annealing of temperatures may effectively enable any residual solvent to be removed from the first injection layer 1720. In one embodiment, the step 1835 of annealing the first injection layer 1720 may be performed in a different chamber to the vacuum drying chamber. In one embodiment, the step 1835 of annealing the first injection layer 1720 may be performed in the same chamber as the vacuum drying chamber. In one embodiment, the step 1835 of annealing the first injection layer 1720 may be performed during the step 1830 of vacuum drying the first injection layer ink 2045.

Preferably, the step 1835 of annealing the first injection layer 1720 is performed in a different step to the step 1830 of vacuum drying the first injection layer ink 2045. Preferably, the step 1835 of annealing the first injection layer 1720 is performed in a different chamber to the step 1830 of vacuum drying the first injection layer ink 2045. Preferably, the step 1835 of annealing the first injection layer 1720 is performed in a different step and in a different chamber to the step 1830 of vacuum drying the first injection layer ink 2045. This enables the vacuum drying step 1830 to be performed at an ambient temperature of 50° C. or less, optionally 30° C. or less, which as described herein, ensures the first injection layer ink 2045 does not dry prematurely to assemble a non-uniform first injection layer 1720 during transfer of the substrate 110 into the vacuum drying chamber. Furthermore, process times for the step 1830 of vacuum drying the first injection layer ink 2045 and the step 1835 of annealing the first injection layer 1720 may be individually optimized. For example, a typical optimized vacuum drying step 1830 may be expected to be 90-120 seconds, whereas a typical optimized annealing step 1835 may be expected to be in the range of 10-30 minutes, such that multiple substrates are required to be loaded into a single annealing chamber to ensure a steady process flow for manufacturing displays. Separating the step 1830 of vacuum drying and the step 1835 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform first injection layers 1720 with reduced optoelectronic performance and a non-optimized manufacturing process flow with higher cost.

The assembly and resultant thicknesses, morphologies or profiles of the assembled layers, including the first injection layer 1720, first transport layer 1725 and perovskite emissive layer 1735 may be further influenced by the solid content of the respective first injection layer ink 2045, first transport layer ink 2035 and perovskite ink 1240.

In one embodiment, the first injection layer ink 2045 may comprise at least one first charge injection material mixed in at least one solvent at a concentration by weight in the range of 0.01 wt. % to 10 wt. %. In one embodiment, the first injection layer ink 2045 may comprise at least one first charge injection material mixed in at least one solvent at a concentration by weight of in the range of 0.1 wt. % to 5 wt. %. In one embodiment, the first transport layer ink 2035 may comprise at least one first charge transport material mixed in at least one solvent at a concentration by weight in the range of 0.01 wt. % to 10 wt. %. In one embodiment, the first transport layer ink 2035 may comprise at least one first charge transport material mixed in at least one solvent at a concentration by weight of in the range of 0.1 wt. % to 5 wt. %. In one embodiment, the perovskite ink 1240 may comprise at least one perovskite light emitting material mixed in at least one solvent at a concentration by weight in the range of 0.01 wt. % to 10 wt. %. In one embodiment, the perovskite ink 1240 may comprise at least one perovskite light emitting material mixed in at least one solvent at a concentration by weight of in the range of 0.1 wt. % to 5 wt. %.

Such ranges of concentration by weight in the first injection layer ink 2045, first transport layer ink 2035 and perovskite ink 1240 may enable the thicknesses of the first injection layer 1720, first transport layer 1725 and perovskite emissive layer 1735 to be controlled. In one embodiment, by increasing the concentration by weight of the first charge injection material, the thickness of the first injection layer 1720 may be increased. In one embodiment, the thickness of the first injection layer 1720 may be in the range of 10 nm to 80 nm. In one embodiment, by increasing the concentration by weight of the first charge transport material, the thickness of the first transport layer 1725 may be increased. In one embodiment, the thickness of the first transport layer 1725 may be in the range of 10 nm to 80 nm. In one embodiment, by increasing the concentration by weight of the perovskite light emitting material, the thickness of the perovskite emissive layer 1735 may be increased. In one embodiment, the thickness of the perovskite emissive layer 1735 may be in the range of 15 nm to 150 nm. Such a thickness range may maximize the proportion of recombination of electrons and holes within the perovskite emissive layer 1735, thereby maximizing the efficiency of light emission from the perovskite emissive layer 1735.

Such a ranges of concentration by weight of material in the respective inks may further enable the morphologies and profiles of the first injection layer 1720, first transport layer 1725 and perovskite emissive layer 1735 to be controlled. For example, an ink with higher weight concentration may be of higher viscosity than an ink with lower weight concentration. The change in viscosity may affect how the respective ink contracts and solidifies to form a layer during vacuum drying. This may result in a different morphology of first charge injection material, first charge transport material and perovskite light emitting material in the respective first injection layer 1720, first transport layer 1725 and perovskite emissive layer 1735 after vacuum drying, as well as different profiles of the first injection layer 1720, first transport layer 1725 and perovskite emissive layer 1735.

Note that as described herein, layer thickness is defined as the thickness of the respective layer at the centre of the at least one sub-pixel. It is not defined as the thickness of the respective layer in regions of the at least one sub-pixel over or adjacent to the bank structure 1230. For a well-controlled application of method 1800, the resulting first injection layer 1720, first transport layer 1725 and perovskite emissive layer 1735 may each be of uniform thickness across the at least one sub-pixel, with less than approximately 10%, and optionally less than approximately 5% thickness variation across the at least one sub-pixel. However, in some instances, application of method 1800 may result in substantial thickness variation of the first injection layer 1720, first transport layer 1725 and perovskite emissive layer 1735 across the at least one sub-pixel. In all instances, layer thickness is defined at the centre of the at least one sub-pixel.

Figure 13:
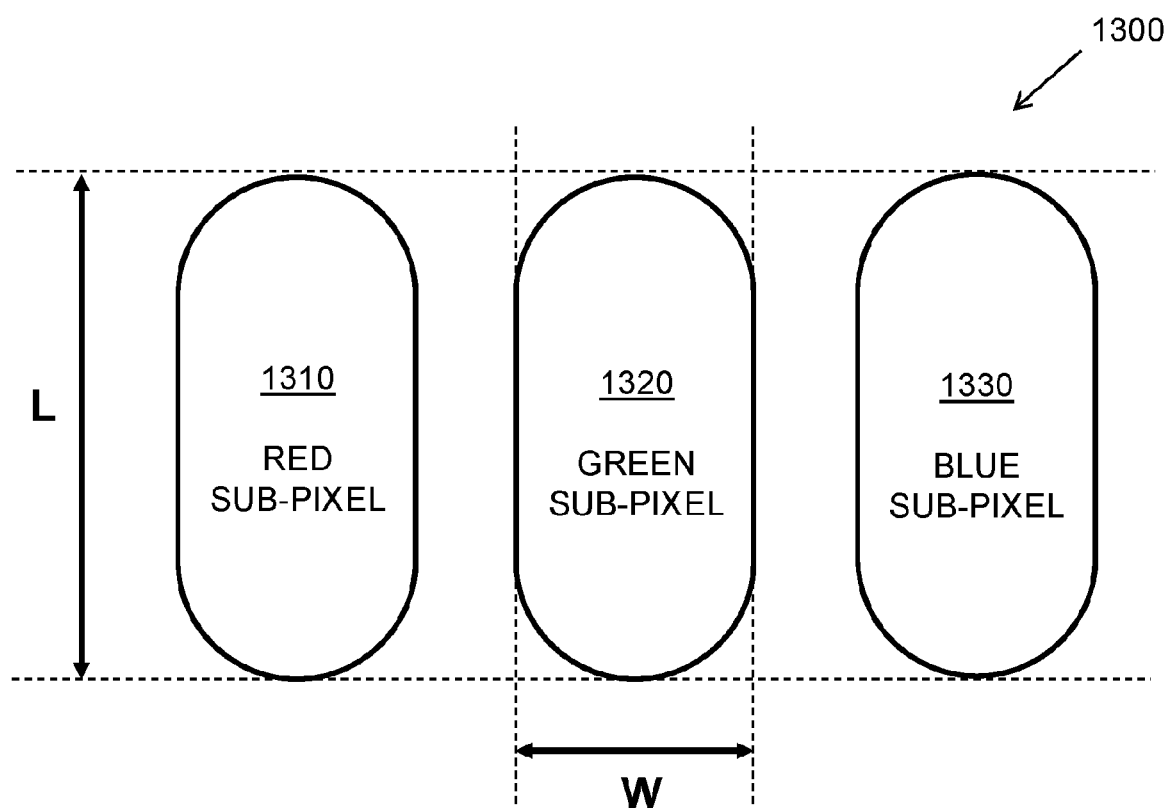
FIG. 13 depicts exemplary designs of sub-pixels.

The assembly and resultant morphologies or profiles of the assembled layers, including the first injection layer 1720, first transport layer 1725 and perovskite emissive layer 1735 may be further influenced by the dimensions of the at least one sub-pixel into which the first injection layer ink 2045, first transport layer ink 2035 and perovskite ink 1240 are inkjet printed. The dimensions of the at least one sub-pixel may be defined by the bank structure 1230. FIG. 13 depicts exemplary designs of sub-pixels. Included in FIG. 13 is an arrangement 1300 of three adjacent sub-pixels, each of length L and width W. The first sub-pixel 1310 may comprise a red sub-pixel, wherein such a red sub-pixel may comprise a red perovskite light emitting device comprising a red perovskite emissive layer 1735. The second sub-pixel 1320 may comprise a green sub-pixel, wherein such a green sub-pixel may comprise a green perovskite light emitting device comprising a green perovskite emissive layer 1735. The third sub-pixel 1330 may comprise a blue sub-pixel, wherein such a blue sub-pixel may comprise a blue perovskite light emitting device comprising a blue perovskite emissive layer 1735. A typical pixel arrangement of a commercial display may comprise a sub-pixel arrangement such as 1300.

In one embodiment, the at least one sub-pixel into which the first injection layer ink 2045, first transport layer ink 2035 and perovskite ink 1240 are inkjet printed may be of length in the range of 100 μm to 2501 μm, and of width in the range of 40 μm to 80 μm. Such ranges of sub-pixel lengths and widths correspond to the dimensions required for television displays of size approximately 55-inch to 77-inch with 4K2K pixel resolution, or more formally 3840×2160 pixel resolution, which is also referred to as ultra-high definition (UHD) resolution. In one embodiment, the at least one sub-pixel into which the first injection layer ink 2045, first transport layer ink 2035 and perovskite ink 1240 are inkjet printed may be of length in the range of 50 μm to 1501 μm, and of width in the range of 20 μm to 40 μm. Such ranges of sub-pixel lengths and widths correspond to the dimensions required for television displays of size approximately 55-inch to 77-inch with 8K pixel resolution, or more formally 7680×4320 pixel resolution, which is also referred to as 8K ultra high definition (8K UHD). In one embodiment, the at least one sub-pixel into which the first injection layer ink 2045, first transport layer ink 2035 and perovskite ink 1240 are inkjet printed may be of length in the range of 10 μm to 50 μm, and of width in the range of 5 μm to 20 μm. Such ranges of sub-pixel lengths and widths correspond to the dimensions required for smartphone displays of resolution in the approximate range of 400 to 600 pixels per inch (ppi).

The assembly and resultant thicknesses, morphologies or profiles of the assembled layers, such as the first injection layer 1720, first transport layer 1725 and perovskite emissive layer 1735 may be further influenced by the ink drop volume during the respective steps of depositing the first injection layer ink 2045, first transport layer ink 2035 and perovskite ink 1240. For example, the profile of the layers may be tuned by using a larger number of drops of lower volume, or a lower number of drops of larger volume. In one embodiment, the profile of the assembled first injection layer 1720, first transport layer 1725 and perovskite emissive layer 1735 may each be controlled by varying the ink drop volume during the respective steps of depositing the first injection layer ink 2045, first transport layer ink 2035 and perovskite ink 1240.

For larger sub-pixels, ink drops with a larger volume may be used during the steps of depositing the first injection layer ink 2045, first transport layer ink 2035 and perovskite ink 1240. In one embodiment, the hole injection layer ink drop volume may be in the range of 5 pico-liters to 15 pico-liters. In one embodiment, the hole transport layer ink drop volume may be in the range of 5 pico-liters to 15 pico-liters. In one embodiment, the perovskite ink drop volume may be in the range of 5 pico-liters to 15 pico-liters. Such a range of ink drop volumes may be suitable for inkjet printing ink into sub-pixels of length in the range of 100 μm to 250 μm, and of width in the range of 40 μm to 80 μm, as required for television displays of size approximately 55-inch to 77-inch with 4K2K pixel resolution. Such a range of ink drop volumes may also be suitable for inkjet printing ink into sub-pixels of length in the range of 50 μm to 150 μm, and of width in the range of 20 μm to 40 μm, as required for television displays of size approximately 55-inch to 77-inch with 8K pixel resolution.

For smaller sub-pixels, ink drops with a smaller volume may be used during the steps of depositing the first injection layer ink 2045, first transport layer ink 2035 and perovskite ink 1240. In one embodiment, the hole injection layer ink drop volume may be in the range of 0.5 pico-liters to 2 pico-liters. In one embodiment, the hole transport layer ink drop volume may be in the range of 0.5 pico-liters to 2 pico-liters. In one embodiment, the perovskite ink drop volume may be in the range of 0.5 pico-liters to 2 pico-liters. Such a range of ink drop volumes may be suitable for inkjet printing ink into sub-pixels of length in the range of 10 μm to 50 μm, and of width in the range of 5 μm to 20 μm, as required for smartphone displays of resolution in the approximate range of 400 to 600 pixels per inch (ppi).

The assembly and resultant thicknesses, morphologies or profiles of the assembled layers, such as the first injection layer 1720, first transport layer 1725 and perovskite emissive layer 1735 may be further influenced by the number of ink drops during the respective steps of depositing the first injection layer ink 2045, first transport layer ink 2035 and perovskite ink 1240. In one embodiment, the profiles of the assembled first injection layer 1720, first transport layer 1725 and perovskite emissive layer 1735 may be controlled by varying the number of ink drops during the respective steps of depositing the first injection layer ink 2045, first transport layer ink 2035 and perovskite ink 1240. For example, the profiles of the first injection layer 1720, first transport layer 1725 and perovskite emissive layer 1735 may be tuned by using a larger number of drops of lower volume or a lower number of drops of larger volume. In one embodiment, the total number of hole injection layer ink drops may in the range of 4 ink drops to 20 ink drops. In one embodiment, the total number of hole transport layer ink drops may be in the range of 4 ink drops to 20 ink drops. In one embodiment, the total number of perovskite ink drops may in the range of 4 ink drops to 20 ink drops. For each layer, a larger number of ink drops of lower volume may allow for the respective inks to be spread more evenly across the sub-pixel, potentially resulting in more uniform layers after vacuum drying. Conversely, for each layer, a lower number of ink drops of larger volume may allow for the respective inks to be inkjet printed more rapidly, enabling a reduced takt time during the manufacturing process.

Figure 14:
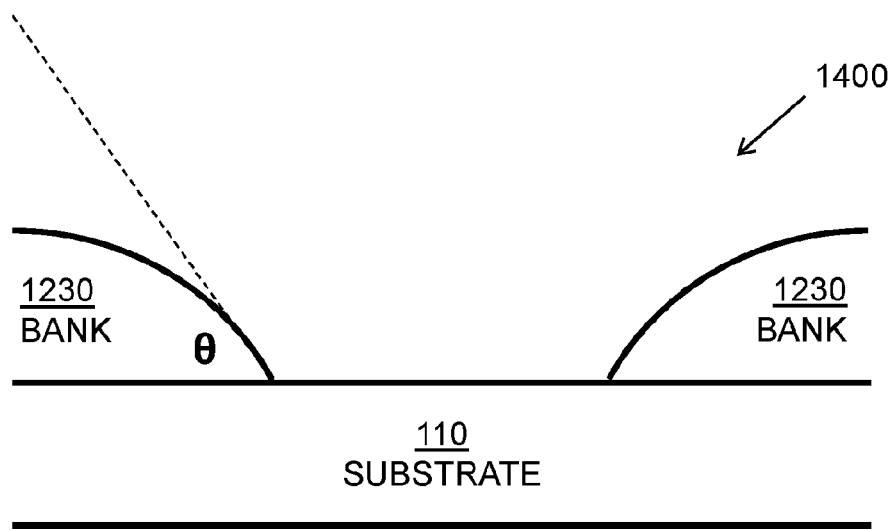
FIG. 14 depicts a cross-section of a bank structure.

The assembly and resultant thicknesses, morphologies or profiles of the assembled layers, including the first injection layer 1720, first transport layer 1725 and perovskite emissive layer 1735 may be further influenced by the bank structure 1230 used to define the at least one sub-pixel. FIG. 14 depicts arrangement 1400, which depicts a cross-section of a bank structure 1230 disposed over a substrate 110. The bank structure 1230 is disposed over the substrate 110 such that the bank structure 1230 is inclined at an angle θ at the edge of the at least one sub-pixel. In one embodiment, the profiles of the assembled layers, including the first injection layer 1720, first transport layer 1725 and perovskite emissive layer 1735 may be controlled by varying the angle of the bank structure 1230 at the edge of the at least one sub-pixel. For example, where the angle θ is lower, the first injection layer ink 2045, first transport layer ink 2035 and perovskite ink 1240 may each spread further over the bank structure 1230, which may influence the layer profiles when the respective inks are vacuum dried to assemble layers. In one embodiment, the bank structure 1230 may be provided at an angle θ in the range of 30° to 60° at the edge of the at least one sub-pixel. Such a range of angles θ may effectively contain the first injection layer ink 2045, first transport layer ink 2035 and perovskite ink 1240 within the sub-pixel, while also allowing the inks to assemble uniform layers during vacuum drying.

In one embodiment, the profiles of the assembled layers, including the first injection layer 1720, first transport layer 1725 and perovskite emissive layer 1735 may be controlled by varying the surface energy of the bank structure 1230. For example, if the surface energy of the bank structure 1230 is substantially higher than the surface energy of each of the inks, then the inks may be attracted to and spread over the surface of the bank structure 1230. However, if the surface energy of the bank structure 1230 is not substantially higher than the surface energy of each of the inks, then the inks may be repelled from and not spread over the bank structure 1230. In one embodiment, the surface energy of the bank structure 1230 may be controlled such that the lower proportion of the bank structure 1230, nearest the substrate 110, has substantially higher surface energy than each of the first injection layer ink 2045, first transport layer ink 2035 and perovskite ink 1240, while the upper proportion of the bank structure 1230, furthest away from the substrate 110, does not have substantially higher surface energy than each of the first injection layer ink 2045, first transport layer ink 2035 and perovskite ink 1240. This may enable the first injection layer ink 2045, first transport layer ink 2035 and perovskite ink 1240 to each spread evenly across the sub-pixel and remain in contact with the lower proportion of the bank structure 1230, without any de-wetting, but prevent the first injection layer ink 2045, first transport layer ink 2035 and perovskite ink 1240 from spreading over the upper proportion of the bank structure 1230 into one or more adjacent sub-pixels. The first injection layer ink 2045, first transport layer ink 2035 and perovskite ink 1240 may then assemble uniform layers after vacuum drying.

In one embodiment, method 1800 comprises an optional additional step 1880 of depositing a blocking layer 1740 over the perovskite emissive layer 1735 using a method of vapour deposition. In one embodiment, method 1800 comprises an optional additional step 1885 of depositing a second transport layer 1745 over the perovskite emissive layer 1735 using a method of vapour deposition. In one embodiment, method 1800 comprises an optional additional step 1890 of depositing a second injection layer 1750 over the perovskite emissive layer 1735 using a method of vapour deposition.

Figure 22:
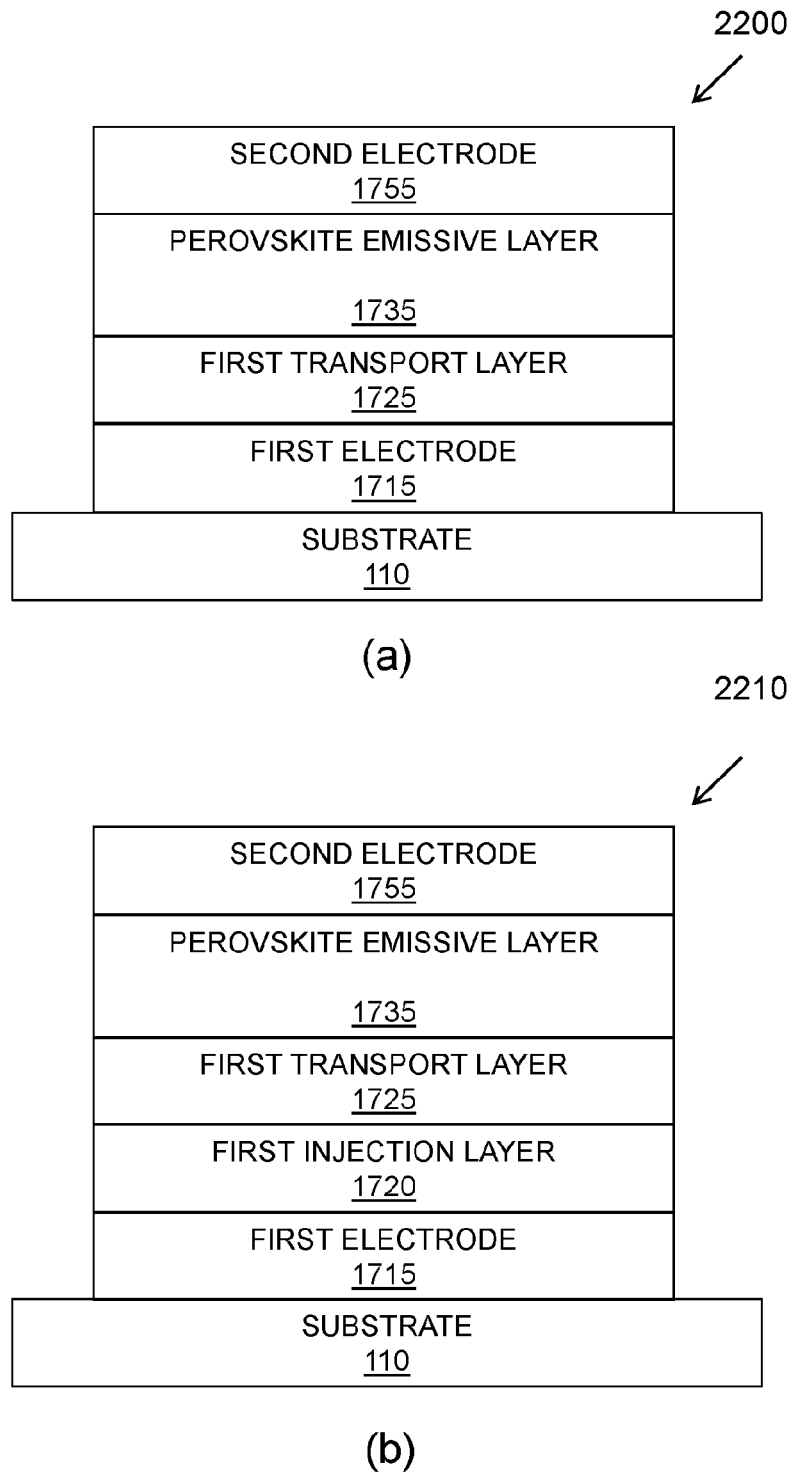
FIG. 22 depicts various layer configurations for a generic perovskite light emitting device.
Figure 22:
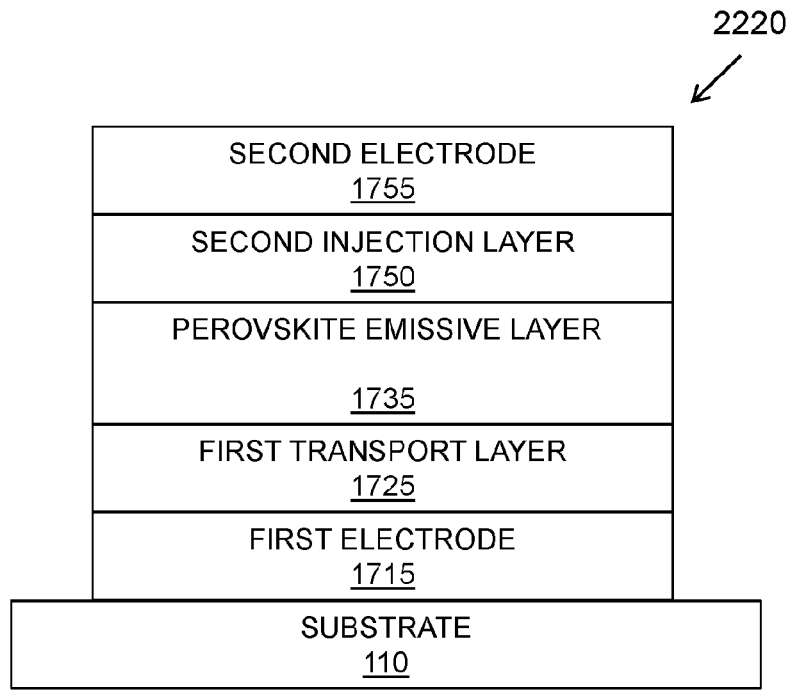
Figure 22:
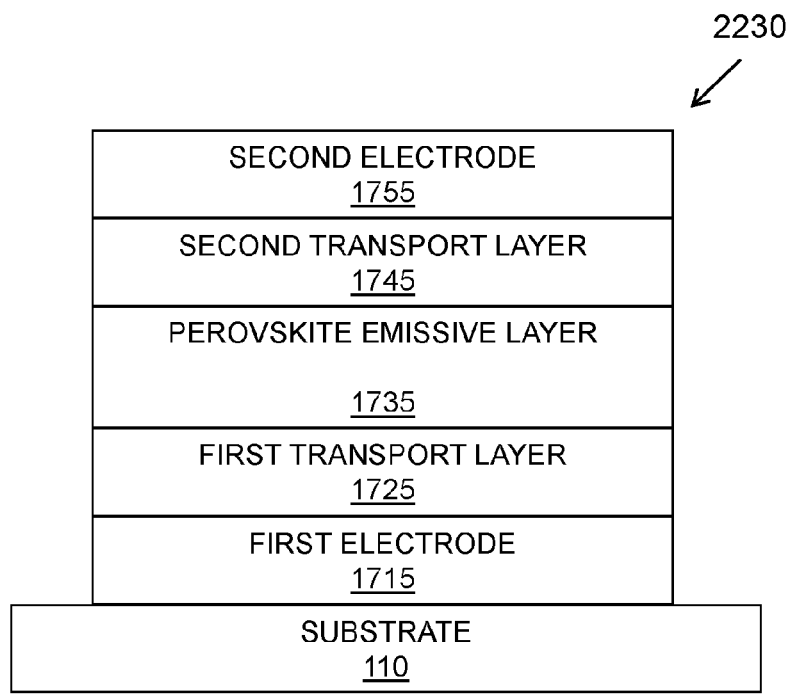
Figure 22:
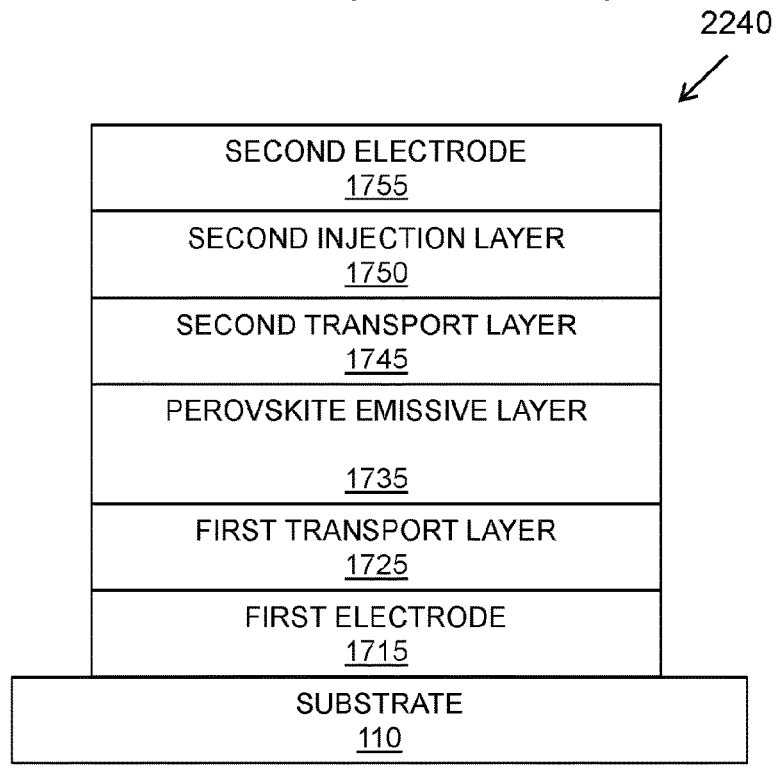
Figure 22:
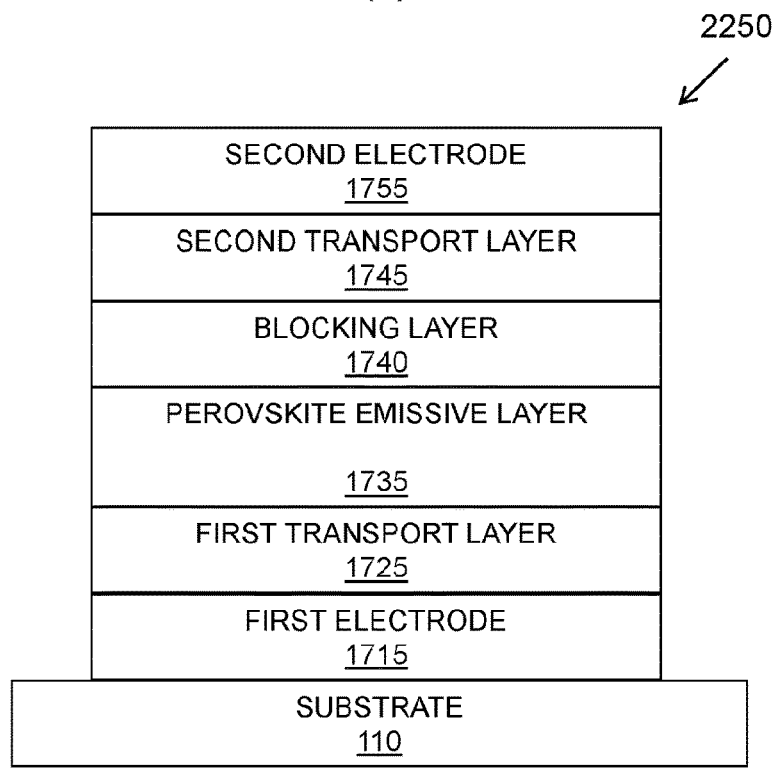
Figure 22:
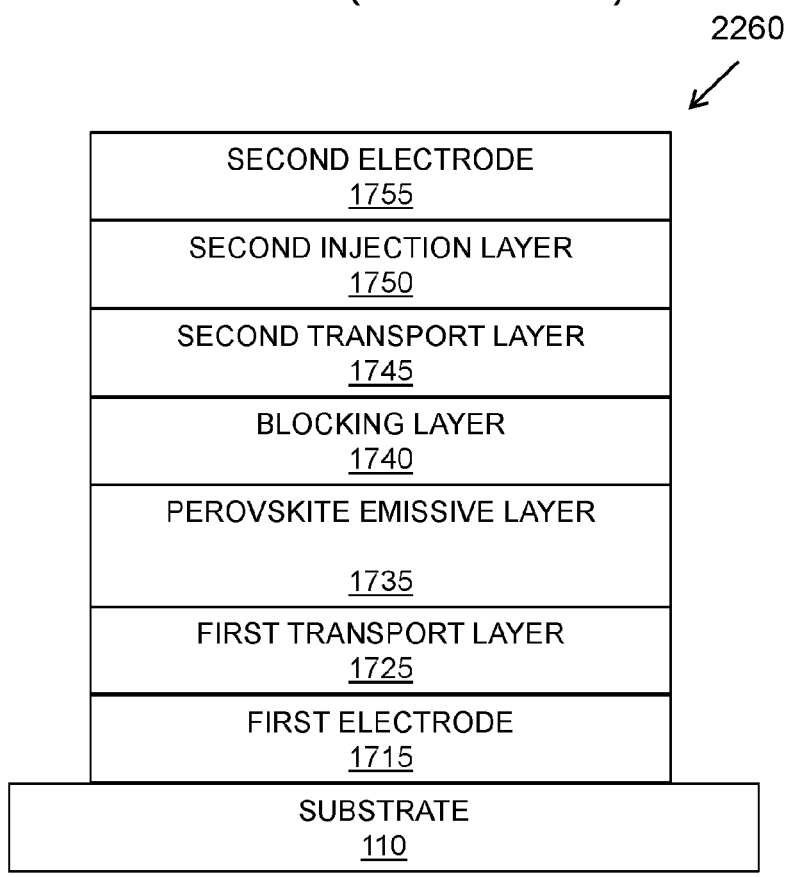

FIG. 22 depicts various layer configurations for a generic perovskite light emitting device. In one embodiment, after the step 1875 of annealing the perovskite emissive layer 1735, but before the step 1895 of depositing a second electrode 1755 over the perovskite emissive layer 1735 using a method of vapour deposition, the method 1800 further comprises the step 1890 of depositing a second injection layer 1750 over the perovskite emissive layer 1735 using a method of vapour deposition. This layer configuration is depicted by arrangement 2220 in FIG. 22c. The inclusion of an optional second injection layer 1750 may improve the injection of charge from the second electrode 1755 into the device.

In one embodiment, after the step 1875 of annealing the perovskite emissive layer 1735, but before the step 1895 of depositing a second electrode 1755 over the perovskite emissive layer 1735 using a method of vapour deposition, the method 1800 further comprises the step 1885 of depositing a second transport layer 1745 over the perovskite emissive layer 1735 using a method of vapour deposition. This layer configuration is depicted by arrangement 2230 in FIG. 22d. The inclusion of an optional second transport layer 1745 may improve transport of charge to the perovskite emissive layer 1735.

In one embodiment, after the step 1875 of annealing the perovskite emissive layer 1735, but before the step 1895 of depositing a second electrode 1755 over the perovskite emissive layer 1735 using a method of vapour deposition, the method 1800 further comprises: step 1885 of depositing a second transport layer 1745 over the perovskite emissive layer 1735 using a method of vapour deposition; and step 1890 of depositing a second injection layer 1750 over the second transport layer 1745 using a method of vapour deposition. This layer configuration is depicted by arrangement 2240 in FIG. 22e. The inclusion of an optional second transport layer 1745 and an optional second injection layer 1750 may improve the injection of charge from the second electrode 1755 into the device, and the transport of charge to the perovskite emissive layer 1735.

In one embodiment, after the step 1875 of annealing the perovskite emissive layer 1735, but before the step 1895 of depositing a second electrode 1755 over the perovskite emissive layer 1735 using a method of vapour deposition, the method 1800 further comprises: step 1880 of depositing a blocking layer 1740 over the perovskite emissive layer 1735 using a method of vapour deposition; and step 1885 of depositing a second transport layer 1745 over the blocking layer 1740 using a method of vapour deposition. This layer configuration is depicted by arrangement 2250 in FIG. 22f. The inclusion of an optional blocking layer 1740 and an optional second transport layer 1745 may improve the transport of charge to the perovskite emissive layer 1735 and reduce the leakage of charge from the perovskite emissive layer 1735.

In one embodiment, after the step 1875 of annealing the perovskite emissive layer 1735, but before the step 1895 of depositing a second electrode 1755 over the perovskite emissive layer 1735 using a method of vapour deposition, the method 1800 further comprises: step 1880 of depositing a blocking layer 1740 over the perovskite emissive layer 1735 using a method of vapour deposition; step 1885 of depositing a second transport layer 1745 over the blocking layer 1740 using a method of vapour deposition; and step 1890 of depositing a second injection layer 1750 over the second transport layer 1745 using a method of vapour deposition. This layer configuration is depicted by arrangement 2260 in FIG. 22g. The inclusion of an optional blocking layer 1740, an optional second transport layer 1745 and an optional second injection layer 1750 may improve the injection of charge from the second electrode 1755 into the device, the transport of charge to the perovskite emissive layer 1735 and reduce the leakage of charge from the perovskite emissive layer 1735.

Figure 24:
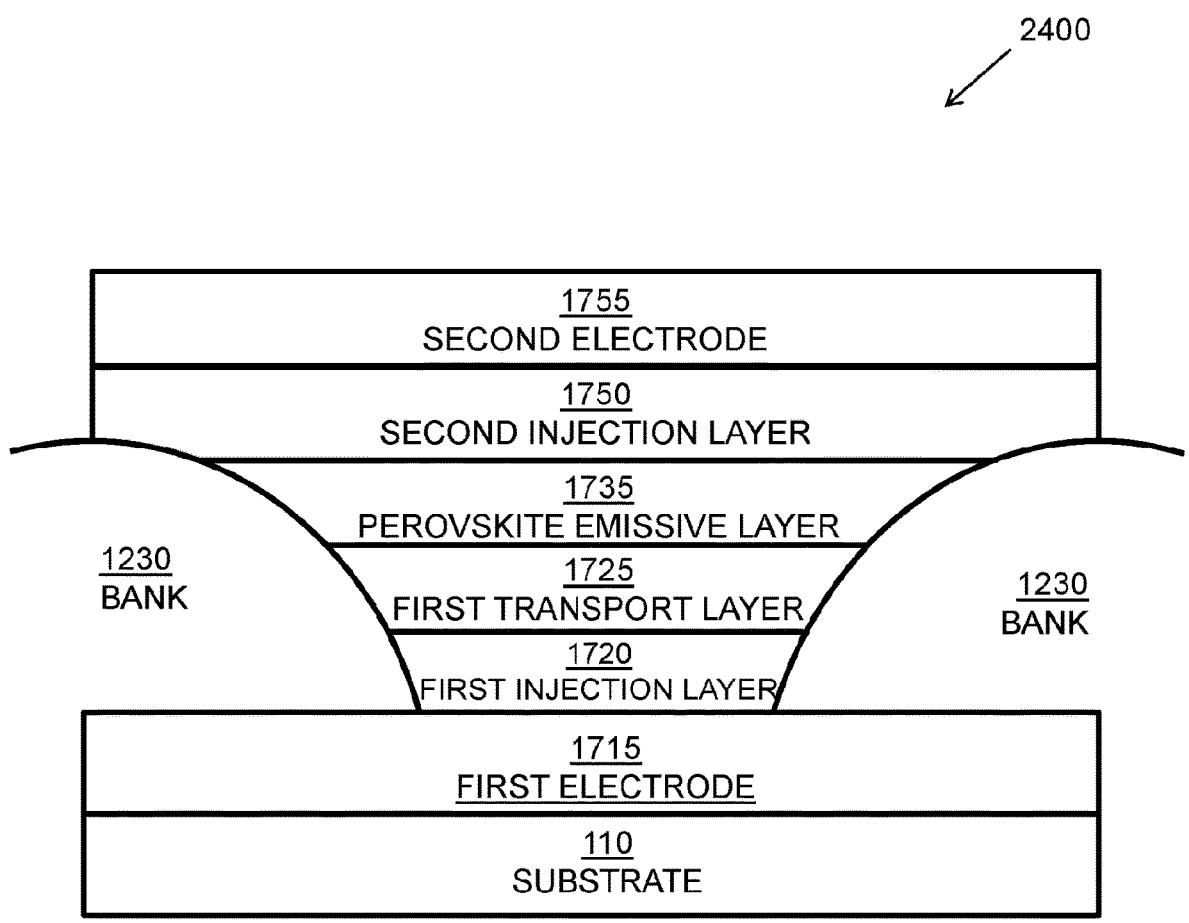
FIG. 24 depicts a cross-section of an exemplary generic perovskite light emitting device.

The present invention relates to a method 1800 of fabricating a perovskite light emitting device. The present invention further relates to perovskite light emitting devices fabricated using the disclosed method. FIG. 24 depicts a cross-section of an exemplary perovskite light emitting device 2400 that may be fabricated using the disclosed method. The perovskite light emitting device 2400 comprises a substrate 110, a first electrode 1715, a first injection layer 1720, a first transport layer 1725, a perovskite emissive layer 1735, a second injection layer 1750 and a second electrode 1755. The perovskite light emitting device 2400 further comprises a bank structure 1230. The perovskite light emitting device 2400 is one example of a perovskite light emitting device that may be fabricated using the disclosed method 1800. Additional perovskite light emitting device architectures may also be fabricated using method 1800, and these additional device architectures are also covered by this disclosure.

In one embodiment of the disclosed method, the first electrode is an anode, the first injection layer, where included, is a hole injection layer, the first transport layer is a hole transport layer, the blocking layer, where included, is a hole blocking layer, the second transport layer, where included, is an electron transport layer, the second injection layer, where included, is an electron injection layer and the second electrode is a cathode, such that the perovskite light emitting device is a standard perovskite light emitting device.

Figure 10:
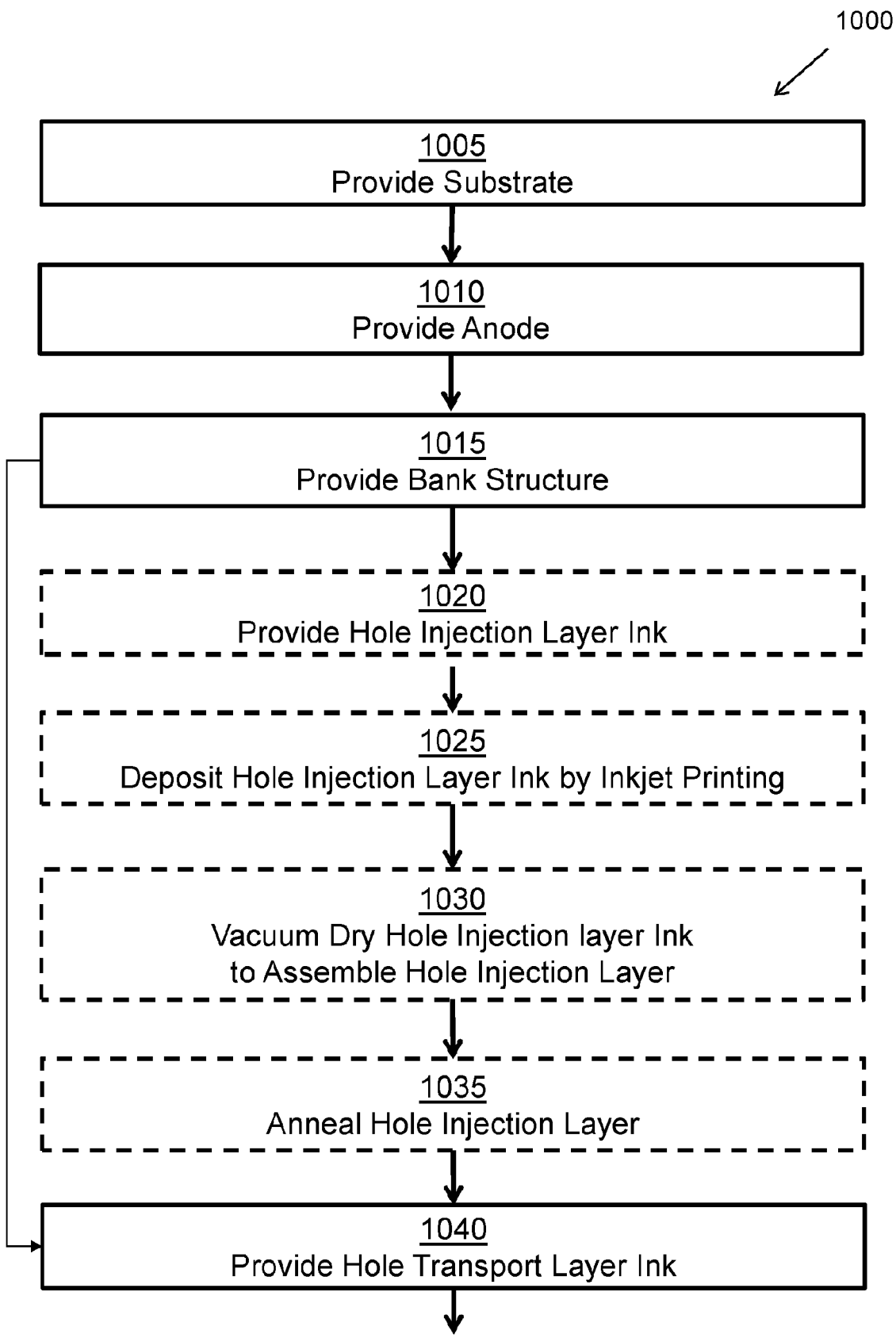
FIG. 10 depicts a process flow for a method for fabricating a standard perovskite light emitting device.
Figure 10:
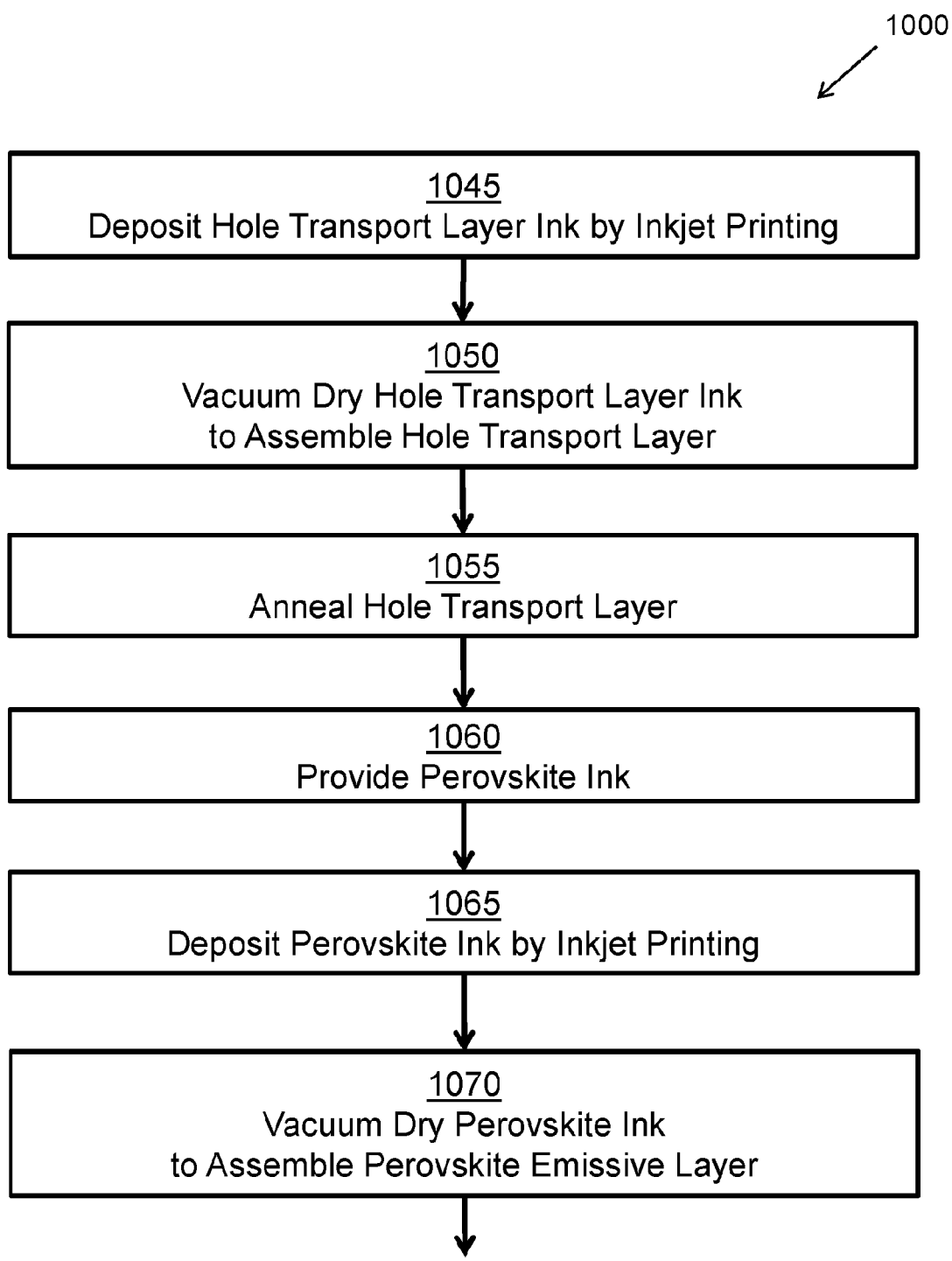
Figure 10:
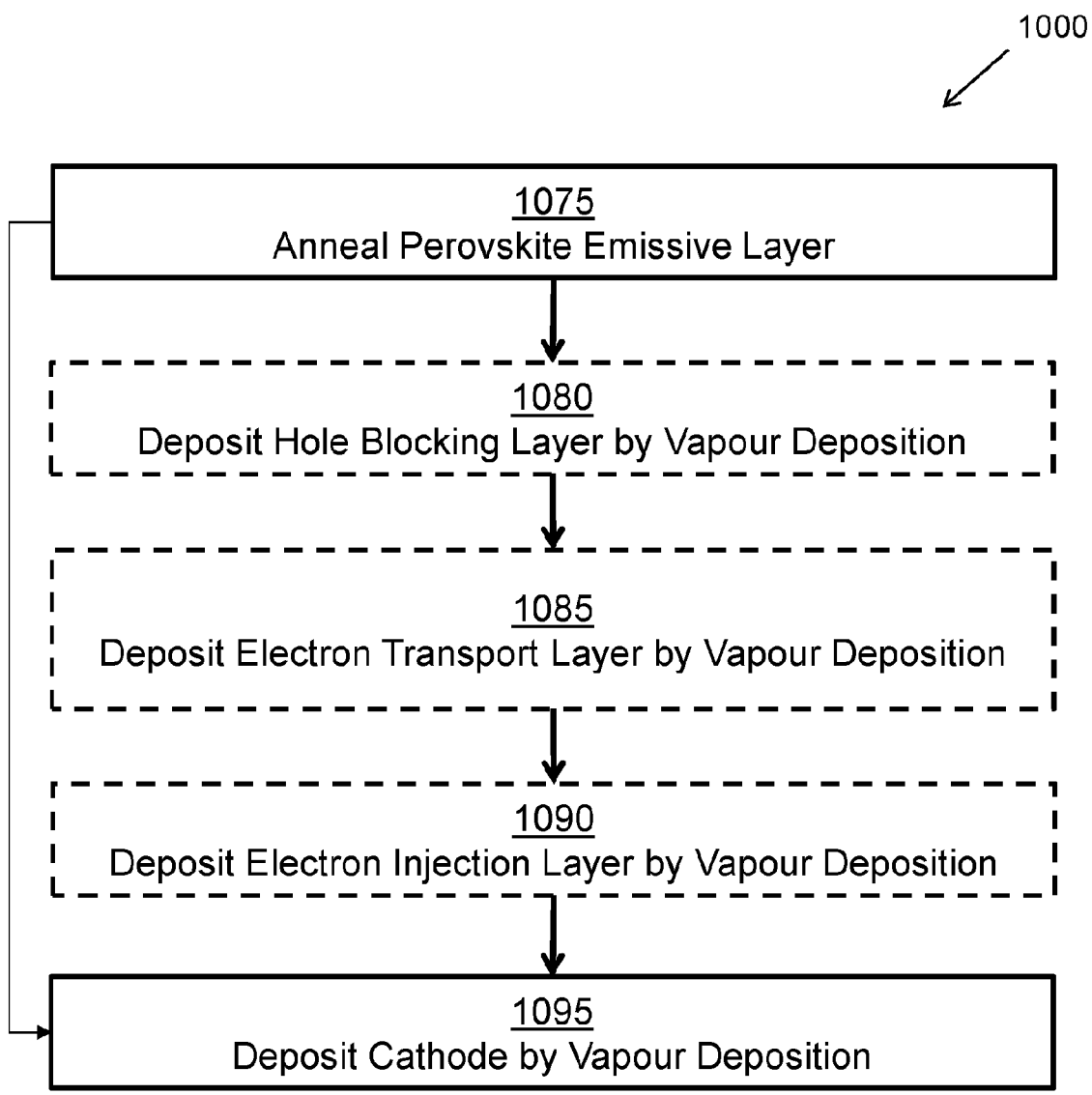

FIG. 10 depicts a method 1000 for fabricating a perovskite light emitting device. The method 1000 comprises: step 1005 of providing a substrate, which is labelled "Provide Substrate"; step 1010 of providing an anode disposed over the substrate, which is labelled "Provide Anode"; step 1015 of providing a bank structure disposed over the substrate, wherein the bank structure is patterned so as to define at least one sub-pixel on the substrate, which is labelled "Provide Bank Structure"; step 1040 of providing a hole transport layer ink, wherein the hole transport layer ink comprises at least one solvent and at least one hole transport material mixed in the at least one solvent, which is labelled "Provide Hole Transport Layer Ink"; step 1045 of depositing the hole transport layer ink into the at least one sub-pixel over the anode using a method of inkjet printing, which is labelled "Deposit Hole Transport Layer Ink by Inkjet Printing"; step 1050 of vacuum drying the hole transport layer ink inside a vacuum drying chamber to assemble a hole transport layer over the anode in the at least one sub-pixel, which is labelled "Vacuum Dry Hole Transport Layer Ink to Assemble Hole Transport Layer; step 1055 of annealing the hole transport layer, which is labelled "Anneal Hole Transport Layer"; step 1060 of providing a perovskite ink, wherein the perovskite ink comprises at least one solvent and at least one perovskite light emitting material mixed in the at least one solvent, which is labelled "Provide Perovskite Ink"; step 1065 of depositing the perovskite ink into the at least one sub-pixel over the hole transport layer using a method of inkjet printing, which is labelled "Deposit Perovskite Ink by Inkjet Printing"; step 1070 of vacuum drying the perovskite ink inside a vacuum drying chamber to assemble a perovskite emissive layer over the hole transport layer in the at least one sub-pixel, which is labelled "Vacuum Dry Perovskite Ink to Assemble Perovskite Emissive Layer; step 1075 of annealing the perovskite emissive layer, which is labelled "Anneal Perovskite Emissive Layer; and step 1095 of depositing a cathode over the perovskite emissive layer using a method of vapour deposition, which is labelled "Deposit Cathode by Vapour Deposition".

Optionally, method 1000 comprises the additional steps: 1020 of providing a hole injection layer ink, wherein the hole injection layer ink comprises at least one solvent and at least one hole injection material mixed in the at least one solvent, which is labelled "Provide Hole Injection Layer Ink"; step 1025 of depositing the hole injection layer ink into the at least one sub-pixel over the anode using a method of inkjet printing, which is labelled "Deposit Hole Injection Layer Ink by Inkjet Printing"; step 1030 of vacuum drying the hole injection layer ink inside a vacuum drying chamber to assemble a hole injection layer over the anode in the at least one sub-pixel, which is labelled "Vacuum Dry Hole Injection Layer Ink to Assemble Hole Injection Layer; and step 1035 of annealing the hole injection layer, which is labelled "Anneal Hole Injection Layer".

The optional additional steps 1020, 1025, 1030 and 1035 are marked by boxes outlined with dashed lines in FIG. 10. The dashed lines represent that the additional steps 1020, 1025, 1030 and 1035 are optional steps in method 1000. In contrast, boxes outlined with a solid line in FIG. 10 are not optional steps in method 1000. Arrangement 1500 in FIG. 15*a* depicts an exemplary perovskite light emitting device fabricated using method 1000, without the inclusion of the optional steps 1020, 1025, 1030 and 1035. The perovskite light emitting device in arrangement 1500 therefore does not include an optional hole injection layer 120. Arrangement 1510 in FIG. 15*b* depicts an exemplary perovskite light emitting device fabricated using method 1000, with the inclusion of the optional steps 1020, 1025, 1030 and 1035. The perovskite light emitting device in arrangement 1510 therefore includes an optional hole injection layer 120.

Optionally, method 1000 further comprises the additional steps: 1080 of depositing a hole blocking layer over the perovskite emissive layer using a method of vapour deposition, which is labelled "Deposit Hole Blocking Layer by Vapour Deposition"; step 1085 of depositing an electron transport layer over the perovskite emissive layer using a method of vapour deposition, which is labelled "Deposit Electron Transport Layer by Vapour Deposition"; and step 1090 of depositing an electron injection layer over the perovskite emissive layer using a method of vapour deposition, which is labelled "Deposit Electron Injection Layer by Vapour Deposition". The optional additional steps 1080, 1085 and 1090 are marked by boxes outlined with dashed lines in FIG. 10. The dashed lines represent that the additional steps 1080, 1085 and 1090 are optional steps in method 1000. In contrast, boxes outlined with a solid line in FIG. 10 are not optional steps in method 1000.

Figure 12:
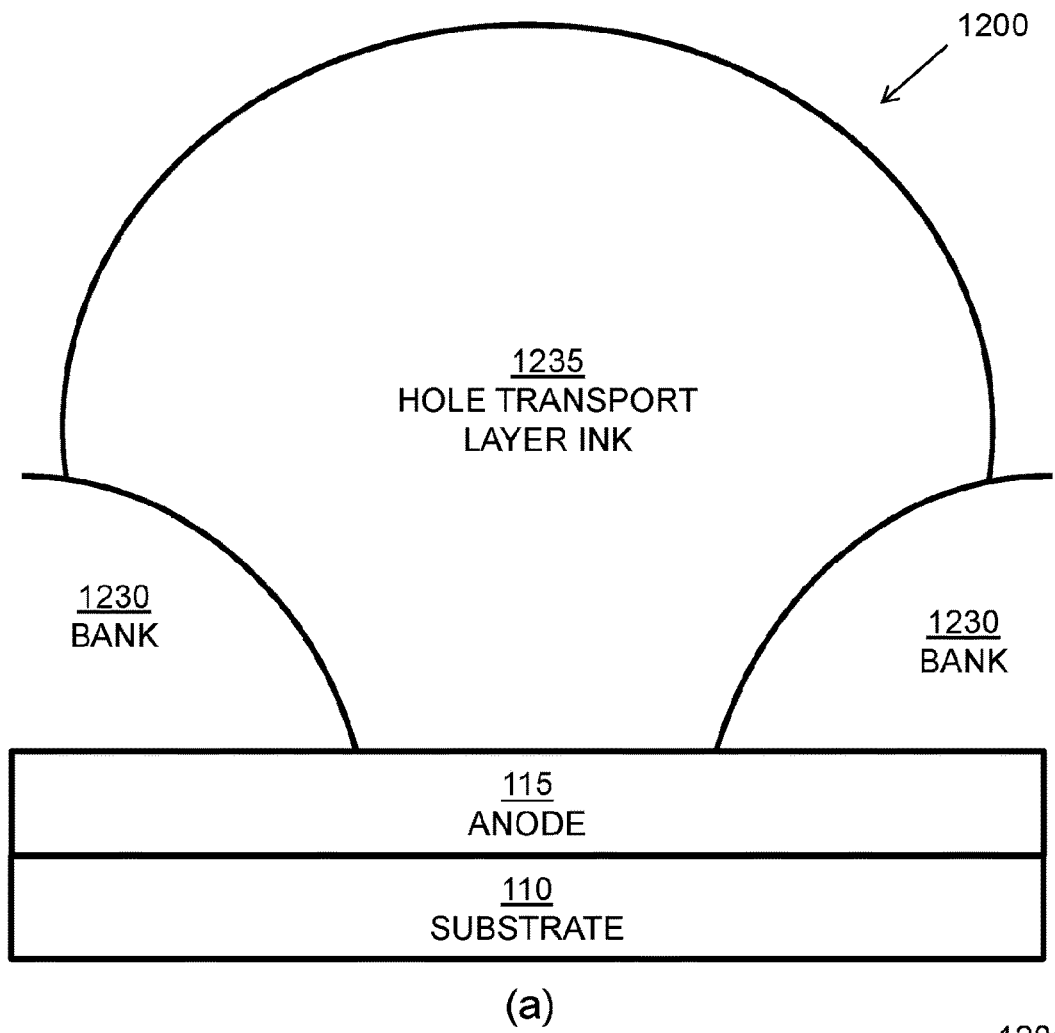
FIG. 12 depicts the assembly of various device layers of a standard perovskite light emitting device from various inks.
Figure 12:
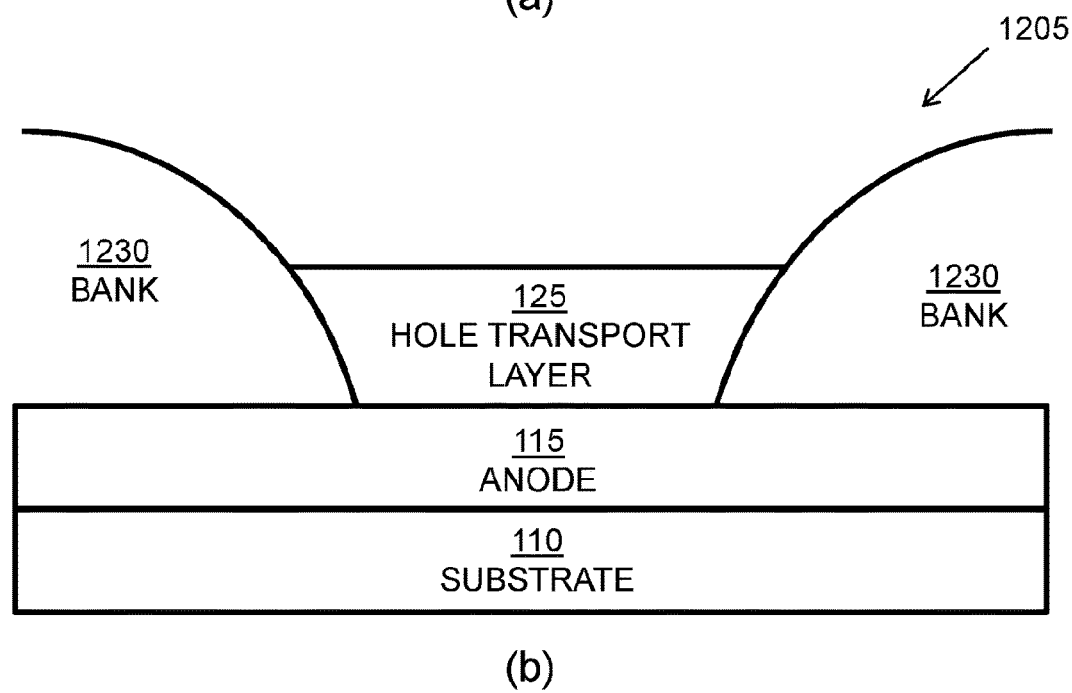
Figure 12:
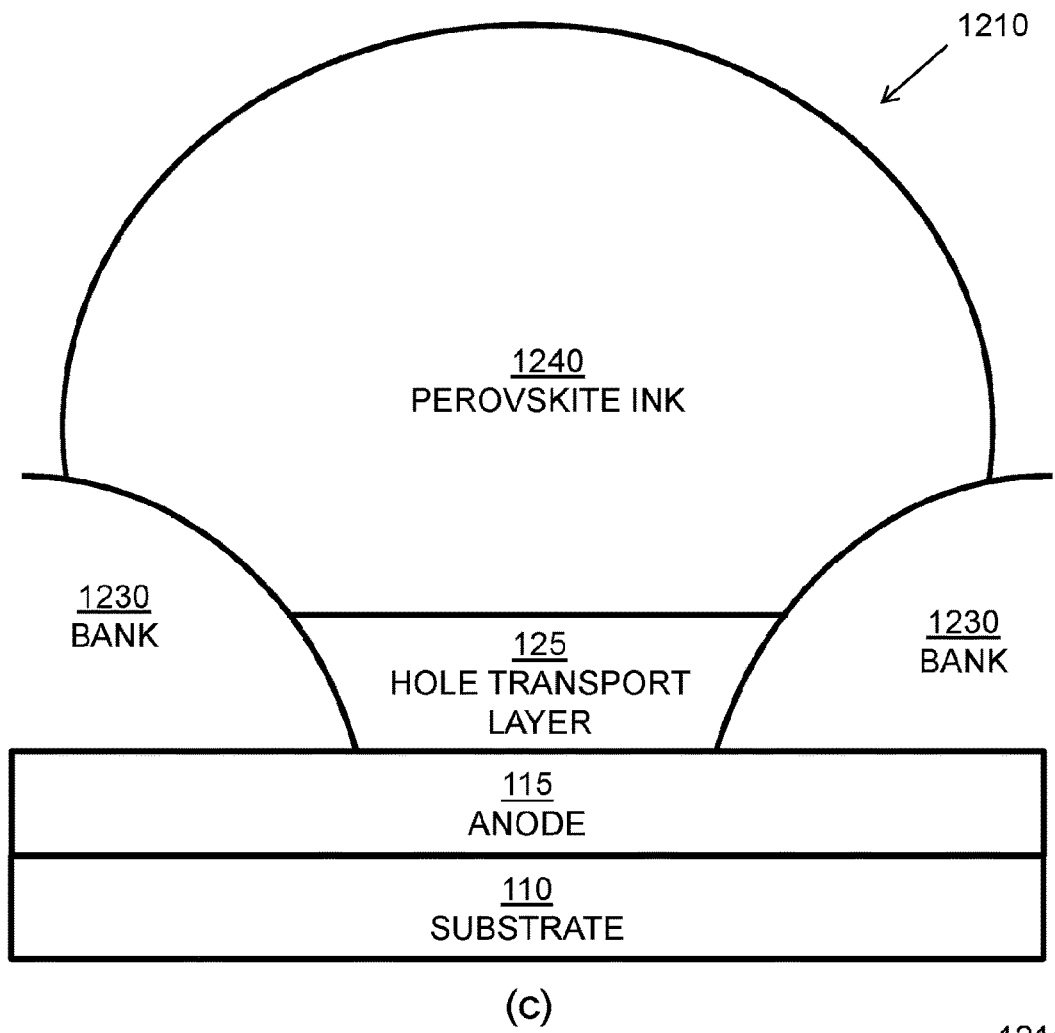
Figure 12:
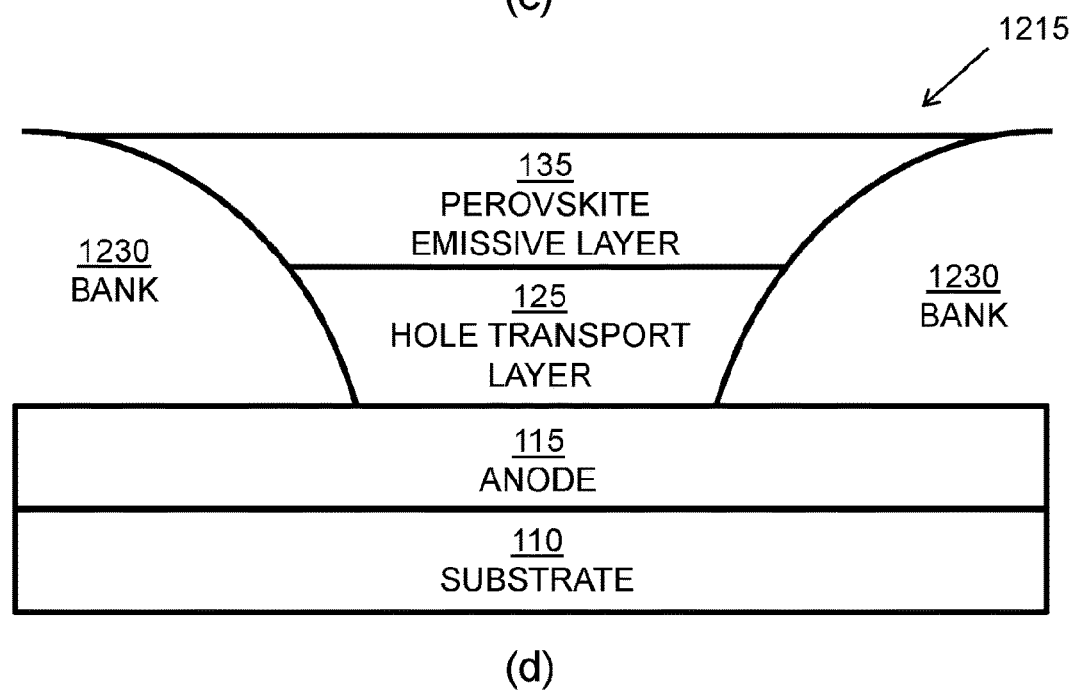
Figure 12:
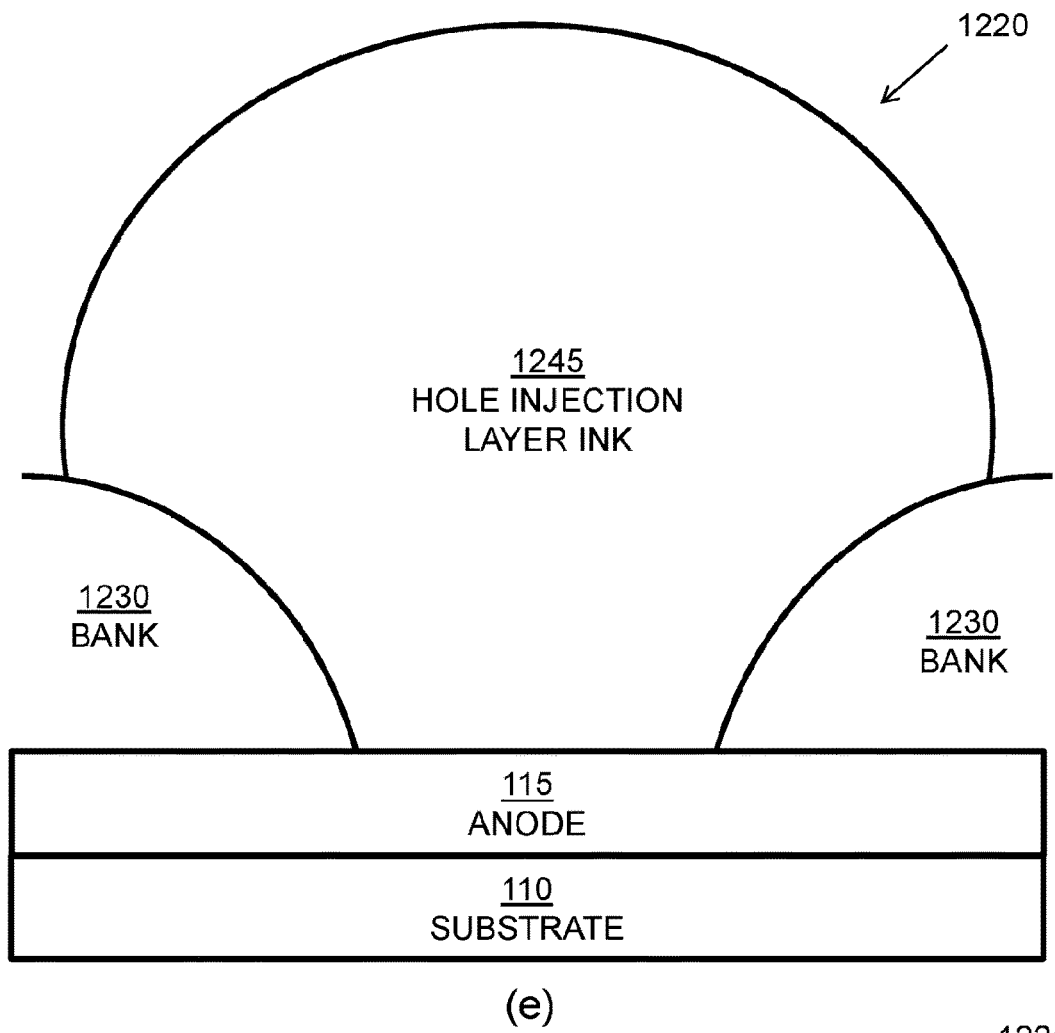
Figure 12:
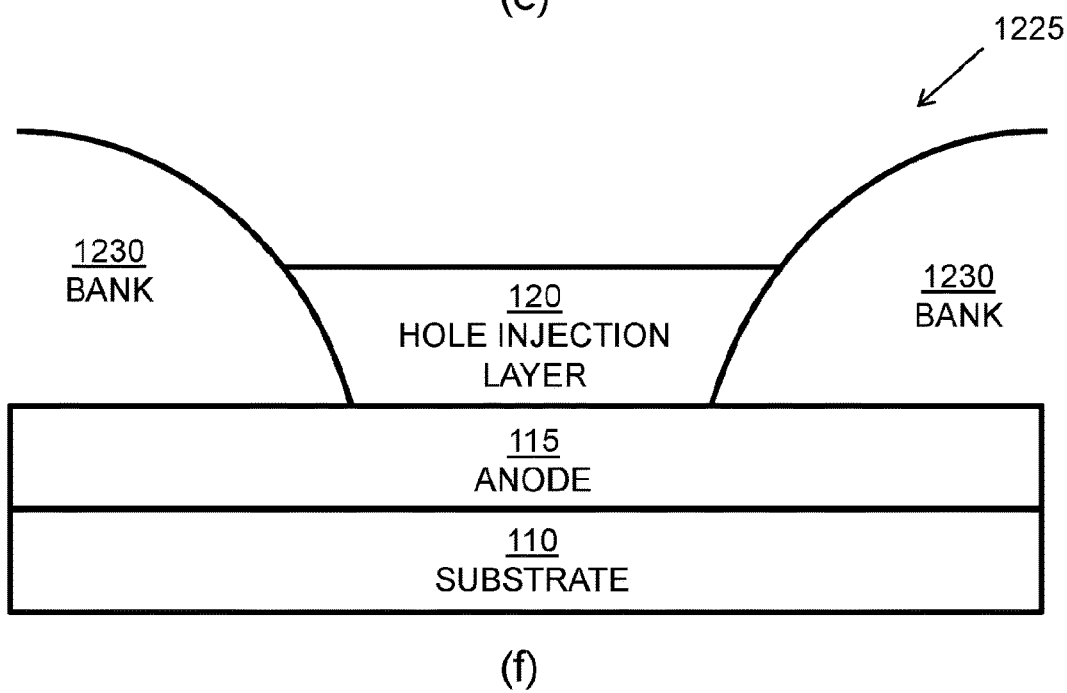

Method 1000 may be further understood with reference to FIG. 11, which depicts exemplary vacuum drying curves 1110 and 1120 that may be applied during steps 1030, 1050 and 1070, as well as with reference to FIG. 4, which depicts a standard perovskite light emitting device and with reference to FIG. 12, which depicts the assembly of various device layers of a standard perovskite light emitting device from various inks.

Method 1000 comprises a step 1005 of providing a substrate 110. The substrate 110 may be rigid or flexible. The substrate 110 may be flat or curved. The substrate 110 may be transparent, translucent or opaque. Preferred substrate 110 materials are glass, plastic and metal foil. Method 1000 further comprises a step 1010 of providing an anode 115 disposed over the substrate 110. The anode 115 may be transparent, enabling a bottom-emission device architecture or reflective, enabling a top-emission device architecture. Method 1000 further comprises a step 1015 of providing a bank structure 1230 disposed over the substrate 110, wherein the bank structure 1230 is patterned so as to define at least one sub-pixel on the substrate 110. The bank structure 1230 defines the area into which the hole transport layer ink 1235, the perovskite ink 1240, and optionally the hole injection layer ink 1245, may be inkjet printed and contained. For a display, the defined area may correspond to a sub-pixel of the display.

Method 1000 further comprises a step 1040 of providing a hole transport layer ink 1235, wherein the hole transport layer ink 1235 comprises at least one solvent and at least one hole transport material mixed in the at least one solvent. The at least one solvent is needed to solubilize the at least one hole transport material to form a hole transport ink 1235 that can be inkjet printed. Method 1000 further comprises a step 1045 of depositing the hole transport layer ink 1235 into the at least one sub-pixel over the anode 115 using a method of inkjet printing.

Arrangement 1200 in FIG. 12a depicts a hole transport layer ink 1235 that has been deposited into the at least one sub-pixel over the anode 115 using a method of inkjet printing. The sub-pixel is defined by a bank structure 1230. Inkjet printing has several advantages over other deposition techniques. Inkjet printing is readily compatible with manufacturing processes for displays. Ink droplets may be printed uniformly with high accuracy and at high speed across large area substrates. Ink droplets may be printed on demand with no more than the necessary ink volume for each layer deposited into each sub-pixel, resulting in substantially higher material utilization than for vacuum deposition processes. In one embodiment, the step 1045 of depositing the hole transport layer ink 1235 into the at least one sub-pixel over the anode 115 by inkjet printing is performed in an atmosphere of air. In one embodiment, the step 1045 of depositing the hole transport layer ink 1235 into the at least one sub-pixel over the anode 115 by inkjet printing is performed in an atmosphere of nitrogen.

Method 1000 further comprises a step 1050 of vacuum drying the hole transport layer ink 1235 inside a vacuum drying chamber to assemble a hole transport layer 125 over the anode 115 in the at least one sub-pixel. The process of vacuum drying the hole transport layer ink 1235 can be understood with reference to FIG. 12a and FIG. 12b. Arrangement 1200 in FIG. 12a depicts the status of method 1000 after step 1045, but before step 1050. That is to say, arrangement 1200 depicts the status before the step of vacuum drying the hole transport layer ink 1235. During step 1050, the arrangement 1200 is transferred to a vacuum drying chamber. Within the vacuum drying chamber, ambient pressure is reduced to extract one or more solvents from the hole transport layer ink 1235. This causes the hole transport layer ink 1235 to contract and solidify to assemble a hole transport layer 125. Arrangement 1205 in FIG. 12b depicts the status of method 1000 after step 1050. That is to say, arrangement 1205 depicts the status after the step of vacuum drying the hole transport layer ink 1235. After vacuum drying, one or more solvents have been extracted from the hole transport layer ink 1235, and a hole transport layer 125 has been assembled.

Vacuum drying has several advantages over other layer assembly techniques. For example, the rate at which one or more solvents are extracted from the hole transport layer ink 1235 may be controlled by varying the rate at which pressure is reduced in a vacuum drying chamber. This enables both the profile and morphology of the assembled hole transport layer 125 to be controlled by varying the rate of vacuum drying of the hole transport layer ink 1235. Using an external factor, such as ambient pressure, to control the morphology and profile of the hole transport layer 125 is advantageous compared to spincoat techniques, such as those disclosed in Wang et al. because the hole transport layer 125 properties may be controlled more precisely and with greater reproducibility.

Vacuum drying enables hole transport layers 125 to be assembled rapidly across large area substrates 110, as required in the manufacturing process for displays, where takt times are typically of order 90-120 seconds. This cannot be achieved by alternative drying processes such as annealing a hole transport layer ink 1235 to assemble a hole transport layer 125, which is the method that has been used in all previous work on perovskite light emitting devices. As disclosed herein, an additional step 1055 of annealing the hole transport layer 125 after it has been assembled by a step 1050 of vacuum drying is advantageous. Such an additional annealing step 1055 would not assemble the hole transport layer 125 from the hole transport layer ink 1235 because the hole transport layer 125 would already have been assembled during the vacuum drying step 1050. Such an additional annealing step 1055 would instead remove residual solvent from the assembled hole transport layer 125 and optimize the morphology of the hole transport layer 125.

The process of vacuum drying may be further understood with reference to FIG. 11, which depicts two exemplary vacuum drying curves 1110 and 1120, which may be applied during step 1050.

In one embodiment, during the step 1050 of vacuum drying the hole transport layer ink 1235, the pressure inside the vacuum drying chamber may be reduced to less than or equal to 0.0001 mbar. By reducing the pressure to less than or equal to 0.0001 mbar, one or more solvents may be extracted from the hole transport layer ink 1235 to assemble a hole transport layer 125. Furthermore, by reducing the pressure to less than or equal to 0.0001 mbar, very little residual solvent may remain in the hole transport layer 125 after step 1050.

In one embodiment, during the step 1050 of vacuum drying the hole transport layer ink 1235, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1050 of vacuum drying the hole transport layer ink 1235, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1050 of vacuum drying the hole transport layer ink 1235 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1050 of vacuum drying the hole transport layer ink 1235 may include additional time for processes such as transfer and alignment of the substrate 110, but such additional time is not included in the foregoing discussion of vacuum drying process times.

Preferably, during the step 1050 of vacuum drying the hole transport layer ink 1235 to assemble the first transport layer 125, the ambient temperature inside the vacuum drying chamber is 50° C. or less, optionally 30° C. or less. This low temperature ensures that the hole transport layer ink 1235 does not dry prematurely to assemble a non-uniform hole transport layer 125 during transfer of the substrate 110 into the vacuum drying chamber. For example, if the ambient temperature inside the vacuum drying chamber were higher than approximately 50° C., the hole transport layer ink 1235 disposed over the area of the substrate 110 that enters the vacuum chamber first would begin to dry before the hole transport layer ink 1235 disposed over the area of the substrate 110 that enters the vacuum chamber last. This would result in an imbalance of vapour pressure and evaporation rate of the hole transport layer ink 1235 across the substrate 110 and the assembly of a non-uniform hole transport layer 125 with reduced optoelectronic performance.

The rate at which ambient pressure is reduced may be tuned according to the required hole transport layer 125 morphology and profile. The rate at which ambient pressure is reduced may also be tuned according to other additional factors that may influence the assembly and resultant morphology and profile of the hole transport layer 125. Such additional factors may include solid content of the hole transport layer ink, sub-pixel dimensions, volume of the hole transport layer ink drops, number of the hole transport layer ink drops and bank structure 1230 design. The ability to tune the rate at which ambient pressure is reduced during step 1050 in the disclosed method 1000 enables greater control over the assembly and resultant morphology and profile of a hole transport layer 125 compared to alternative self-assembly processes, such as those described in Wang et al. This results in improved perovskite light emitting device performance.

Method 1000 further comprises a step 1055 of annealing the hole transport layer 125. By annealing the hole transport layer 125, any residual solvent may be removed from the hole transport layer 125. Furthermore, by annealing the hole transport layer 125, the thickness, morphology or profile of the hole transport layer 125 may be defined by any movement of the hole transport layer 125 during extraction of any residual solvent during the annealing process. In one embodiment, the hole transport layer 125 may be a cross-linked layer, and after the step 1055 of annealing the hole transport layer, the hole transport layer 125 may be cross-linked. In one embodiment, the step 1055 of annealing the hole transport layer 125 may be performed in an atmosphere of nitrogen. Such a nitrogen atmosphere may be preferred for the annealing process because one or more materials within the hole transport layer 125 may be susceptible to oxidation and degradation when annealed in an atmosphere of air.

In one embodiment, during the step 1055 of annealing the hole transport layer 125, the annealing temperature may be in the range of 100° C. to 220° C. Such a range annealing of temperatures may effectively enable any residual solvent to be removed from the hole transport layer 125. In one embodiment, the step 1055 of annealing the hole transport layer 125 may be performed in a different chamber to the vacuum drying chamber. In one embodiment, the step 1055 of annealing the hole transport layer 125 may be performed in the same chamber as the vacuum drying chamber. In one embodiment, the step 1055 of annealing the hole transport layer 125 may be performed during the step 1050 of vacuum drying the hole transport layer ink 1235.

Preferably, the step 1055 of annealing the hole transport layer 125 is performed in a different step to the step 1050 of vacuum drying the hole transport layer ink 1235. Preferably, the step 1055 of annealing the hole transport layer 125 is performed in a different chamber to the step 1050 of vacuum drying the hole transport layer ink 1235. Preferably, the step 1055 of annealing the hole transport layer 125 is performed in a different step and in a different chamber to the step 1050 of vacuum drying the hole transport layer ink 1235. This enables the vacuum drying step 1050 to be performed at an ambient temperature of 50° C. or less, optionally 30° C. or less, which as described herein, ensures the hole transport layer ink 1235 does not dry prematurely to assemble a non-uniform hole transport layer 125 during transfer of the substrate 110 into the vacuum drying chamber. Furthermore, process times for the step 1050 of vacuum drying the hole transport layer ink 1235 and the step 1055 of annealing the hole transport layer 125 may be individually optimized. For example, a typical optimized vacuum drying step 1050 may be expected to be 90-120 seconds, whereas a typical optimized annealing step 1055 may be expected to be in the range of 10-30 minutes, such that multiple substrates are required to be loaded into a single annealing chamber to ensure a steady process flow for manufacturing displays. Separating the step 1050 of vacuum drying and the step 1055 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform hole transport layers 125 with reduced optoelectronic performance and a non-optimized manufacturing process flow with higher cost.

Method 1000 further comprises a step 1060 of providing a perovskite ink 1240, wherein the perovskite ink 1240 comprises at least one solvent and at least one perovskite light emitting material mixed in the at least one solvent. The at least one solvent is needed to solubilize the at least one perovskite light emitting material to form a perovskite ink 1240 that can be inkjet printed.

Method 1000 further comprises a step 1065 of depositing the perovskite ink 1240 into the at least one sub-pixel over the hole transport layer 125 using a method of inkjet printing. Inkjet printing allows for inks for red, green and blue emissive layers to be deposited within different sub-pixels of a display, without the need for expensive fine metal masks that would be required for patterning red, green and blue emissive layers within different sub-pixels of a display using vapour deposition processes. The inkjet printing process may be performed in an atmosphere of air or nitrogen, avoiding the need for expensive vacuum chambers, as required to deposit layers using vapour deposition processes.

Arrangement 1210 in FIG. 12c depicts a perovskite ink 1240 that has been deposited into the at least one sub-pixel over a hole transport layer 125 using a method of inkjet printing. The sub-pixel is defined by a bank structure 1230. In one embodiment, the step of depositing the perovskite ink 1240 into the at least one sub-pixel over the hole transport layer 125 by inkjet printing is performed in an atmosphere of air. In one embodiment, the step 1065 of depositing the perovskite ink 1240 into the at least one sub-pixel over the hole transport layer 125 by inkjet printing is performed in an atmosphere of nitrogen.

Method 1000 further comprises a step 1070 of vacuum drying the perovskite ink 1240 inside a vacuum drying chamber to assemble a perovskite emissive layer 135 over the hole transport layer 125 in the at least one sub-pixel. The process of vacuum drying the perovskite ink 1240 can be understood with reference to FIG. 12c and FIG. 12d. Arrangement 1210 in FIG. 12c depicts the status of method 1000 after step 1065, but before step 1070. That is to say, arrangement 1210 depicts the status before the step of vacuum drying the perovskite ink 1240. During step 1070, the arrangement 1210 is transferred to a vacuum drying chamber. Within the vacuum drying chamber, ambient pressure is reduced to extract one or more solvents from the perovskite ink 1240. This causes the perovskite ink 1240 to contract and solidify to assemble a perovskite emissive layer 135. Arrangement 1215 in FIG. 12*d* depicts the status of method 1000 after step 1070. That is to say, arrangement 1215 depicts the status after the step of vacuum drying the perovskite ink 1240. After vacuum drying, one or more solvents have been extracted from perovskite ink 1240, and a perovskite emissive layer 135 has been assembled.

Vacuum drying has several advantages over other layer assembly techniques. For example, the rate at which one or more solvents are extracted from the perovskite ink 1240 may be controlled by varying the rate at which pressure is reduced in a vacuum drying chamber. This enables both the profile and morphology of the assembled perovskite emissive layer 135 to be controlled by varying the rate of vacuum drying of the perovskite ink 1240. Using an external factor, such as ambient pressure, to control the morphology and profile of the perovskite emissive layer 135 is advantageous compared to spincoat techniques, such as those disclosed in Wang et al. because the perovskite emissive layer 135 properties may be controlled more precisely and with greater reproducibility.

Vacuum drying enables perovskite emissive layers 135 to be assembled rapidly across large area substrates 110, as required in the manufacturing process for displays, where takt times are typically of order 90-120 seconds. This cannot be achieved by alternative drying processes such as annealing a perovskite ink 1240 to assemble a perovskite emissive layer 135, which is the method that has been used in all previous work on perovskite light emitting devices. As disclosed herein, an additional step 1075 of annealing the perovskite emissive layer 135 after it has been assembled by a step 1070 of vacuum drying is advantageous. Such an additional annealing step 1075 would not assemble the perovskite emissive layer 135 from the perovskite ink 1240 because the perovskite emissive layer 135 would already have been assembled during the vacuum drying step 1070. Such an additional annealing step 1075 would instead remove residual solvent from the assembled perovskite emissive layer 135 and optimize the morphology of the perovskite emissive layer 135.

The process of vacuum drying may be further understood with reference to FIG. 11, which depicts two exemplary vacuum drying curves 1110 and 1120, which may be applied during step 1070.

In one embodiment, during the step 1070 of vacuum drying the perovskite ink 1240, the pressure inside the vacuum drying chamber may be reduced to less than or equal to 0.0001 mbar. By reducing the pressure to less than or equal to 0.0001 mbar, one or more solvents may be extracted from the perovskite ink 1240 to assemble a perovskite emissive layer 135. Furthermore, by reducing the pressure to less than or equal to 0.0001 mbar, very little residual solvent may remain in the perovskite emissive layer 135 after step 1070.

In one embodiment, during the step 1070 of vacuum drying the perovskite ink 1240, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1070 of vacuum drying the perovskite ink 1240, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1070 of vacuum drying the perovskite ink 1240 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1070 of vacuum drying the perovskite ink 1240 may include additional time for processes such as transfer and alignment of the substrate 110, but such additional time is not included in the foregoing discussion of vacuum drying process times.

Preferably, during the step 1070 of vacuum drying the perovskite ink 1240 to assemble the perovskite emissive layer 135, the ambient temperature inside the vacuum drying chamber is 50° C. or less, optionally 30° C. or less. This low temperature ensures that the perovskite ink 1240 does not dry prematurely to assemble a non-uniform perovskite emissive layer 135 during transfer of the substrate 110 into the vacuum drying chamber. For example, if the ambient temperature inside the vacuum drying chamber were higher than approximately 50° C., the perovskite ink 1240 disposed over the area of the substrate 110 that enters the vacuum chamber first would begin to dry before the perovskite ink 1240 disposed over the area of the substrate 110 that enters the vacuum chamber last. This would result in an imbalance of vapour pressure and evaporation rate of the perovskite ink 1240 across the substrate 110 and the assembly of a non-uniform perovskite emissive layer 135 with reduced optoelectronic performance.

The rate at which ambient pressure is reduced may be tuned according to the required perovskite emissive layer 135 morphology and profile. The rate at which ambient pressure is reduced may also be tuned according to other additional factors that may influence the assembly and resultant morphology and profile of the perovskite emissive layer 135. Such additional factors may include solid content of the perovskite ink, sub-pixel dimensions, volume of the perovskite ink drops, number of the perovskite ink drops and bank structure 1230 design. The ability to tune the rate at which ambient pressure is reduced during step 1070 in the disclosed method 1000 enables greater control over the assembly and resultant morphology and profile of a perovskite emissive layer 135 compared to alternative self-assembly processes, such as those described in Wang et al. This results in improved perovskite light emitting device performance.

Method 1000 further comprises a step 1075 of annealing the perovskite emissive layer 135. By annealing the perovskite emissive layer 135, any residual solvent may be removed from the perovskite emissive layer 135. Furthermore, by annealing the perovskite emissive layer 135, the thickness, morphology or profile of the perovskite emissive layer 135 may be defined by any movement of the perovskite emissive layer 135 during extraction of any residual solvent during the annealing process. In one embodiment, the perovskite emissive layer 135 may be a cross-linked layer, and after the step 1075 of annealing the perovskite emissive layer, the perovskite emissive layer 135 may be cross-linked. In one embodiment, the step 1075 of annealing the perovskite emissive layer 135 may be performed in an atmosphere of nitrogen. Such a nitrogen atmosphere may be preferred for the annealing process because one or more materials within the perovskite emissive layer 135 may be susceptible to oxidation and degradation when annealed in an atmosphere of air.

In one embodiment, during the step 1075 of annealing the perovskite emissive layer 135, the annealing temperature may be in the range of 80° C. to 200° C. In one embodiment, during the step 1075 of annealing the perovskite emissive layer 135, the annealing temperature may be in the range of 80° C. to 160° C. Such a range annealing of temperatures may effectively enable any residual solvent to be removed from the perovskite emissive layer 135. In one embodiment, the step 1075 of annealing the perovskite emissive layer 135 may be performed in a different chamber to the vacuum drying chamber. In one embodiment, the step 1075 of annealing the perovskite emissive layer 135 may be performed in the same chamber as the vacuum drying chamber. In one embodiment, the step 1075 of annealing the perovskite emissive layer may be performed during the step 1070 of vacuum drying the perovskite ink 1240.

Preferably, the step 1075 of annealing the perovskite emissive layer 135 is performed in a different chamber to the step 1070 of vacuum drying the perovskite ink 1240. Preferably, the step 1075 of annealing the perovskite emissive layer 135 is performed in a different step and in a different chamber to the step 1070 of vacuum drying the perovskite ink 1240. This enables the vacuum drying step 1070 to be performed at an ambient temperature of 50° C. or less, optionally 30° C. or less, which as described herein, ensures the perovskite ink 1240 does not dry prematurely to assemble a non-uniform perovskite emissive layer 135 during transfer of the substrate 110 into the vacuum drying chamber. Furthermore, process times for the step 1070 of vacuum drying the perovskite ink 1240 and the step 1075 of annealing the perovskite emissive layer 135 may be individually optimized. For example, a typical optimized vacuum drying step 1070 may be expected to be 90-120 seconds, whereas a typical optimized annealing step 1075 may be expected to be in the range of 10-30 minutes, such that multiple substrates are required to be loaded into a single annealing chamber to ensure a steady process flow for manufacturing displays. Separating the step 1070 of vacuum drying and the step 1075 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform perovskite emissive layers 135 with reduced optoelectronic performance and a non-optimized manufacturing process flow with higher cost.

Method 1000 further comprises a step 1095 of depositing a cathode 155 over the perovskite emissive layer 135 using a method of vapour deposition, which is labelled "Deposit Cathode by Vapour Deposition". The cathode 155 may be transparent, enabling a top-emission device architecture, or reflective, enabling a bottom-emission device architecture.

In one embodiment, method 1000 comprises an optional additional step 1020 of providing a hole injection layer ink 1245, wherein the hole injection layer ink 1245 comprises at least one solvent and at least one hole injection material mixed in the at least one solvent. The at least one solvent is needed to solubilize the at least one hole injection material to form a hole injection layer ink 1245 that can be inkjet printed. In one embodiment, method 1000 comprises an optional additional step 1025 of depositing the hole injection layer ink 1245 into the at least one sub-pixel over the anode 115 using a method of inkjet printing.

Arrangement 1220 in FIG. 12e depicts a hole injection layer ink 1245 that has been deposited into the at least one sub-pixel over the anode 115 using a method of inkjet printing. The sub-pixel is defined by a bank structure 1230. In one embodiment, the step 1025 of depositing the hole injection layer ink 1245 into the at least one sub-pixel over the anode 115 by inkjet printing is performed in an atmosphere of air. In one embodiment, the step 1025 of depositing the hole injection layer ink 1245 into the at least one sub-pixel over the anode 115 by inkjet printing is performed in an atmosphere of nitrogen.

In one embodiment, method 1000 comprises an optional additional step 1030 of vacuum drying the hole injection layer ink 1245 inside a vacuum drying chamber to assemble a hole injection layer 120 over the anode 115 in the at least one sub-pixel. The process of vacuum drying the hole injection layer ink 1245 can be understood with reference to FIG. 12e and FIG. 12f. Arrangement 1220 in FIG. 12e depicts the status of method 1000 after step 1025, but before step 1030. That is to say, arrangement 1220 depicts the status before the step of vacuum drying the hole injection layer ink 1245. During step 1030, the arrangement 1220 is transferred to a vacuum drying chamber. Within the vacuum drying chamber, ambient pressure is reduced to extract one or more solvents from the hole injection layer ink 1245. This causes the hole injection layer ink 1245 to contract and solidify to assemble a hole injection layer 120. Arrangement 1225 in FIG. 12f depicts the status of method 1000 after step 1030. That is to say, arrangement 1225 depicts the status after the step of vacuum drying the hole injection layer ink 1245. After vacuum drying, one or more solvents have been extracted from the hole injection layer ink 1245, and a hole injection layer 120 has been assembled.

Vacuum drying has several advantages over other layer assembly techniques. For example, the rate at which one or more solvents are extracted from the hole injection layer ink 1245 may be controlled by varying the rate at which pressure is reduced in a vacuum drying chamber. This enables both the profile and morphology of the assembled hole injection layer 120 to be controlled by varying the rate of vacuum drying of the hole injection layer ink 1245. Using an external factor, such as ambient pressure, to control the morphology and profile of the hole injection layer 120 is advantageous compared to spincoat techniques, such as those disclosed in Wang et al. because the hole injection layer 120 properties may be controlled more precisely and with greater reproducibility.

Vacuum drying enables hole injection layers 120 to be assembled rapidly across large area substrates 110, as required in the manufacturing process for displays, where takt times are typically of order 90-120 seconds. This cannot be achieved by alternative drying processes such as annealing a hole injection layer ink 1245 to assemble a hole injection layer 120, which is the method that has been used in all previous work on perovskite light emitting devices. As disclosed herein, an additional step 1035 of annealing the hole injection layer 120 after it has been assembled by a step 1030 of vacuum drying is advantageous. Such an additional annealing step 1035 would not assemble the hole injection layer 120 from the hole injection layer ink 1245 because the hole injection layer 120 would already have been assembled during the vacuum drying step 1030. Such an additional annealing step 1035 would instead remove residual solvent from the assembled hole injection layer 120 and optimize the morphology of the hole injection layer 120.

The process of vacuum drying may be further understood with reference to FIG. 11, which depicts two exemplary vacuum drying curves 1110 and 1120, which may be applied during step 1030.

In one embodiment, during the step 1030 of vacuum drying the hole injection layer ink 1245, the pressure inside the vacuum drying chamber may be reduced to less than or equal to 0.0001 mbar. By reducing the pressure to less than or equal to 0.0001 mbar, one or more solvents may be extracted from the hole injection layer ink 1245 to assemble a hole injection layer 120. Furthermore, by reducing the pressure to less than or equal to 0.0001 mbar, very little residual solvent may remain in the hole injection layer 120 after step 1030.

In one embodiment, during the step 1030 of vacuum drying the hole injection layer ink 1245, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1030 of vacuum drying the hole injection layer ink 1245, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1030 of vacuum drying the hole injection layer ink 1245 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1030 of vacuum drying the hole injection layer ink 1245 may include additional time for processes such as transfer and alignment of the substrate 110, but such additional time is not included in the foregoing discussion of vacuum drying process times.

Preferably, during the step 1030 of vacuum drying the hole injection layer ink 1245 to assemble the hole injection layer 120, the ambient temperature inside the vacuum drying chamber is 50° C. or less, optionally 30° C. or less. This low temperature ensures that the hole injection layer ink 1245 does not dry prematurely to assemble a non-uniform hole injection layer 120 during transfer of the substrate 110 into the vacuum drying chamber. For example, if the ambient temperature inside the vacuum drying chamber were higher than approximately 50° C., the hole injection layer ink 1245 disposed over the area of the substrate 110 that enters the vacuum chamber first would begin to dry before the hole injection layer ink 1245 disposed over the area of the substrate 110 that enters the vacuum chamber last. This would result in an imbalance of vapour pressure and evaporation rate of the hole injection layer ink 1245 across the substrate 110 and the assembly of a non-uniform hole injection layer 120 with reduced optoelectronic performance.

The rate at which ambient pressure is reduced may be tuned according to the required hole injection layer 120 morphology and profile. The rate at which ambient pressure is reduced may also be tuned according to other additional factors that may influence the assembly and resultant morphology and profile of the hole injection layer 120. Such additional factors may include solid content of the hole injection layer ink, sub-pixel dimensions, volume of the hole injection layer ink drops, number of the hole injection layer ink drops and bank structure 1230 design. The ability to tune the rate at which ambient pressure is reduced during step 1030 in the disclosed method 1000 enables greater control over the assembly and resultant morphology and profile of a hole injection layer 120 compared to alternative self-assembly processes, such as those described in Wang et al. This results in improved perovskite light emitting device performance.

In one embodiment, method 1000 comprises an optional additional step 1035 of annealing the hole injection layer 120. By annealing the hole injection layer 120, any residual solvent may be removed from the hole injection layer 120. Furthermore, by annealing the hole injection layer 120, the thickness, morphology or profile of the hole injection layer 120 may be defined by any movement of the hole injection layer 120 during extraction of any residual solvent during the annealing process. In one embodiment, the hole injection layer 120 may be a cross-linked layer, and after the step 1035 of annealing the hole injection layer, the hole injection layer 120 may be cross-linked. In one embodiment, the step 1035 of annealing the hole injection layer 120 may be performed in an atmosphere of air. In one embodiment, the step 1035 of annealing the hole injection layer 120 may be performed in an atmosphere of nitrogen.

In one embodiment, during the step 1035 of annealing the hole injection layer 120, the annealing temperature may be in the range of 100° C. to 220° C. Such a range annealing of temperatures may effectively enable any residual solvent to be removed from the hole injection layer 120. In one embodiment, the step 1035 of annealing the hole injection layer 120 may be performed in a different chamber to the vacuum drying chamber. In one embodiment, the step 1035 of annealing the hole injection layer 120 may be performed in the same chamber as the vacuum drying chamber. In one embodiment, the step 1035 of annealing the hole injection layer 120 may be performed during the step 1030 of vacuum drying the hole injection layer ink 1245.

Preferably, the step 1035 of annealing the hole injection layer 120 is performed in a different step to the step 1030 of vacuum drying the hole injection layer ink 1245. Preferably, the step 1035 of annealing the hole injection layer 120 is performed in a different chamber to the step 1030 of vacuum drying the hole injection layer ink 1245. Preferably, the step 1035 of annealing the hole injection layer 120 is performed in a different step and in a different chamber to the step 1030 of vacuum drying the hole injection layer ink 1245. This enables the vacuum drying step 1030 to be performed at an ambient temperature of 50° C. or less, optionally 30° C. or less, which as described herein, ensures the hole injection layer ink 1245 does not dry prematurely to assemble a non-uniform hole injection layer 120 during transfer of the substrate 110 into the vacuum drying chamber. Furthermore, process times for the step 1030 of vacuum drying the hole injection layer ink 1245 and the step 1035 of annealing the hole injection layer 120 may be individually optimized. For example, a typical optimized vacuum drying step 1030 may be expected to be 90-120 seconds, whereas a typical optimized annealing step 1035 may be expected to be in the range of 10-30 minutes, such that multiple substrates are required to be loaded into a single annealing chamber to ensure a steady process flow for manufacturing displays. Separating the step 1030 of vacuum drying and the step 1035 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform hole injection layers 120 with reduced optoelectronic performance and a non-optimized manufacturing process flow with higher cost.

The assembly and resultant thicknesses, morphologies or profiles of the assembled layers, including the hole injection layer 120, hole transport layer 125 and perovskite emissive layer 135 may be further influenced by the solid content of the respective hole injection layer ink 1245, hole transport layer ink 1235 and perovskite ink 1240.

In one embodiment, the hole injection layer ink 1245 may comprise at least one hole injection material mixed in at least one solvent at a concentration by weight in the range of 0.01 wt. % to 10 wt. %. In one embodiment, the hole injection layer ink 1245 may comprise at least one hole injection material mixed in at least one solvent at a concentration by weight of in the range of 0.1 wt. % to 5 wt. %. In one embodiment, the hole transport layer ink 1235 may comprise at least one hole transport material mixed in at least one solvent at a concentration by weight in the range of 0.01 wt. % to 10 wt. %. In one embodiment, the hole transport layer ink 1235 may comprise at least one hole transport material mixed in at least one solvent at a concentration by weight of in the range of 0.1 wt. % to 5 wt. %. In one embodiment, the perovskite ink 1240 may comprise at least one perovskite light emitting material mixed in at least one solvent at a concentration by weight in the range of 0.01 wt. % to 10 wt. %. In one embodiment, the perovskite ink 1240 may comprise at least one perovskite light emitting material mixed in at least one solvent at a concentration by weight of in the range of 0.1 wt. % to 5 wt.

Such ranges of concentration by weight in the hole injection layer ink 1245, hole transport layer ink 1235 and perovskite ink 1240 may enable the thicknesses of the hole injection layer 120, hole transport layer 125 and perovskite emissive layer 135 to be controlled. In one embodiment, by increasing the concentration by weight of the hole injection material, the thickness of the hole injection layer 120 may be increased. In one embodiment, the thickness of the hole injection layer 120 may be in the range of 10 nm to 80 nm. In one embodiment, by increasing the concentration by weight of the hole transport material, the thickness of the hole transport layer 125 may be increased. In one embodiment, the thickness of the hole transport layer 125 may be in the range of 10 nm to 80 nm. In one embodiment, by increasing the concentration by weight of the perovskite light emitting material, the thickness of the perovskite emissive layer 135 may be increased. In one embodiment, the thickness of the perovskite emissive layer 135 may be in the range of 15 nm to 150 nm. Such a thickness range may maximize the proportion of recombination of electrons and holes within the perovskite emissive layer 135, thereby maximizing the efficiency of light emission from the perovskite emissive layer 135.

Such a ranges of concentration by weight of material in the respective inks may further enable the morphologies and profiles of the hole injection layer 120, hole transport layer 125 and perovskite emissive layer 135 to be controlled. For example, an ink with higher weight concentration may be of higher viscosity than an ink with lower weight concentration. The change in viscosity may affect how the respective ink contracts and solidifies to form a layer during vacuum drying. This may result in a different morphology of hole injection material, hole transport material and perovskite light emitting material in the respective hole injection layer 120, hole transport layer 125 and perovskite emissive layer 135 after vacuum drying, as well as different profiles of the hole injection layer 120, hole transport layer 125 and perovskite emissive layer 135.

Note that as described herein, layer thickness is defined as the thickness of the respective layer at the centre of the at least one sub-pixel. It is not defined as the thickness of the respective layer in regions of the at least one sub-pixel over or adjacent to the bank structure 1230. For a well-controlled application of method 1000, the resulting hole injection layer 120, hole transport layer 125 and perovskite emissive layer 135 may each be of uniform thickness across the at least one sub-pixel, with less than approximately 10%, and optionally less than approximately 5% thickness variation across the at least one sub-pixel. However, in some instances, application of method 1000 may result in substantial thickness variation of the hole injection layer 120, hole transport layer 125 and perovskite emissive layer 135 across the at least one sub-pixel. In all instances, layer thickness is defined at the centre of the at least one sub-pixel.

The assembly and resultant morphologies or profiles of the assembled layers, including the hole injection layer 120, hole transport layer 125 and perovskite emissive layer 135 may be further influenced by the dimensions of the at least one sub-pixel into which the hole injection layer ink 1245, hole transport layer ink 1235 and perovskite ink 1240 are inkjet printed. The dimensions of the at least one sub-pixel may be defined by the bank structure 1230. FIG. 13 depicts exemplary designs of sub-pixels. Included in FIG. 13 is an arrangement 1300 of three adjacent sub-pixels, each of length L and width W. The first sub-pixel 1310 may comprise a red sub-pixel, wherein such a red sub-pixel may comprise a red perovskite light emitting device comprising a red perovskite emissive layer 135. The second sub-pixel 1320 may comprise a green sub-pixel, wherein such a green sub-pixel may comprise a green perovskite light emitting device comprising a green perovskite emissive layer 135. The third sub-pixel 1330 may comprise a blue sub-pixel, wherein such a blue sub-pixel may comprise a blue perovskite light emitting device comprising a blue perovskite emissive layer 135. A typical pixel arrangement of a commercial display may comprise a sub-pixel arrangement such as 1300.

In one embodiment, the at least one sub-pixel into which the hole injection layer ink 1245, hole transport layer ink 1235 and perovskite ink 1240 are inkjet printed may be of length in the range of 100 μm to 2501 μm, and of width in the range of 40 μm to 80 μm. Such ranges of sub-pixel lengths and widths correspond to the dimensions required for television displays of size approximately 55-inch to 77-inch with 4K2K pixel resolution, or more formally 3840×2160 pixel resolution, which is also referred to as ultra-high definition (UHD) resolution. In one embodiment, the at least one sub-pixel into which the hole injection layer ink 1245, hole transport layer ink 1235 and perovskite ink 1240 are inkjet printed may be of length in the range of 50

µm to 150 µm, and of width in the range of 20 µm to 40 µm. Such ranges of sub-pixel lengths and widths correspond to the dimensions required for television displays of size approximately 55-inch to 77-inch with 8K pixel resolution, or more formally 7680×4320 pixel resolution, which is also referred to as 8K ultra high definition (8K UHD). In one embodiment, the at least one sub-pixel into which the hole injection layer ink 1245, hole transport layer ink 1235 and perovskite ink 1240 are inkjet printed may be of length in the range of 10 µm to 50 µm, and of width in the range of 5 µm to 20 µm. Such ranges of sub-pixel lengths and widths correspond to the dimensions required for smartphone displays of resolution in the approximate range of 400 to 600 pixels per inch (ppi).

The assembly and resultant thicknesses, morphologies or profiles of the assembled layers, such as the hole injection layer 120, hole transport layer 125 and perovskite emissive layer 135 may be further influenced by the ink drop volume during the respective steps of depositing the hole injection layer ink 1245, hole transport layer ink 1235 and perovskite ink 1240. For example, the profile of the layers may be tuned by using a larger number of drops of lower volume, or a lower number of drops of larger volume. In one embodiment, the profile of the assembled hole injection layer 120, hole transport layer 125 and perovskite emissive layer 135 may each be controlled by varying the ink drop volume during the respective steps of depositing the hole injection layer ink 1245, hole transport layer ink 1235 and perovskite ink 1240.

For larger sub-pixels, ink drops with a larger volume may be used during the steps of depositing the hole injection layer ink 1245, hole transport layer ink 1235 and perovskite ink 1240. In one embodiment, the hole injection layer ink drop volume may be in the range of 5 pico-liters to 15 pico-liters. In one embodiment, the hole transport layer ink drop volume may be in the range of 5 pico-liters to 15 pico-liters. In one embodiment, the perovskite ink drop volume may be in the range of 5 pico-liters to 15 pico-liters. Such a range of ink drop volumes may be suitable for inkjet printing ink into sub-pixels of length in the range of 100 µm to 250 µm, and of width in the range of 40 µm to 80 µm, as required for television displays of size approximately 55-inch to 77-inch with 4K2K pixel resolution. Such a range of ink drop volumes may also be suitable for inkjet printing ink into sub-pixels of length in the range of 50 µm to 150 µm, and of width in the range of 20 µm to 40 µm, as required for television displays of size approximately 55-inch to 77-inch with 8K pixel resolution.

For smaller sub-pixels, ink drops with a smaller volume may be used during the steps of depositing the hole injection layer ink 1245, hole transport layer ink 1235 and perovskite ink 1240. In one embodiment, the hole injection layer ink drop volume may be in the range of 0.5 pico-liters to 2 pico-liters. In one embodiment, the hole transport layer ink drop volume may be in the range of 0.5 pico-liters to 2 pico-liters. In one embodiment, the perovskite ink drop volume may be in the range of 0.5 pico-liters to 2 pico-liters. Such a range of ink drop volumes may be suitable for inkjet printing ink into sub-pixels of length in the range of 10 µm to 50 µm, and of width in the range of 5 µm to 20 µm, as required for smartphone displays of resolution in the approximate range of 400 to 600 pixels per inch (ppi).

The assembly and resultant thicknesses, morphologies or profiles of the assembled layers, such as the hole injection layer 120, hole transport layer 125 and perovskite emissive layer 135 may be further influenced by the number of ink drops during the respective steps of depositing the hole injection layer ink 1245, hole transport layer ink 1235 and perovskite ink 1240. In one embodiment, the profiles of the assembled hole injection layer 120, hole transport layer 125 and perovskite emissive layer 135 may be controlled by varying the number of ink drops during the respective steps of depositing the hole injection layer ink 1245, hole transport layer ink 1235 and perovskite ink 1240. For example, the profiles of the hole injection layer 120, hole transport layer 125 and perovskite emissive layer 135 may be tuned by using a larger number of drops of lower volume or a lower number of drops of larger volume. In one embodiment, the total number of hole injection layer ink drops may in the range of 4 ink drops to 20 ink drops. In one embodiment, the total number of hole transport layer ink drops may in the range of 4 ink drops to 20 ink drops. In one embodiment, the total number of perovskite ink drops may in the range of 4 ink drops to 20 ink drops. For each layer, a larger number of ink drops of lower volume may allow for the respective inks to be spread more evenly across the sub-pixel, potentially resulting in more uniform layers after vacuum drying. Conversely, for each layer, a lower number of ink drops of larger volume may allow for the respective inks to be inkjet printed more rapidly, enabling a reduced takt time during the manufacturing process.

The assembly and resultant thicknesses, morphologies or profiles of the assembled layers, including the hole injection layer 120, hole transport layer 125 and perovskite emissive layer 135 may be further influenced by the bank structure 1230 used to define the at least one sub-pixel. FIG. 14 depicts arrangement 1400, which depicts a cross-section of a bank structure 1230 disposed over a substrate 110. The bank structure 1230 is disposed over the substrate 110 such that the bank structure 1230 is inclined at an angle θ at the edge of the at least one sub-pixel. In one embodiment, the profiles of the assembled layers, including the hole injection layer 120, hole transport layer 125 and perovskite emissive layer 135 may be controlled by varying the angle of the bank structure 1230 at the edge of the at least one sub-pixel. For example, where the angle θ is lower, the hole injection layer ink 1245, hole transport layer ink 1235 and perovskite ink 1240 may each spread further over the bank structure 1230, which may influence the layer profiles when the respective inks are vacuum dried to assemble layers. In one embodiment, the bank structure 1230 may be provided at an angle θ in the range of 30° to 60° at the edge of the at least one sub-pixel. Such a range of angles θ may effectively contain the hole injection layer ink 1245, hole transport layer ink 1235 and perovskite ink 1240 within the sub-pixel, while also allowing the inks to assemble uniform layers during vacuum drying.

In one embodiment, the profiles of the assembled layers, including the hole injection layer 120, hole transport layer 125 and perovskite emissive layer 135 may be controlled by varying the surface energy of the bank structure 1230. For example, if the surface energy of the bank structure 1230 is substantially higher than the surface energy of each of the inks, then the inks may be attracted to and spread over the surface of the bank structure 1230. However, if the surface energy of the bank structure 1230 is not substantially higher than the surface energy of each of the inks, then the inks may be repelled from and not spread over the bank structure 1230. In one embodiment, the surface energy of the bank structure 1230 may be controlled such that the lower proportion of the bank structure 1230, nearest the substrate 110, has substantially higher surface energy than each of the hole injection layer ink 1245, hole transport layer ink 1235 and perovskite ink 1240, while the upper proportion of the bank structure 1230, furthest away from the substrate 110, does not have substantially higher surface energy than each of the hole injection layer ink 1245, hole transport layer ink 1235 and perovskite ink 1240. This may enable the hole injection layer ink 1245, hole transport layer ink 1235 and perovskite ink 1240 to each spread evenly across the sub-pixel and remain in contact with the lower proportion of the bank structure 1230, without any de-wetting, but prevent the hole injection layer ink 1245, hole transport layer ink 1235 and perovskite ink 1240 from spreading over the upper proportion of the bank structure 1230 into one or more adjacent sub-pixels. The hole injection layer ink 1245, hole transport layer ink 1235 and perovskite ink 1240 may then assemble uniform layers after vacuum drying.

In one embodiment, method 1000 comprises an optional additional step 1080 of depositing a hole blocking layer 140 over the perovskite emissive layer 135 using a method of vapour deposition. In one embodiment, method 1000 comprises an optional additional step 1085 of depositing an electron transport layer 145 over the perovskite emissive layer 135 using a method of vapour deposition. In one embodiment, method 1000 comprises an optional additional step 1090 of depositing an electron injection layer 150 over the perovskite emissive layer 135 using a method of vapour deposition.

Figure 15:
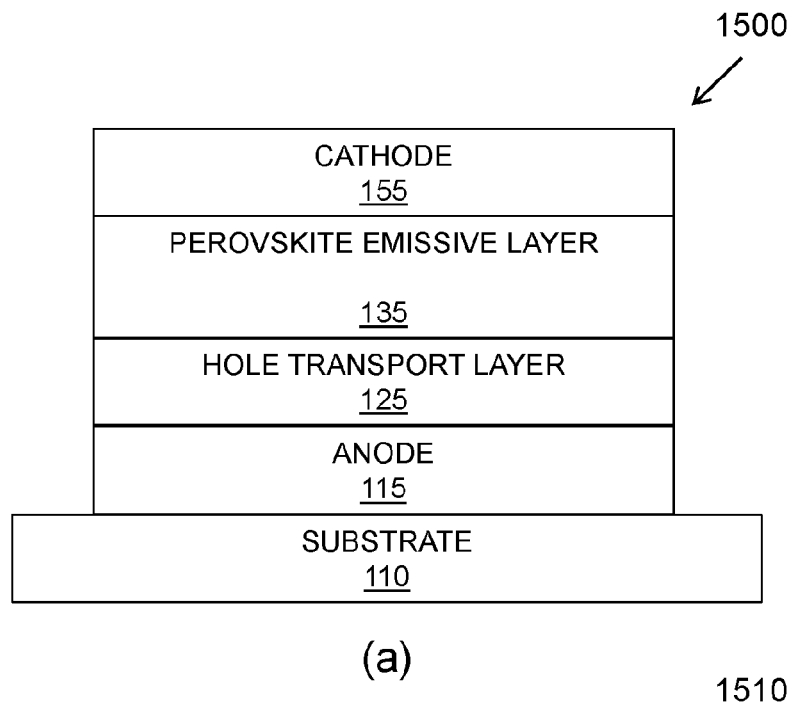
FIG. 15 depicts various layer configurations for a standard perovskite light emitting device.
Figure 15:
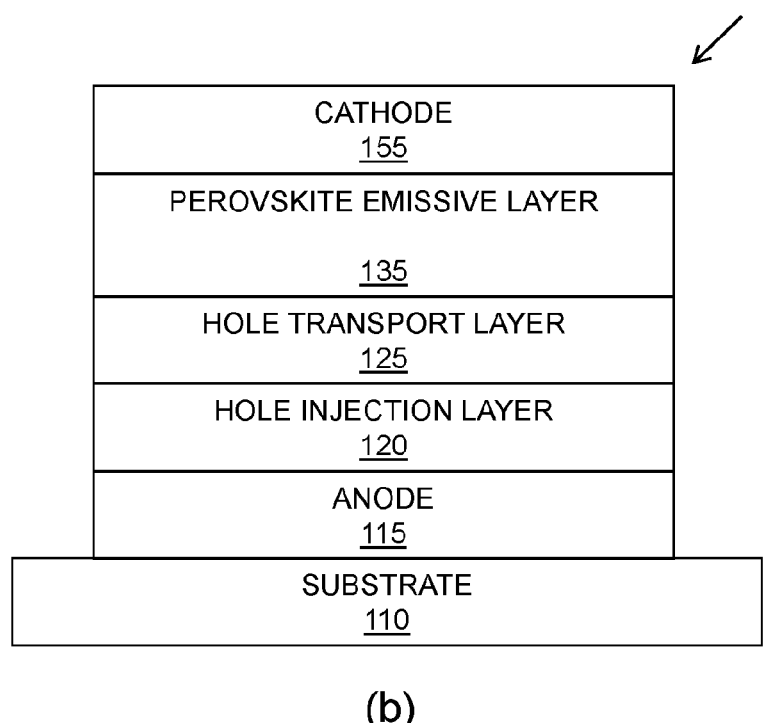
Figure 15:
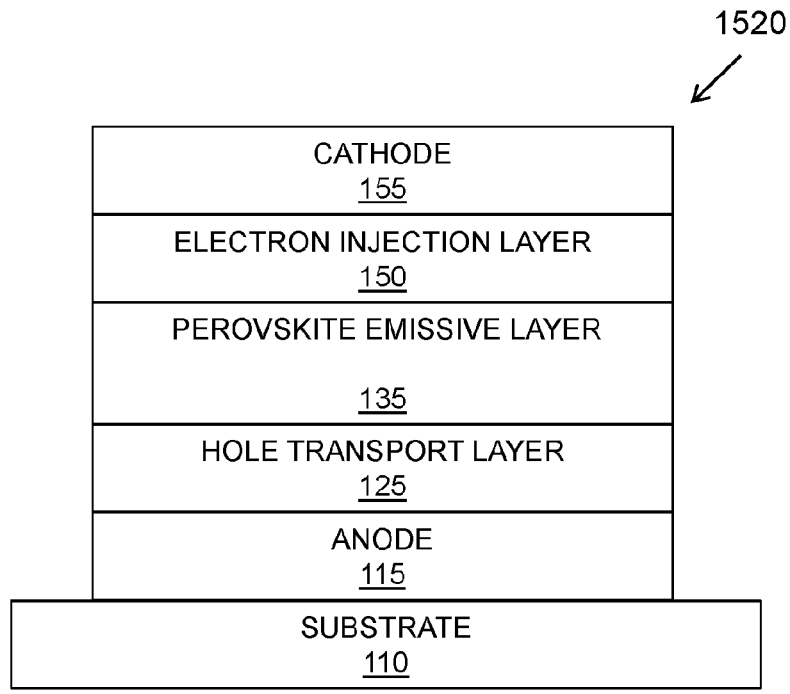
Figure 15:
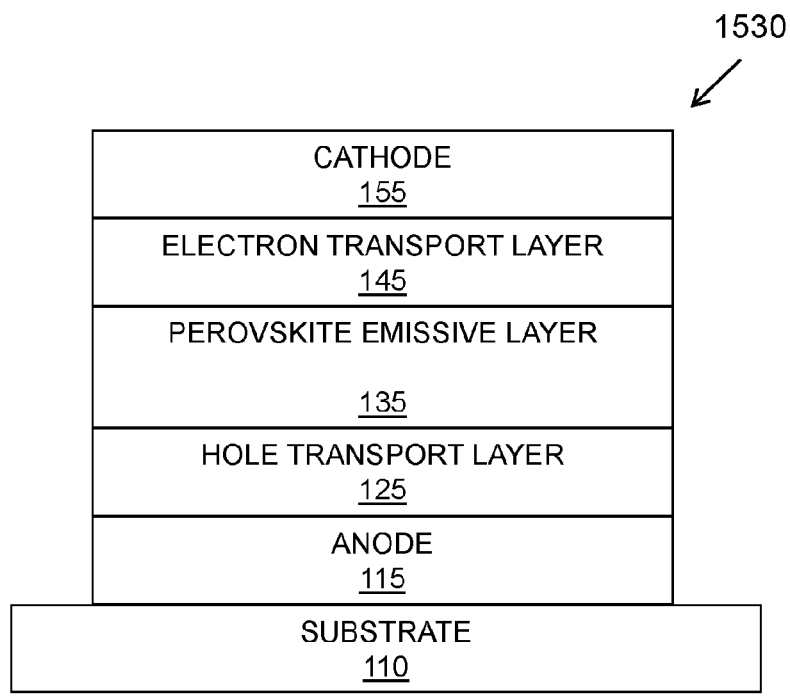
Figure 15:
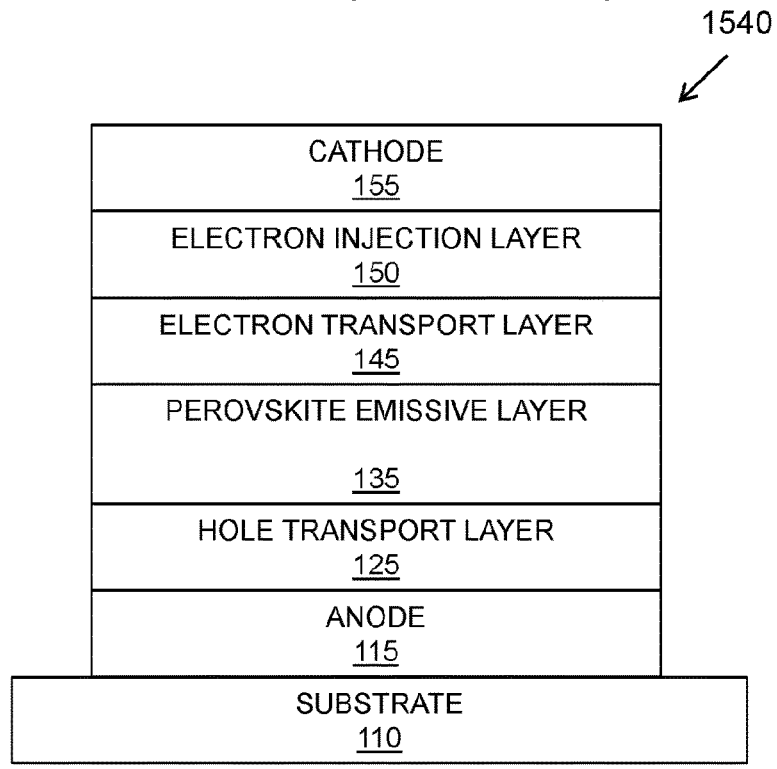
Figure 15:
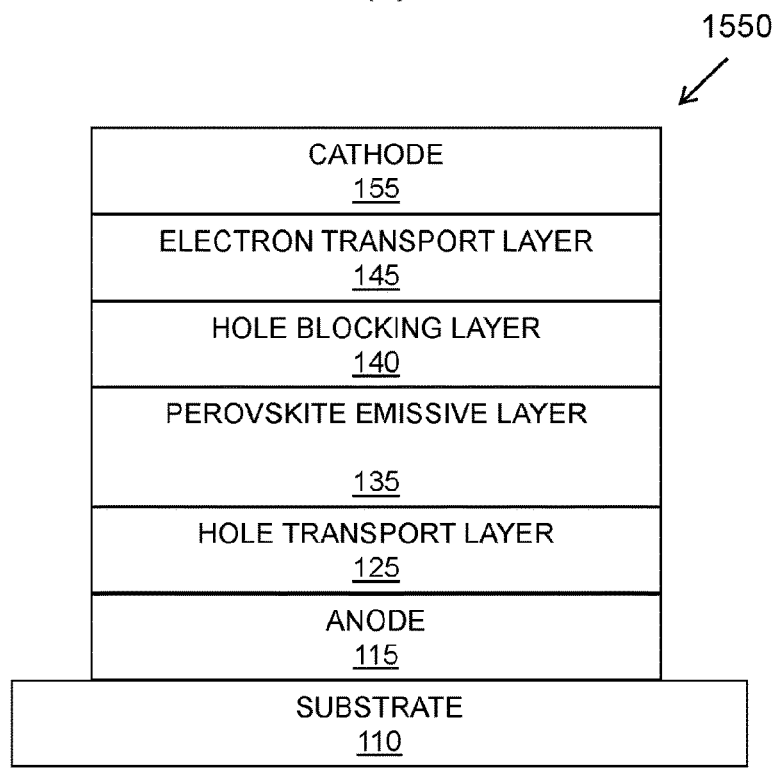
Figure 15:
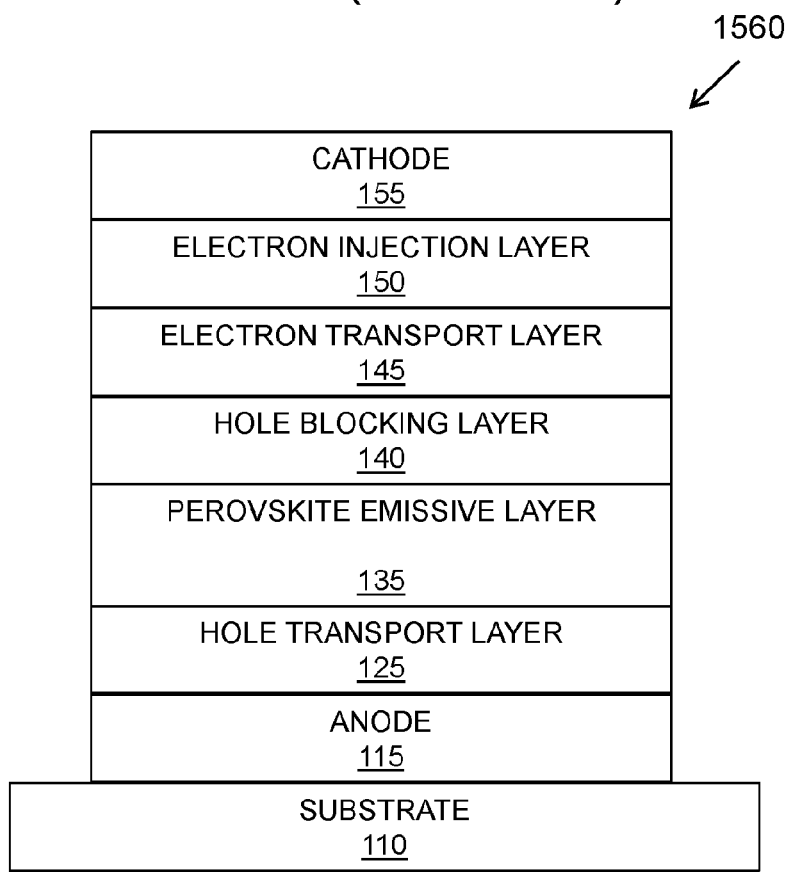

FIG. 15 depicts various layer configurations for a perovskite light emitting device. In one embodiment, after the step 1075 of annealing the perovskite emissive layer 135, but before the step 1095 of depositing a cathode 155 over the perovskite emissive layer 135 using a method of vapour deposition, the method 1000 further comprises the step 1090 of depositing an electron injection layer 150 over the perovskite emissive layer 135 using a method of vapour deposition. This layer configuration is depicted by arrangement 1520 in FIG. 15*c*. The inclusion of an optional electron injection layer 150 may improve the injection of electrons from the cathode 155 into the device.

In one embodiment, after the step 1075 of annealing the perovskite emissive layer 135, but before the step 1095 of depositing a cathode 155 over the perovskite emissive layer 135 using a method of vapour deposition, the method 1000 further comprises the step 1085 of depositing an electron transport layer 145 over the perovskite emissive layer 135 using a method of vapour deposition. This layer configuration is depicted by arrangement 1530 in FIG. 15*d*. The inclusion of an optional electron transport layer 145 may improve transport of electrons to the perovskite emissive layer 135.

In one embodiment, after the step 1075 of annealing the perovskite emissive layer 135, but before the step 1095 of depositing a cathode 155 over the perovskite emissive layer 135 using a method of vapour deposition, the method 1000 further comprises: step 1085 of depositing an electron transport layer 145 over the perovskite emissive layer 135 using a method of vapour deposition; and step 1090 of depositing an electron injection layer 150 over the electron transport layer 145 using a method of vapour deposition. This layer configuration is depicted by arrangement 1540 in FIG. 15*e*. The inclusion of an optional electron transport layer 145 and an optional electron injection layer 150 may improve the injection of electrons from the cathode 155 into the device, and the transport of electrons to the perovskite emissive layer 135.

In one embodiment, after the step 1075 of annealing the perovskite emissive layer 135, but before the step 1095 of depositing a cathode 155 over the perovskite emissive layer 135 using a method of vapour deposition, the method 1000 further comprises: step 1080 of depositing a hole blocking layer 140 over the perovskite emissive layer 135 using a method of vapour deposition; and step 1085 of depositing an electron transport layer 145 over the hole blocking layer 140 using a method of vapour deposition. This layer configuration is depicted by arrangement 1550 in FIG. 15*f*. The inclusion of an optional hole blocking layer 140 and an optional electron transport layer 145 may improve the transport of electrons to the perovskite emissive layer 135 and reduce the leakage of holes from the perovskite emissive layer 135.

In one embodiment, after the step 1075 of annealing the perovskite emissive layer 135, but before the step 1095 of depositing a cathode 155 over the perovskite emissive layer 135 using a method of vapour deposition, the method 1000 further comprises: step 1080 of depositing a hole blocking layer 140 over the perovskite emissive layer 135 using a method of vapour deposition; step 1085 of depositing an electron transport layer 145 over the hole blocking layer 140 using a method of vapour deposition; and step 1090 of depositing an electron injection layer 150 over the electron transport layer 145 using a method of vapour deposition. This layer configuration is depicted by arrangement 1560 in FIG. 15*g*. The inclusion of an optional hole blocking layer 140, an optional electron transport layer 145 and an optional electron injection layer 150 may improve the injection of electrons from the cathode 155 into the device, the transport of electrons to the perovskite emissive layer 135 and reduce the leakage of holes from the perovskite emissive layer 135.

Figure 16:
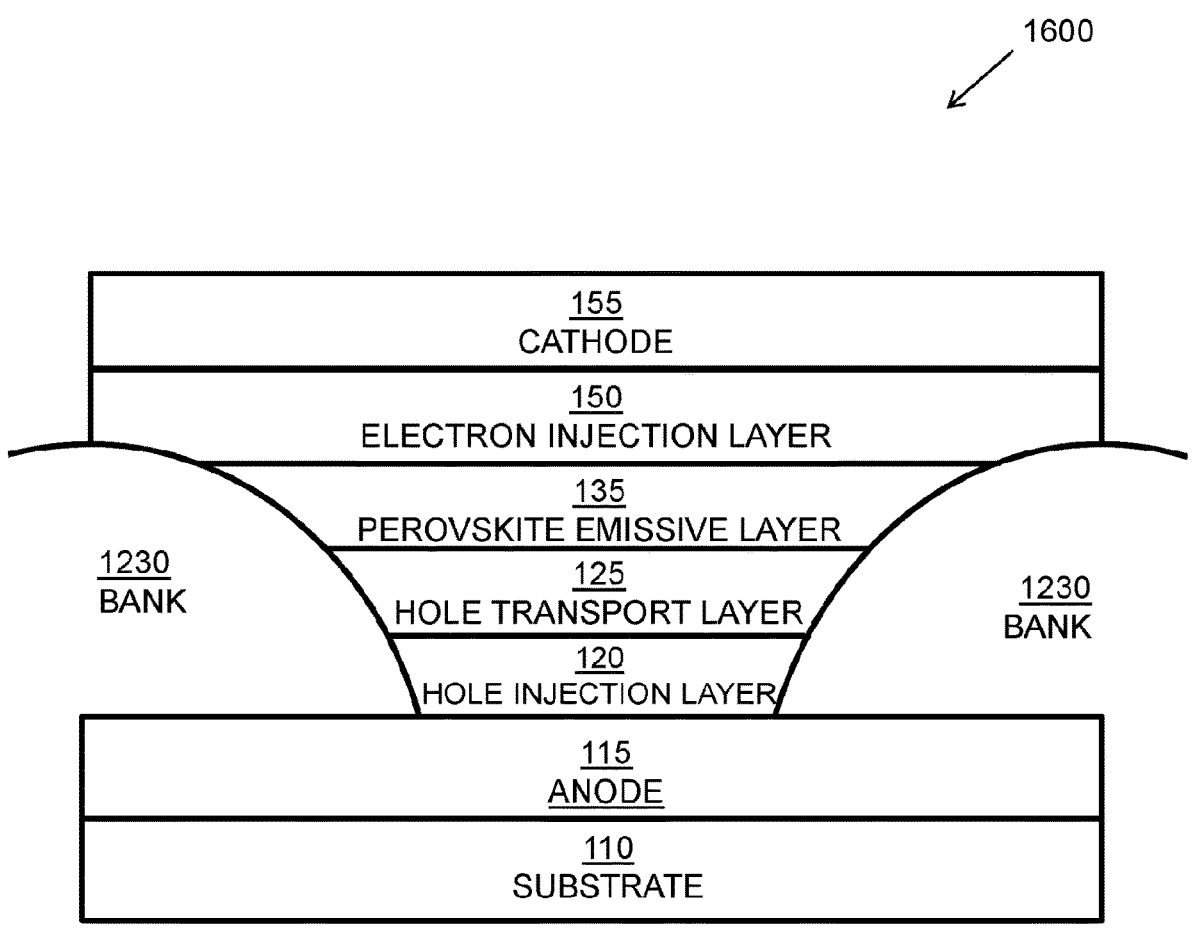
FIG. 16 depicts a cross-section of an exemplary standard perovskite light emitting device.

The present invention relates to a method 1000 of fabricating a standard perovskite light emitting device. The present invention further relates to standard perovskite light emitting devices fabricated using the disclosed method. FIG. 16 depicts a cross-section of an exemplary standard perovskite light emitting device 1600 that may be fabricated using the disclosed method. The standard perovskite light emitting device 1600 comprises a substrate 110, an anode 115, a hole injection layer 120, a hole transport layer 125, a perovskite emissive layer 135, an electron injection layer 150 and a cathode 155. The standard perovskite light emitting device 1600 further comprises a bank structure 1230. The standard perovskite light emitting device 1600 is one example of a perovskite light emitting device that may be fabricated using the disclosed method 1000. Additional standard perovskite light emitting device architectures may also be fabricated using method 1000, and these additional device architectures are also covered by this disclosure.

In one embodiment of the disclosed method, the first electrode is a cathode, the first injection layer, where included, is an electron injection layer, the first transport layer is an electron transport layer, the blocking layer, where included, is an electron blocking layer, the second transport layer, where included, is a hole transport layer, the second injection layer, where included, is a hole injection layer and the second electrode is an anode, such that the perovskite light emitting device is an inverted perovskite light emitting device.

Figure 19:
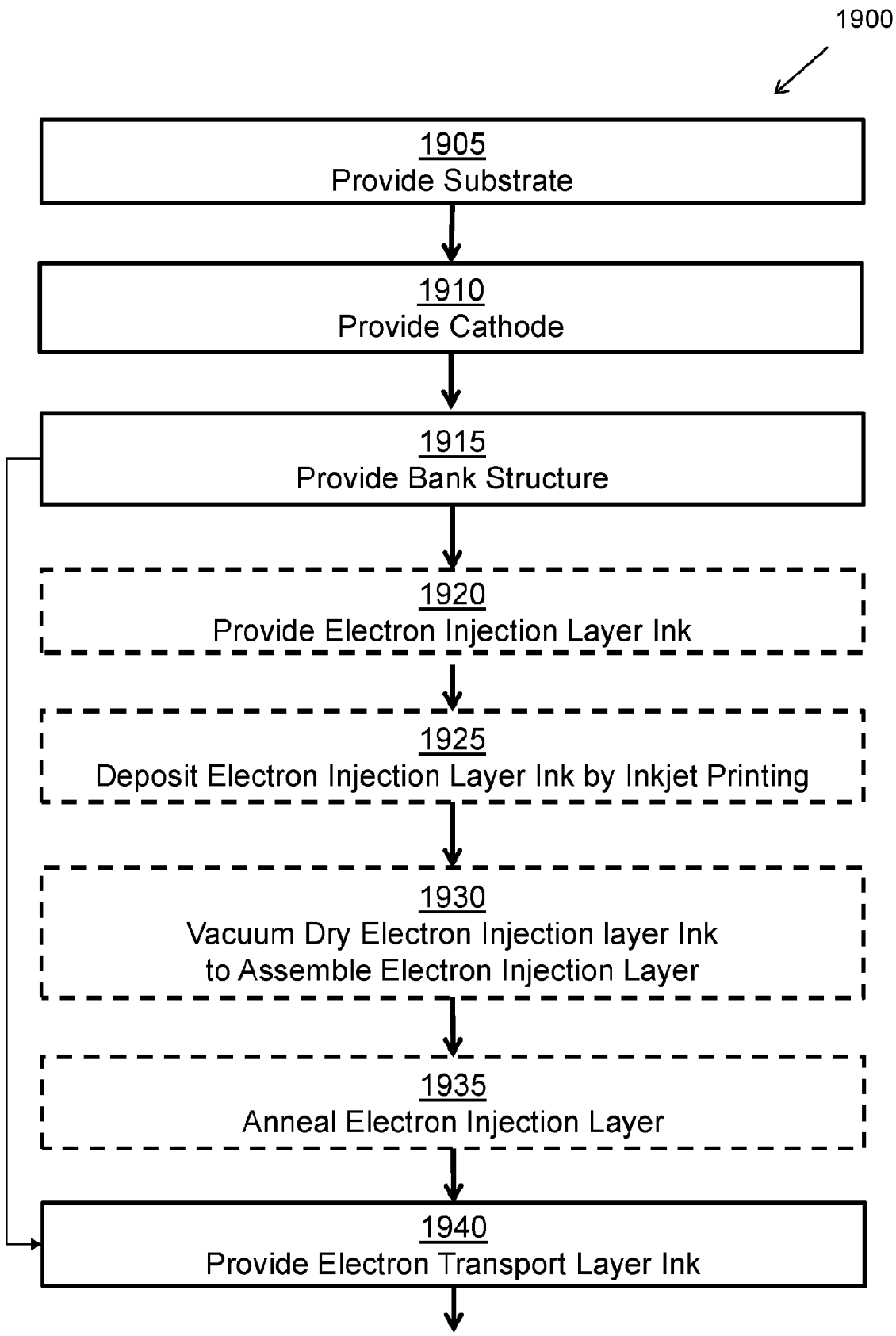
FIG. 19 depicts a process flow for a method for fabricating an inverted perovskite light emitting device.
Figure 19:
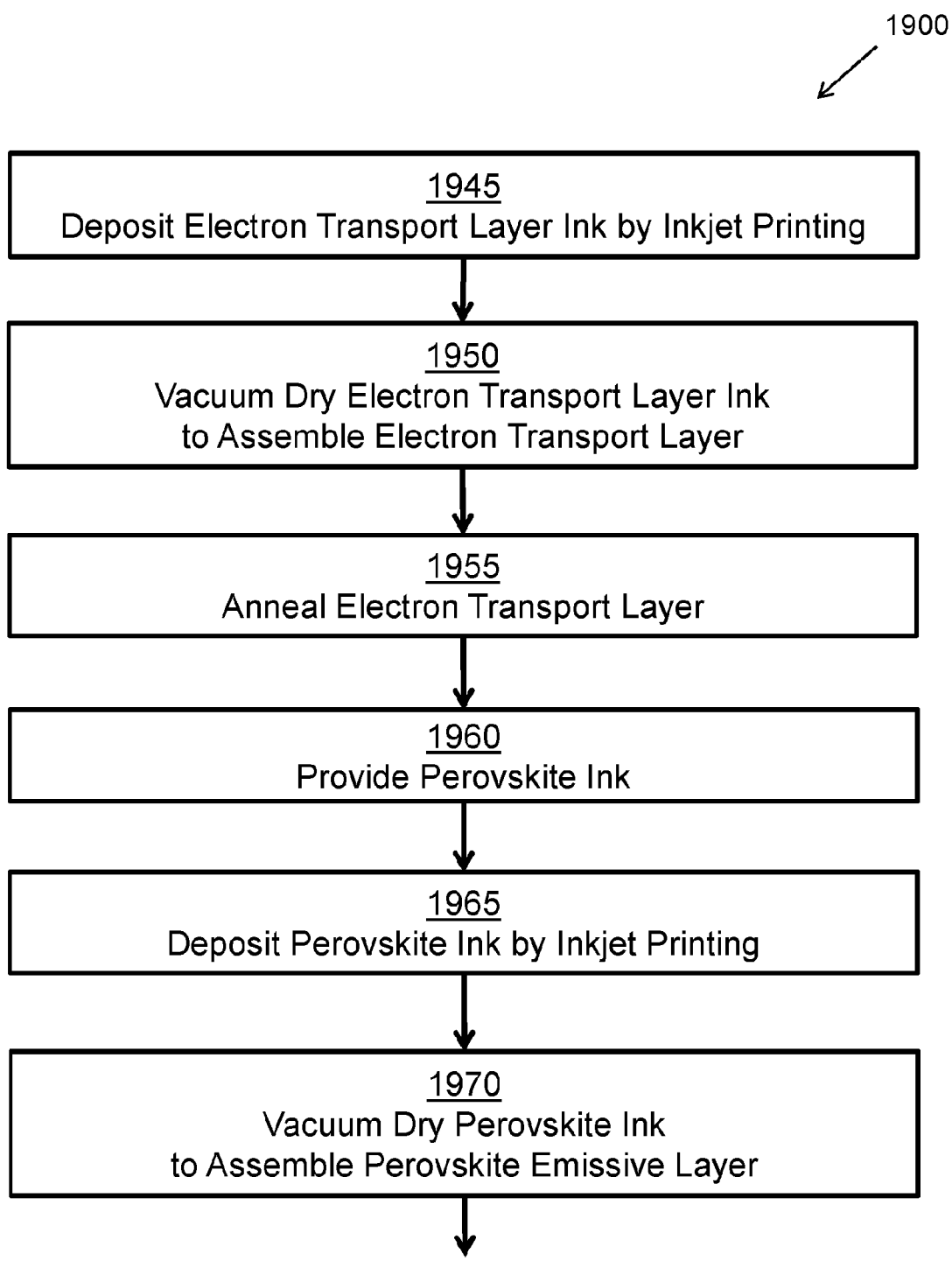
Figure 19:
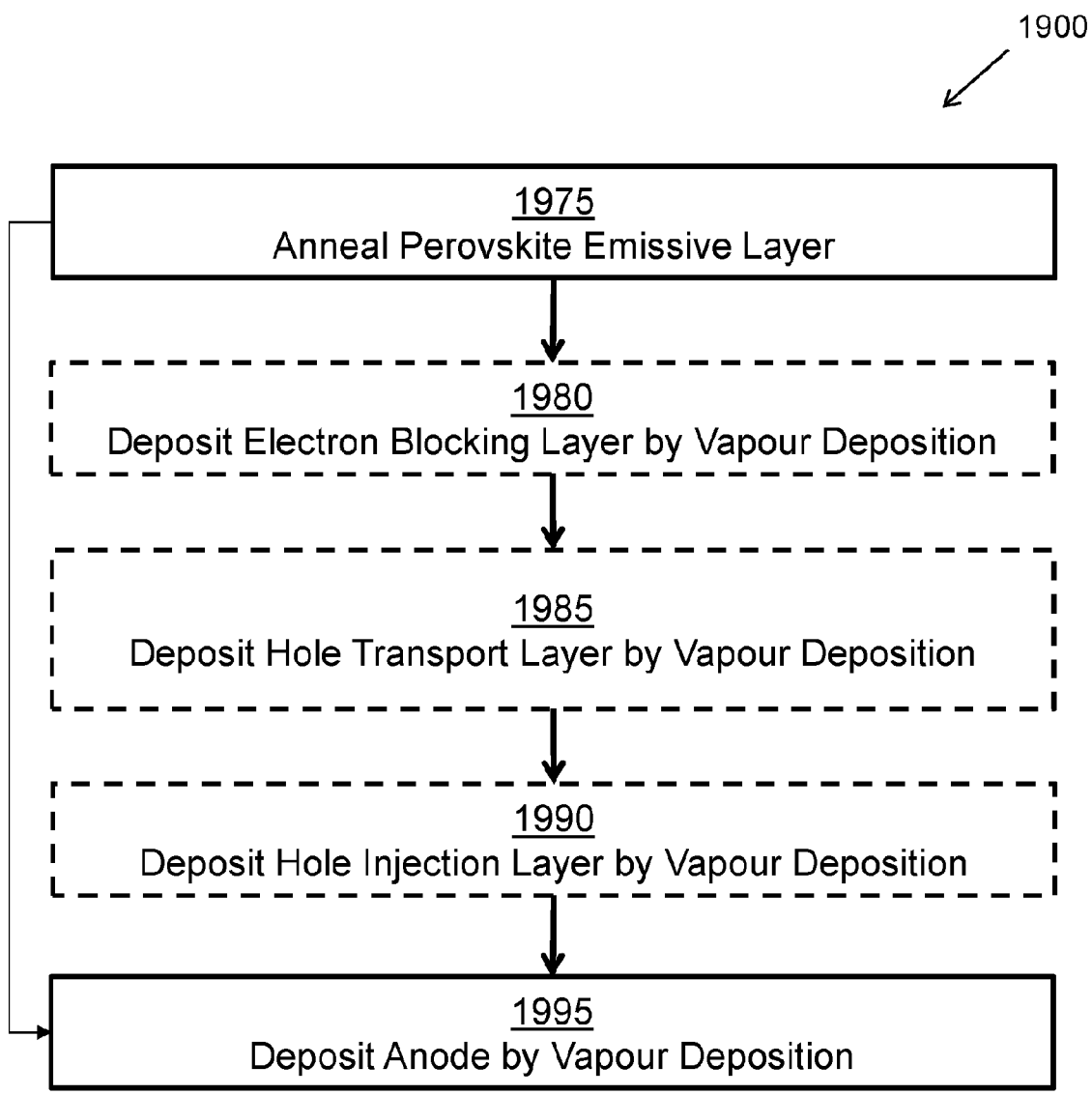

FIG. 19 depicts a method 1900 for assembling an inverted perovskite light emitting device. The method 1900 comprises: step 1905 of providing a substrate, which is labelled "Provide Substrate"; step 1910 of providing an cathode disposed over the substrate, which is labelled "Provide Cathode"; step 1915 of providing a bank structure disposed over the substrate, wherein the bank structure is patterned so as to define at least one sub-pixel on the substrate, which is labelled "Provide Bank Structure"; step 1940 of providing an electron transport layer ink, wherein the electron transport layer ink comprises at least one solvent and at least one electron transport material mixed in the at least one solvent, which is labelled "Provide Electron Transport Layer Ink"; step 1945 of depositing the electron transport layer ink into the at least one sub-pixel over the cathode using a method of inkjet printing, which is labelled "Deposit Electron Transport Layer Ink by Inkjet Printing"; step 1950 of vacuum drying the electron transport layer ink inside a vacuum drying chamber to assemble an electron transport layer over the cathode in the at least one sub-pixel, which is labelled "Vacuum Dry Electron Transport Layer Ink to Assemble Electron Transport Layer; step 1955 of annealing the electron transport layer, which is labelled "Anneal Electron Transport Layer"; step 1960 of providing a perovskite ink, wherein the perovskite ink comprises at least one solvent and at least one perovskite light emitting material mixed in the at least one solvent, which is labelled "Provide Perovskite Ink"; step 1965 of depositing the perovskite ink into the at least one sub-pixel over the electron transport layer using a method of inkjet printing, which is labelled "Deposit Perovskite Ink by Inkjet Printing"; step 1970 of vacuum drying the perovskite ink inside a vacuum drying chamber to assemble a perovskite emissive layer over the electron transport layer in the at least one sub-pixel, which is labelled "Vacuum Dry Perovskite Ink to Assemble Perovskite Emissive Layer; step 1975 of annealing the perovskite emissive layer, which is labelled "Anneal Perovskite Emissive Layer; and step 1995 of depositing an anode over the perovskite emissive layer using a method of vapour deposition, which is labelled "Deposit Anode by Vapour Deposition".

Optionally, method 1900 comprises the additional steps: 1920 of providing an electron injection layer ink, wherein the electron injection layer ink comprises at least one solvent and at least one electron injection material mixed in the at least one solvent, which is labelled "Provide Electron Injection Layer Ink"; step 1925 of depositing the electron injection layer ink into the at least one sub-pixel over the cathode using a method of inkjet printing, which is labelled "Deposit Electron Injection Layer Ink by Inkjet Printing"; step 1930 of vacuum drying the electron injection layer ink inside a vacuum drying chamber to assemble an electron injection layer over the cathode in the at least one sub-pixel, which is labelled "Vacuum Dry Electron Injection Layer Ink to Assemble Electron Injection Layer; and step 1935 of annealing the electron injection layer, which is labelled "Anneal Electron Injection Layer".

The optional additional steps 1920, 1925, 1930 and 1935 are marked by boxes outlined with dashed lines in FIG. 19. The dashed lines represent that the additional steps 1920, 1925, 1930 and 1935 are optional steps in method 1900. In contrast, boxes outlined with a solid line in FIG. 19 are not optional steps in method 1900. Arrangement 2300 in FIG. 23a depicts an exemplary inverted perovskite light emitting device fabricated using method 1900, without the inclusion of the optional steps 1920, 1925, 1930 and 1935.

The inverted perovskite light emitting device in arrangement 2300 therefore does not include an optional electron injection layer 220. Arrangement 2310 in FIG. 23b depicts an exemplary inverted perovskite light emitting device fabricated using method 1900, with the inclusion of the optional steps 1920, 1925, 1930 and 1935. The inverted perovskite light emitting device in arrangement 2310 therefore includes an optional electron injection layer 220.

Optionally, method 1900 further comprises the additional steps: 1980 of depositing an electron blocking layer over the perovskite emissive layer using a method of vapour deposition, which is labelled "Deposit Electron Blocking Layer by Vapour Deposition"; step 1985 of depositing a hole transport layer over the perovskite emissive layer using a method of vapour deposition, which is labelled "Deposit Hole Transport Layer by Vapour Deposition"; and step 1990 of depositing a hole injection layer over the perovskite emissive layer using a method of vapour deposition, which is labelled "Deposit Hole Injection Layer by Vapour Deposition". The optional additional steps 1980, 1985 and 1990 are marked by boxes outlined with dashed lines in FIG. 19. The dashed lines represent that the additional steps 1980, 1985 and 1990 are optional steps in method 1900. In contrast, boxes outlined with a solid line in FIG. 19 are not optional steps in method 1900.

Figure 21:
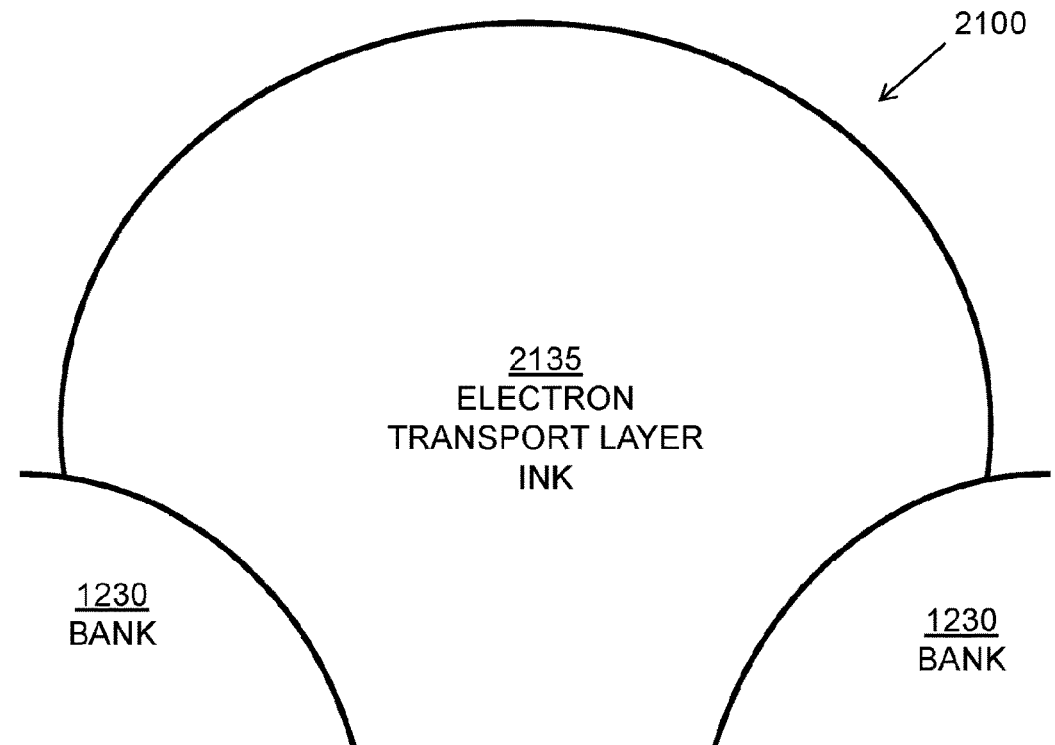
FIG. 21 depicts the assembly of various device layers of an inverted perovskite light emitting device from various inks.
Figure 21:
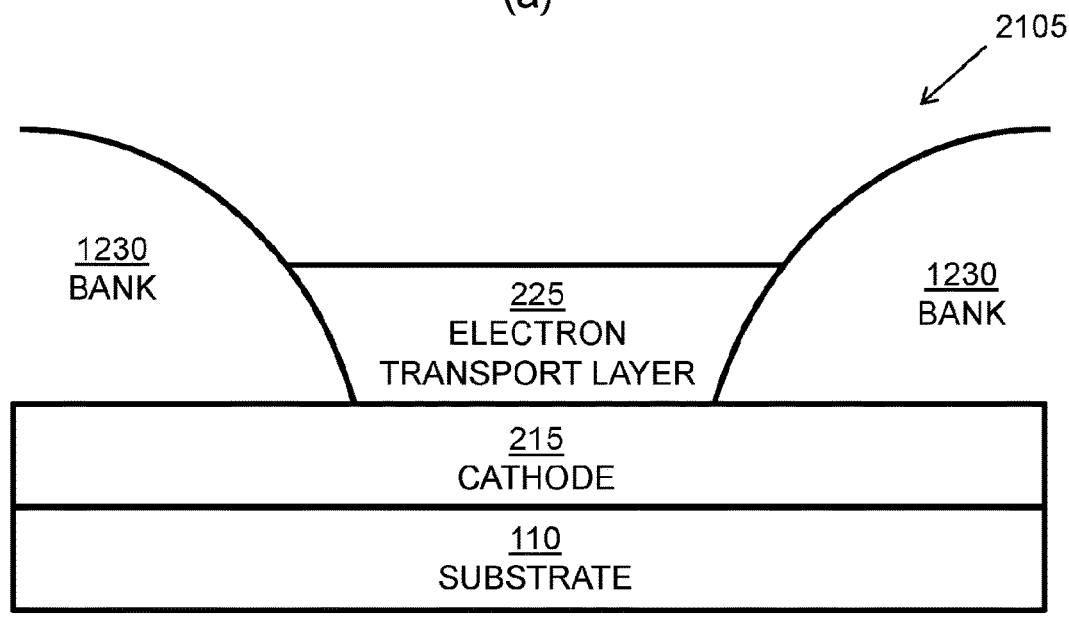
Figure 21:
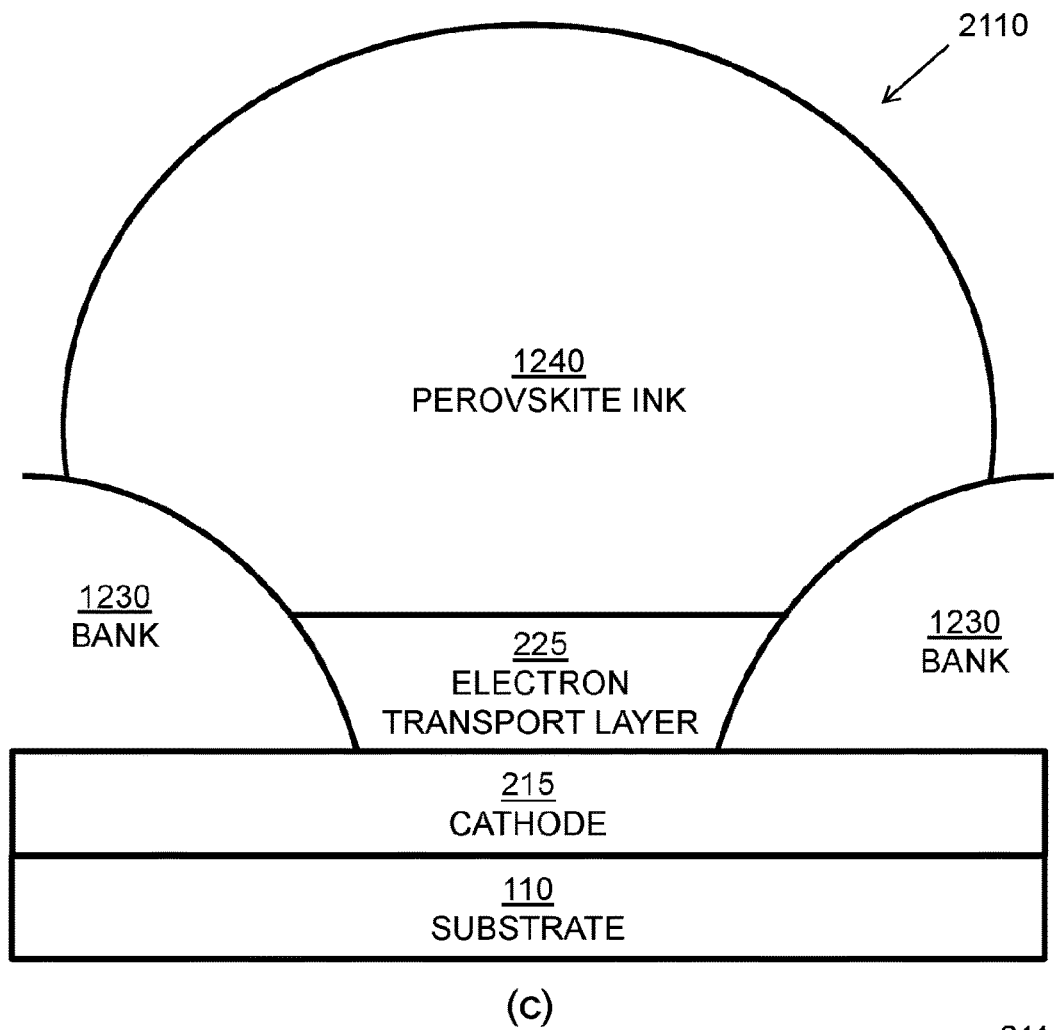
Figure 21:
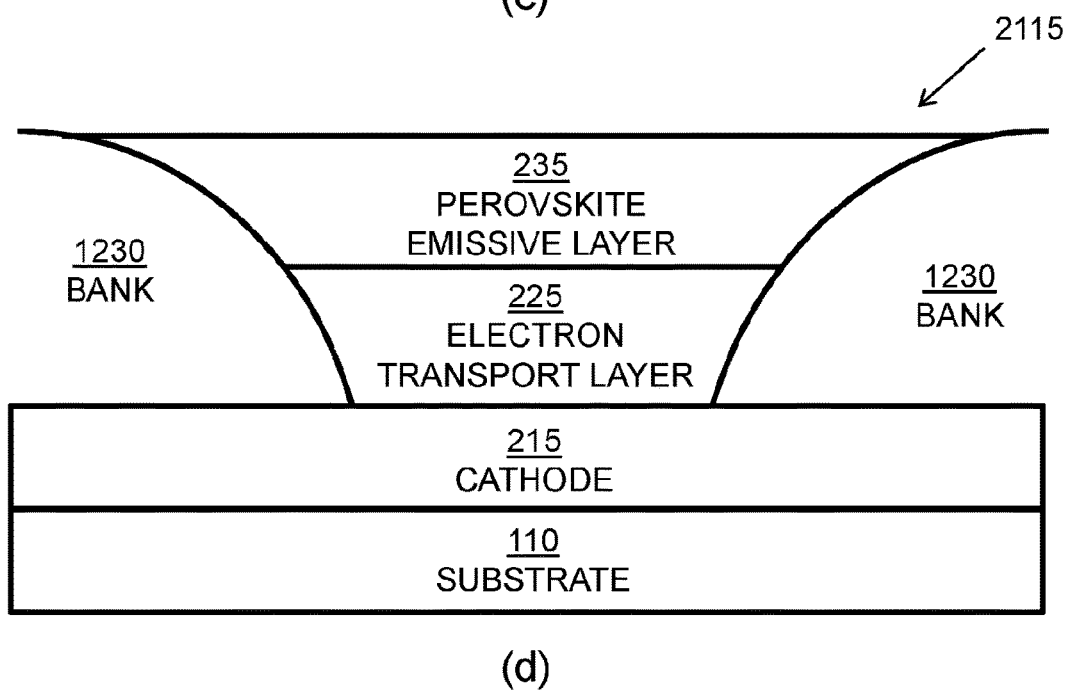
Figure 21:
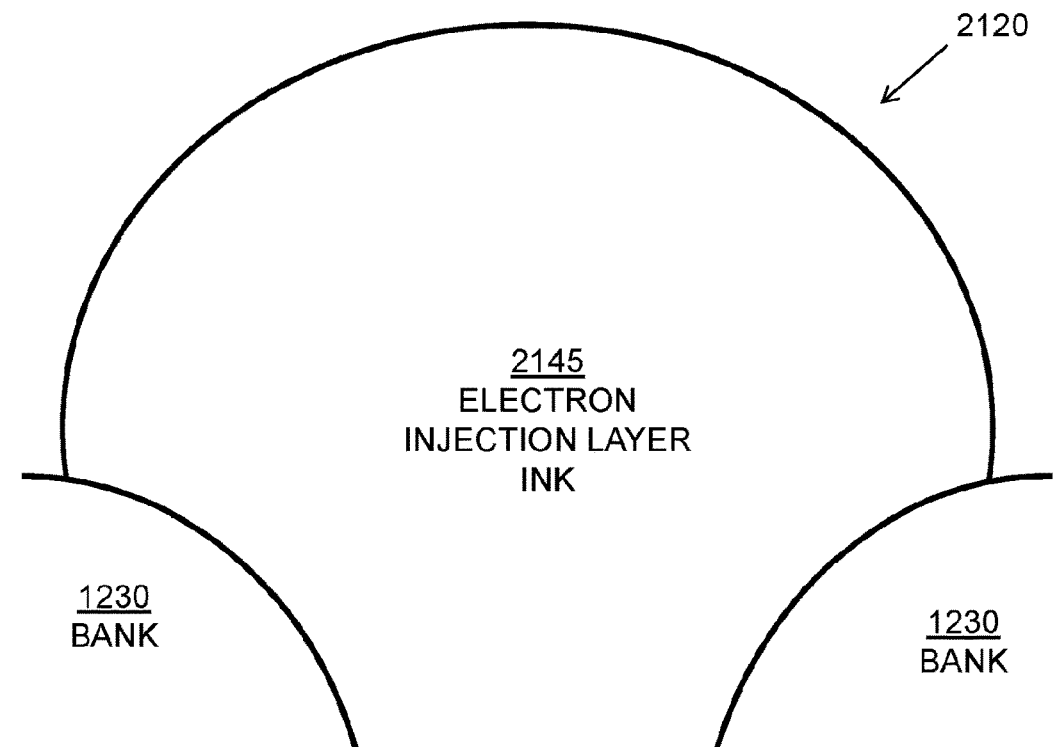
Figure 21:
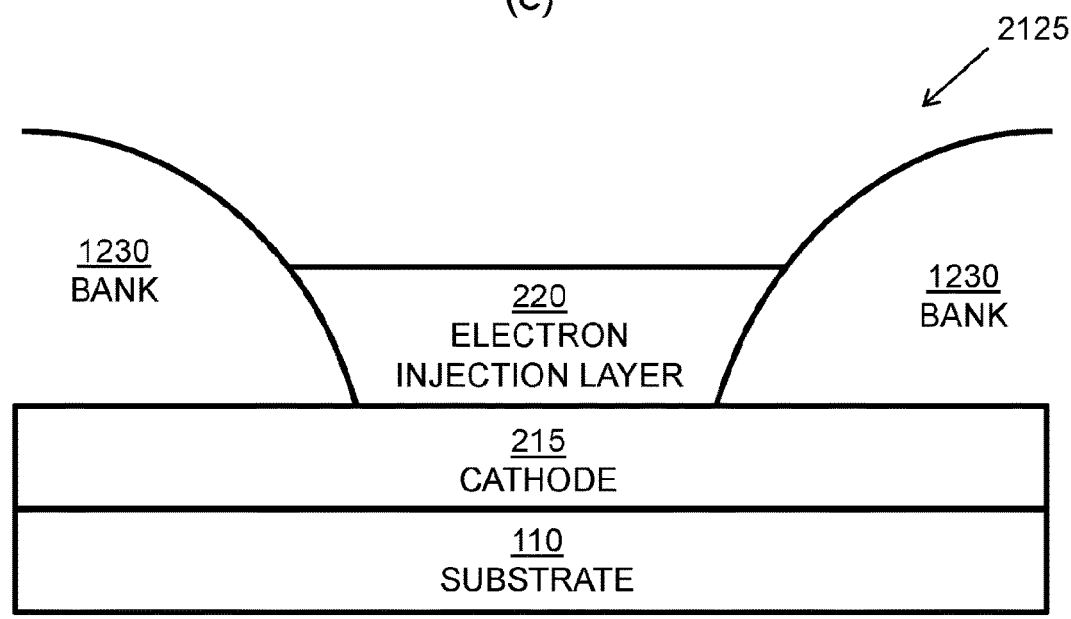

Method 1900 may be further understood with reference to FIG. 11, which depicts exemplary vacuum drying curves 1110 and 1120 that may be applied during steps 1930, 1950 and 1970, as well as with reference to FIG. 5, which depicts an inverted perovskite light emitting device, and with reference to FIG. 21, which depicts the assembly of various device layers of an inverted perovskite light emitting device from various inks.

Method 1900 comprises a step 1905 of providing a substrate 110. The substrate 110 may be rigid or flexible. The substrate 110 may be flat or curved. The substrate 110 may be transparent, translucent or opaque. Preferred substrate 110 materials are glass, plastic and metal foil. Method 1900 further comprises a step 1910 of providing a cathode 215 disposed over the substrate 110. The cathode 215 may be transparent, enabling a bottom-emission device architecture, or reflective, enabling a top-emission device architecture. Method 1900 further comprises a step 1915 of providing a bank structure 1230 disposed over the substrate 110, wherein the bank structure 1230 is patterned so as to define at least one sub-pixel on the substrate 110. The bank structure 1230 defines the area into which the electron transport layer ink 2135, the perovskite ink 1240, and optionally the electron injection layer ink 2145, may be inkjet printed and contained. For a display, the defined area may correspond to a sub-pixel of the display.

Method 1900 further comprises a step 1940 of providing an electron transport layer ink 2135, wherein the electron transport layer ink 2135 comprises at least one solvent and at least one electron transport material mixed in the at least one solvent. The at least one solvent is needed to solubilize the at least one electron transport material to form an electron transport ink 2135 that can be inkjet printed. Method 1900 further comprises a step 1945 of depositing the electron transport layer ink 2135 into the at least one sub-pixel over the cathode 215 using a method of inkjet printing.

Arrangement 2100 in FIG. 21a depicts an electron transport layer ink 2135 that has been deposited into the at least one sub-pixel over the cathode 215 using a method of inkjet printing. The sub-pixel is defined by a bank structure 1230. Inkjet printing has several advantages over other deposition techniques. Inkjet printing is readily compatible with manufacturing processes for displays. Ink droplets may be printed uniformly with high accuracy and at high speed across large area substrates. Ink droplets may be printed on demand with no more than the necessary ink volume for each layer deposited into each sub-pixel, resulting in substantially higher material utilization than for vacuum deposition processes. In one embodiment, the step 1945 of depositing the electron transport layer ink 2135 into the at least one sub-pixel over the cathode 215 by inkjet printing is performed in an atmosphere of air. In one embodiment, the step 1945 of depositing the electron transport layer ink 2135 into the at least one sub-pixel over the cathode 215 by inkjet printing is performed in an atmosphere of nitrogen.

Method 1900 further comprises a step 1950 of vacuum drying the electron transport layer ink 2135 inside a vacuum drying chamber to assemble an electron transport layer 225 over the cathode 215 in the at least one sub-pixel. The process of vacuum drying the electron transport layer ink 2135 can be understood with reference to FIG. 21a and FIG. 21b. Arrangement 2100 in FIG. 21a depicts the status of method 1900 after step 1945, but before step 1950. That is to say, arrangement 2100 depicts the status before the step of vacuum drying the electron transport layer ink 2135. During step 1950, the arrangement 2100 is transferred to a vacuum drying chamber. Within the vacuum drying chamber, ambient pressure is reduced to extract one or more solvents from the electron transport layer ink 2135. This causes the electron transport layer ink 2135 to contract and solidify to assemble an electron transport layer 225. Arrangement 2105 in FIG. 21b depicts the status of method 1900 after step 1950. That is to say, arrangement 2105 depicts the status after the step of vacuum drying the electron transport layer ink 2135. After vacuum drying, one or more solvents have been extracted from the electron transport layer ink 2135, and an electron transport layer 225 has been assembled.

Vacuum drying has several advantages over other layer assembly techniques. For example, the rate at which one or more solvents are extracted from the electron transport layer ink 2135 may be controlled by varying the rate at which pressure is reduced in a vacuum drying chamber. This enables both the profile and morphology of the assembled electron transport layer 225 to be controlled by varying the rate of vacuum drying of the electron transport layer ink 2135. Using an external factor, such as ambient pressure, to control the morphology and profile of the electron transport layer 225 is advantageous compared to spincoat techniques, such as those disclosed in Wang et al. because the electron transport layer 225 properties may be controlled more precisely and with greater reproducibility.

Vacuum drying enables electron transport layers 225 to be assembled rapidly across large area substrates 110, as required in the manufacturing process for displays, where takt times are typically of order 90-120 seconds. This cannot be achieved by alternative drying processes such as annealing an electron transport layer ink 2135 to assemble an electron transport layer 225, which is the method that has been used in all previous work on perovskite light emitting devices. As disclosed herein, an additional step 1955 of annealing the electron transport layer 225 after it has been assembled by a step 1950 of vacuum drying is advantageous. Such an additional annealing step 1955 would not assemble the electron transport layer 225 from the electron transport layer ink 2135 because the electron transport layer 225 would already have been assembled during the vacuum drying step 1950. Such an additional annealing step 1955 would instead remove residual solvent from the assembled electron transport layer 225 and optimize the morphology of the electron transport layer 225.

The process of vacuum drying may be further understood with reference to FIG. 11, which depicts two exemplary vacuum drying curves 1110 and 1120, which may be applied during step 1950.

In one embodiment, during the step 1950 of vacuum drying the electron transport layer ink 2135, the pressure inside the vacuum drying chamber may be reduced to less than or equal to 0.0001 mbar. By reducing the pressure to less than or equal to 0.0001 mbar, one or more solvents may be extracted from the electron transport layer ink 2135 to assemble an electron transport layer 225. Furthermore, by reducing the pressure to less than or equal to 0.0001 mbar, very little residual solvent may remain in the electron transport layer 225 after step 1950.

In one embodiment, during the step 1950 of vacuum drying the electron transport layer ink 2135, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1950 of vacuum drying the electron transport layer ink 2135, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1950 of vacuum drying the electron transport layer ink 2135 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1950 of vacuum drying the electron transport layer ink 2135 may include additional time for processes such as transfer and alignment of the substrate 110, but such additional time is not included in the foregoing discussion of vacuum drying process times.

Preferably, during the step 1950 of vacuum drying the electron transport layer ink 2135 to assemble the electron transport layer 225, the ambient temperature inside the vacuum drying chamber is 50° C. or less, optionally 30° C. or less. This low temperature ensures that the electron transport layer ink 2135 does not dry prematurely to assemble a non-uniform electron transport layer 225 during transfer of the substrate 110 into the vacuum drying chamber. For example, if the ambient temperature inside the vacuum drying chamber were higher than approximately 50° C., the electron transport layer ink 2135 disposed over the area of the substrate 110 that enters the vacuum chamber first would begin to dry before the electron transport layer ink 2135 disposed over the area of the substrate 110 that enters the vacuum chamber last. This would result in an imbalance of vapour pressure and evaporation rate of the electron transport layer ink 2135 across the substrate 110 and the assembly of a non-uniform electron transport layer 225 with reduced optoelectronic performance.

The rate at which ambient pressure is reduced may be tuned according to the required electron transport layer 225 morphology and profile. The rate at which ambient pressure is reduced may also be tuned according to other additional factors that may influence the assembly and resultant morphology and profile of the electron transport layer 225. Such additional factors may include solid content of the electron transport layer ink, sub-pixel dimensions, volume of the electron transport layer ink drops, number of the electron transport layer ink drops and bank structure 1230 design.

The ability to tune the rate at which ambient pressure is reduced during step 1950 in the disclosed method 1900 enables greater control over the assembly and resultant morphology and profile of an electron transport layer 225 compared to alternative self-assembly processes, such as those described in Wang et al. This results in improved perovskite light emitting device performance.

Method 1900 further comprises a step 1955 of annealing the electron transport layer 225. By annealing the electron transport layer 225, any residual solvent may be removed from the electron transport layer 225. Furthermore, by annealing the electron transport layer 225, the thickness, morphology or profile of the electron transport layer 225 may be defined by any movement of the electron transport layer 225 during extraction of any residual solvent during the annealing process. In one embodiment, the electron transport layer 225 may be a cross-linked layer, and after the step 1955 of annealing the electron transport layer, the electron transport layer 225 may be cross-linked. In one embodiment, the step 1955 of annealing the electron transport layer 225 may be performed in an atmosphere of nitrogen. Such a nitrogen atmosphere may be preferred for the annealing process because one or more materials within the electron transport layer 225 may be susceptible to oxidation and degradation when annealed in an atmosphere of air.

In one embodiment, during the step 1955 of annealing the electron transport layer 225, the annealing temperature may be in the range of 100° C. to 220° C. Such a range annealing of temperatures may effectively enable any residual solvent to be removed from the electron transport layer 225. In one embodiment, the step 1955 of annealing the electron transport layer 225 may be performed in a different chamber to the vacuum drying chamber. In one embodiment, the step 1955 of annealing the electron transport layer 225 may be performed in the same chamber as the vacuum drying chamber. In one embodiment, the step 1955 of annealing the electron transport layer 225 may be performed during the step 1950 of vacuum drying the electron transport layer ink 2135.

Preferably, the step 1955 of annealing the electron transport layer 225 is performed in a different step to the step 1950 of vacuum drying the electron transport layer ink 2135. Preferably, the step 1955 of annealing the electron transport layer 225 is performed in a different chamber to the step 1950 of vacuum drying the electron transport layer ink 2135. Preferably, the step 1955 of annealing the electron transport layer 225 is performed in a different step and in a different chamber to the step 1950 of vacuum drying the electron transport layer ink 2135. This enables the vacuum drying step 1950 to be performed at an ambient temperature of 50° C. or less, optionally 30° C. or less, which as described herein, ensures the electron transport layer ink 2135 does not dry prematurely to assemble a non-uniform electron transport layer 225 during transfer of the substrate 110 into the vacuum drying chamber. Furthermore, process times for the step 1950 of vacuum drying the electron transport layer ink 2135 and the step 1955 of annealing the electron transport layer 225 may be individually optimized. For example, a typical optimized vacuum drying step 1950 may be expected to be 90-120 seconds, whereas a typical optimized annealing step 1955 may be expected to be in the range of 10-30 minutes, such that multiple substrates are required to be loaded into a single annealing chamber to ensure a steady process flow for manufacturing displays. Separating the step 1950 of vacuum drying and the step 1955 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform electron transport layers 225 with reduced optoelectronic performance and a non-optimized manufacturing process flow with higher cost.

Method 1900 further comprises a step 1960 of providing a perovskite ink 1240, wherein the perovskite ink 1240 comprises at least one solvent and at least one perovskite light emitting material mixed in the at least one solvent. The at least one solvent is needed to solubilize the at least one perovskite light emitting material to form a perovskite ink 1240 that can be inkjet printed.

Method 1900 further comprises a step 1965 of depositing the perovskite ink 1240 into the at least one sub-pixel over the electron transport layer 225 using a method of inkjet printing. Inkjet printing allows for inks for red, green and blue emissive layers to be deposited within different sub-pixels of a display, without the need for expensive fine metal masks that would be required for patterning red, green and blue emissive layers within different sub-pixels of a display using vapour deposition processes. The inkjet printing process may be performed in an atmosphere of air or nitrogen, avoiding the need for expensive vacuum chambers, as required to deposit layers using vacuum deposition processes.

Arrangement 2110 in FIG. 21c depicts a perovskite ink 1240 that has been deposited into the at least one sub-pixel over an electron transport layer 225 using a method of inkjet printing. The sub-pixel is defined by a bank structure 1230. In one embodiment, the step 1965 of depositing the perovskite ink 1240 into the at least one sub-pixel over the electron transport layer 225 by inkjet printing is performed in an atmosphere of air. In one embodiment, the step 1965 of depositing the perovskite ink 1240 into the at least one sub-pixel over the electron transport layer 225 by inkjet printing is performed in an atmosphere of nitrogen.

Method 1900 further comprises a step 1970 of vacuum drying the perovskite ink 1240 inside a vacuum drying chamber to assemble a perovskite emissive layer 235 over the electron transport layer 225 in the at least one sub-pixel. The process of vacuum drying the perovskite ink 1240 can be understood with reference to FIG. 21c and FIG. 21d. Arrangement 2110 in FIG. 21c depicts the status of method 1900 after step 1965, but before step 1970. That is to say, arrangement 2110 depicts the status before the step of vacuum drying the perovskite ink 1240. During step 1970, the arrangement 2110 is transferred to a vacuum drying chamber. Within the vacuum drying chamber, ambient pressure is reduced to extract one or more solvents from the perovskite ink 1240. This causes the perovskite ink 1240 to contract and solidify to assemble a perovskite emissive layer 235. Arrangement 2115 in FIG. 21d depicts the status of method 1900 after step 1970. That is to say, arrangement 2115 depicts the status after the step of vacuum drying the perovskite ink 1240. After vacuum drying, one or more solvents have been extracted from perovskite ink 1240, and a perovskite emissive layer 235 has been assembled.

Vacuum drying has several advantages over other layer assembly techniques. For example, the rate at which one or more solvents are extracted from the perovskite ink 1240 may be controlled by varying the rate at which pressure is reduced in a vacuum drying chamber. This enables both the profile and morphology of the assembled perovskite emissive layer 235 to be controlled by varying the rate of vacuum drying of the perovskite ink 1240. Using an external factor, such as ambient pressure, to control the morphology and profile of the perovskite emissive layer 235 is advantageous compared to spincoat techniques, such as those disclosed in Wang et al. because the perovskite emissive layer 235 properties may be controlled more precisely and with greater reproducibility.

Vacuum drying enables perovskite emissive layers 235 to be assembled rapidly across large area substrates 110, as required in the manufacturing process for displays, where takt times are typically of order 90-120 seconds. This cannot be achieved by alternative drying processes such as annealing a perovskite ink 1240 to assemble a perovskite emissive layer 235, which is the method that has been used in all previous work on perovskite light emitting devices. As disclosed herein, an additional step 1975 of annealing the perovskite emissive layer 235 after it has been assembled by a step 1970 of vacuum drying is advantageous. Such an additional annealing step 1975 would not assemble the perovskite emissive layer 235 from the perovskite ink 1240 because the perovskite emissive layer 235 would already have been assembled during the vacuum drying step 1970. Such an additional annealing step 1975 would instead remove residual solvent from the assembled perovskite emissive layer 235 and optimize the morphology of the perovskite emissive layer 235.

The process of vacuum drying may be further understood with reference to FIG. 11, which depicts two exemplary vacuum drying curves 1110 and 1120, which may be applied during step 1970.

In one embodiment, during the step 1970 of vacuum drying the perovskite ink 1240, the pressure inside the vacuum drying chamber may be reduced to less than or equal to 0.0001 mbar. By reducing the pressure to less than or equal to 0.0001 mbar, one or more solvents may be extracted from the perovskite ink 1240 to assemble a perovskite emissive layer 235. Furthermore, by reducing the pressure to less than or equal to 0.0001 mbar, very little residual solvent may remain in the perovskite emissive layer 235 after step 1970.

In one embodiment, during the step 1970 of vacuum drying the perovskite ink 1240, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1970 of vacuum drying the perovskite ink 1240, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1970 of vacuum drying the perovskite ink 1240 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1970 of vacuum drying the perovskite ink 1240 may include additional time for processes such as transfer and alignment of the substrate 110, but such additional time is not included in the foregoing discussion of vacuum drying process times.

Preferably, during the step 1970 of vacuum drying the perovskite ink 1240 to assemble the perovskite emissive layer 235, the ambient temperature inside the vacuum drying chamber is 50° C. or less, optionally 30° C. or less. This low temperature ensures that the perovskite ink 1240 does not dry prematurely to assemble a non-uniform perovskite emissive layer 235 during transfer of the substrate 110 into the vacuum drying chamber. For example, if the ambient temperature inside the vacuum drying chamber were higher than approximately 50° C., the perovskite ink 1240 disposed over the area of the substrate 110 that enters the vacuum chamber first would begin to dry before the perovskite ink 1240 disposed over the area of the substrate 110 that enters the vacuum chamber last. This would result in an imbalance of vapour pressure and evaporation rate of the perovskite ink 1240 across the substrate 110 and the assembly of a non-uniform perovskite emissive layer 235 with reduced optoelectronic performance.

The rate at which ambient pressure is reduced may be tuned according to the required perovskite emissive layer 235 morphology and profile. The rate at which ambient pressure is reduced may also be tuned according to other additional factors that may influence the assembly and resultant morphology and profile of the perovskite emissive layer 235. Such additional factors may include solid content of the perovskite ink, sub-pixel dimensions, volume of the perovskite ink drops, number of the perovskite ink drops and bank structure 1230 design. The ability to tune the rate at which ambient pressure is reduced during step 1970 in the disclosed method 1900 enables greater control over the assembly and resultant morphology and profile of a perovskite emissive layer 235 compared to alternative self-assembly processes, such as those described in Wang et al. This results in improved perovskite light emitting device performance.

Method 1900 further comprises a step 1975 of annealing the perovskite emissive layer 235. By annealing the perovskite emissive layer 235, any residual solvent may be removed from the perovskite emissive layer 235. Furthermore, by annealing the perovskite emissive layer 235, the thickness, morphology or profile of the perovskite emissive layer 235 may be defined by any movement of the perovskite emissive layer 235 during extraction of any residual solvent during the annealing process. In one embodiment, the perovskite emissive layer 235 may be a cross-linked layer, and after the step 1975 of annealing the perovskite emissive layer, the perovskite emissive layer 235 may be cross-linked. In one embodiment, the step 1975 of annealing the perovskite emissive layer 235 may be performed in an atmosphere of nitrogen. Such a nitrogen atmosphere may be preferred for the annealing process because one or more materials within the perovskite emissive layer 235 may be susceptible to oxidation and degradation when annealed in an atmosphere of air.

In one embodiment, during the step 1975 of annealing the perovskite emissive layer 235, the annealing temperature may be in the range of 80° C. to 200° C. In one embodiment, during the step 1975 of annealing the perovskite emissive layer 235, the annealing temperature may be in the range of 80° C. to 160° C. Such a range annealing of temperatures may effectively enable any residual solvent to be removed from the perovskite emissive layer 235. In one embodiment, the step 1975 of annealing the perovskite emissive layer 235 may be performed in a different chamber to the vacuum drying chamber. In one embodiment, the step 1975 of annealing the perovskite emissive layer 235 may be performed in the same chamber as the vacuum drying chamber. In one embodiment, the step 1975 of annealing the perovskite emissive layer may be performed during the step 1970 of vacuum drying the perovskite ink 1240.

Preferably, the step 1975 of annealing the perovskite emissive layer 235 is performed in a different chamber to the step 1970 of vacuum drying the perovskite ink 1240. Preferably, the step 1975 of annealing the perovskite emissive layer 235 is performed in a different step and in a different chamber to the step 1970 of vacuum drying the perovskite ink 1240. This enables the vacuum drying step 1970 to be performed at an ambient temperature of 50° C. or less, optionally 30° C. or less, which as described herein, ensures the perovskite ink 1240 does not dry prematurely to assemble a non-uniform perovskite emissive layer 235 during transfer of the substrate 110 into the vacuum drying chamber. Furthermore, process times for the step 1970 of vacuum drying the perovskite ink 1240 and the step 1975 of annealing the perovskite emissive layer 235 may be individually optimized. For example, a typical optimized vacuum drying step 1970 may be expected to be 90-120 seconds, whereas a typical optimized annealing step 1975 may be expected to be in the range of 10-30 minutes, such that multiple substrates are required to be loaded into a single annealing chamber to ensure a steady process flow for manufacturing displays. Separating the step 1970 of vacuum drying and the step 1975 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform perovskite emissive layers 235 with reduced optoelectronic performance and a non-optimized manufacturing process flow with higher cost.

Method 1900 further comprises a step 1995 of depositing an anode 255 over the perovskite emissive layer 235 using a method of vapour deposition, which is labelled "Deposit Anode by Vapour Deposition". The anode 255 may be transparent, enabling a top-emission device architecture, or reflective, enabling a bottom-emission device architecture.

In one embodiment, method 1900 comprises an optional additional step 1920 of providing an electron injection layer ink 2145, wherein the electron injection layer ink 2145 comprises at least one solvent and at least one electron injection material mixed in the at least one solvent. The at least one solvent is needed to solubilize the at least one electron injection material to form an electron injection layer ink 2145 that can be inkjet printed. In one embodiment, method 1900 comprises an optional additional step 1925 of depositing the electron injection layer ink 2145 into the at least one sub-pixel over the cathode 215 using a method of inkjet printing.

Arrangement 2120 in FIG. 21e depicts an electron injection layer ink 2145 that has been deposited into the at least one sub-pixel over the cathode 215 using a method of inkjet printing. The sub-pixel is defined by a bank structure 1230. In one embodiment, the step 1925 of depositing the electron injection layer ink 2145 into the at least one sub-pixel over the cathode 215 by inkjet printing is performed in an atmosphere of air. In one embodiment, the step 1925 of depositing the electron injection layer ink 2145 into the at least one sub-pixel over the cathode 215 by inkjet printing is performed in an atmosphere of nitrogen.

In one embodiment, method 1900 comprises an optional additional step 1930 of vacuum drying the electron injection layer ink 2145 inside a vacuum drying chamber to assemble an electron injection layer 220 over the cathode 215 in the at least one sub-pixel. The process of vacuum drying the electron injection layer ink 2145 can be understood with reference to FIG. 21e and FIG. 21f. Arrangement 2120 in FIG. 21e depicts the status of method 1900 after step 1925, but before step 1930. That is to say, arrangement 2120 depicts the status before the step of vacuum drying the electron injection layer ink 2145. During step 1930, the arrangement 2120 is transferred to a vacuum drying chamber. Within the vacuum drying chamber, ambient pressure is reduced to extract one or more solvents from the electron injection layer ink 2145. This causes the electron injection layer ink 2145 to contract and solidify to assemble an electron injection layer 220. Arrangement 2125 in FIG. 21f depicts the status of method 1900 after step 1930. That is to say, arrangement 2125 depicts the status after the step of vacuum drying the electron injection layer ink 2145. After vacuum drying, one or more solvents have been extracted from the electron injection layer ink 2145, and an electron injection layer 220 has been assembled.

Vacuum drying has several advantages over other layer assembly techniques. For example, the rate at which one or more solvents are extracted from the electron injection layer ink 2145 may be controlled by varying the rate at which pressure is reduced in a vacuum drying chamber. This enables both the profile and morphology of the assembled electron injection layer 220 to be controlled by varying the rate of vacuum drying of the electron injection layer ink 2145. Using an external factor, such as ambient pressure, to control the morphology and profile of the electron injection layer 220 is advantageous compared to spincoat techniques, such as those disclosed in Wang et al. because the electron injection layer 220 properties may be controlled more precisely and with greater reproducibility.

Vacuum drying enables electron injection layers 220 to be assembled rapidly across large area substrates 110, as required in the manufacturing process for displays, where takt times are typically of order 90-120 seconds. This cannot be achieved by alternative drying processes such as annealing an electron injection layer ink 2145 to assemble an electron injection layer 220, which is the method that has been used in all previous work on perovskite light emitting devices. As disclosed herein, an additional step 1935 of annealing the electron injection layer 220 after it has been assembled by a step 1930 of vacuum drying is advantageous. Such an additional annealing step 1935 would not assemble the electron injection layer 220 from the electron injection layer ink 2145 because the electron injection layer 220 would already have been assembled during the vacuum drying step 1930. Such an additional annealing step 1935 would instead remove residual solvent from the assembled electron injection layer 220 and optimize the morphology of the electron injection layer 220.

The process of vacuum drying may be further understood with reference to FIG. 11, which depicts two exemplary vacuum drying curves 1110 and 1120, which may be applied during step 1930.

In one embodiment, during the step 1930 of vacuum drying the electron injection layer ink 2145, the pressure inside the vacuum drying chamber may be reduced to less than or equal to 0.0001 mbar. By reducing the pressure to less than or equal to 0.0001 mbar, one or more solvents may be extracted from the electron injection layer ink 2145 to assemble an electron injection layer 220. Furthermore, by reducing the pressure to less than or equal to 0.0001 mbar, very little residual solvent may remain in the electron injection layer 220 after step 1930.

In one embodiment, during the step 1930 of vacuum drying the electron injection layer ink 2145, the pressure inside the vacuum drying chamber may be reduced to less than or equal to 0.0001 mbar in less than or equal to 60 seconds. For example, by applying vacuum drying curve 1110 in FIG. 11, the pressure reaches 0.0001 mbar in time t2, where t2 may be less than or equal to 60 seconds. In one embodiment, during the step 1930 of vacuum drying the electron injection layer ink 2145, the pressure inside the vacuum drying chamber may be reduced to less than or equal to 0.0001 mbar in less than or equal to 30 seconds. For example, by applying vacuum drying curve 1120 in FIG. 11, the pressure reaches 0.0001 mbar in time t1, where t1 may be less than or equal to 30 seconds. In one embodiment, the duration of the step 1930 of vacuum drying the electron injection layer ink 2145 may be less than or equal to 120 seconds. For example, by applying vacuum drying curves 1110 or 1120 in FIG. 11, the vacuum drying process may be completed at time t3, where t3 may be less than or equal to 120 seconds. Such vacuum drying process times are compatible with in-line manufacturing processes for displays, where takt time is typically of order 90-120 seconds.

Note that in the foregoing, the start of the vacuum drying process is defined as the point in time at which the ambient pressure inside the vacuum drying chamber starts to be reduced from a pressure of approximately 1000 mbar, and the end of the vacuum drying process is defined as the time at which the ambient pressure returns to a pressure of approximately 1000 mbar. The step 1930 of vacuum drying the electron injection layer ink 2145 may include additional time for processes such as transfer and alignment of the substrate 110, but such additional time is not included in the foregoing discussion of vacuum drying process times.

Preferably, during the step 1930 of vacuum drying the electron injection layer ink 2145 to assemble the electron injection layer 220, the ambient temperature inside the vacuum drying chamber is 50° C. or less, optionally 30° C. or less. This low temperature ensures that the electron injection layer ink 2145 does not dry prematurely to assemble a non-uniform electron injection layer 220 during transfer of the substrate 110 into the vacuum drying chamber. For example, if the ambient temperature inside the vacuum drying chamber were higher than approximately 50° C., the electron injection layer ink 2145 disposed over the area of the substrate 110 that enters the vacuum chamber first would begin to dry before the electron injection layer ink 2145 disposed over the area of the substrate 110 that enters the vacuum chamber last. This would result in an imbalance of vapour pressure and evaporation rate of the electron injection layer ink 2145 across the substrate 110 and the assembly of a non-uniform electron injection layer 220 with reduced optoelectronic performance.

The rate at which ambient pressure is reduced may be tuned according to the required electron injection layer 220 morphology and profile. The rate at which ambient pressure is reduced may also be tuned according to other additional factors that may influence the assembly and resultant morphology and profile of the electron injection layer 220. Such additional factors may include solid content of the electron injection layer ink, sub-pixel dimensions, volume of the electron injection layer ink drops, number of the electron injection layer ink drops and bank structure 1230 design. The ability to tune the rate at which ambient pressure is reduced during step 1930 in the disclosed method 1900 enables greater control over the assembly and resultant morphology and profile of an electron injection layer 220 compared to alternative self-assembly processes, such as those described in Wang et al. This results in improved perovskite light emitting device performance.

In one embodiment, method 1900 comprises an optional additional step 1935 of annealing the electron injection layer 220. By annealing the electron injection layer 220, any residual solvent may be removed from the electron injection layer 220. Furthermore, by annealing the electron injection layer 220, the thickness, morphology or profile of the electron injection layer 220 may be defined by any movement of the electron injection layer 220 during extraction of any residual solvent during the annealing process. In one embodiment, the electron injection layer 220 may be a cross-linked layer, and after the step 1935 of annealing the electron injection layer, the electron injection layer 220 may be cross-linked. In one embodiment, the step 1935 of annealing the electron injection layer 220 may be performed in an atmosphere of air. In one embodiment, the step 1935 of annealing the electron injection layer 220 may be performed in an atmosphere of nitrogen.

In one embodiment, during the step 1935 of annealing the electron injection layer 220, the annealing temperature may be in the range of 100° C. to 220° C. Such a range annealing of temperatures may effectively enable any residual solvent to be removed from the electron injection layer 220. In one embodiment, the step 1935 of annealing the electron injection layer 220 may be performed in a different chamber to the vacuum drying chamber. In one embodiment, the step 1935 of annealing the electron injection layer 220 may be performed in the same chamber as the vacuum drying chamber. In one embodiment, the step 1935 of annealing the electron injection layer 220 may be performed during the step 1930 of vacuum drying the electron injection layer ink 2145.

Preferably, the step 1935 of annealing the electron injection layer 220 is performed in a different step to the step 1930 of vacuum drying the electron injection layer ink 2145. Preferably, the step 1935 of annealing the electron injection layer 220 is performed in a different chamber to the step 1930 of vacuum drying the electron injection layer ink 2145. Preferably, the step 1935 of annealing the electron injection layer 220 is performed in a different step and in a different chamber to the step 1930 of vacuum drying the electron injection layer ink 2145. This enables the vacuum drying step 1930 to be performed at an ambient temperature of 50° C. or less, optionally 30° C. or less, which as described herein, ensures the electron injection layer ink 2145 does not dry prematurely to assemble a non-uniform electron injection layer 220 during transfer of the substrate 110 into the vacuum drying chamber. Furthermore, process times for the step 1930 of vacuum drying the electron injection layer ink 2145 and the step 1935 of annealing the electron injection layer 220 may be individually optimized. For example, a typical optimized vacuum drying step 1930 may be expected to be 90-120 seconds, whereas a typical optimized annealing step 1935 may be expected to be in the range of 10-30 minutes, such that multiple substrates are required to be loaded into a single annealing chamber to ensure a steady process flow for manufacturing displays. Separating the step 1930 of vacuum drying and the step 1935 of annealing thereby enables an optimized manufacturing process flow with a takt time of 90-120 seconds. This is a substantial improvement over the related art disclosed in patent applications WO 2017/080325 A1 and US 2018/0327622 A1, where vacuum drying and annealing are performed in a single step of high temperature vacuum drying, which results in the assembly of non-uniform electron injection layers 220 with reduced optoelectronic performance and a non-optimized manufacturing process flow with higher cost.

The assembly and resultant thicknesses, morphologies or profiles of the assembled layers, including the electron injection layer 220, electron transport layer 225 and perovskite emissive layer 235 may be further influenced by the solid content of the respective electron injection layer ink 2145, electron transport layer ink 2135 and perovskite ink 1240.

In one embodiment, the electron injection layer ink 2145 may comprise at least one electron injection material mixed in at least one solvent at a concentration by weight in the range of 0.01 wt. % to 10 wt. %. In one embodiment, the electron injection layer ink 2145 may comprise at least one electron injection material mixed in at least one solvent at a concentration by weight of in the range of 0.1 wt. % to 5 wt. %. In one embodiment, the electron transport layer ink 2135 may comprise at least one electron transport material mixed in at least one solvent at a concentration by weight in the range of 0.01 wt. % to 10 wt. %. In one embodiment, the electron transport layer ink 2135 may comprise at least one electron transport material mixed in at least one solvent at a concentration by weight of in the range of 0.1 wt. % to 5 wt. %. In one embodiment, the perovskite ink 1240 may comprise at least one perovskite light emitting material mixed in at least one solvent at a concentration by weight in the range of 0.01 wt. % to 10 wt. %. In one embodiment, the perovskite ink 1240 may comprise at least one perovskite light emitting material mixed in at least one solvent at a concentration by weight in the range of 0.1 wt. % to 5 wt. %.

Such ranges of concentration by weight in the electron injection layer ink 2145, electron transport layer ink 2135 and perovskite ink 1240 may enable the thicknesses of the electron injection layer 220, electron transport layer 225 and perovskite emissive layer 235 to be controlled. In one embodiment, by increasing the concentration by weight of the electron injection material, the thickness of the electron injection layer 220 may be increased. In one embodiment, the thickness of the electron injection layer 220 may be in the range of 10 nm to 80 nm. In one embodiment, by increasing the concentration by weight of the electron transport material, the thickness of the electron transport layer 225 may be increased. In one embodiment, the thickness of the electron transport layer 225 may be in the range of 10 nm to 80 nm. In one embodiment, by increasing the concentration by weight of the perovskite light emitting material, the thickness of the perovskite emissive layer 235 may be increased. In one embodiment, the thickness of the perovskite emissive layer 235 may be in the range of 15 nm to 150 nm. Such a thickness range may maximize the proportion of recombination of electrons and holes within the perovskite emissive layer 235, thereby maximizing the efficiency of light emission from the perovskite emissive layer 235.

Such a ranges of concentration by weight of material in the respective inks may further enable the morphologies and profiles of the electron injection layer 220, electron transport layer 225 and perovskite emissive layer 235 to be controlled. For example, an ink with higher weight concentration may be of higher viscosity than an ink with lower weight concentration. The change in viscosity may affect how the respective ink contracts and solidifies to form a layer during vacuum drying. This may result in a different morphology of electron injection material, electron transport material and perovskite light emitting material in the respective electron injection layer 220, electron transport layer 225 and perovskite emissive layer 235 after vacuum drying, as well as different profiles of the electron injection layer 220, electron transport layer 225 and perovskite emissive layer 235.

Note that as described herein, layer thickness is defined as the thickness of the respective layer at the centre of the at least one sub-pixel. It is not defined as the thickness of the respective layer in regions of the at least one sub-pixel over or adjacent to the bank structure 1230. For a well-controlled application of method 1900, the resulting electron injection layer 220, electron transport layer 225 and perovskite emissive layer 235 may each be of uniform thickness across the at least one sub-pixel, with less than approximately 10%, and optionally less than approximately 5% thickness variation across the at least one sub-pixel. However, in some instances, application of method 1900 may result in substantial thickness variation of the electron injection layer 220, electron transport layer 225 and perovskite emissive layer 235 across the at least one sub-pixel. In all instances, layer thickness is defined at the centre of the at least one sub-pixel.

The assembly and resultant morphologies or profiles of the assembled layers, including the electron injection layer 220, electron transport layer 225 and perovskite emissive layer 235 may be further influenced by the dimensions of the at least one sub-pixel into which the electron injection layer ink 2145, electron transport layer ink 2135 and perovskite ink 1240 are inkjet printed. The dimensions of the at least one sub-pixel may be defined by the bank structure 1230. FIG. 13 depicts exemplary designs of sub-pixels. Included in FIG. 13 is an arrangement 1300 of three adjacent sub-pixels, each of length L and width W. The first sub-pixel 1310 may comprise a red sub-pixel, wherein such a red sub-pixel may comprise a red perovskite light emitting device comprising a red perovskite emissive layer 235. The second sub-pixel 1320 may comprise a green sub-pixel, wherein such a green sub-pixel may comprise a green perovskite light emitting device comprising a green perovskite emissive layer 235. The third sub-pixel 1330 may comprise a blue sub-pixel, wherein such a blue sub-pixel may comprise a blue perovskite light emitting device comprising a blue perovskite emissive layer 235. A typical pixel arrangement of a commercial display may comprise a sub-pixel arrangement such as 1300.

In one embodiment, the at least one sub-pixel into which the electron injection layer ink 2145, electron transport layer ink 2135 and perovskite ink 1240 are inkjet printed may be of length in the range of 100 μm to 2501 μm, and of width in the range of 40 μm to 80 μm. Such ranges of sub-pixel lengths and widths correspond to the dimensions required for television displays of size approximately 55-inch to 77-inch with 4K2K pixel resolution, or more formally 3840×2160 pixel resolution, which is also referred to as ultra-high definition (UHD) resolution. In one embodiment, the at least one sub-pixel into which the electron injection layer ink 2145, electron transport layer ink 2135 and perovskite ink 1240 are inkjet printed may be of length in the range of 50 μm to 1501 μm, and of width in the range of 20 μm to 40 μm. Such ranges of sub-pixel lengths and widths correspond to the dimensions required for television displays of size approximately 55-inch to 77-inch with 8K pixel resolution, or more formally 7680×4320 pixel resolution, which is also referred to as 8K ultra high definition (8K UHD). In one embodiment, the at least one sub-pixel into which the electron injection layer ink 2145, electron transport layer ink 2135 and perovskite ink 1240 are inkjet printed may be of length in the range of 10 μm to 50 μm, and of width in the range of 5 μm to 20 μm. Such ranges of sub-pixel lengths and widths correspond to the dimensions required for smartphone displays of resolution in the approximate range of 400 to 600 pixels per inch (ppi).

The assembly and resultant thicknesses, morphologies or profiles of the assembled layers, such as the electron injection layer 220, electron transport layer 225 and perovskite emissive layer 235 may be further influenced by the ink drop volume during the respective steps of depositing the electron injection layer ink 2145, electron transport layer ink 2135 and perovskite ink 1240. For example, the profile of the layers may be tuned by using a larger number of drops of lower volume, or a lower number of drops of larger volume. In one embodiment, the profile of the assembled electron injection layer 220, electron transport layer 225 and perovskite emissive layer 235 may each be controlled by varying the ink drop volume during the respective steps of depositing the electron injection layer ink 2145, electron transport layer ink 2135 and perovskite ink 1240.

For larger sub-pixels, ink drops with a larger volume may be used during the steps of depositing the electron injection layer ink 2145, electron transport layer ink 2135 and perovskite ink 1240. In one embodiment, the electron injection layer ink drop volume may be in the range of 5 pico-liters to 15 pico-liters. In one embodiment, the electron transport layer ink drop volume may be in the range of 5 pico-liters to 15 pico-liters. In one embodiment, the perovskite ink drop volume may be in the range of 5 pico-liters to 15 pico-liters. Such a range of ink drop volumes may be suitable for inkjet printing ink into sub-pixels of length in the range of 100 μm to 2501 μm, and of width in the range of 40 μm to 80 μm, as required for television displays of size approximately 55-inch to 77-inch with 4K2K pixel resolution. Such a range of ink drop volumes may also be suitable for inkjet printing ink into sub-pixels of length in the range of 50 μm to 1501 μm, and of width in the range of 20 μm to 40 μm, as required for television displays of size approximately 55-inch to 77-inch with 8K pixel resolution.

For smaller sub-pixels, ink drops with a smaller volume may be used during the steps of depositing the electron injection layer ink 2145, electron transport layer ink 2135 and perovskite ink 1240. In one embodiment, the electron injection layer ink drop volume may be in the range of 0.5 pico-liters to 2 pico-liters. In one embodiment, the electron transport layer ink drop volume may be in the range of 0.5 pico-liters to 2 pico-liters. In one embodiment, the perovskite ink drop volume may be in the range of 0.5 pico-liters to 2 pico-liters. Such a range of ink drop volumes may be suitable for inkjet printing ink into sub-pixels of length in the range of 10 μm to 50 μm, and of width in the range of 5 μm to 20 μm, as required for smartphone displays of resolution in the approximate range of 400 to 600 pixels per inch (ppi).

The assembly and resultant thicknesses, morphologies or profiles of the assembled layers, such as the electron injection layer 220, electron transport layer 225 and perovskite emissive layer 235 may be further influenced by the number of ink drops during the respective steps of depositing the electron injection layer ink 2145, electron transport layer ink 2135 and perovskite ink 1240. In one embodiment, the profiles of the assembled electron injection layer 220, electron transport layer 225 and perovskite emissive layer 235 may be controlled by varying the number of ink drops during the respective steps of depositing the electron injection layer ink 2145, electron transport layer ink 2135 and perovskite ink 1240. For example, the profiles of the electron injection layer 220, electron transport layer 225 and perovskite emissive layer 235 may be tuned by using a larger number of drops of lower volume or a lower number of drops of larger volume. In one embodiment, the total number of electron injection layer ink drops may in the range of 4 ink drops to 20 ink drops. In one embodiment, the total number of electron transport layer ink drops may in the range of 4 ink drops to 20 ink drops. In one embodiment, the total number of perovskite ink drops may in the range of 4 ink drops to 20 ink drops. For each layer, a larger number of ink drops of lower volume may allow for the respective inks to be spread more evenly across the sub-pixel, potentially resulting in more uniform layers after vacuum drying. Conversely, for each layer, a lower number of ink drops of larger volume may allow for the respective inks to be inkjet printed more rapidly, enabling a reduced takt time during the manufacturing process.

The assembly and resultant thicknesses, morphologies or profiles of the assembled layers, including the electron injection layer 220, electron transport layer 225 and perovskite emissive layer 235 may be further influenced by the bank structure 2130 used to define the at least one sub-pixel. FIG. 14 depicts arrangement 1400, which depicts a cross-section of a bank structure 1230 disposed over a substrate 110. The bank structure 1230 is disposed over the substrate 110 such that the bank structure 1230 is inclined at an angle θ at the edge of the at least one sub-pixel. In one embodiment, the profiles of the assembled layers, including the electron injection layer 220, electron transport layer 225 and perovskite emissive layer 235 may be controlled by varying the angle of the bank structure 1230 at the edge of the at least one sub-pixel. For example, where the angle θ is lower, the electron injection layer ink 2145, electron transport layer ink 2135 and perovskite ink 1240 may each spread further over the bank structure 1230, which may influence the layer profiles when the respective inks are vacuum dried to assemble layers. In one embodiment, the bank structure 1230 may be provided at an angle θ in the range of 30° to 60° at the edge of the at least one sub-pixel. Such a range of angles θ may effectively contain the electron injection layer ink 2145, electron transport layer ink 2135 and perovskite ink 1240 within the sub-pixel, while also allowing the inks to assemble uniform layers during vacuum drying.

In one embodiment, the profiles of the assembled layers, including the electron injection layer 220, electron transport layer 225 and perovskite emissive layer 235 may be controlled by varying the surface energy of the bank structure 1230. For example, if the surface energy of the bank structure 1230 is substantially higher than the surface energy of each of the inks, then the inks may be attracted to and spread over the surface of the bank structure 1230. However, if the surface energy of the bank structure 1230 is not substantially higher than the surface energy of each of the inks, then the inks may be repelled from and not spread over the bank structure 1230. In one embodiment, the surface energy of the bank structure 1230 may be controlled such that the lower proportion of the bank structure 1230, nearest the substrate 110, has substantially higher surface energy than each of the electron injection layer ink 2145, electron transport layer ink 2135 and perovskite ink 1240, while the upper proportion of the bank structure 1230, furthest away from the substrate 110, does not have substantially higher surface energy than each of the electron injection layer ink 2145, electron transport layer ink 2135 and perovskite ink 1240. This may enable the electron injection layer ink 2145, electron transport layer ink 2135 and perovskite ink 1240 to each spread evenly across the sub-pixel and remain in contact with the lower proportion of the bank structure 1230, without any de-wetting, but prevent the electron injection layer ink 2145, electron transport layer ink 2135 and perovskite ink 1240 from spreading over the upper proportion of the bank structure 1230 into one or more adjacent sub-pixels. The electron injection layer ink 2145, electron transport layer ink 2135 and perovskite ink 1240 may then assemble uniform layers after vacuum drying.

Figure 23:
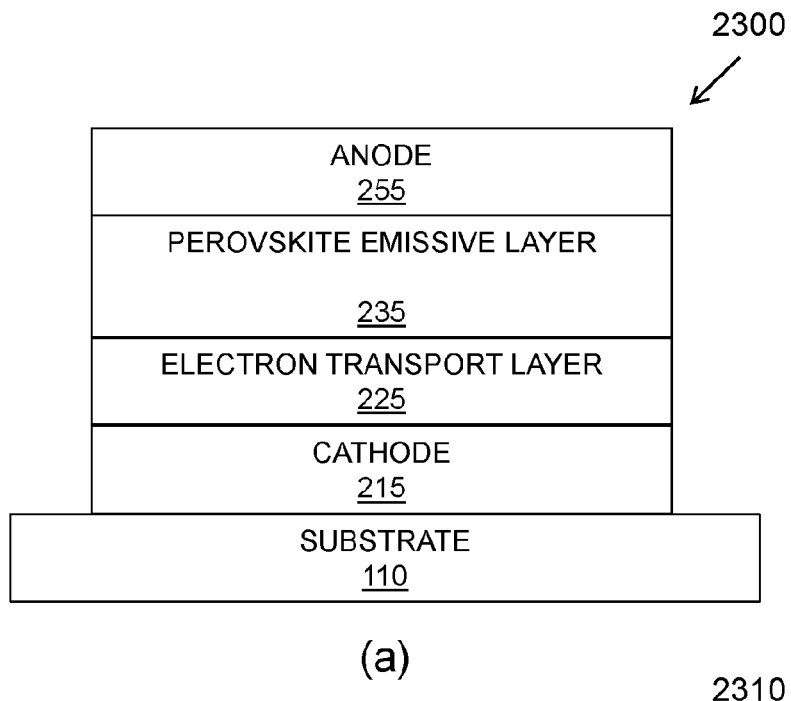
FIG. 23 depicts various layer configurations for an inverted perovskite light emitting device.
Figure 23:
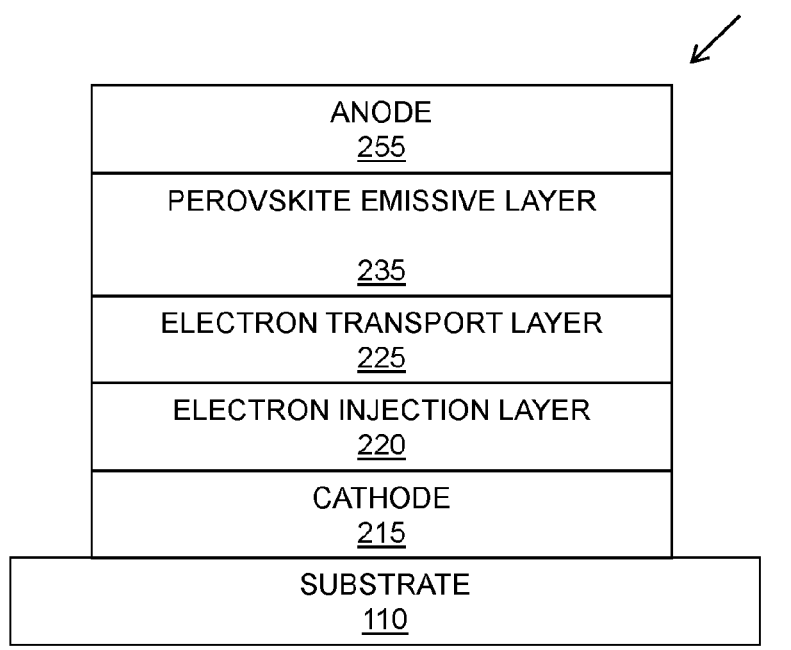
Figure 23:
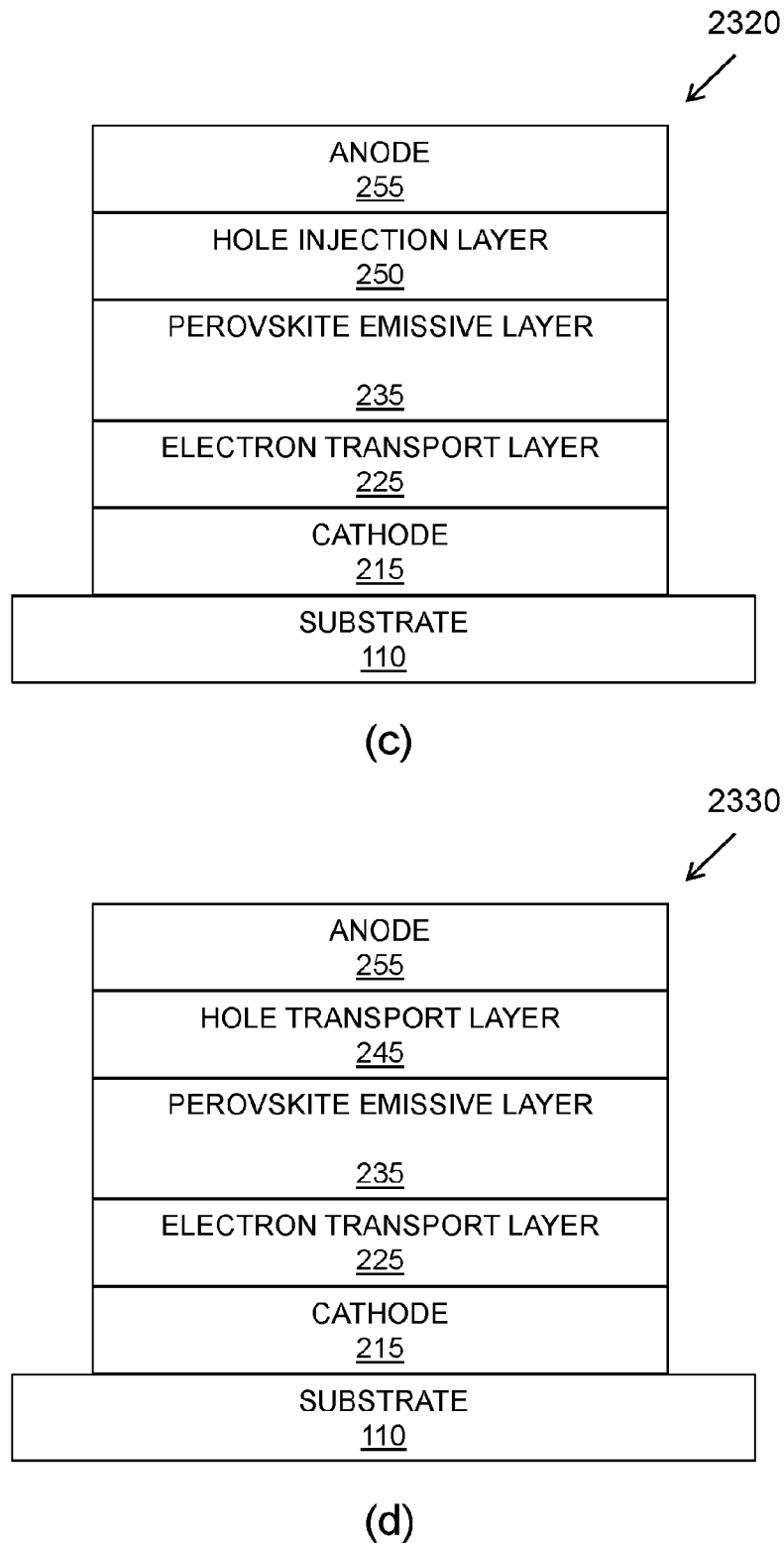
Figure 23:
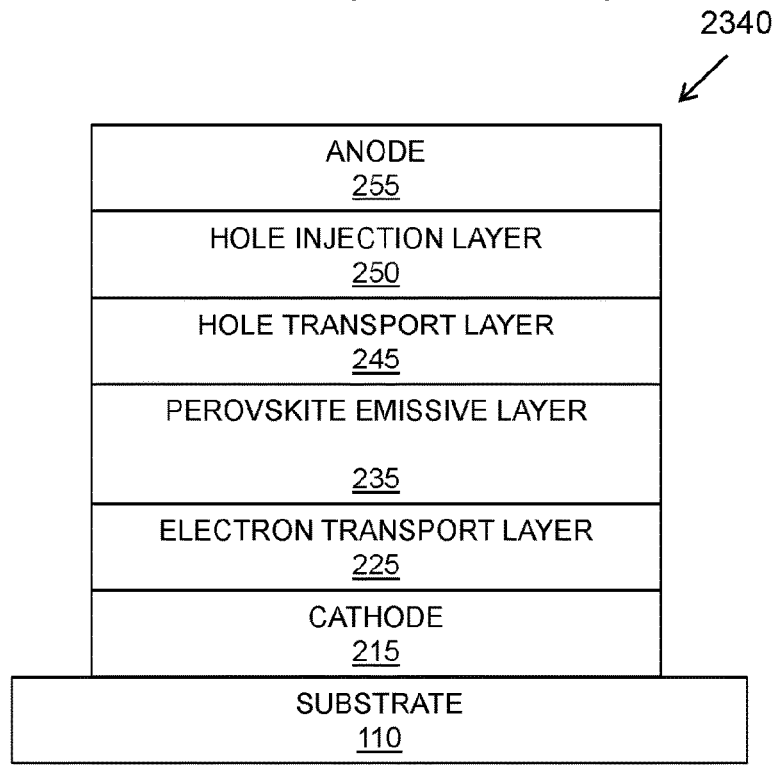
Figure 23:
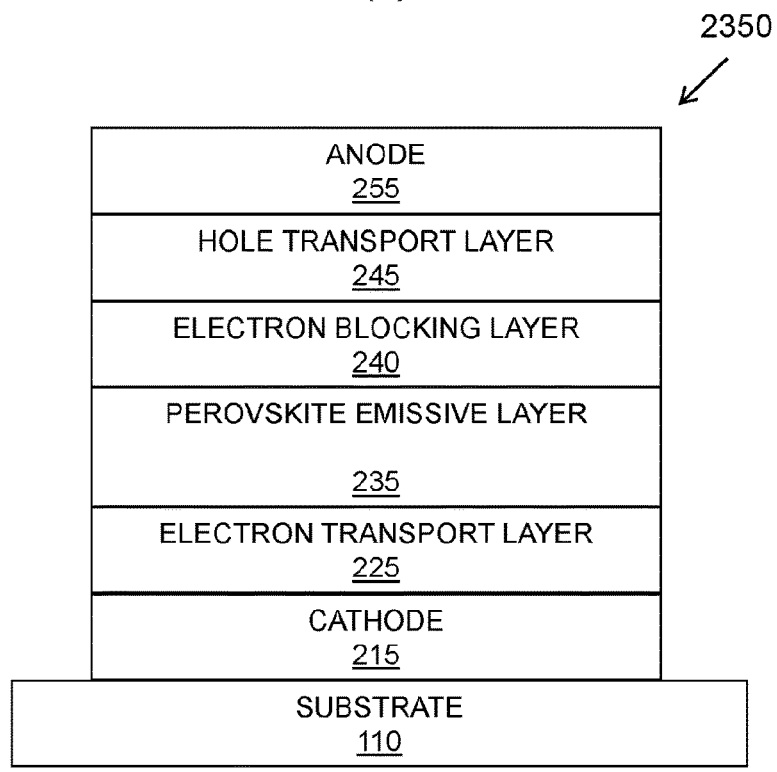
Figure 23:
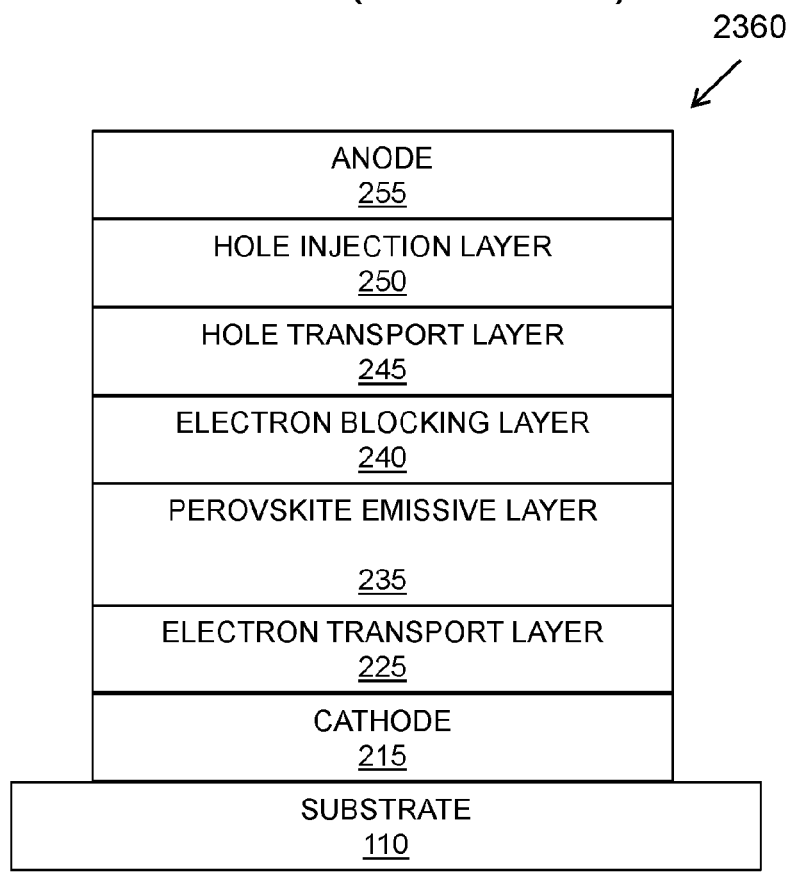

In one embodiment, method 1900 comprises an optional additional step 1980 of depositing an electron blocking layer 240 over the perovskite emissive layer 235 using a method of vapour deposition. In one embodiment, method 1900 comprises an optional additional step 1985 of depositing a hole transport layer 245 over the perovskite emissive layer 235 using a method of vapour deposition. In one embodiment, method 1900 comprises an optional additional step 1990 of depositing a hole injection layer 250 over the perovskite emissive layer 235 using a method of vapour deposition. FIG. 23 depicts various layer configurations for an inverted perovskite light emitting device. In one embodiment, after the step 1975 of annealing the perovskite emissive layer 235, but before the step 1995 of depositing an anode 255 over the perovskite emissive layer 235 using a method of vapour deposition, the method 1900 further comprises the step 1990 of depositing a hole injection layer 250 over the perovskite emissive layer 235 using a method of vapour deposition. This layer configuration is depicted by arrangement 2320 in FIG. 23c. The inclusion of an optional hole injection layer 250 may improve the injection of holes from the anode 255 into the device.

In one embodiment, after the step 1975 of annealing the perovskite emissive layer 235, but before the step 1995 of depositing an anode 255 over the perovskite emissive layer 235 using a method of vapour deposition, the method 1900 further comprises the step 1985 of depositing a hole transport layer 245 over the perovskite emissive layer 235 using a method of vapour deposition. This layer configuration is depicted by arrangement 2330 in FIG. 23d. The inclusion of an optional hole transport layer 245 may improve transport of holes to the perovskite emissive layer 235.

In one embodiment, after the step 1975 of annealing the perovskite emissive layer 235, but before the step 1995 of depositing a anode 255 over the perovskite emissive layer 235 using a method of vapour deposition, the method 1900 further comprises: step 1985 of depositing a hole transport layer 245 over the perovskite emissive layer 235 using a method of vapour deposition; and step 1990 of depositing a hole injection layer 250 over the hole transport layer 245 using a method of vapour deposition. This layer configuration is depicted by arrangement 2340 in FIG. 23e. The inclusion of an optional hole transport layer 245 and an optional hole injection layer 250 may improve the injection of holes from the anode 255 into the device, and the transport of holes to the perovskite emissive layer 235.

In one embodiment, after the step 1975 of annealing the perovskite emissive layer 235, but before the step 1995 of depositing an anode 255 over the perovskite emissive layer 235 using a method of vapour deposition, the method 1900 further comprises: step 1980 of depositing an electron blocking layer 240 over the perovskite emissive layer 235 using a method of vapour deposition; and step 1985 of depositing a hole transport layer 245 over the electron blocking layer 240 using a method of vapour deposition. This layer configuration is depicted by arrangement 2350 in FIG. 23f. The inclusion of an optional electron blocking layer 240 and an optional hole transport layer 245 may improve the transport of holes to the perovskite emissive layer 235 and reduce the leakage of electron from the perovskite emissive layer 235.

In one embodiment, after the step 1975 of annealing the perovskite emissive layer 235, but before the step 1995 of depositing an anode 255 over the perovskite emissive layer 235 using a method of vapour deposition, the method 1900 further comprises: step 1980 of depositing an electron blocking layer 240 over the perovskite emissive layer 235 using a method of vapour deposition; step 1985 of depositing a hole transport layer 245 over the electron blocking layer 240 using a method of vapour deposition; and step 1990 of depositing a hole injection layer 250 over the hole transport layer 245 using a method of vapour deposition. This layer configuration is depicted by arrangement 2360 in FIG. 23g. The inclusion of an optional electron blocking layer 240, an optional hole transport layer 245 and an optional hole injection layer 250 may improve the injection of holes from the anode 255 into the device, the transport of holes to the perovskite emissive layer 235 and reduce the leakage of electron from the perovskite emissive layer 235.

Figure 25:
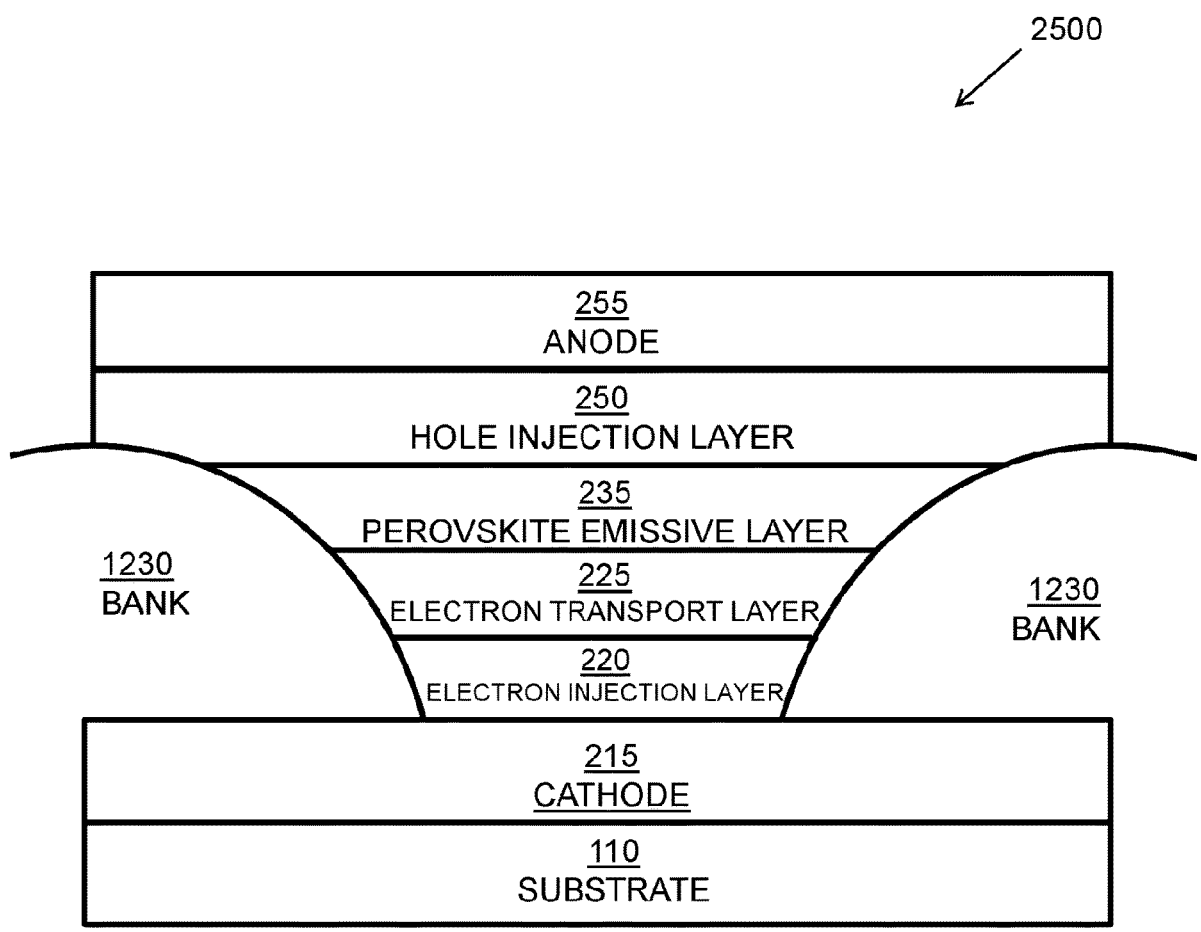
FIG. 25 depicts a cross-section of an exemplary inverted perovskite light emitting device.

The present invention relates to a method 1900 of fabricating an inverted perovskite light emitting device. The present invention further relates to inverted perovskite light emitting devices fabricated using the disclosed method. FIG. 25 depicts a cross-section of an exemplary inverted perovskite light emitting device 2500 that may be fabricated using the disclosed method. The inverted perovskite light emitting device 2500 comprises a substrate 110, a cathode 215, an electron injection layer 220, an electron transport layer 225, a perovskite emissive layer 235, a hole injection layer 250 and an anode 255. The inverted perovskite light emitting device 2500 further comprises a bank structure 1230. The inverted perovskite light emitting device 2500 is one example of an inverted perovskite light emitting device that may be fabricated using the disclosed method 1900. Additional inverted perovskite light emitting device architectures may also be fabricated using method 1900, and these additional device architectures are also covered by this disclosure.

A method of fabricating a perovskite light emitting device is provided. In one embodiment, the method comprises the steps of: providing a substrate; providing an anode disposed over the substrate; providing a bank structure disposed over the substrate, wherein the bank structure is patterned so as to define at least one sub-pixel on the substrate; providing a hole transport layer ink, wherein the hole transport layer ink comprises at least one solvent and at least one hole transport material mixed in the at least one solvent; depositing the hole transport layer ink into the at least one sub-pixel over the anode using a method of inkjet printing; vacuum drying the hole transport layer ink inside a vacuum drying chamber to assemble a hole transport layer over the anode in the at least one sub-pixel; annealing the hole transport layer; providing a perovskite ink, wherein the perovskite ink comprises at least one solvent and at least one perovskite light emitting material mixed in the at least one solvent; depositing the perovskite ink into the at least one sub-pixel over the hole transport layer using a method of inkjet printing; vacuum drying the perovskite ink inside a vacuum drying chamber to assemble a perovskite emissive layer over the hole transport layer in the at least one sub-pixel; annealing the perovskite emissive layer; and depositing a cathode over the perovskite emissive layer using a method of vapour deposition.

In one embodiment, the thickness of the hole transport layer is in the range of 10 nm to 80 nm. In one embodiment, the hole transport layer is a cross-linked layer. In one embodiment, the step of depositing the hole transport layer ink into the at least one sub-pixel over the anode using a method of inkjet printing is performed in an atmosphere of air or nitrogen. In one embodiment, the step of annealing the hole transport layer is performed in an atmosphere of nitrogen. In one embodiment, the hole transport layer is annealed at a temperature in the range of 100° C. to 220° C.

In one embodiment, the thickness of the perovskite emissive layer is in the range of 15 nm to 150 nm. In one embodiment, the step of depositing the perovskite ink into the at least one sub-pixel over the hole transport layer using a method of inkjet printing is performed in an atmosphere of air or nitrogen. In one embodiment, the step of annealing the perovskite emissive layer is performed in an atmosphere of nitrogen. In one embodiment, the perovskite emissive layer is annealed at a temperature in the range of 80° C. to 200° C.

In one embodiment, after the step of providing a bank structure disposed over the substrate, wherein the bank structure is patterned so as to define at least one sub-pixel on the substrate, but before the step of providing a hole transport layer ink, wherein the hole transport layer ink comprises at least one solvent and at least one hole transport material mixed in the at least one solvent, the method further comprises the steps of: providing a hole injection layer ink, wherein the hole injection layer ink comprises at least one solvent and at least one hole injection material mixed in the at least one solvent; depositing the hole injection layer ink into the at least one sub-pixel over the anode using a method of inkjet printing; vacuum drying the hole injection layer ink inside a vacuum drying chamber to assemble a hole injection layer over the anode in the at least one sub-pixel; and annealing the hole injection layer.

In one embodiment, the thickness of the hole injection layer is in the range of 10 nm to 80 nm. In one embodiment, the step of depositing the hole injection layer ink into the at least one sub-pixel over the anode using a method of inkjet printing is performed in an atmosphere of air or nitrogen. In one embodiment, the hole injection layer is annealed at a temperature in the range of 100° C. to 220° C. In one embodiment, the step of annealing the hole injection layer is performed in an atmosphere of air or nitrogen.

In one embodiment, after the step of annealing the perovskite emissive layer, but before the step of depositing a cathode over the perovskite emissive layer using a method of vapour deposition, the method further comprises the step of depositing an electron injection layer over the perovskite emissive layer using a method of vapour deposition.

In one embodiment, after the step of annealing the perovskite emissive layer, but before the step of depositing a cathode over the perovskite emissive layer using a method of vapour deposition, the method further comprises the step of depositing an electron transport layer over the perovskite emissive layer using a method of vapour deposition.

In one embodiment, after the step of annealing the perovskite emissive layer, but before the step of depositing a cathode over the perovskite emissive layer using a method of vapour deposition, the method further comprises the steps of depositing an electron transport layer over the perovskite emissive layer using a method of vapour deposition, and depositing an electron injection layer over the electron transport layer using a method of vapour deposition.

In one embodiment, after the step of annealing the perovskite emissive layer, but before the step of depositing a cathode over the perovskite emissive layer using a method of vapour deposition, the method further comprises the steps of depositing a hole blocking layer over the perovskite emissive layer using a method of vapour deposition, and depositing an electron transport layer over the hole blocking layer using a method of vapour deposition.

In one embodiment, after the step of annealing the perovskite emissive layer, but before the step of depositing a cathode over the perovskite emissive layer using a method of vapour deposition, the method further comprises the steps of depositing a hole blocking layer over the perovskite emissive layer using a method of vapour deposition, depositing an electron transport layer over the hole blocking layer using a method of vapour deposition, and depositing an electron injection layer over the electron transport layer using a method of vapour deposition.

In one embodiment, the profile of the assembled perovskite emissive layer may be controlled by varying the rate of vacuum drying of the perovskite ink. In one embodiment, the profile of the assembled hole transport layer may be controlled by varying the rate of vacuum drying of the hole transport layer ink. In one embodiment, the morphology of the assembled perovskite emissive layer may be controlled by varying the rate of vacuum drying of the perovskite ink. In one embodiment, the morphology of the assembled hole transport layer may be controlled by varying the rate of vacuum drying of the hole transport layer ink.

A perovskite light emitting device is provided. In one embodiment, the perovskite light emitting device is fabricated by the aforementioned method comprising the steps of: providing a substrate; providing an anode disposed over the substrate; providing a bank structure disposed over the substrate, wherein the bank structure is patterned so as to define at least one sub-pixel on the substrate; providing a hole transport layer ink, wherein the hole transport layer ink comprises at least one solvent and at least one hole transport material mixed in the at least one solvent; depositing the hole transport layer ink into the at least one sub-pixel over the anode using a method of inkjet printing; vacuum drying the hole transport layer ink inside a vacuum drying chamber to assemble a hole transport layer over the anode in the at least one sub-pixel; annealing the hole transport layer; providing a perovskite ink, wherein the perovskite ink comprises at least one solvent and at least one perovskite light emitting material mixed in the at least one solvent; depositing the perovskite ink into the at least one sub-pixel over the hole transport layer using a method of inkjet printing; vacuum drying the perovskite ink inside a vacuum drying chamber to assemble a perovskite emissive layer over the hole transport layer in the at least one sub-pixel; annealing the perovskite emissive layer; and depositing a cathode over the perovskite emissive layer using a method of vapour deposition.

A method of fabricating an inverted perovskite light emitting device is provided. In one embodiment, the method comprises the steps of: providing a substrate; providing a cathode disposed over the substrate; providing a bank structure disposed over the substrate, wherein the bank structure is patterned so as to define at least one sub-pixel on the substrate; providing an electron transport layer ink, wherein the electron transport layer ink comprises at least one solvent and at least one electron transport material mixed in the at least one solvent; depositing the electron transport layer ink into the at least one sub-pixel over the cathode using a method of inkjet printing; vacuum drying the electron transport layer ink inside a vacuum drying chamber to assemble an electron transport layer over the cathode in the at least one sub-pixel; annealing the electron transport layer; providing a perovskite ink, wherein the perovskite ink comprises at least one solvent and at least one perovskite light emitting material mixed in the at least one solvent; depositing the perovskite ink into the at least one sub-pixel over the electron transport layer using a method of inkjet printing; vacuum drying the perovskite ink inside a vacuum drying chamber to assemble a perovskite emissive layer over the electron transport layer in the at least one sub-pixel, annealing the perovskite emissive layer; and depositing an anode over the perovskite emissive layer using a method of vapour deposition.

In one embodiment, the thickness of the electron transport layer is in the range of 10 nm to 80 nm. In one embodiment, the electron transport layer is a cross-linked layer. In one embodiment, the step of depositing the electron transport layer ink into the at least one sub-pixel over the cathode using a method of inkjet printing is performed in an atmosphere of air or nitrogen. In one embodiment, the step of annealing the electron transport layer is performed in an atmosphere of nitrogen. In one embodiment, the electron transport layer is annealed at a temperature in the range of 100° C. to 220° C.

In one embodiment, the thickness of the perovskite emissive layer is in the range of 15 nm to 150 nm. In one embodiment, the step of depositing the perovskite ink into the at least one sub-pixel over the electron transport layer using a method of inkjet printing is performed in an atmosphere of air or nitrogen. In one embodiment, the step of annealing the perovskite emissive layer is performed in an atmosphere of nitrogen. In one embodiment, the perovskite emissive layer is annealed at a temperature in the range of 80° C. to 200° C.

In one embodiment, after the step of providing a bank structure disposed over the substrate, wherein the bank structure is patterned so as to define at least one sub-pixel on the substrate, but before the step of providing an electron transport layer ink, wherein the electron transport layer ink comprises at least one solvent and at least one electron transport material mixed in the at least one solvent, the method further comprises the steps of: providing an electron injection layer ink; wherein the electron injection layer ink comprises at least one solvent and at least one electron injection material mixed in the at least one solvent; depositing the electron injection layer ink into the at least one sub-pixel over the cathode using a method of inkjet printing; vacuum drying the electron injection layer ink inside a vacuum drying chamber to assemble an electron injection layer over the cathode in the at least one sub-pixel, and annealing the electron injection layer.

In one embodiment, the thickness of the electron injection layer is in the range of 10 nm to 80 nm. In one embodiment, the step of depositing the electron injection layer ink into the at least one sub-pixel over the cathode using a method of inkjet printing is performed in an atmosphere of air or nitrogen. In one embodiment, the electron injection layer is annealed at a temperature in the range of 100° C. to 220° C. In one embodiment, the step of annealing the electron injection layer is performed in an atmosphere of air or nitrogen.

In one embodiment, after the step of annealing the perovskite emissive layer, but before the step of depositing an anode over the perovskite emissive layer using a method of vapour deposition, the method further comprises the step of depositing a hole injection layer over the perovskite emissive layer using a method of vapour deposition.

In one embodiment, after the step of annealing the perovskite emissive layer, but before the step of depositing an anode over the perovskite emissive layer using a method of vapour deposition, the method further comprises the step of depositing a hole transport layer over the perovskite emissive layer using a method of vapour deposition.

In one embodiment, after the step of annealing the perovskite emissive layer, but before the step of depositing an anode over the perovskite emissive layer using a method of vapour deposition, the method further comprises the steps of depositing a hole transport layer over the perovskite emissive layer using a method of vapour deposition, and depositing a hole injection layer over the hole transport layer using a method of vapour deposition.

In one embodiment, after the step of annealing the perovskite emissive layer, but before the step of depositing an anode over the perovskite emissive layer using a method of vapour deposition, the method further comprises the steps of depositing an electron blocking layer over the perovskite emissive layer using a method of vapour deposition, and depositing a hole transport layer over the electron blocking layer using a method of vapour deposition.

In one embodiment, after the step of annealing the perovskite emissive layer, but before the step of depositing an anode over the perovskite emissive layer using a method of vapour deposition, the method further comprises the steps of depositing an electron blocking layer over the perovskite emissive layer using a method of vapour deposition, depositing a hole transport layer over the electron blocking layer using a method of vapour deposition, and depositing a hole injection layer over the hole transport layer using a method of vapour deposition.

In one embodiment, the profile of the assembled perovskite emissive layer may be controlled by varying the rate of vacuum drying of the perovskite ink. In one embodiment, the profile of the assembled electron transport layer may be controlled by varying the rate of vacuum drying of the electron transport layer ink. In one embodiment, the morphology of the assembled perovskite emissive layer may be controlled by varying the rate of vacuum drying of the perovskite ink. In one embodiment, the morphology of the assembled electron transport layer may be controlled by varying the rate of vacuum drying of the electron transport layer ink.

An inverted perovskite light emitting device is provided. In one embodiment, the inverted perovskite light emitting device is fabricated by the aforementioned method comprising the steps of: providing a substrate; providing a cathode disposed over the substrate; providing a bank structure disposed over the substrate, wherein the bank structure is patterned so as to define at least one sub-pixel on the substrate; providing an electron transport layer ink, wherein the electron transport layer ink comprises at least one solvent and at least one electron transport material mixed in the at least one solvent; depositing the electron transport layer ink into the at least one sub-pixel over the cathode using a method of inkjet printing; vacuum drying the electron transport layer ink inside a vacuum drying chamber to assemble an electron transport layer over the cathode in the at least one sub-pixel; annealing the electron transport layer; providing a perovskite ink, wherein the perovskite ink comprises at least one solvent and at least one perovskite light emitting material mixed in the at least one solvent; depositing the perovskite ink into the at least one sub-pixel over the electron transport layer using a method of inkjet printing; vacuum drying the perovskite ink inside a vacuum drying chamber to assemble a perovskite emissive layer over the electron transport layer in the at least one sub-pixel;

annealing the perovskite emissive layer; and depositing an anode over the perovskite emissive layer using a method of vapour deposition.

In one embodiment, a perovskite light emitting device fabricated by the disclosed methods may be incorporated into a sub-pixel of a display. Optionally, the display may be incorporated into a wide range of consumer products. Optionally, the display may be used in televisions, computer monitors, tablets, laptop computers, smart phones, cell phones, digital cameras, video recorders, smartwatches, fitness trackers, personal digital assistants, vehicle displays and other electronic devices. Optionally, the display may be used for micro-displays or heads-up displays. Optionally, the display may be used in light sources for interior or exterior illumination and/or signaling, in smart packaging or in billboards.

A person skilled in the art will understand that only a few examples of use are described, but that they are in no way limiting.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Any numerals included within parentheses in the accompanying claims are intended to assist understanding of the claims and should not be construed in any way to limit subject matter claimed by these claims.

Certain embodiments of the invention are as follows:
1. A method of fabricating a perovskite light emitting device, wherein the method comprises the following steps:
   providing a substrate;
   providing an anode disposed over the substrate;
   providing a bank structure disposed over the substrate, wherein the bank structure is patterned so as to define at least one sub-pixel on the substrate;
   providing a hole transport layer ink, wherein the hole transport layer ink comprises at least one solvent and at least one hole transport material mixed in the at least one solvent;
   depositing the hole transport layer ink into the at least one sub-pixel over the anode using a method of inkjet printing;
   vacuum drying the hole transport layer ink inside a vacuum drying chamber to assemble a hole transport layer over the anode in the at least one sub-pixel;
   annealing the hole transport layer;
   providing a perovskite ink, wherein the perovskite ink comprises at least one solvent and at least one perovskite light emitting material mixed in the at least one solvent;
   depositing the perovskite ink into the at least one sub-pixel over the hole transport layer using a method of inkjet printing;
   vacuum drying the perovskite ink inside a vacuum drying chamber to assemble a perovskite emissive layer over the hole transport layer in the at least one sub-pixel;
   annealing the perovskite emissive layer; and
   depositing a cathode over the perovskite emissive layer using a method of vapour deposition.
2. The method of embodiment 1, wherein the thickness of the hole transport layer is in the range of 10 nm to 80 nm.
3. The method of embodiment 1, wherein the hole transport layer is a cross-linked layer.
4. The method of embodiment 1, wherein the step of depositing the hole transport layer ink into the at least one sub-pixel over the anode using a method of inkjet printing is performed in an atmosphere of air or nitrogen.
5. The method of embodiment 1, wherein the step of annealing the hole transport layer is performed in an atmosphere of nitrogen.
6. The method of embodiment 1, wherein the hole transport layer is annealed at a temperature in the range of 100° C. to 220° C.
7. The method of embodiment 1, wherein the thickness of the perovskite emissive layer is in the range of 15 nm to 150 nm.
8. The method of embodiment 1, wherein the step of depositing the perovskite ink into the at least one sub-pixel over the hole transport layer using a method of inkjet printing is performed in an atmosphere of air or nitrogen.
9. The method of embodiment 1, wherein the step of annealing the perovskite emissive layer is performed in an atmosphere of nitrogen.
10. The method of embodiment 1, wherein the perovskite emissive layer is annealed at a temperature in the range of 80° C. to 200° C.
11. The method of any of embodiments 1 to 10, wherein after the step of providing a bank structure disposed over the substrate, wherein the bank structure is patterned so as to define at least one sub-pixel on the substrate, but before the step of providing a hole transport layer ink, wherein the hole transport layer ink comprises at least one solvent, the method further comprises the following steps:
   providing a hole injection layer ink, wherein the hole transport layer ink comprises at least one solvent and at least one hole transport material mixed in the at least one solvent;
   depositing the hole injection layer ink into the at least one sub-pixel over the anode using a method of inkjet printing;
   vacuum drying the hole injection layer ink inside a vacuum drying chamber to assemble a hole injection layer over the anode in the at least one sub-pixel; and
   annealing the hole injection layer.
12. The method of embodiment 11, wherein the thickness of the hole injection layer is in the range of 10 nm to 80 nm.
13. The method of embodiment 11, wherein the step of depositing the hole injection layer ink into the at least one sub-pixel over the anode using a method of inkjet printing is performed in an atmosphere of air or nitrogen.
14. The method of embodiment 11, wherein the step of annealing the hole injection layer is performed in an atmosphere of air or nitrogen.
15. The method of embodiment 11, wherein the hole injection layer is annealed at a temperature in the range of 100° C. to 220° C.
16. The method of any of embodiments 1 to 15, wherein after the step annealing the perovskite emissive layer, but before the step of depositing a cathode over the perovskite emissive layer using a method of vapour depositing, the method further comprises the step of depositing an electron injection layer over the perovskite emissive layer using a method of vapour deposition.
17. The method of any of embodiments 1 to 15, wherein after the step annealing the perovskite emissive layer, but before the step of depositing a cathode over the perovskite emissive layer using a method of vapour depositing, the method further comprises the step of depositing an electron transport layer over the perovskite emissive layer using a method of vapour deposition.
18. The method of any of embodiments 1 to 15, wherein after the step annealing the perovskite emissive layer, but before the step of depositing a cathode over the perovskite emissive layer using a method of vapour deposition, the method further comprises the following steps:
  depositing an electron transport layer over the perovskite emissive layer using a method of vapour deposition; and
  depositing an electron injection layer over the electron transport layer using a method of vapour deposition.
19. The method of any of embodiments 1 to 15, wherein after the step annealing the perovskite emissive layer, but before the step of depositing a cathode over the perovskite emissive layer using a method of vapour deposition, the method further comprises the following steps:
  depositing a hole blocking layer over the perovskite emissive layer using a method of vapour deposition; and
  depositing an electron transport layer over the hole blocking layer using a method of vapour deposition.
20. The method of any of embodiments 1 to 15, wherein after the step annealing the perovskite emissive layer, but before the step of depositing the cathode over the perovskite emissive layer using a method of vapour deposition, the method further comprises the following steps:
  depositing a hole blocking layer over the perovskite emissive layer using a method of vapour deposition;
  depositing an electron transport layer over the hole blocking layer using a method of vapour deposition; and
  depositing an electron injection layer over the hole blocking layer using a method of vapour deposition.
21. The method of any of embodiments 1 to 20, wherein the profile of the assembled perovskite emissive layer may be controlled by varying the rate of vacuum drying of the perovskite ink.
22. The method of any of embodiments 1 to 21, wherein the profile of the assembled hole transport layer may be controlled by varying the rate of vacuum drying of the hole transport layer ink.
23. The method of any of embodiments 1 to 22, wherein the morphology of the assembled perovskite emissive layer may be controlled by varying the rate of the vacuum drying of the perovskite ink.
24. The method of any of embodiments 1 to 23, wherein the morphology of the assembled hole transport layer may be controlled by varying the rate of vacuum drying of the hole transport layer ink.
25. A perovskite light emitting device, wherein the perovskite light emitting device is fabricated by the method of any of embodiments 1 to 24.
26. A method of fabricating an inverted perovskite light emitting device, wherein the method comprises the following steps:
  providing a substrate;
  providing a cathode disposed over the substrate;
  providing a bank structure disposed over the substrate, wherein the bank structure is patterned so as to define at least one sub-pixel on the substrate; providing an electron transport layer ink, wherein the electron transport layer ink comprises at least one solvent and at least one electron transport material mixed in the at least one solvent;
  depositing the electron transport layer ink into the at least one sub-pixel over the cathode using a method of inkjet printing;
  vacuum drying the electron transport layer ink inside a vacuum drying chamber to assemble an electron transport layer over the cathode in the one or more sub-pixels;
  annealing the electron transport layer;
  providing a perovskite ink, wherein the perovskite ink comprises at least one solvent and at least one perovskite light emitting material mixed in the at least one solvent;
  depositing the perovskite ink into the at least one sub-pixel over the electron transport layer using a method of inkjet printing;
  vacuum drying the perovskite ink inside a vacuum drying chamber to assemble a perovskite emissive layer over the electron transport layer in the one or more sub-pixels;
  annealing the perovskite emissive layer; and
  depositing an anode over the perovskite emissive layer using a method of vapour deposition.
27. The method of embodiment 26, wherein the thickness of the electron transport layer is in the range of 10 nm to 80 nm.
28. The method of embodiment 26, wherein the electron transport layer is a cross-linked layer.
29. The method of embodiment 26, wherein the step of depositing the electron transport layer ink into the at least one sub-pixel over the cathode using a method of inkjet printing is performed in an atmosphere of air or nitrogen.
30. The method of embodiment 26, wherein the step of annealing the electron transport layer is performed in an atmosphere of nitrogen.
31. The method of embodiment 26, wherein the electron transport layer is annealed at a temperature in the range of 100° C. to 220° C.
32. The method of embodiment 26, wherein the thickness of the perovskite emissive layer is in the range of 15 nm to 150 nm.
33. The method of embodiment 26, wherein the step of depositing the perovskite ink into the at least one sub-pixel over the electron transport layer using a method of inkjet printing is performed in an atmosphere of air or nitrogen.
34. The method of embodiment 26, wherein the step of annealing the perovskite emissive layer is performed in an atmosphere of nitrogen.
35. The method of embodiment 26, wherein the perovskite emissive layer is annealed at a temperature in the range of 80° C. to 200° C.
36. The method of any of embodiments 26 to 35, wherein after the step of providing a bank structure disposed over the substrate, wherein the bank structure is patterned so as to define at least one sub-pixel on the substrate, but before the step of providing an electron transport layer ink, wherein the electron transport layer ink comprises at least one solvent and at least one electron transport material mixed in the at least one solvent, the method further comprises the following steps:

providing an electron injection layer ink, wherein the electron injection layer ink comprises at least one solvent and at least one electron injection material mixed in the at least one solvent;

depositing the electron injection layer ink into the at least one sub-pixel over the cathode using a method of inkjet printing;

vacuum drying the electron injection layer ink inside a vacuum drying chamber to assemble an electron injection layer over the cathode in the at least one sub-pixel; and annealing the electron injection layer.

37. The method of embodiment 36, wherein the thickness of the electron injection layer is in the range of 10 nm to 80 nm.

38. The method of embodiment 36, wherein the step of depositing the electron injection layer ink into the at least one sub-pixel over the cathode using a method of inkjet printing is performed in an atmosphere of air or nitrogen.

39. The method of embodiment 36, wherein the step of annealing the electron injection layer is performed in an atmosphere of air or nitrogen.

40. The method of embodiment 36, wherein the electron injection layer is annealed at a temperature in the range of 100° C. to 220° C.

41. The method of any of embodiments 26 to 40, wherein after the step annealing the perovskite emissive layer, but before the step of depositing an anode over the perovskite emissive layer using a method of vapour deposition, the method further comprises the step of depositing a hole injection layer over the perovskite emissive layer using a method of vapour deposition.

42. The method of any of embodiments 26 to 40, wherein after the step annealing the perovskite emissive layer, but before the step of depositing an anode over the perovskite emissive layer using a method of vapour deposition, the method further comprises the step of depositing a hole transport layer over the perovskite emissive layer using a method of vapour deposition.

43. The method of any of embodiments 26 to 40, wherein after the step of annealing the perovskite emissive layer, but before the step of depositing an anode over the perovskite emissive layer using a method of vapour deposition, the method further comprises the following steps:

depositing a hole transport layer over the perovskite emissive layer using a method of vapour deposition; and depositing a hole injection layer over the hole transport layer using a method of vapour deposition.

44. The method of any of the embodiments 26 to 40, wherein after the step annealing the perovskite emissive layer, but before the step of depositing an anode over the perovskite emissive layer using a method of vapour deposition, the method further comprises the following steps:

depositing an electron blocking layer over the perovskite emissive layer using a method of vapour deposition; and depositing a hole transport layer over the electron blocking layer using a method of vapour deposition.

45. The method of any of the embodiments 26 to 40, wherein after the step annealing the perovskite emissive layer, but before the step of depositing an anode over the perovskite emissive layer using a method of vapour deposition, the method further comprises the following steps:

depositing an electron blocking layer over the perovskite emissive layer using a method of vapour deposition;

depositing a hole transport layer over the electron blocking layer using a method of vapour deposition; and depositing a hole injection layer over the hole transport layer using a method of vapour deposition.

46. The method of any of embodiments 26 to 45, wherein the profile of the assembled electron transport layer may be controlled by varying the rate of vacuum drying of the electron transport layer ink.

47. The method of any of embodiments 26 to 46, wherein the morphology of the assembled perovskite emissive layer may be controlled by varying the rate of vacuum drying of the perovskite ink.

48. The method of any of embodiments 26 to 46, wherein the morphology of the assembled electron transport layer may be controlled by varying the rate of vacuum drying of the electron transport layer ink.

49. An inverted perovskite light emitting device, wherein the perovskite light emitting device is fabricated by the method of any of embodiments 26 to 48.

REFERENCES

Adjokatse et al., Broadly tunable metal halide perovskites for solid-state light-emission applications, Materials Today, Volume 20, Issue 8, Pages 413-424 (2017).

Hirose et al., High-efficiency Perovskite QLED Achieving BT.2020 Green Chromaticity, SID Symposium Digest of Technical Papers 2017, Volume 48, Pages 284-287 (2017).

Kumar et al., Efficient Blue Electroluminescence Using Quantum-Confined Two-Dimensional Perovskites, ACS Nano, Volume 10, Pages 9720-9729 (2016).

Soneira et al., iPhone X OLED Display Technology Shoot-Out, DisplayMate Technologies Corporation, http://www.displaymate.com/iPhoneX ShootOut 1a.htm [accessed 20 May 2018].

Wang et al., Perovskite light-emitting diodes based on solution-processed, self-organised multiple quantum wells, Nature Photonics, Volume 10, Pages 699-704 (2016).

The invention claimed is:

1. A method of fabricating a perovskite light emitting device, wherein the method comprises the following steps:

providing a substrate;

providing a first electrode disposed over the substrate;

providing a bank structure disposed over the substrate, wherein the bank structure is patterned so as to define at least one sub-pixel on the substrate;

providing a first transport layer ink, wherein the first transport layer ink comprises at least one solvent and at least one first charge transport material mixed in the at least one solvent;

depositing the first transport layer ink into the at least one sub-pixel over the first electrode using a method of inkjet printing;

vacuum drying the first transport layer ink inside a vacuum drying chamber to assemble a first transport layer over the first electrode in the at least one sub-pixel;

annealing the first transport layer;

providing a perovskite ink, wherein the perovskite ink comprises at least one solvent and at least one perovskite light emitting material mixed in the at least one solvent;

depositing the perovskite ink into the at least one sub-pixel over the first transport layer using a method of inkjet printing;

vacuum drying the perovskite ink inside a vacuum drying chamber to assemble a perovskite emissive layer over the first transport layer in the at least one sub-pixel;

annealing the perovskite emissive layer; and depositing a second electrode over the perovskite emissive layer using a method of vapour deposition.

2. The method of claim 1, wherein during the step of vacuum drying the first transport layer ink inside a vacuum drying chamber to assemble a first transport layer over the first electrode in the at least one sub-pixel, the ambient temperature inside the vacuum drying chamber is 50° C. or less, optionally 30° C. or less.

3. The method of claim 1, wherein the thickness of the first transport layer is in the range of 10 nm to 80 nm.

4. The method of claim 1, wherein the first transport layer is a cross-linked layer.

5. The method of claim 1, wherein the step of annealing the first transport layer is performed in a different chamber to the step of vacuum drying the first transport layer ink inside a vacuum drying chamber to assemble a first transport layer over the first electrode in the at least one sub-pixel.

6. The method of claim 1, wherein during the step of vacuum drying the perovskite ink inside a vacuum drying chamber to assemble a perovskite emissive layer over the first transport layer in the at least one sub-pixel, the pressure inside the vacuum drying chamber is reduced to less than or equal to 0.0001 mbar.

7. The method of claim 1, wherein during the step of vacuum drying the perovskite ink inside a vacuum drying chamber to assemble a perovskite emissive layer over the first transport layer in the at least one sub-pixel, the ambient temperature inside the vacuum drying chamber is 50° C. or less, optionally 30° C. or less.

8. The method of claim 1, wherein the perovskite ink comprises at least one perovskite light emitting material mixed in the at least one solvent at a concentration by weight in the range of 0.01 wt. % to 10 wt. %.

9. The method of claim 1, wherein the thickness of the assembled perovskite emissive layer is in the range of 15 nm to 150 nm.

10. The method of claim 1, wherein the length of the at least one sub-pixel is in the range of 100 μm to 250 μm, and the width of the at least one sub-pixel is in the range of 40 μm to 80 μm.

11. The method of claim 1, wherein the step of annealing the perovskite emissive layer is performed in a different chamber to the step of vacuum drying the perovskite ink inside a vacuum drying chamber to assemble a perovskite emissive layer over the first transport layer in the at least one sub-pixel.

12. The method of claim 1, wherein after the step of providing a bank structure disposed over the substrate, wherein the bank structure is patterned so as to define at least one sub-pixel on the substrate, but before the step of providing a first transport layer ink, wherein the first transport layer ink comprises at least one solvent and at least one first charge transport material mixed in the at least one solvent, the method further comprises the following steps:

providing a first injection layer ink, wherein the first injection layer ink comprises at least one solvent and at least one first charge injection material mixed in the at least one solvent;

depositing the first injection layer ink into the at least one sub-pixel over the first electrode using a method of inkjet printing;

vacuum drying the first injection layer ink inside a vacuum drying chamber to assemble a first injection layer over the first electrode in the at least one sub-pixel; and annealing the first injection layer.

13. The method of claim 12, wherein the thickness of the first injection layer is in the range of 10 nm to 80 nm.

14. The method of claim 12, wherein during the step of vacuum drying the first injection layer ink inside a vacuum drying chamber to assemble a first injection layer over the first electrode in the at least one sub-pixel, the ambient temperature inside the vacuum drying chamber is 50° C. or less, optionally 30° C. or less.

15. The method of claim 12, wherein the step of annealing the first injection layer is performed in a different chamber to the step of vacuum drying the first injection layer ink inside a vacuum drying chamber to assemble a first injection layer over the first electrode in the at least one sub-pixel.

16. The method of claim 12, wherein after the step of annealing the perovskite emissive layer, but before the step of depositing a second electrode over the perovskite emissive layer using a method of vapour deposition, the method further comprises the step of depositing a second injection layer over the perovskite emissive layer using a method of vapour deposition.

17. The method of claim 12, wherein after the step of annealing the perovskite emissive layer, but before the step of depositing a second electrode over the perovskite emissive layer using a method of vapour deposition, the method further comprises the step of depositing a second transport layer over the perovskite emissive layer using a method of vapour deposition.

18. A perovskite light emitting device, wherein the perovskite light emitting device is fabricated by the method of claim 1.

19. A perovskite light emitting device, wherein the perovskite light emitting device is fabricated by the method of claim 1, such that it is a standard perovskite light emitting device.

20. A perovskite light emitting device, wherein the perovskite light emitting device is fabricated by the method of claim 1, such that it is an inverted perovskite light emitting device.

* * * * *